(12) United States Patent
Kobayashi et al.

(10) Patent No.: US 9,424,998 B2
(45) Date of Patent: Aug. 23, 2016

(54) DYE, PHOTOELECTRIC CONVERSION ELEMENT USING THE SAME, PHOTOELECTROCHEMICAL CELL, AND METHOD OF PRODUCING DYE

(71) Applicant: FUJIFILM Corporation, Tokyo (JP)

(72) Inventors: Katsumi Kobayashi, Odawara (JP); Keizo Kimura, Odawara (JP); Tatsuya Susuki, Odawara (JP); Hirotaka Satou, Odawara (JP); Yukio Tani, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 78 days.

(21) Appl. No.: 14/136,995

(22) Filed: Dec. 20, 2013

(65) Prior Publication Data

US 2014/0102540 A1    Apr. 17, 2014

Related U.S. Application Data

(62) Division of application No. 13/126,951, filed as application No. PCT/JP2009/068631 on Oct. 29, 2009, now Pat. No. 8,779,126.

(30) Foreign Application Priority Data

| Oct. 29, 2008 | (JP) | 2008-278903 |
| Dec. 3, 2008 | (JP) | 2008-308951 |
| Mar. 9, 2009 | (JP) | 2009-055195 |
| Jun. 26, 2009 | (JP) | 2009-153051 |
| Jun. 27, 2009 | (JP) | 2009-153052 |
| Jun. 27, 2009 | (JP) | 2009-153053 |

(51) Int. Cl.

| C07D 219/06 | (2006.01) |
| C07D 223/28 | (2006.01) |
| C07D 279/20 | (2006.01) |
| C07D 279/22 | (2006.01) |
| C07D 409/04 | (2006.01) |
| C07D 409/14 | (2006.01) |
| C07D 407/04 | (2006.01) |
| C07D 407/14 | (2006.01) |
| C07D 403/04 | (2006.01) |
| C07D 403/14 | (2006.01) |
| C07D 421/04 | (2006.01) |
| C07D 421/14 | (2006.01) |
| H01G 9/20 | (2006.01) |
| C09B 23/01 | (2006.01) |
| C09B 23/04 | (2006.01) |
| C09B 23/10 | (2006.01) |
| H01M 14/00 | (2006.01) |

(52) U.S. Cl.
CPC ......... *H01G 9/2059* (2013.01); *C09B 23/0091* (2013.01); *C09B 23/04* (2013.01); *C09B 23/102* (2013.01); *H01M 14/005* (2013.01)

(58) Field of Classification Search
CPC  C07D 219/06; C07D 223/28; C07D 279/20; C07D 279/22; C07D 409/04; C07D 409/14; C07D 407/04; C07D 407/14; C07D 403/04; C07D 403/14; C07D 421/04; C07D 421/14
USPC ................ 540/591; 544/35, 38; 546/102
See application file for complete search history.

(56) References Cited

U.S. PATENT DOCUMENTS

| 4,525,588 A | 6/1985 | Zink |
| 5,463,057 A | 10/1995 | Graetzel et al. |
| 5,525,440 A | 6/1996 | Kay et al. |
| 2008/0087327 A1 | 4/2008 | Horiuchi et al. |
| 2009/0044857 A1 | 2/2009 | Shigaki et al. |
| 2011/0061723 A1 | 3/2011 | Kunimoto et al. |

FOREIGN PATENT DOCUMENTS

| AU | 2007221706 | 9/2007 |
| CN | 1858117 | 11/2006 |
| JP | 05-181292 | 7/1993 |
| JP | 07-249790 | 9/1995 |
| JP | 2000-178273 | 6/2000 |

(Continued)

OTHER PUBLICATIONS

International Search Report, PCT/JP2009/068631, Feb. 2, 2010.

(Continued)

*Primary Examiner* — Brenda Coleman
(74) *Attorney, Agent, or Firm* — Young & Thompson

(57) ABSTRACT

A dye, having a structure represented by formula (1A):

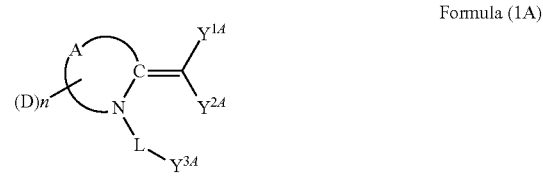

Formula (1A)

wherein A represents a group of atoms necessary for forming a ring together with the carbon-nitrogen bond; at least one of $Y^{1A}$ and $Y^{2A}$ represents an acidic group, in which when they each represent an acidic group, they may be the same as or different from each other, or when only one of them represents an acidic group, the other represents an electron-withdrawing group; D represents a group to give a dye; n represents an integer of 1 or greater; L represents a single bond or a divalent linking group; and $Y^{3A}$ represents an acidic group.

7 Claims, 1 Drawing Sheet

(56) References Cited

FOREIGN PATENT DOCUMENTS

| JP | 2002-322161 | 11/2002 |
|---|---|---|
| JP | 2004-063274 | 2/2004 |
| JP | 2004-302207 | 10/2004 |
| JP | 2005015750 A | 1/2005 |
| JP | 2005-63833 | 3/2005 |
| JP | 2006-073375 | 3/2006 |
| JP | 2006-156212 | 6/2006 |
| JP | 2006-156213 | 6/2006 |
| JP | 2008-135197 | 6/2008 |
| JP | 2008-226470 | 9/2008 |
| JP | 2009-272296 | 11/2009 |
| JP | 2010-013444 | 1/2010 |
| JP | 2010-065033 | 3/2010 |
| WO | 97/39748 | 10/1997 |
| WO | WO 2006/134939 | 12/2006 |
| WO | WO 2007/100033 | 9/2007 |
| WO | WO 2009/109499 | 9/2009 |

OTHER PUBLICATIONS

Partial European Search Report dated Sep. 23, 2013 in corresponding European Patent Application No. 09823685.
Japanese Notice of Reasons for Rejection dated Oct. 1, 2013 in corresponding Japanese Patent Application No. 2009-153051 with English translation of Japanese Notice of Reasons for Rejection.
Amaresh Mishra et al., "Metal-Free Organic Dyes for Dye-Sensitized Solar Cells: From Structure: Property Relationships to Design Rules", Angewandte Chemie International Edition, vol. 48, No. 14, Mar. 23, 2009, pp. 2474-2499, XP 055044815.
Ruikui Chen e al., "Effect of Tetrahydroquinoline Dyes Structure on the Performance of Organic Dye-Sensitized Solar Cells", Chemical Materials, vol. 19, No. 16, 2007, pp. 4007-4015.
CAPLUS printout of Sahni et al., Studies of Azo Derivatives of 8-amino-1 0, 11-dihydro-5H-dibenzo(b,e)(1 ,4) diazepine-11-thione: Part IV, Journal of the Indian Chemical Society (1981), vol. 58, No. 3, pp. 305-306.
CAPLUS printout of Grover et al., Synthesis of 8-substituted-1 0, 11-dihydro-11-oxo-5H-dibenzo(b,e )(1,4)diazepines: Part II, Journal of the Indian Chemical Society (1978), vol. 55, No. 2, pp. 154-155.
CAPLUS printout of Buttgereit et al., Addition Reactions Between Dye Cations (Electron Acceptors) and 0-, N- and C-Lewis Bases (Electron Donors) as a Cause for Abnormally Low-Absorption Bands for Dyes in Certain Solvents, Berichte der Bunsen-Gesellschaft (1965), vol. 69, No. 4, pp. 301-308.
European Search Report—EP 14 00 2105—Jun. 15, 2015.
KR Office Action, dated Oct. 20, 2015; Application No. 2011-7012207.
Australian Office Action dated Mar. 10, 2016; Application No. 2009310805.

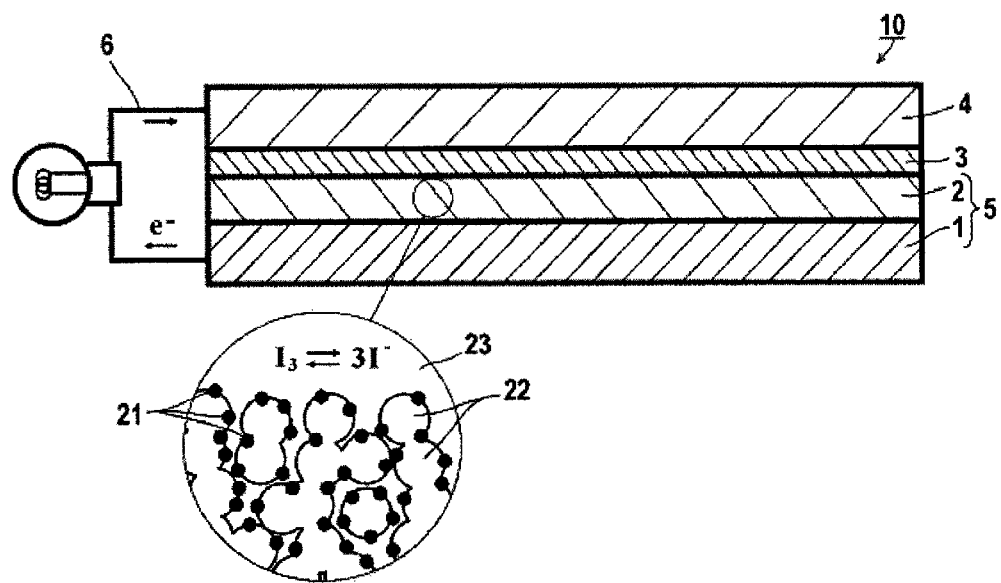

DYE, PHOTOELECTRIC CONVERSION ELEMENT USING THE SAME, PHOTOELECTROCHEMICAL CELL, AND METHOD OF PRODUCING DYE

CROSS REFERENCE TO RELATED APPLICATIONS

This application is a division of application Ser. No. 13/126,951 filed on May 6, 2011, which is a National Stage of PCT/JP2009/068631 filed on Oct. 29, 2009, which claims foreign priority to Japanese Application Nos. 2008-278903, 2008-308951, 2009-055195, 2009-153051, 2009-153052 and 2009-153053 filed on Oct. 29, 2008, Dec. 3, 2008, Mar. 9, 2009, Jun. 26, 2009, Jun. 27, 2009 and Jun. 27, 2009, respectively. The entire contents of each of the above applications are hereby incorporated by reference.

TECHNICAL FIELD

The present invention relates to a dye, a photoelectric conversion element sensitized with a dye, and a photoelectrochemical cell (dye-sensitized solar cell) using the same. Further, the present invention relates to a method of producing a dye.

BACKGROUND ART

Photoelectric conversion elements are used in various photosensors, copying machines, solar cells, and the like. These photoelectric conversion elements have adopted various systems to be put into use, such as elements utilizing metals, elements utilizing semiconductors, elements utilizing organic pigments or dyes, or combinations of these elements. Among them, solar cells that make use of non-exhaustive solar energy do not necessitate fuels, and full-fledged practicalization of solar cells as an inexhaustible clean energy is being highly expected. Under such circumstances, research and development of silicon-based solar cells have long been in progress. Many countries also support policy-wise considerations, and thus dissemination of silicon-based solar cells is still in progress. However, silicon is an inorganic material, and has limitations per se in terms of throughput and molecular modification.

As a next-generation technology to solve such problems as described above, research is being vigorously carried out on dye-sensitized solar cells. Particularly, Graetzel et al. at l'Ecole Polytechnique de l'Universite de Lausanne in Switzerland have developed a dye-sensitized solar cell in which a dye formed from a ruthenium complex is fixed at the surface of a porous titanium oxide thin film, and have realized a conversion efficiency that is comparable to that of amorphous silicon. Thus, they instantly attracted the attention of researchers all over the world.

Patent Literatures 1 to 3 describe dye-sensitized photoelectric conversion elements making use of semiconductor fine particles sensitized by a dye, to which the foregoing technology has been applied. These have an advantageous that a device can be produced by relatively simple steps. However, the ruthenium complex dyes used in the sensitized dyes are very expensive. Furthermore, there are concerns about the supply of ruthenium, and it still cannot be said that this technology is satisfactory as a next-generation technology supporting clean energy to cope with the above-described problems in a full-fledged manner. Rather, the research and development intended for practicalization has been just begun to some extent. For such reasons, development of a photoelectric conversion element which is sensitized by an organic material that is inexpensive and is less restricted in resources, and which has sufficient conversion efficiency, is desired. Reports are beginning to emerge on the use of organic dyes as sensitizers of a photoelectric conversion element (see Patent Literature 4).

CITATION LIST

Patent Literatures

Patent Literature 1: U.S. Pat. No. 5,463,057
Patent Literature 2: U.S. Pat. No. 5,525,440
Patent Literature 3: JP-A-7-249790 ("JP-A" means unexamined published Japanese patent application)
Patent Literature 4: JP-A-2008-135197

DISCLOSURE OF INVENTION

Technical Problem

The problem of the present invention is to provide a photoelectrochemical cell having high conversion efficiency using a low-cost dye.

Solution to Problem

As a result of intensive investigations, the present inventors have found that photoelectrochemical cells having high conversion efficiency can be provided by using dyes of a first invention, a second invention and a third invention, respectively. The present invention was made based on this finding.
1. Dye of First Embodiment of Invention
The dye of the first embodiment of the present invention is a specific dye having a cyclic structure containing a carbon atom and a nitrogen atom, in which an acidic group binds to the nitrogen atom of the cyclic structure through a single bond or a divalent linking group, and the exomethylene of the cyclic structure is substituted with one or more acidic group(s).

The problems of the present invention can be solved by the following means.
<1a> A dye, having a structure represented by formula (1A):

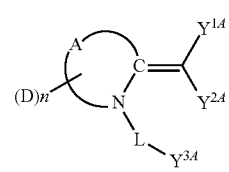

Formula (1A)

wherein A represents a group of atoms necessary for forming a ring together with the carbon-nitrogen bond; at least one of $Y^{1A}$ and $Y^{2A}$ represents an acidic group, in which when they each represent an acidic group, they may be the same as or different from each other, or when only one of them represents an acidic group, the other represents an electron-withdrawing group; D represents a group to give a dye; n represents an integer of 1 or greater; L represents a single bond or a divalent linking group; and $Y^{3A}$ represents an acidic group.
<2a> The dye described in the above item <1a>, wherein the dye having the structure represented by formula (1A) has a structure represented by any one of formulae (2A) to (5A):

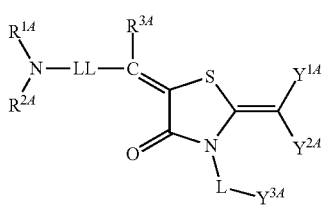

Formula (2A)

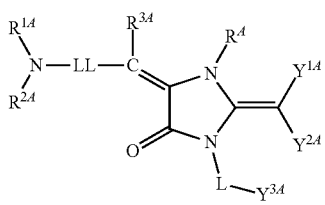

Formula (3A)

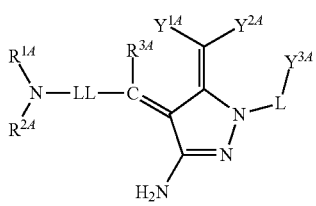

Formula (4A)

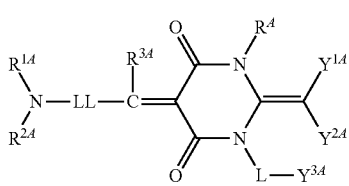

Formula (5A)

wherein at least one of $Y^{1A}$ and $Y^{2A}$ represents an acidic group, in which when they each represent an acidic group, they may be the same as or different from each other, or when only one of them represents an acidic group, the other represents an electron-withdrawing group; LL represents at least one divalent linking group selected from the group consisting of an alkenylene group, an alkynylene group and an arylene group, each of which may have a substituent; $Y^{3A}$ represents an acidic group; $R^A$, $R^{1A}$, $R^{2A}$ and $R^{3A}$ each independently represent a hydrogen atom, an aliphatic group, an aromatic group, or a heterocyclic group linked through a carbon atom; $R^{1A}$ and $R^{2A}$ may form a ring together with the substituent on LL; and L has the same meaning as in formula (1A).

<3a> The dye described in the above item <2a>, wherein the dye having the structure represented by formula (2A) has a structure represented by formula (6A):

Formula (6A)

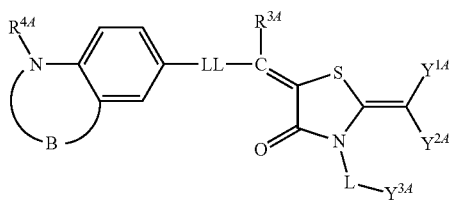

wherein at least one of $Y^{1A}$ and $Y^{2A}$ represents an acidic group, in which when they each represent an acidic group, they may be the same as or different from each other, or when only one of them represents an acidic group, the other represents an electron-withdrawing group; LL represents at least one divalent linking group selected from the group consisting of an alkenylene group, an alkynylene group and an arylene group, each of which may have a substituent; $Y^{3A}$ represents an acidic group; $R^{3A}$ and $R^{4A}$ each independently represent a hydrogen atom, an aliphatic group, an aromatic group, or a heterocyclic group linked through a carbon atom; B represents a group of atoms necessary for forming a ring together with the two carbon atoms and the nitrogen atom on the benzene ring; and L has the same meaning as in formula (1A).

<4a> The dye described in the above item <2a>, wherein the dye having the structure represented by formula (5A) is represented by formula (7A):

Formula (7A)

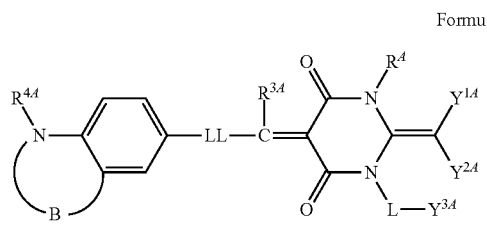

wherein at least one of $Y^{1A}$ and $Y^{2A}$ represents an acidic group, in which when they each represent an acidic group, they may be the same as or different from each other, or when only one of them represents an acidic group, the other represents an electron-withdrawing group; LL represents at least one divalent linking group selected from the group consisting of an alkenylene group, an alkynylene group and an arylene group, each of which may have a substituent; $Y^{3A}$ represents an acidic group; $R^A$, $R^{3A}$ and $R^{4A}$ each independently represent a hydrogen atom, an aliphatic group, an aromatic group, or a heterocyclic group linked through a carbon atom; B represents a group of atoms necessary for forming a ring together with the two carbon atoms and the nitrogen atom on the benzene ring; and L has the same meaning as in formula (1A).

<5a> The dye described in any one of the items <1a> to <4a>, wherein the acidic group of $Y^{1A}$ and $Y^{2A}$ is a carboxyl group.

<6a> A method of producing a dye, which comprises the step of:
deprotecting at least one of $Z^{1A}$, $Z^{2A}$ and $Z^{3A}$, which is a substituent represented by formula (9A) in a compound represented by formula (8A), in the presence of a transition metal catalyst, thereby to obtain the dye having a structure represented by formula (1A):

Formula (8A)

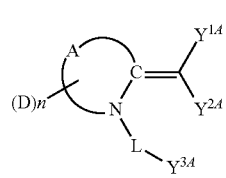

wherein A, D, n and L each have the same meanings as those in formula (1A), respectively; at lease one of $Z^{1A}$, $Z^{2A}$ and $Z^{3A}$ represents a substituent represented by formula (9A), and $Z^{1A}$, $Z^{2A}$ and $Z^{3A}$ each are not the substituent represented by formula (9A), each represent an acidic group, in which any one of $Z^{1A}$ and $Z^{2A}$ represents an electron-withdrawing group.

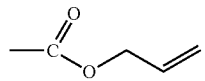

Formula (9A)

<7a> A photoelectric conversion element, comprising a light-receiving electrode, wherein the light-receiving electrode comprises semiconductor fine particles sensitized by the dye described in any one of the items <1a> to <5a>.
<8a> A photoelectrochemical cell, comprising the photoelectric conversion element described in the above item <7a>.

2. Dye of Second Embodiment of Invention

The dye of the second embodiment of the present invention is a dye having a specific structure containing benzene rings linked with a nitrogen-containing 7-membered heterocyclic ring.

The problems of the present invention can be solved by the following means.
<1b> A dye, having a structure represented by formula (1B):

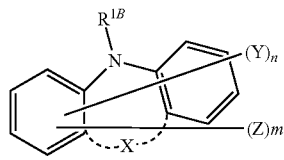

Formula (1B)

wherein X represents a group of non-metallic atoms necessary for forming a nitrogen-containing 7-membered hetero ring by linking with the benzene rings; Y represents a group to give a dye; n represents an integer of 1 or more; Z represents a substituent; m represents zero (0) or a positive integer; when m is an integer of 2 or more, Z's may be the same as or different from each other; and $R^{1B}$ represents a hydrogen atom, an aliphatic group, an aromatic group or a heterocyclic group that is linked with the nitrogen atom via a carbon atom.
<2b> The dye described in the above item <1b>, wherein the dye represented by formula (1B) has a structure represented by formula (2B):

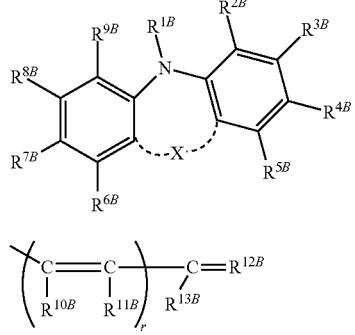

Formula (2B)

Formula (3B)

wherein, in formula (2B), X represents a group of non-metallic atoms necessary for forming a nitrogen-containing 7-membered hetero ring by linking with the benzene rings; $R^{1B}$ represents a hydrogen atom, an aliphatic group, an aromatic group or a heterocyclic group that is linked with the nitrogen atom via a carbon atom; $R^{2B}$ to $R^{9B}$ each independently represent a hydrogen atom or a substituent; and at least one substituent of $R^{2B}$ to $R^{9B}$ represents a group to give a dye represented by formula (3B);
wherein, in formula (3B), $R^{10B}$, $R^{11B}$ and $R^{13B}$ each independently represent a hydrogen atom, an aliphatic group, an aromatic group or a heterocyclic group; r represents an integer of 0 or more; the carbon-carbon double bond in formula (3B) may be any of an E-form and a Z-form; and $R^{12B}$ represents a group having at least one acidic group, or an acidic nucleus.
<3b> The dye described in the above item <1b> or <2b>, wherein the dye having a structure represented by formula (1B) or (2B) is represented by formula (4B):

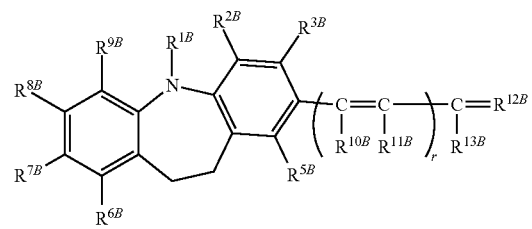

Formula (4B)

wherein $R^{1B}$ to $R^{3B}$ and $R^{5B}$ to $R^{13B}$ in formula (4B) each have the same meaning as $R^{1B}$ to $R^{3B}$ and $R^{5B}$ to $R^{13B}$ in formula (2B) or (3B), respectively.
<4b> The dye described in the above item <1b> or <2b>, wherein the dye having a structure represented by formula (1B) or (2B) is represented by formula (5B):

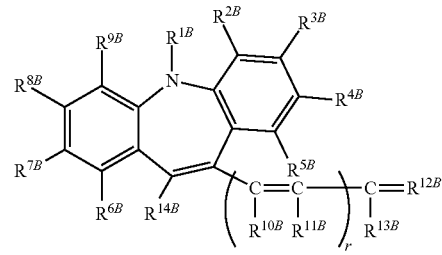

Formula (5B)

wherein $R^{1B}$ to $R^{13B}$ in formula (5B) each have the same meaning as $R^{1B}$ to $R^{13B}$ in formula (2B) or (3B), respectively; and $R^{14B}$ represents a hydrogen atom, an alkyl group, an alkoxy group, an alkylthio group, an aryl group, an aryloxy group, an arylthio group or a heterocyclic group.
<5b> The dye described in the above item <1b> or <2b>, wherein the dye having a structure represented by formula (1B) or (2B) is represented by formula (6B):

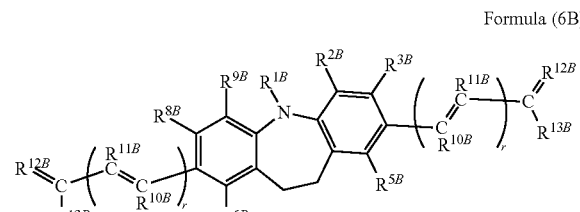

Formula (6B)

wherein $R^{1B}$ to $R^{3B}$, $R^{5B}$, $R^{6B}$ and $R^{8B}$ to $R^{13B}$ in formula (6B) each have the same meaning as $R^{1B}$ to $R^{3B}$, $R^{5B}$, $R^{6B}$ and $R^{8B}$ to $R^{13B}$ in formula (2B) or (3B), respectively.

<6b> The dye described in any one of the above items <2b> to <5b>, wherein $R^{12B}$ is represented by formula (7B) or (8B):

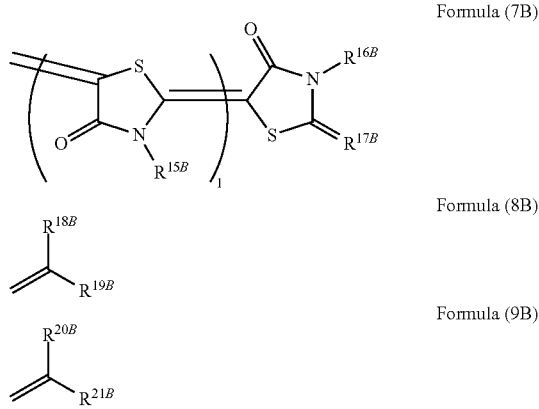

Formula (7B)

Formula (8B)

Formula (9B)

wherein, in formula (7B), $R^{15B}$ and $R^{16B}$ each independently represent an aliphatic group, an aromatic group, or a heterocyclic group (at least one functional group thereof may have an acidic group); 1 represents 0 or 1; the carbon-carbon double bonds in formula (7B) may be any of an E-form or a Z-form; $R^{17B}$ in formula (7B) represents a sulfur atom or a group represented by formula (9B); and the carbon-carbon double bond in formula (9B) may be any of an E-form or a Z-form;

wherein, in formula (8B), $R^{18B}$ and $R^{19B}$ each independently represent a cyano group or an acidic group, and may be the same as or different from each other; and the carbon-carbon double bond in formula (8B) may be any of an E-form or a Z-form; and wherein, in formula (9B), $R^{20B}$ and $R^{21B}$ each independently represent a cyano group or an acidic group, and may be the same as or different from each other; and the carbon-carbon double bond in formula (9B) may be any of an E-form or a Z-form.

<7b> The dye described in the above item <6b>, wherein the group represented by formula (7B) is a group represented by formula (10B):

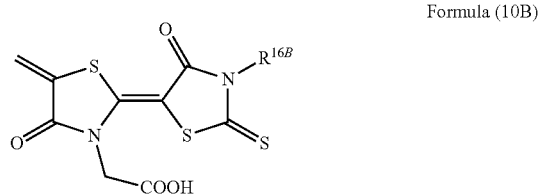

Formula (10B)

wherein $R^{16B}$ represents an aliphatic group, an aromatic group or a heterocyclic group (each of which may have an acidic group).

<8b> The dye described in any one of the above items <2b> to <5b>, wherein $R^{12B}$ is represented by formula (11B):

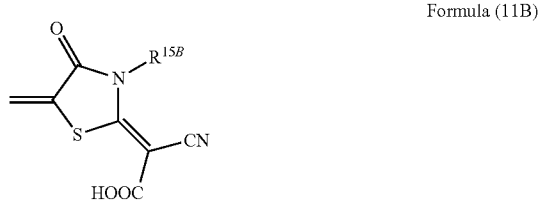

Formula (11B)

wherein $R^{15B}$ represents an aliphatic group, an aromatic group or a heterocyclic group (each of which may have an acidic group).

<9b> The dye described in any one of the above items <2b> to <5b>, wherein $R^{12B}$ is represented by formula (12B).

Formula (12B)

<10b> A photoelectric conversion element, comprising a light-receiving electrode, wherein the light-receiving electrode comprises semiconductor fine particles sensitized by the dye described in any one of the items <1b> to <9b>.

<11b> The photoelectric conversion element described in the item <10b>, further comprising a porous material of insulation between the light-receiving electrode and a counter electrode.

<12b> A photoelectrochemical cell, comprising the photoelectric conversion element described in the above item <10b> or <11b>.

3. Dye of Third Embodiment of Invention

The dye of the third embodiment of the present invention has a 6-membered or 7-membered nitrogen-containing heterocyclic ring linked with a benzene ring, and has a substituent having a specific structure on the benzene ring.

The problems of the present invention can be solved by the following means.

<1c> A dye, having a structure represented by formula (1C) in the molecule:

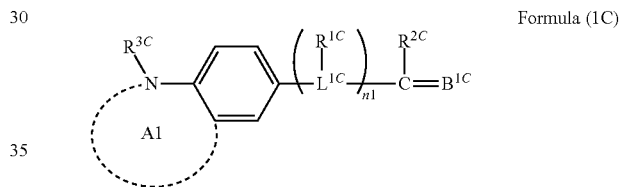

Formula (1C)

wherein $A^1$ represents a 6- or 7-membered nitrogen-containing heterocycle formed by linking with the benzene ring and the nitrogen atom; $L^{1C}$ represents an electron transfer-linking group containing at least one hetero ring selected from the group consisting of a thiophene ring, a furane ring, a pyrrole ring, a selenophene ring, and a hetero ring in which at least two of those are condensed with each other; $R^{1C}$ and $R^{3C}$ each independently represent a hydrogen atom or a substituent; $R^{2C}$ represents a hydrogen atom or a substituent; $B^{1C}$ represents a heterocyclic acidic nucleus, or a methylene group substituted with an electron-withdrawing group; $B^{1C}$ represents a group having at least one acidic group; and n1 represents an integer of 1 to 12.

<2c> The dye described in the above item <1c>, wherein the dye represented by formula (1C) is represented by formula (2C):

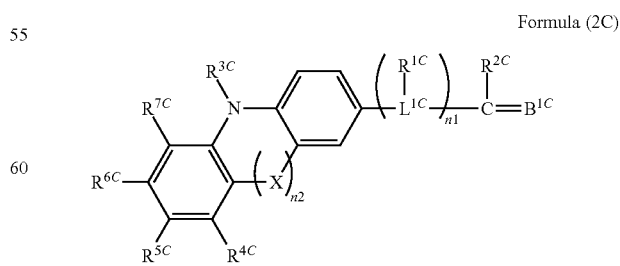

Formula (2C)

wherein X represents a group of non-metallic atoms necessary for forming a 6- or 7-membered nitrogen-containing heterocycle by linking with the benzene rings and the nitrogen atom; $L^{1C}$, $R^{1C}$, $R^{2C}$, $R^{3C}$, $B^{1C}$ and n1 each have the same meaning as those in formula (1C), respectively; $R^{4C}$ to $R^{7C}$ each independently represent a hydrogen atom or a substituent; and n2 represents an integer of 1 or 2.

<3c> The dye described in the above item <2c>, wherein, in formula (2C), X is a non-metallic atom for forming a 7-membered nitrogen-containing heterocycle by linking with the benzene rings and the nitrogen atom.

<4c> The dye described in any one of the above items <1c> to <3c>, wherein $B^{1C}$ is represented by formula (3C) or (4C):

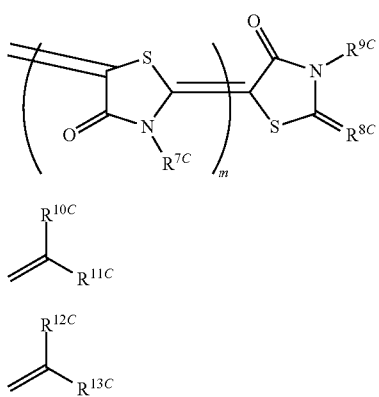

Formula (3C)

Formula (4C)

Formula (5C)

wherein, in formula (3C), $R^{7C}$ and $R^{9C}$ each independently represent an aliphatic group, an aromatic group or a heterocyclic group (at least one functional group thereof may have an acidic group); m represents 0 or 1; the carbon-carbon double bond in formula (3C) may be any of an E-form or a Z-form; $R^{8C}$ in formula (3C) represents a sulfur atom or a group represented by formula (5C); and the carbon-carbon double bond in formula (5C) may be any of an E-form or a Z-form;

wherein, in formula (4C), $R^{10C}$ and $R^{11C}$ each independently represent a cyano group or an acidic group, and may be the same as or different from each other; and the carbon-carbon double bond in formula (4C) may be any of an E-form or a Z-form; and wherein, in formula (5C), $R^{12C}$ and $R^{13C}$ each independently represent a cyano group or an acidic group, and may be the same as or different from each other; and the carbon-carbon double bond in formula (5C) may be any of an E-form or a Z-form.

<5c> The dye described in the above item <4c>, wherein the dye having the structure represented by formula (3C) is represented by formula (6C):

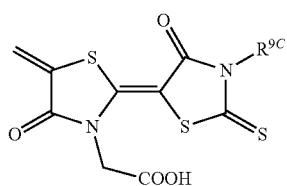

Formula (6C)

wherein $R^{9C}$ represents an aliphatic group, an aromatic group or a heterocyclic group (each of which may have an acidic group).

<6c> The dye described in any one of the above items <1c> to <3c>, wherein $B^{1C}$ is represented by formula (7C):

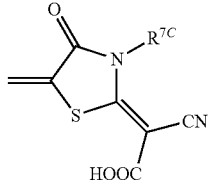

Formula (7C)

wherein $R^{7C}$ represents an aliphatic group, an aromatic group or a heterocyclic group (each of which may have an acidic group).

<7c> The dye described in any one of the above items <1c> to <3c>, wherein $B^{1C}$ is represented by formula (8C).

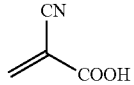

Formula (8C)

<8c> A photoelectric conversion element, comprising a light-receiving electrode, wherein the light-receiving electrode comprises semiconductor fine particles sensitized by the dye described in any one of the items <1c> to <7c>.

<9c> The photoelectric conversion element described in the item <8c>, further comprising a porous material of insulation between the light-receiving electrode and a counter electrode.

<10c> The photoelectric conversion element described in any one of the above items <8c> to <9c>, comprising an electrolytic solution comprising γ-butyrolactone.

<11c> A photoelectrochemical cell, comprising the photoelectric conversion element described in any one of the above items <8c> to <10c>.

Advantageous Effects of Invention

The dye of the first invention, the dye of the second invention and the dye of the third invention each have such favorable characteristics that high photoelectric conversion efficiency is obtained when the dye is used as a sensitizing dye for photoelectric conversion elements or photoelectrochemical cells. In addition, since each of the dyes does not make it necessary to use ruthenium in the sensitizing dye, photoelectric conversion elements or photoelectrochemical cells can be provided at a low cost.

Further, the method of producing a dye according to the present invention makes it possible to suppress a by-product and resultantly to obtain the dye of the present invention with a favorable yield.

Other and further features and advantages of the invention will appear more fully from the following description, appropriately referring to the accompanying drawing.

BRIEF DESCRIPTION OF THE DRAWINGS

FIG. 1 is a cross-sectional view schematically showing an exemplary embodiment of the photoelectric conversion element according to the present invention.

MODE FOR CARRYING OUT THE INVENTION

1. Dye for Use in the First Embodiment of the Present Invention

Development of a dye used in dye-sensitized photoelectric conversion elements has been traditionally focused mainly on the donor site. There, attention was paid to a dye having a cyclic compound introduced to the adsorption site, and thorough investigations were made. As a result, it was found that there can be provided a photoelectrochemical cell having high conversion efficiency which is capable of absorbing up to a relatively long wavelength region in the solar spectrum, by the first embodiment of the present invention using a particular dye (dye compound), as a sensitizing dye, in which a cyclic structure formed from carbon atoms and nitrogen atoms has an acidic group linked to the nitrogen atom of the cyclic structure via a single bond or divalent linking group, and an exomethylene of the cyclic structure is substituted with one or more acidic groups. The present invention was made based on this finding.

The dye having a structure represented by any one of formula (1A) to (7A) for use in the first embodiment of the present invention will be explained. The dye acts as a sensitizing dye for the photoelectrochemical cell of the present invention.

In formula (1A), A represents a group of atoms necessary for forming a ring together with the carbon-nitrogen bond. A preferred example of the ring formed by A is a residue obtained by eliminating a carbonyl group or a thiocarbonyl group from a heterocyclic acidic nucleus. Examples of the heterocyclic acidic nucleus include those described in, for example, T. H. James, "The Theory of the Photographic Process, 4th edition", Macmillan publishing, 1977, p. 199. More preferred examples of the ring formed by A include residues obtained by eliminating a carbonyl group or a thiocarbonyl group from rhodanine, hydantoin, thiohydantoin, barbituric acid, thiobarbituric acid, pyrazolidinedione, pyrazolone, indanedione or isoxazolone; even more preferred examples include residues obtained by eliminating a carbonyl group or a thiocarbonyl group from rhodanine, hydantoin, thiohydantoin, barbituric acid or thiobarbituric acid; and a particularly preferred example is residues obtained by eliminating a carbonyl group or a thiocarbonyl group from rhodanine.

At least one of $Y^{1A}$ and $Y^{2A}$ represents an acidic group, and when both of them represent an acidic group, they may be the same as or different from each other. When only one of them is an acidic group, the other one represents an electron-withdrawing group. $Y^{3A}$ represents an acidic group.

In the present invention, the term "acidic group" means a group in which the pKa value of the most acidic hydrogen atom among the hydrogen atoms constituting the acidic group is 13 or less. Examples of the acidic group include a carboxylic acid group (a carboxyl group), a sulfonic acid group, a phosphonic acid group, a phenolic hydroxyl group, an alkylsulfonylcarbamoyl group and a phosphoric acid group. Preferred examples include a carboxylic acid group, a sulfonic acid group, a phosphonic acid group and a phenolic hydroxyl group; more preferred examples include a carboxylic acid group and a sulfonic acid group; and particularly preferred examples include a carboxylic acid group.

The electron-withdrawing group may be a substituent having the effects described below (-I effect and -M effect). In general, an electron-withdrawing group attenuates the electron density at a particular position of a molecule. The electron-withdrawing property or electron-donating property cannot be explained only by the difference in the electronegativity. That is, since an excitation effect, a mesomeric effect and the like work together in a compositive manner, the manifestation of the electron-withdrawing property or the electron-donating property can vary with the aromaticity, presence of a conjugated system, or a topological positional relationship. As an experimental rule for quantitatively evaluating and predicting these effects on the basis of the acid dissociation constant of para- and meta-substituted benzoic acid, there is known Hammett's rule. In the case of the excitation effect, the electron-withdrawing effect is referred to as the -I effect, while the electron-donating effect is referred to as the +I effect, and an atom having higher electronegativity than carbon exhibits the -I effect. Furthermore, an anion exhibits the +I effect, while a cation exhibits the -I effect. In the case of the mesomeric effect, the electron-withdrawing effect is referred to as the -M effect, while the electron-donating effect is referred to as the +M effect. Examples of the electron-withdrawing group are shown below.

Excitation Effect
(-I effect)

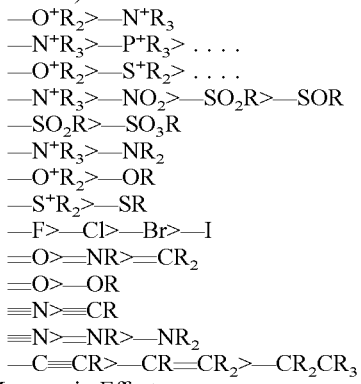

—O⁺R₂>—N⁺R₃
—N⁺R₃>—P⁺R₃> . . . .
—O⁺R₂>—S⁺R₂> . . . .
—N⁺R₃>—NO₂>—SO₂R>—SOR
—SO₂R>—SO₃R
—N⁺R₃>—NR₂
—O⁺R₂>—OR
—S⁺R₂>—SR
—F>—Cl>—Br>—I
=O>=NR>=CR₂
=O>—OR
≡N>=CR
≡N>=NR>—NR₂
—C≡CR>—CR=CR₂>—CR₂CR₃

Mesomeric Effect
(-M effect)

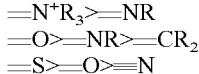

=N⁺R₃>=NR
=O>=NR>=CR₂
=S>=O>=N

Preferred examples of the electron-withdrawing group include a cyano group, a nitro group, a sulfonyl group, a sulfoxy group, an acyl group, an alkoxycarbonyl group and a carbamoyl group; more preferred examples include a cyano group, a nitro group and a sulfonyl group; and a particularly preferred example is a cyano group.

In formulae (1A) to (7A) of the dye of the first embodiment of the present invention, it is preferable that one of $Y^{1A}$ and $Y^{2A}$ is a carboxylic acid group and the other is a cyano group. In the dye having this structure, acidity of the carboxylic acid group that is an acid group can be increased by an electron-withdrawing effect due to a cyano group. The photoelectric conversion element containing semiconductor fine particles sensitized with the dye can exhibit high photoelectric conversion efficiency.

In formula (1A), D represents a group to give a dye. The term "group to give a dye" means a group of atoms necessary for constituting a dye as a whole, together with the structure other than Y in the formula (1A). Examples of the dye formed by Y include polymethine dyes such as merocyanine, hemicyanine, styryl, oxonol and cyanine; diarylmethines including acridine, xanthene, and thioxanthene; triarylmethine, coumarin, indoaniline, indophenol, diazine, oxazine, thiazine, diketopyrrolopyrrole, indigo, anthraquinone, perylene, quinacridone, naphthoquinone, bipyridyl, terpyridyl, tetrapyridyl, and phenanthroline. Preferred examples include polymethine dyes and polyaryl dyes.

n represents an integer of 1 or greater, and is preferably 1 to 5, more preferably 1 to 3, and particularly preferably 1.

In formulae (1A) to (7A), L represents a single bond or a divalent linking group, and L is preferably a single bond or a divalent linking group. The divalent linking group is not particularly limited, but is preferably a divalent linking group having 0 to 30 carbon atoms, for example, an alkylene group and an arylene group. The divalent linking group may also contain a heteroatom(s). Preferred examples of L include methylene, ethylene, propylene, phenylene and ethenylene.

$R^A$, $R^{1A}$, $R^{2A}$ and $R^{3A}$ in the formulas (2A) to (7A) each independently represent a hydrogen atom, an aliphatic group, an aromatic group, or a heterocyclic group linked through a carbon atom. Preferred examples include an aliphatic group and an aromatic group, and a particularly preferred example is an aliphatic group. $R^{3A}$ is preferably a hydrogen atom.

Examples of the aliphatic group include an alkyl group (e.g. methyl, ethyl, n-propyl, isopropyl, t-butyl, n-octyl, eicosyl, 2-chloroethyl, 2-cyanoethyl, or 2-ethylhexyl), and a cycloalkyl group (preferably a substituted or unsubstituted cycloalkyl group having 3 to 30 carbon atoms, e.g. cyclohexyl, cyclopentyl, or 4-n-dodecylcyclohexyl). Preferred examples of the aliphatic group include an alkyl group and an alkenyl group, each having 1 to 30 carbon atoms (preferably having 1 to 25 carbon atoms, more preferably having 1 to 20 carbon atoms), and the aliphatic group may be substituted.

Examples of the aromatic group include a benzene ring, a furan ring, a pyrrole ring, a pyridine ring, a thiophene ring, an imidazole ring, an oxazole ring, a thiazole ring, a pyrazole ring, an isoxazole ring, an isothiazole ring, a pyrimidine ring, a pyrazine ring, or rings formed by condensation of the foregoing rings. These groups may be substituted. Preferred examples include a benzene ring, a pyrrole ring, a pyridine ring and a thiophene ring; more preferred examples include a benzene ring and a thiophene ring; and a particularly preferred example is a benzene ring. These groups may be substituted.

The heterocyclic group linked through a carbon atom is preferably a 3- to 6-membered substituted or unsubstituted heterocyclic group, more preferably a 5- or 6-membered unsubstituted heterocyclic group, and particularly preferably a 6-membered heterocyclic group (for example, piperidine or morpholine). These groups may be substituted.

In the formulae (2A) to (7A), LL represents at least one divalent linking group selected from the group consisting of an alkenylene group, an alkynylene group and an arylene group. LL may be a combination of these groups, and may also be substituted.

Preferred examples the alkenylene group include ethenylene. Preferred examples the alkynylene group include ethynylene. Preferred examples of the arylene group include a benzene ring, a furan ring, and a pyrrole ring, or divalent rings formed by condensation of the foregoing rings. Examples of LL include those groups represented by any one of the formulas shown below. Among the formulas shown below, L-a, L-b, L-c or L-e is preferable; L-a, L-b or L-e is more preferable; and L-b is particularly preferable.

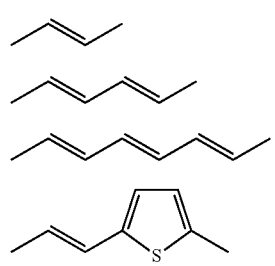

L-a

L-b

L-c

L-d

-continued

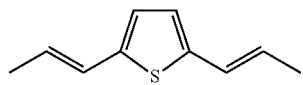
L-e

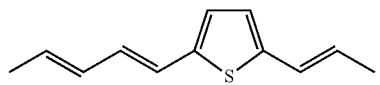
L-f

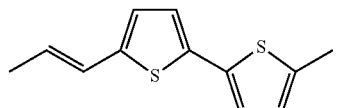
L-g

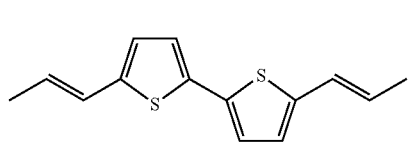
L-h

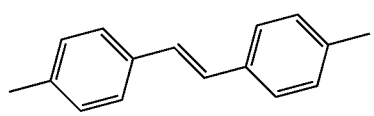
L-i

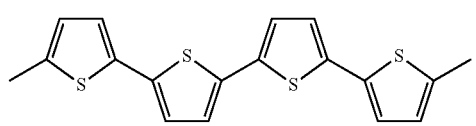
L-j

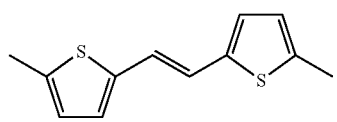
L-k

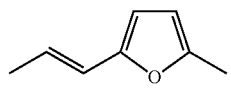
L-l

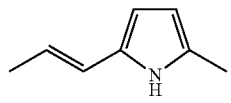
L-m

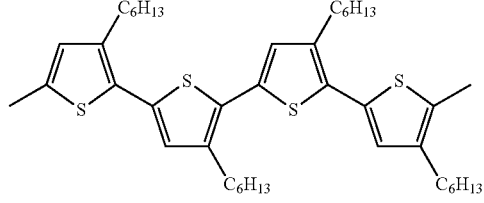
L-n

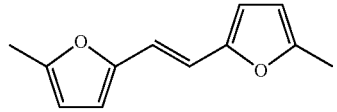
L-o

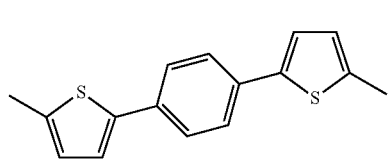
L-p

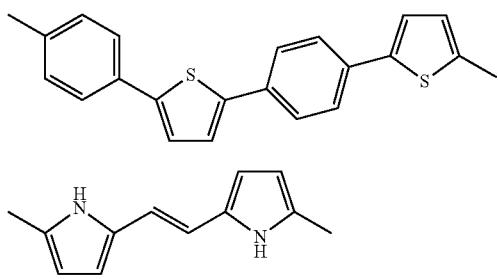

L-q

L-r

In the formulas (6A) and (7A), B represents a group of atoms necessary for forming a ring together with the two carbon atoms and the nitrogen atom on the benzene ring.

The acidic group (for example, a carboxylic acid group, a phosphonic acid group or a sulfonic acid group) in formulas (1A) to (7A) may be dissociated and have a counter cation. The counter cation is not particularly limited, and may be any of an organic cation and an inorganic cation. Representative examples include an alkali metal ion (lithium, sodium, potassium, or the like), an alkaline earth metal ion (magnesium, calcium or the like), and cations of ammonium, alkylammonium (for example, diethylammonium, or tetrabutylammonium), pyridinium, alkylpyridinium (for example, methylpyridinium), guanidium and tetraalkylphosphonium.

(Optional Substituent)

According to the first embodiment of the present invention, the dye may have an appropriate substituent (hereinafter, referred to as substituent $W_A$). Specific examples of the substituent $W_A$ include: a halogen atom (e.g. a fluorine atom, a chlorine atom, a bromine atom, or an iodine atom); an alkyl group [which represents a substituted or unsubstituted linear, branched, or cyclic alkyl group, and which includes an alkyl group (preferably an alkyl group having 1 to 30 carbon atoms, e.g. a methyl group, an ethyl group, an n-propyl group, an isopropyl group, a t-butyl group, an n-octyl group, an eicosyl group, a 2-chloroethyl group, a 2-cyanoethyl group, or a 2-ethylhexyl group), a cycloalkyl group (preferably a substituted or unsubstituted cycloalkyl group having 3 to 30 carbon atoms, e.g. a cyclohexyl group, a cyclopentyl group, or a 4-n-dodecylcyclohexyl group), a bicycloalkyl group (preferably a substituted or unsubstituted bicycloalkyl group having 5 to 30 carbon atoms, i.e. a monovalent group obtained by removing one hydrogen atom from a bicycloalkane having 5 to 30 carbon atoms, e.g. a bicyclo[1.2.2]heptan-2-yl group or a bicyclo[2.2.2]octan-3-yl group), and a tricyclo or higher structure having three or more ring structures; and an alkyl group in substituents described below (e.g. an alkyl group in an alkylthio group) represents such an alkyl group of the above concept]; an alkenyl group [which represents a substituted or unsubstituted linear, branched, or cyclic alkenyl group, and which includes an alkenyl group (preferably a substituted or unsubstituted alkenyl group having 2 to 30 carbon atoms, e.g. a vinyl group, an allyl group, a prenyl group, a geranyl group, or an oleyl group), a cycloalkenyl group (preferably a substituted or unsubstituted cycloalkenyl group having 3 to 30 carbon atoms, i.e. a monovalent group obtained by removing one hydrogen atom from a cycloalkene having 3 to 30 carbon atoms, e.g. a 2-cyclopenten-1-yl group or a 2-cyclohexen-1-yl group), and a bicycloalkenyl group (which represents a substituted or unsubstituted bicycloalkenyl group, preferably a substituted or unsubstituted bicycloalkenyl group having 5 to 30 carbon atoms, i.e. a monovalent group obtained by removing one hydrogen atom from a bicycloalkene having one double bond, e.g. a bicyclo [2.2.1]hept-2-en-1-yl group or a bicyclo[2.2.2]oct-2-en-4-yl group)]; an alkynyl group (preferably a substituted or unsubstituted alkynyl group having 2 to 30 carbon atoms, e.g. an ethynyl group, a propargyl group, or a trimethylsilylethynyl group); an aryl group (preferably a substituted or unsubstituted aryl group having 6 to 30 carbon atoms, e.g. a phenyl group, a p-tolyl group, a naphthyl group, an m-chlorophenyl group, or an o-hexadecanoylaminophenyl group); an aromatic group (e.g. a benzene ring, a furan ring, a pyrrole ring, a pyridine ring, a thiophene ring, an imidazole ring, an oxazole ring, a thiazole ring, a pyrazole ring, an isoxazole ring, an isothiazole ring, a pyrimidine ring, a pyrazine ring, or rings formed by condensation of the foregoing rings); a heterocyclic group (preferably a monovalent group obtained by removing one hydrogen atom from a substituted or unsubstituted 5- or 6-membered aromatic or nonaromatic heterocyclic compound; more preferably a 5- or 6-membered aromatic heterocyclic group having 3 to 30 carbon atoms, e.g. a 2-furyl group, a 2-thienyl group, a 2-pyrimidinyl group, a 2-benzothiazolyl group); a cyano group; a hydroxyl group; a nitro group; a carboxyl group; an alkoxy group (preferably a substituted or unsubstituted alkoxy group having 1 to 30 carbon atoms, e.g. a methoxy group, an ethoxy group, an isopropoxy group, a t-butoxy group, an n-octyloxy group, or a 2-methoxyethoxy group); an aryloxy group (preferably a substituted or unsubstituted aryloxy group having 6 to 30 carbon atoms, e.g. a phenoxy group, a 2-methylphenoxy group, a 4-t-butylphenoxy group, a 3-nitrophenoxy group, or a 2-tetradecanoylaminophenoxy group); a silyloxy group (preferably a silyloxy group having 3 to 20 carbon atoms, e.g. a trimethylsilyloxy group or a t-butyldimethylsilyloxy group); a heterocyclic oxy group (preferably a substituted or unsubstituted heterocyclic oxy group having 2 to 30 carbon atoms, e.g. a 1-phenyltetrazol-5-oxy group or a 2-tetrahydropyranyloxy group); an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, e.g. a formyloxy group, an acetyloxy group, a pivaloyloxy group, a stearoyloxy group, a benzoyloxy group, or a p-methoxyphenylcarbonyloxy group); a carbamoyloxy group (preferably a substituted or unsubstituted carbamoyloxy group having 1 to 30 carbon atoms, e.g. an N,N-dimethylcarbamoyloxy group, an N,N-diethylcarbamoyloxy group, a morpholinocarbonyloxy group, an N,N-di-n-octylaminocarbonyloxy group, or an N-n-octylcarbamoyloxy group); an alkoxycarbonyloxy group (preferably a substituted or unsubstituted alkoxycarbonyloxy group having 2 to 30 carbon atoms, e.g. a methoxycarbonyloxy group, an ethoxycarbonyloxy group, a t-butoxycarbonyloxy group, or an n-octylcarbonyloxy group); an aryloxycarbonyloxy group (preferably a substituted or unsubstituted aryloxycarbonyloxy group having 7 to 30 carbon atoms, e.g. a phenoxycarbonyloxy group, a p-methoxyphenoxycarbonyloxy group, or a p-n-hexadecyloxyphenoxycarbonyloxy group); an amino group (preferably an amino group, a substituted or unsubstituted alkylamino group having 1 to 30 carbon atoms, or a substituted or unsubstituted arylamino group having 6 to 30 carbon atoms, e.g. an amino group, a methylamino group, a dimethylamino group, an anilino group, an N-methyl-anilino group, or a diphenylamino group); an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, e.g. a formylamino group, an acetylamino group, a pivaloylamino group, a lauroylamino group, a benzoylamino group, or a 3,4,5-tri-n-octyloxyphenylcarbonylamino group); an aminocarbonylamino group (preferably a substituted or unsubstituted aminocarbonylamino group having 1 to 30 carbon atoms, e.g. a carbamoylamino group, an N,N-dimethylaminocarbonylamino group, an N,N-diethylaminocarbonylamino group, or a morpholinocarbonylamino group); an alkoxycarbonylamino group (preferably a substituted or unsubstituted alkoxycarbonylamino group having 2 to 30 carbon atoms, e.g. a methoxycarbonylamino group, an ethoxycarbonylamino group, a t-butoxycarbonylamino group, an n-octadecyloxycarbonylamino group, or an N-methyl-methoxycarbonylamino group); an aryloxycarbonylamino group (preferably a substituted or unsubstituted aryloxycarbonylamino group having 7 to 30 carbon atoms, e.g. a phenoxycarbonylamino group, a p-chlorophenoxycarbonylamino group, or an m-n-octyloxyphenoxycarbonylamino group); a sulfamoylamino group (preferably a substituted or unsubstituted sulfamoylamino group having 0 to 30 carbon atoms, e.g. a sulfamoylamino group, an N,N-dimethylaminosulfonylamino group, or an N-n-octylaminosulfonylamino group); an alkyl- or aryl-sulfonylamino group (preferably a substituted or unsubstituted alkylsulfonylamino group having 1 to 30 carbon atoms, or a substituted or unsubstituted arylsulfonylamino group having 6 to 30 carbon atoms, e.g. a methylsulfonylamino group, a butylsulfonylamino group, a phenylsulfonylamino group, a 2,3,5-trichlorophenylsulfonylamino group, or a p-methylphenylsulfonylamino group); a mercapto group; an alkylthio group (preferably a substituted or unsubstituted alkylthio group having 1 to 30 carbon atoms, e.g. a methylthio group, an ethylthio group, or an n-hexadecylthio group); an arylthio group (preferably a substituted or unsubstituted arylthio group having 6 to 30 carbon atoms, e.g. a phenylthio group, a p-chlorophenylthio group, or an m-methoxyphenylthio group); a heterocyclic thio group (preferably a substituted or unsubstituted heterocyclic thio group having 2 to 30 carbon atoms, e.g. a 2-benzothiazolylthio group or a 1-phenyltetrazol-5-ylthio group); a sulfamoyl group (preferably a substituted or unsubstituted sulfamoyl group having 0 to 30 carbon atoms, e.g. an N-ethylsulfamoyl group, an N-(3-dodecyloxypropyl)sulfamoyl group, an N,N-dimethylsulfamoyl group, an N-acetylsulfamoyl group, an N-benzoylsulfamoyl group, or an N—(N'-phenylcarbamoyl)sulfamoyl group); a sulfo group; an alkyl- or aryl-sulfinyl group (preferably a substituted or unsubstituted alkylsulfinyl group having 1 to 30 carbon atoms, or a substituted or unsubstituted arylsulfinyl group having 6 to 30 carbon atoms, e.g. a methylsulfinyl group, an ethylsulfinyl group, a phenylsulfinyl group, or a p-methylphenylsulfinyl group); an alkyl- or aryl-sulfonyl group (preferably a substituted or unsubstituted alkylsulfonyl group having 1 to 30 carbon atoms, or a substituted or unsubstituted arylsulfonyl group having 6 to 30 carbon atoms, e.g. a methylsulfonyl group, an ethylsulfonyl group, a phenylsulfonyl group, or a p-methylphenylsulfonyl group); an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms, which is bonded to said carbonyl group through a carbon atom, e.g. an acetyl group, a pivaloyl group, a 2-chloroacetyl group, a stearoyl group, a benzoyl group, a p-n-octyloxyphenylcarbonyl group, a 2-pyridylcarbonyl group, or a 2-furylcarbonyl group); an aryloxycarbonyl group (preferably a substituted or unsubstituted aryloxycarbonyl group having 7 to 30 carbon atoms, e.g. a phenoxycarbonyl group, an o-chlorophenoxycarbonyl group, an m-nitrophenoxycarbonyl group, or a p-t-butylphenoxycarbonyl group); an alkoxycarbonyl group (preferably a substituted or unsubstituted alkoxycarbonyl group having 2 to 30 carbon atoms, e.g. a methoxycarbonyl group, an ethoxycarbonyl group, a t-butoxycarbonyl group, or an n-octadecyloxycarbonyl group); a carbamoyl group (preferably a substituted or unsubstituted carbamoyl group having 1 to 30 carbon atoms, e.g. a carbamoyl group, an N-methylcarbamoyl group, an N,N-dimethylcarbamoyl group, an N,N-di-n-octylcarbamoyl group, or an N-(methylsulfonyl)carbamoyl group); an aryl- or heterocyclic-azo group (preferably a substituted or unsubstituted aryl azo group having 6 to 30 carbon atoms, or a substituted or unsubstituted heterocyclic azo group having 3 to 30 carbon atoms, e.g. a phenylazo group, a p-chlorophenylazo group, or a 5-ethylthio-1,3,4-thiadiazol-2-ylazo group); an imido group (preferably an N-succinimido group or an N-phthalimido group); a phosphino group (preferably a substituted or unsubstituted phosphino group having 2 to 30 carbon atoms, e.g. a dimethylphosphino group, a diphenylphosphino group, or a methylphenoxyphosphino group); a phosphinyl group (preferably a substituted or unsubstituted phosphinyl group having 2 to 30 carbon atoms, e.g. a phosphinyl group, a dioctyloxyphosphinyl group, or a diethoxyphosphinyl group); a phosphinyloxy group (preferably a substituted or unsubstituted phosphinyloxy group having 2 to 30 carbon atoms, e.g. a diphenoxyphosphinyloxy group or a dioctyloxyphosphinyloxy group); a phosphinylamino group (preferably a substituted or unsubstituted phosphinylamino group having 2 to 30 carbon atoms, e.g. a dimethoxyphosphinylamino group or a dimethylaminophosphinylamino group); and a silyl group (preferably a substituted or unsubstituted silyl group having 3 to 30 carbon atoms, e.g. a trimethylsilyl group, a t-butyldimethylsilyl group, or a phenyldimethylsilyl group).

The substituent may be further substituted. In that case, examples of the substituent include the substituent $W_A$ mentioned above.

Specific examples of the dye having at least one structure represented by any one of formulas (1A) to (7A) are shown in the followings, but the present invention is not limited thereto.

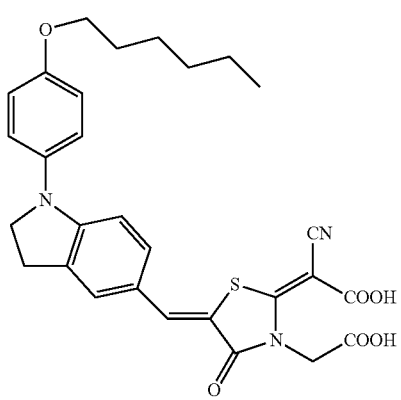

D-1

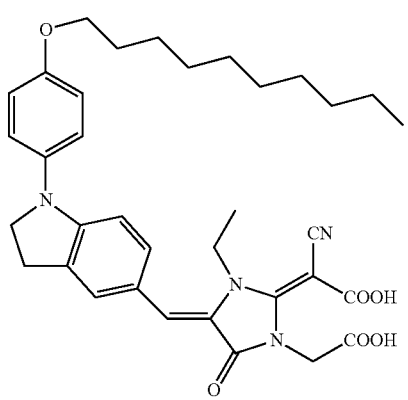

D-2

-continued
D-3
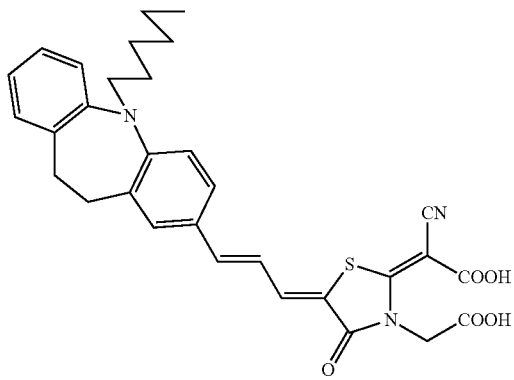
D-4
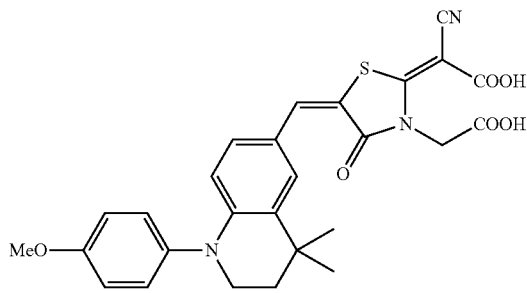
D-5
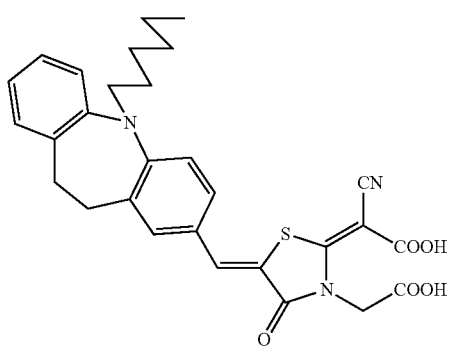
D-6
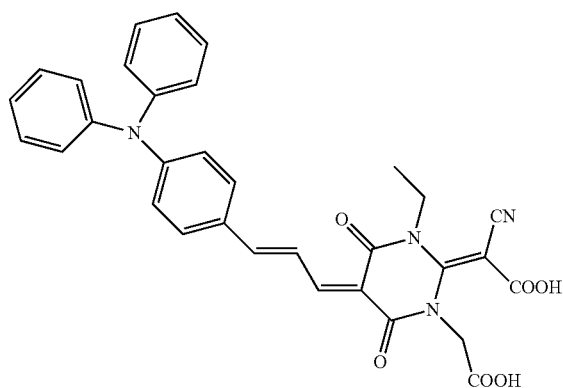
D-7
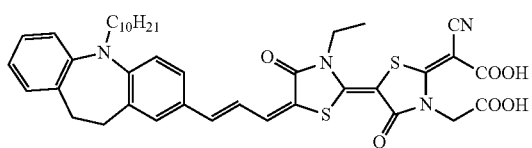
D-8
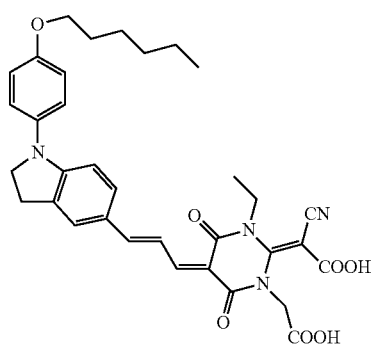
D-9
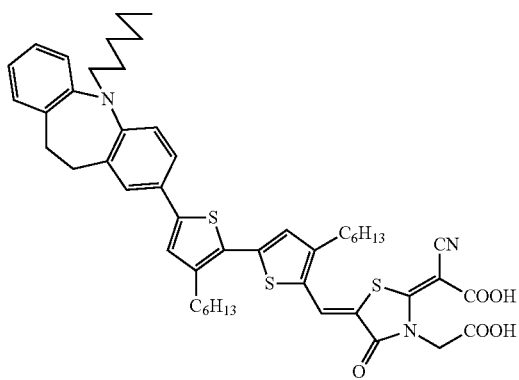
D-10
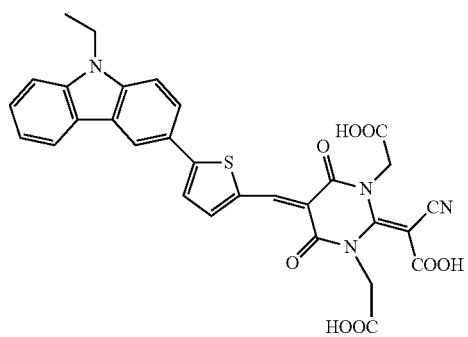

D-11
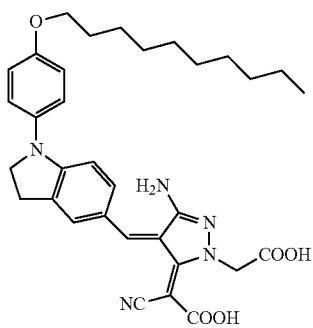
D-12
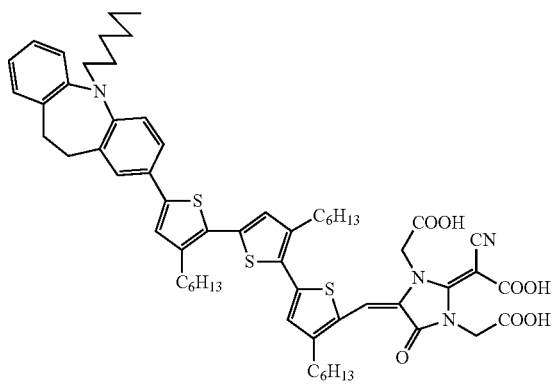
D-13
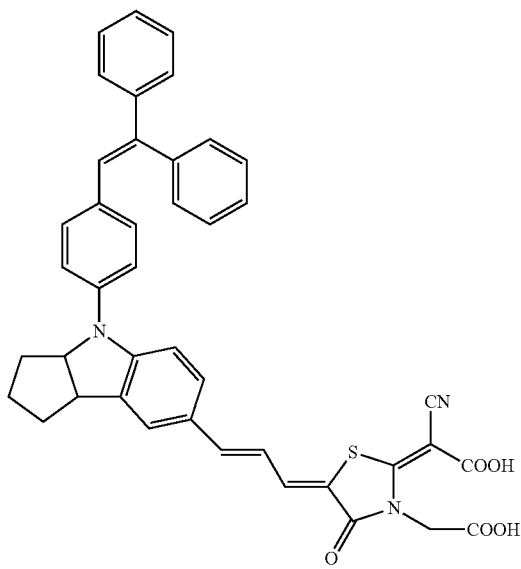
D-14
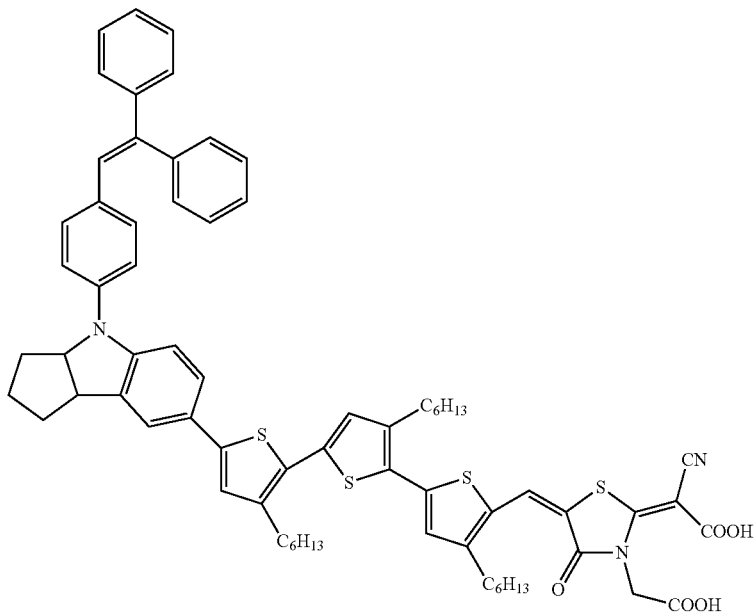

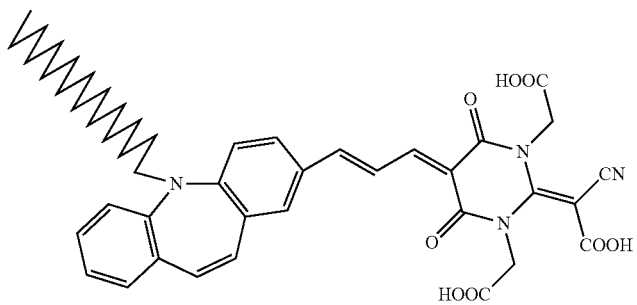

D-15

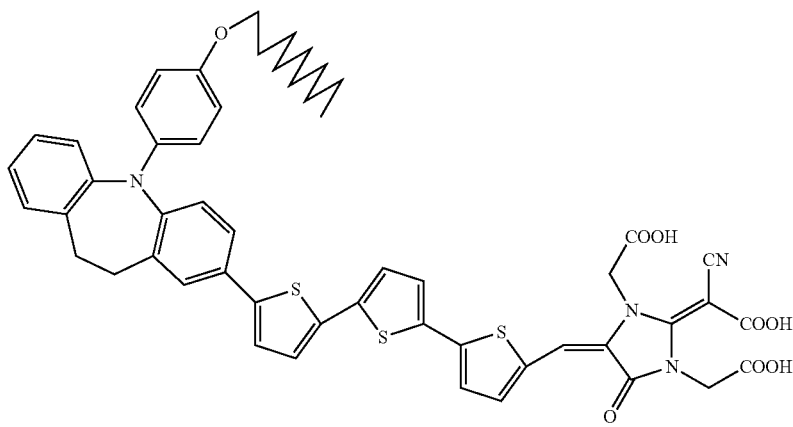

D-16

The dye (dye compound) having at least one structure represented by any one of formulae (1A) to (7A) can be synthesized by, for example, methods described or cited in F. M. Harmer, "Heterocyclic Compounds—Cyanine Dyes and Related Compounds", John Wiley & Sons, New York and London, 1994, or methods similar thereto.

The dye (dye compound) having at least one of the structures represented by any of the above-described formulae (1A) to (7A) is preferably produced according to a method which includes a process of obtaining a dye having the above-described formula (1A) by deprotecting of at least one of $Z^{1A}$, $Z^{2A}$ and $Z^{3A}$ that is a substituent represented by formula (9A) in the compound represented by formula (8A), in the presence of a transition metal catalyst. Deprotection of the compound represented by formula (8A), that is protected with a specific substituent group represented by formula (9A), in the presence of a transition metal catalyst makes it possible to suppress a by-product and resultantly to obtain the dye having the structure represented by formula (1A) in good yield, which is different from the case where deprotection is performed using other substituent group as a protective group in accordance with a conventional method.

Formula (8A)

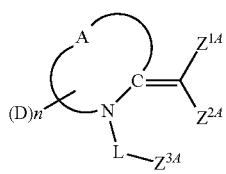

Formula (9A)

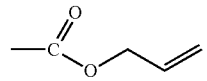

In formula (8A), A, D, n and L each have the same meaning as those in formula (1A), respectively; at lease one of $Z^{1A}$, $Z^{2A}$ and $Z^{3A}$ represents a substituent represented by formula (9A); and when each of $Z^{1A}$, $Z^{2A}$ and $Z^{3A}$ is not the substituent represented by formula (9A), each represent an acidic group, in which any one of $Z^{1A}$ and $Z^{2A}$ represents an electron-withdrawing group.

When $Z^{1A}$, $Z^{2A}$ or $Z^{3A}$ represents neither the substituent group represented by formula (9A) nor the electron-withdrawing group, the acidic group that is represented by the $Z^{1A}$, $Z^{2A}$ or $Z^{3A}$ is such acidic group that the pKa value of the most acidic hydrogen atom among the hydrogen atoms constituting the acidic group is 13 or less. Examples of the acidic group include a carboxylic acid group, a sulfonic acid group, a phosphonic acid group, a phenolic hydroxyl group, an alkylsulfonylcarbamoyl group and a phosphoric acid group. Preferred examples include a carboxylic acid group, a sulfonic acid group, a phosphonic acid group and a phenolic hydroxyl group; more preferred examples include a carboxylic acid group and a sulfonic acid group; and particularly preferred examples include a carboxylic acid group.

When $Z^{1A}$, $Z^{2A}$ or $Z^{3A}$ represents neither the substituent group represented by formula (9A) nor the acidic group, but represents an electron-withdrawing group, examples of the electron-withdrawing group include substituent groups having the −I effect and substituent groups having the −M effect as described above.

The electron-withdrawing group is preferably a cyano group, a nitro group, a sulfonyl group, a sulfoxy group, an acyl group, an alkoxycarbonyl group or a carbamoyl group; further preferably a cyano group, a nitro group or a sulfonyl group; and particularly preferably a cyano group.

Specific examples of the dye having at least one structure represented by formula (8A) are shown in the followings, but the present invention is not limited thereto.

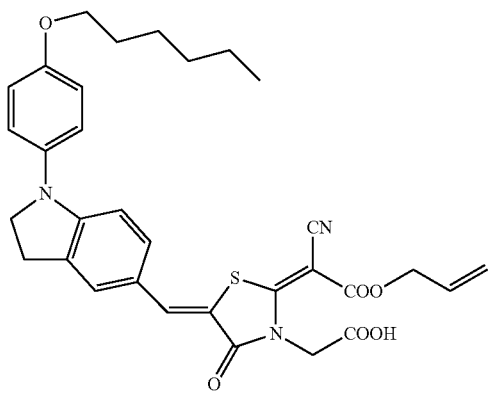

I-1

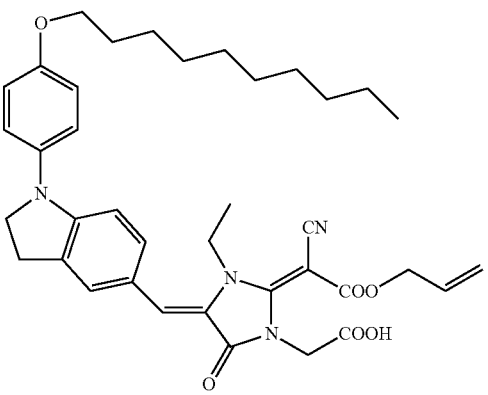

I-2

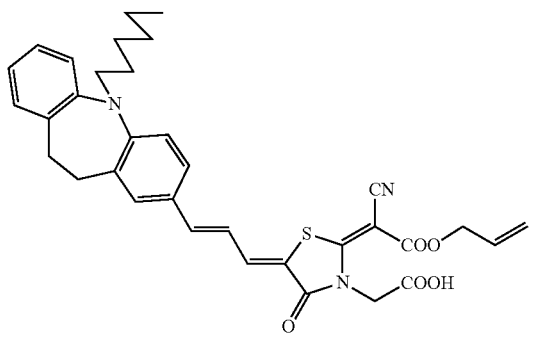

I-3

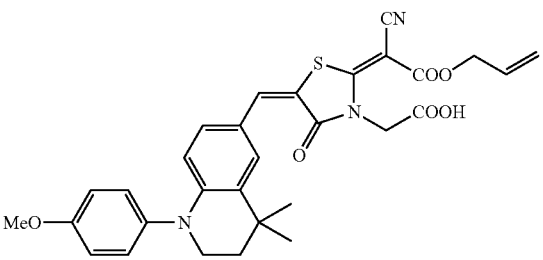

I-4

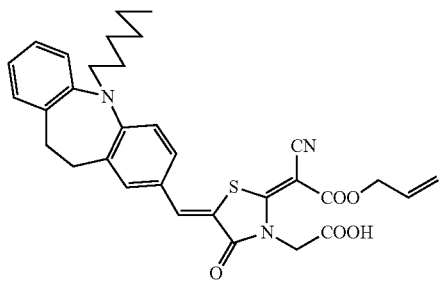

I-5

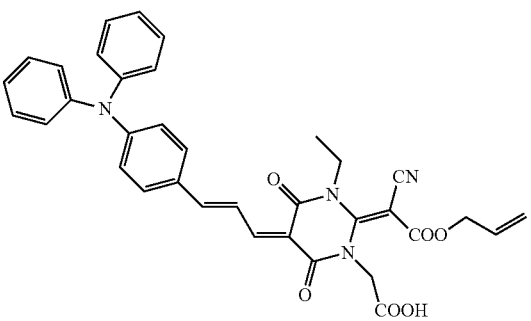

I-6

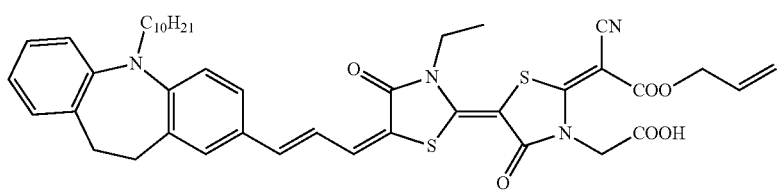

I-7

-continued
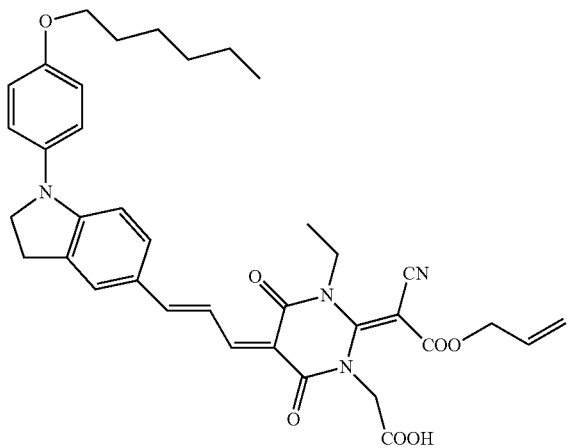
I-8
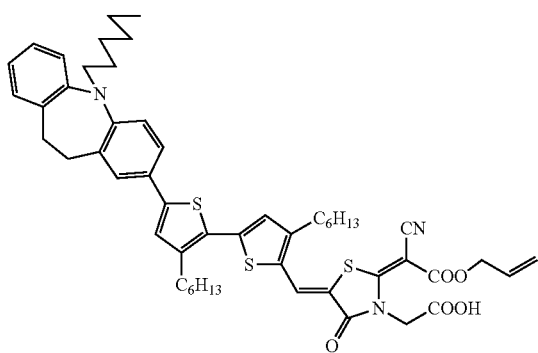
I-9
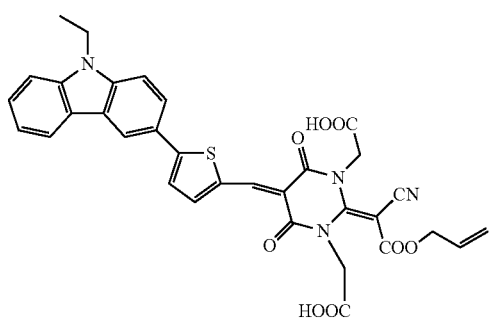
I-10
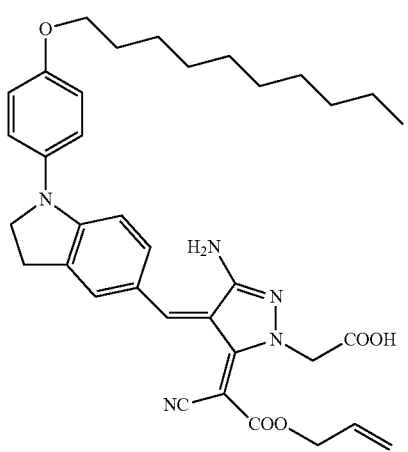
I-11

-continued
I-12
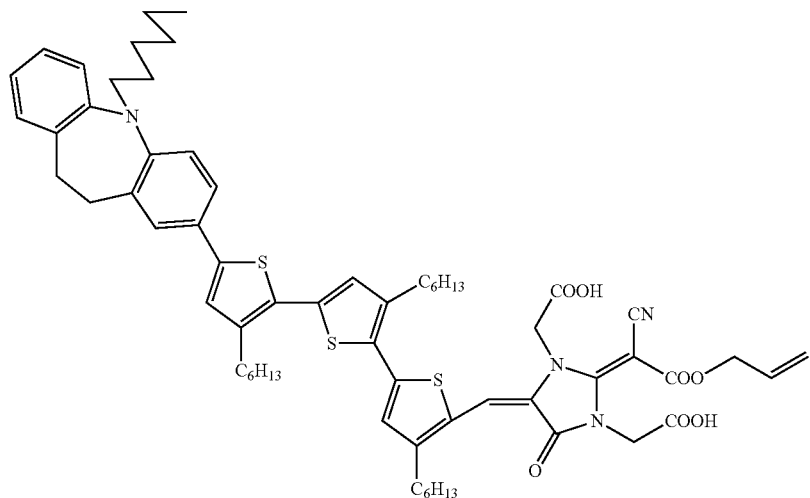
I-13
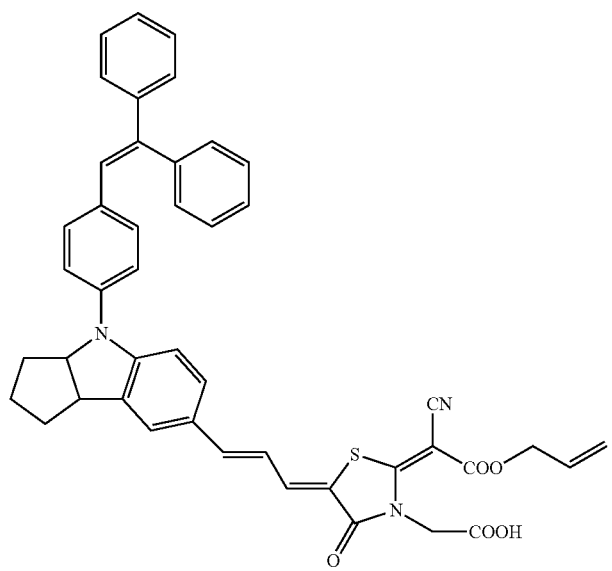
I-14
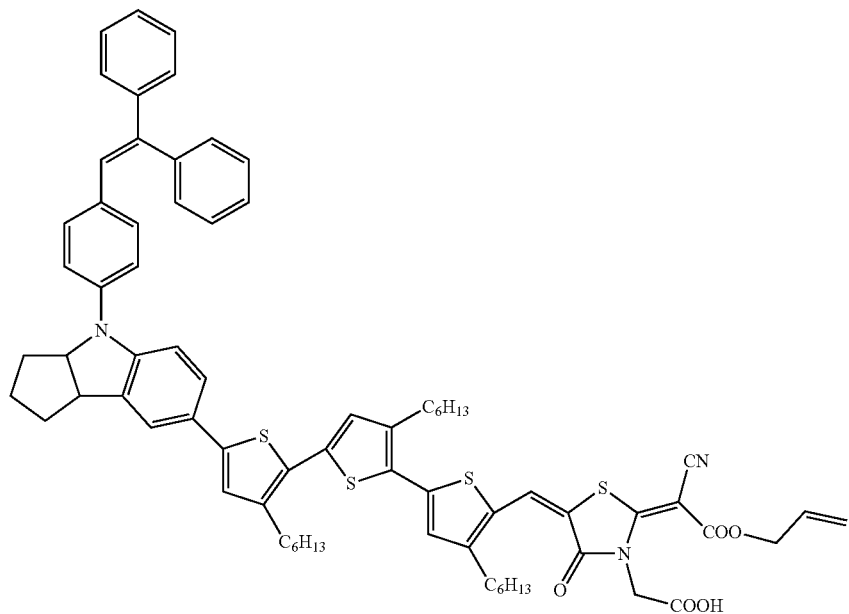

-continued

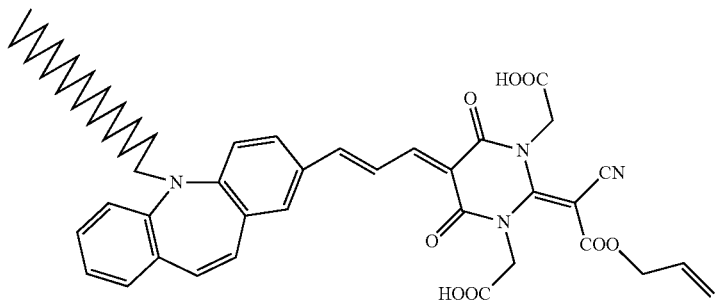

I-15

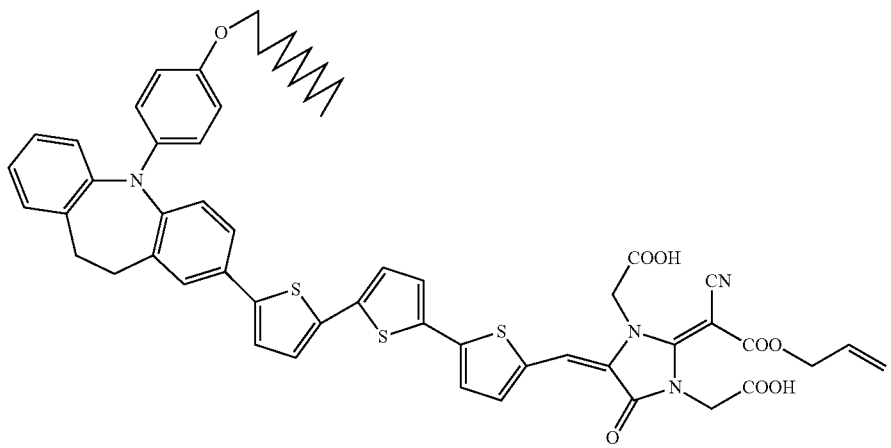

I-16

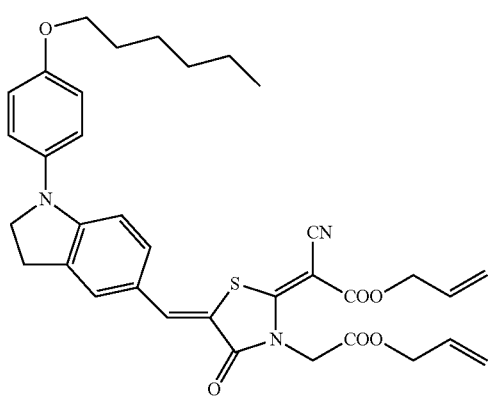

I-17

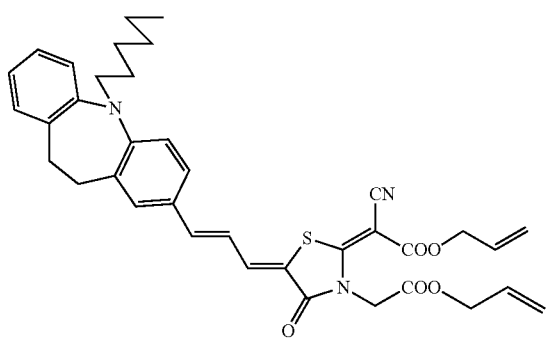

I-18

The compound represented by formula (8A) can be synthesized with reference to literatures. For example, it can be synthesized by methods described or cited in F. M. Harmer, "Heterocyclic Compounds—Cyanine Dyes and Related Compounds", John Wiley & Sons, New York and London, 1994, or methods similar thereto.

Among transition metals that are used for a method of producing the dye having the structure represented by formula (1A) from a compound represented by formula (8A) in the presence of the transition metal catalyst, nickel, palladium, molybdenum, and ruthenium are preferred, and palladium is more preferred.

A form of palladium is not particularly limited as long as it is a palladium compound. Examples of the palladium compound include tetravalent palladium compounds such as sodium hexachloropalladate (IV) tetrahydrate, and potassium hexachloropalladate (IV); divalent palladium compounds such as palladium (II) chloride, palladium (II) bromide, palladium (II) iodide, palladium (II) acetate, palladium acetylacetonate (II), dichlorobis (acetonitrile) palladium (II), dichlorobis (benzonitrile) palladium (II), and dichlorobis (triphenylphosphine) palladium (II); and zerovalent palladium compounds such as tetrakistriphenylphosphine palladium, bis(dibenzylidene) palladium, tris (dibenzylidene) dipalladium (0), and tris (dibenzylidene) dipalladium chloroform complex.

A use amount of the above-described palladium compound is not particularly limited. The use amount thereof is generally from 0.00001 to 0.1 mole times, and preferably from 0.0001 to 0.05 mole times as much as the compound represented by formula (8A).

In this production method, generally a dye having the structure represented by the above-described formula (1A) can be produced in good yield in the case where a tertiary phosphorus compound is used as a ligand.

The tertiary phosphorus compound is not particularly limited. Examples of the tertiary phosphorus compound include triphenylphosphine, triorthtolylphosphine, diphenylphosphinoferrocene, tri n-butylphosphine, triisobutylphosphine, tri sec-butylphosphine, tri tert-butylphosphine, 1,1'-bis(di-t-butylphosphino)ferrocene, 1,3-bis (di-t-butylphosphino) propane, 1,4-bis(di-t-butylphosphino) butane, and 1,5-bis(di-t-butylphosphino) pentane. In addition, the tertiary phosphorus compound may be a form in which the tertiary phosphorus compound has already coordinated to a metal catalyst, namely a metal complex.

A use amount of the tertiary phosphorus compound is generally from 0.01 to 20 mole times, and preferably from 0.5 to 10.0 mole times as much as one palladium atom of the palladium compound.

In this reaction, a base is used in order to neutralize an acid that is generated as a by-product. As the base, any of inorganic bases and organic bases may be used.

Examples of the inorganic bases include: carbonates such as cesium carbonate, potassium carbonate, sodium carbonate, and lithium carbonate; acetates such as potassium acetate, sodium acetate, and lithium acetate; hydrogen carbonates such as potassium hydrogen carbonate, sodium hydrogen carbonate, and lithium hydrogen carbonate; sulfates such as potassium sulfate, sodium sulfate, and lithium sulfate; hydrogen sulfates such as potassium hydrogen sulfate, sodium hydrogen sulfate, and lithium hydrogen sulfate; phosphates such as potassium phosphate, sodium phosphate, and lithium phosphate; and tert-butoxide salts such as potassium tert-butoxide, sodium tert-butoxide, and lithium tert-butoxide.

As the organic bases, tertiary amines are ordinarily used. Examples of the organic bases include morpholine, triethylamine, tributylamine, trihexylamine, triisopropylamine, diisopropylethylamine, N-methylmorpholine, N-ethylmorpholine, tricyclohexylamine, and pyridine.

A preferable base is inorganic bases, and more preferably tert-butoxide salts. A use amount of the base is not particularly limited, as long as the amount thereof is 4.0 or more mole times as much as compound (3), since a theoretical amount thereof is 4.0 mole times as much as the compound (3). The amount thereof is preferably from 4.0 to 40.0 mole times, and more preferably from 4.0 to 20.0 mole times.

Examples of a solvent used for the reaction include: hydrocarbon type solvents such as benzene, toluene, n-hexane, and cyclohexane; ether type solvents such as diethyl ether, tetrahydrofurane (THF), 1,4-dioxane, tert-butylmethyl ether (MTBE), dimethoxyethane, and ethyleneglycol dimethylether; halogen type solvents such as methylene chloride, chloroform, 1,1,1-trichloroethane, and chlorobenzene; amide type solvents such as dimethylformamide (DMF), and N-methylpyrrolidone (NMP); sulfoxide type solvents such as dimethylsulfoxide (DMSO); phosphoramide type solvents such as hexamethylphosphoramide (HMPA), and hexamethylphosphoroustriamide (HMPT). Among these solvents, hydrocarbon type solvents and ether type solvents are preferred. Further, hydrocarbon type solvents are more preferable. In addition, these solvents are used solely or in combination of two kinds or more.

This reaction is preferably performed under the inert gas atmosphere such as nitrogen, helium, or argon. Herein, the reaction may be performed under ordinary pressure, or increased pressure.

The addition order of these individual compounds is not particularly limited. Accordingly, each of these compounds may be added to a reactor in an arbitrary order. Further, in the case of using a tertiary phosphorous compound, a palladium compound and the tertiary phosphorous compound are mixed in advance, and then other compounds may be added in an arbitrary order.

The reaction temperature, though depends on the kind of the base and the solvent used for the reaction, is ordinarily from 20° C. to 250° C., and preferably from 20° C. to 180° C. The reaction time, though depends on the reaction temperature and the use amount of a transition metal catalyst used for the reaction, is ordinarily from 30 minutes to 48 hours, and preferably from 1 to 24 hours.

Regarding the above Exemplified dye D-1, an example of the production method of the present invention is described with reference to the following scheme.

Firstly, allyl cyanoacetate in which a protective group is an allyl group is prepared as one of starting compounds. After that, Compound D-1-b can be obtained while the allyl group of the protective group is kept as it is. As shown in the following scheme, the Compound D-1-b is allowed to react with Compound D-1-e that is separately prepared. After that, the Exemplified dye D-1 can be obtained by deprotection in the presence of tetrakistriphenylphosphine palladium.

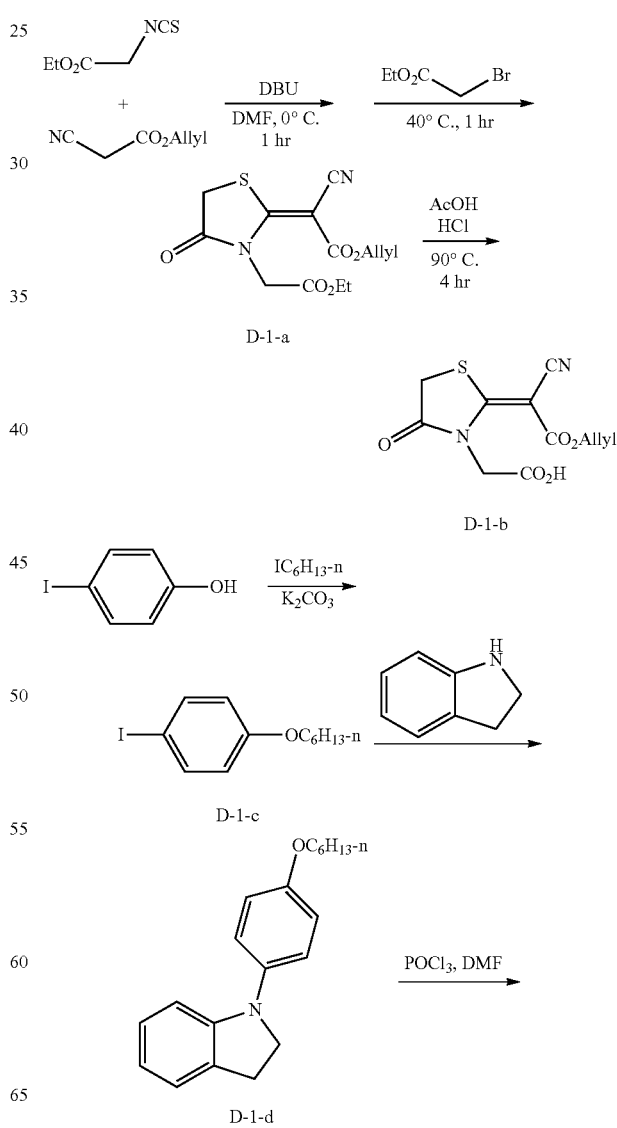

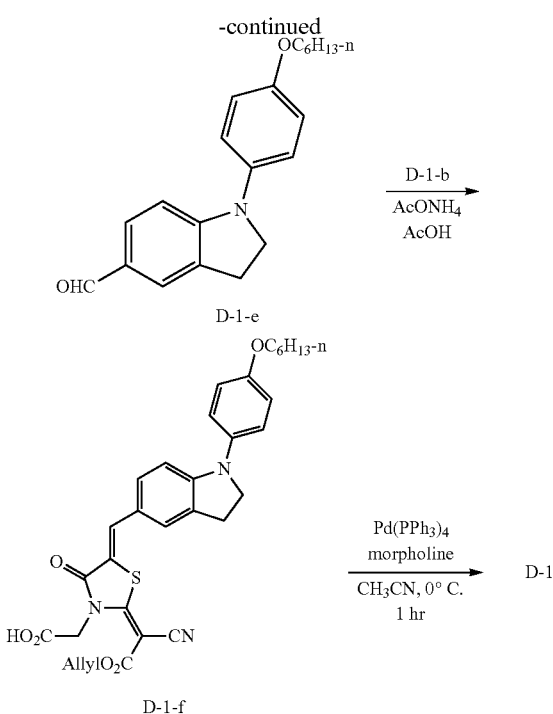

In the case where the dye of the first embodiment of the present invention is produced by the production method of the present invention, by-products are very few. As a result, a photoelectric conversion element containing semiconductor fine particles sensitized with the dye prepared by the production method of the present invention can exhibit high photoelectric conversion efficiency. Further, in the case where a dye is produced by the production method of the present invention, a tiny amount of the compound that is protected by a protective group represented by the above-described formula (8A) remains in the dye. The thus-produced dye compound has little or no adverse effect on photoelectric conversion efficiency, when a photoelectric conversion element is produced by using the dye. It is acceptable for the compound represented by the formula (8A) to be contained in an amount of 10 ppm or more. However, when the content of the compound is too much, there is a possibility of the adverse effect on photoelectric conversion efficiency. Accordingly, the content of the compound represented by the formula (8A) is preferably 50 ppm or less, and more preferably 20 ppm or less.

2. Dye for Use in the Second Embodiment of the Present Invention

As a result of intensive investigation, the present inventors have found that introduction of the following three design concepts makes it possible to obtain dyes (dye compounds) of the second embodiment of the present invention and the third embodiment of the present invention, each of which imparts high photoelectric conversion efficiency and also has excellent durability. Further, they have found that each of a photoelectric conversion element containing semiconductor particles sensitized with the dye and a photoelectrochemical cell equipped with the photoelectric conversion element as a component has a high photoelectric conversion efficiency.

<Design Concept 1>

In order to promote delocalization of cation radicals, one-electron oxidation state of the dye is stabilized by introducing a donor site having a widespread conjugation system.

<Design Concept 2>

It is presumed that high photoelectric conversion efficiency can be obtained by broadening an absorption region of the dye to improve electron-injection efficiency of from a dye to titanium oxide. Accordingly, either an acceptor structure that is highly effective in broadening of an absorption region, or an acceptor structure that is highly effective in electron-injection efficiency, or alternatively a combination of both such structures is used.

<Design Concept 3>

It is presumed that there is a possibility that only about ⅓ of a total surface area of titanium oxide is covered with a conventional dye, and consequently an adsorption amount can be increased by controlling dye alignment in the adsorption state. Accordingly, the present inventors have figured out to introduce into a dye a structure that actively promotes a J-association of the dye. Herein, the words "structure that actively promotes a J-association" means a molecular structure that aligns a group having hydrophobicity and high affinity for electrolyte, such as a long-chain alkyl group or an aryl group, at the position of the opposite side to an anchor site such as a COOH group, and in addition, a structure that promotes alignment of the Brickstone structure, the Staircase structure, or the Ladder structure by imparting high planarity to a dye molecule, and introducing therein such a substituent group that is capable of sterically protruding from a plane at a center of molecular conjugated plane, or alternatively by producing the same effects as those described above by distortion of a molecule or the like.

The dye of the second embodiment of the present invention has a structure represented by formula (1B).

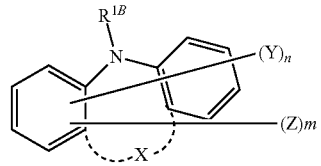

Formula (1B)

In formula (1B), X represents a group of non-metallic atoms necessary for forming a nitrogen-containing 7-membered ring by linking with the benzene rings. Here, the term "group of non-metallic atoms" means a group of atoms bonded by at least one kind of member selected from the group consisting of carbon, oxygen, nitrogen and sulfur atoms.

In formula (1B), Y represents a group to give a dye. Here, the term "group to give a dye" means a group of atoms necessary for constituting a dye as a whole, together with the structure other than Y in formula (1B). Examples of the dye formed by Y include polymethine dyes such as merocyanine, hemicyanine, styryl, oxonol and cyanine; diarylmethines such as acridine, xanthene, and thioxanthene; triarylmethine, coumarin, indoaniline, indophenol, diazine, oxazine, thiazine, diketopyrrolopyrrole, indigo, anthraquinone, perylene, quinacridone, naphthoquinone, bipyridyl, terpyridyl, tetrapyridyl, and phenanthroline. Preferred examples include polymethine dyes and polyaryl dyes. n represents an integer of 1 or more, preferably 1 to 2.

In formula (1B), Z represents a substituent, and examples thereof include an aliphatic group, an aromatic group, a heterocyclic group or the like. Specific examples of the substituent include an alkyl group, an alkoxy group, an alkylthio group, an aryl group, an aryloxy group, an arylthio group, and a heterocyclic ring. Preferred examples include an alkyl group (for example, methyl, ethyl, n-butyl, n-hexyl, isobutyl, sec-butyl, t-butyl, n-dodecyl, cyclohexyl, or benzyl), a substituted aryl group (for example, phenyl, tolyl, or naphthyl), and an alkoxy group (for example, methoxy, ethoxy, isopropoxy or butoxy).

m represents 0 or a positive integer. The substituents represented by Z may be the same as or different from each other, when m is 2 or more.

$R^{1B}$ represents a hydrogen atom, an aliphatic group, an aromatic group, or a heterocyclic group that is linked via a carbon atom. Specific preferred examples of $R^{1B}$ include a substituted or unsubstituted alkyl group having 1 to 20 carbon atoms (for example, methyl, ethyl, n-butyl, n-hexyl, isobutyl, sec-butyl, t-butyl, n-dodecyl, cyclohexyl or benzyl), a substituted or unsubstituted aryl group (for example, phenyl, tolyl or naphthyl), and a substituted or unsubstituted heterocyclic residue (for example, pyridyl, imidazolyl, furyl, thienyl, oxazolyl, thiazolyl, benzimidazolyl, or quinolyl). A more preferred example of $R^{1B}$ is a substituted or unsubstituted alkyl group having 1 to 20 carbon atoms (for example, methyl, ethyl, n-butyl, n-hexyl, isobutyl, sec-butyl, t-butyl, n-dodecyl, cyclohexyl, or benzyl).

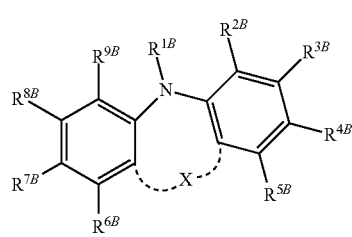

Formula (2B)

In the formula (2B), X represents a group of non-metallic atoms necessary for forming a nitrogen-containing 7-membered ring by linking with the benzene rings. Here, the term "group of non-metallic atoms" means a group of atoms bonded by at least one kind of atoms selected from the group consisting of carbon, oxygen, nitrogen and sulfur atoms. $R^{1B}$ represents a hydrogen atom, an aliphatic group, an aromatic group or a heterocyclic group that is linked via a carbon atom. Specific preferred examples of $R^{1B}$ include a substituted or unsubstituted alkyl group having 1 to 20 carbon atoms (for example, methyl, ethyl, n-butyl, n-hexyl, isobutyl, sec-butyl, t-butyl, n-dodecyl, cyclohexyl or benzyl), a substituted or unsubstituted aryl group (for example, phenyl, tolyl or naphthyl), and a substituted or unsubstituted heterocyclic residue (for example, pyridyl, imidazolyl, furyl, thienyl, oxazolyl, thiazolyl, benzimidazolyl, or quinolyl). More preferred examples of $R^{1B}$ include a substituted or unsubstituted alkyl group having 1 to 20 carbon atoms (for example, methyl, ethyl, n-butyl, n-hexyl, isobutyl, sec-butyl, t-butyl, n-dodecyl, cyclohexyl, or benzyl). $R^{2B}$ to $R^{9B}$ each independently represent a hydrogen atom or a substituent, and at least one substituent of $R^{2B}$ to $R^{9B}$ represents a group to give a dye represented by formula (3B). Specific examples of the substituent include an alkyl group, an alkoxy group, an alkylthio group, an aryl group, an aryloxy group, an arylthio group and a heterocyclic group. Preferred examples include an alkyl group (for example, methyl, ethyl, n-butyl, n-hexyl, isobutyl, sec-butyl, t-butyl, n-dodecyl, cyclohexyl, or benzyl), a substituted aryl group (for example, phenyl, tolyl or naphthyl), and an alkoxy group (for example, methoxy, ethoxy, isopropoxy, or butoxy).

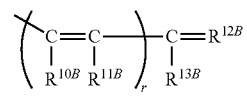

Formula (3B)

In formula (3B), $R^{12B}$ represents a group having at least one acidic group, or an acidic nucleus substituted with at least one acidic group.

Examples of the acidic nucleus include those described in, for example, T. H. James, "The Theory of the Photographic Process, 4th edition", Macmillan publishing, 1977, p. 199.

When $R^{12B}$ has at least one acidic group, it is preferable that $R^{12B}$ simultaneously has an electron-withdrawing group, and the electron-withdrawing group may be a substituent having the effects described below (–I effect and –M effect). When $R^{12B}$ has an acidic group and an electron-withdrawing group, the type or bonding position of the electron-withdrawing group is appropriately selected so as to exhibit an effect that the overlap of the molecular orbital in the excited state of the dye and the light-receiving electrode seems to increase.

In general, an electron-withdrawing group attenuates the electron density at a particular position of a molecule. The electron-withdrawing property or electron-donating property cannot be explained only by the difference in the electronegativity. That is, since an excitation effect, a mesomeric effect and the like work together in a compositive manner, the manifestation of the electron-withdrawing property or the electron-donating property can vary with the aromaticity, presence of a conjugated system, or a topological positional relationship. As an experimental rule for quantitatively evaluating and predicting these effects on the basis of the acid dissociation constant of para- and meta-substituted benzoic acid, there is known Hammett's rule. In the case of the excitation effect, the electron-withdrawing effect is referred to as the –I effect, while the electron-donating effect is referred to as the +I effect, and an atom having higher electronegativity than carbon exhibits the –I effect. Furthermore, an anion exhibits the +I effect, while a cation exhibits the –I effect. In the case of the mesomeric effect, the electron-withdrawing effect is referred to as the –M effect, while the electron-donating effect is referred to as the +M effect. Examples of the electron-withdrawing group are shown below.

Excitation Effect
(–I effect)

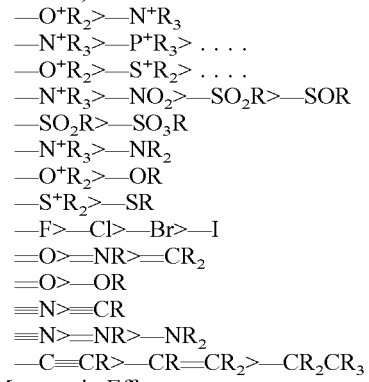

Mesomeric Effect
(–M effect)

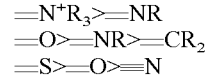

Preferred examples of the acidic nucleus include a rhodanine nucleus, hydantoin, thiohydantoin, barbituric acid, pyrazolidinedione, pyrazolone, and indanedione. These may contain two or more acidic nuclei linked together, with each acidic nucleus having been dehydrated and condensed at the carbonyl moiety. Preferred examples include rhodanine, hydantoin, thiohydantoin, barbituric acid and pyrazolidinedione, and rhodanine is particularly preferred among them.

The acidic group contained in $R^{12B}$ represents a proton-dissociative group having a pKa of 13 or lower. Specific preferred examples of the acidic group include a carboxylic acid, a sulfonic acid, a phosphoric acid and a phosphoric acid ester. A more preferred example of the acidic group is a carboxylic acid. The carbon-carbon double bond may be any of an E-form double bond and a Z-form double bond.

In formula (3B), $R^{10B}$, $R^{11B}$ and $R^{13B}$ each independently represent a hydrogen atom, an aliphatic group, an aromatic group or a heterocyclic group. r represents an integer of 0 or more. The carbon-carbon double bond in formula (3B) may be any of an E-form double bond and a Z-form double bond. $R^{10B}$, $R^{11B}$ and $R^{13B}$ each are preferably a hydrogen atom, an aliphatic group or an aromatic group; more preferably an aliphatic group or an aromatic group.

Formula (4B)

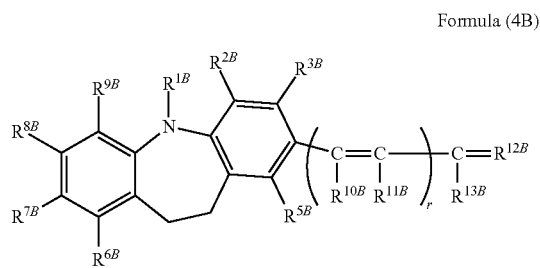

The dye represented by formula (4B) is a dye where X in formula (1B) represents an ethylene group, and a nitrogen-containing 7-membered ring structure has been formed thereby. Furthermore, one of the benzene rings substituted with a nitrogen atom has one group to give a dye at the para-position.

Formula (5B)

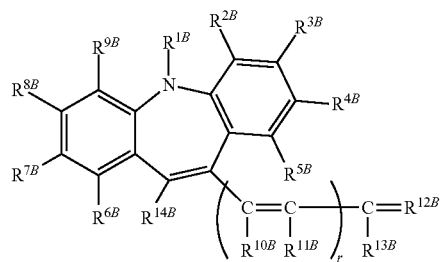

The dye represented by formula (5B) has a carbon-carbon double bond in the nitrogen-containing 7-membered ring, and has a group to give a dye on the nitrogen-containing 7-membered ring. In formula (5B), $R^{14B}$ represents a hydrogen atom, an alkyl group, an alkoxy group, an alkylthio group, an aryl group, an aryloxy group, an arylthio group, or a heterocyclic group. $R^{14B}$ is preferably an alkyl group (for example, methyl, ethyl, n-butyl, n-hexyl, isobutyl, sec-butyl, t-butyl, n-dodecyl, cyclohexyl or benzyl), a substituted aryl group (for example, phenyl, tolyl or naphthyl), or an alkoxy group (for example, methoxy, ethoxy, isopropoxy or butoxy).

Formula (6B)

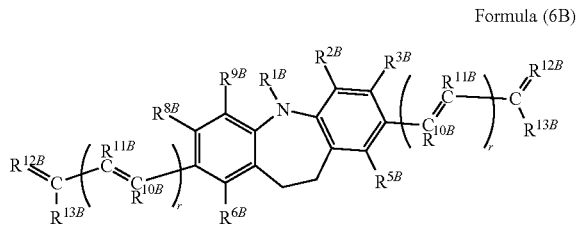

The dye represented by formula (6B) is a dye where X in formula (1B) represents an ethylene group, and a nitrogen-containing 7-membered ring structure has been formed thereby. Each of the two benzene rings substituted with a nitrogen atom has one group to give a dye at the para-position.

In formulas (3B) to (6B), $R^{12B}$ may be a group represented by formula (7B) or formula (8B).

Formula (7B)

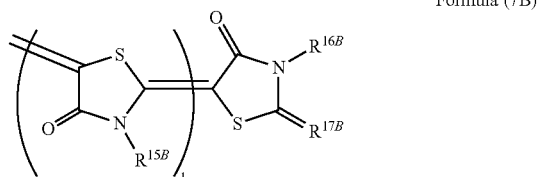

Formula (8B)

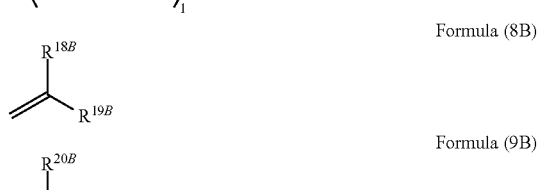

Formula (9B)

In formula (7), $R^{15B}$ and $R^{16B}$ each independently represent an aliphatic group, an aromatic group or a heterocyclic group (at least one functional group thereof may have an acidic group). l represents 0 or 1. The carbon-carbon double bond in formula (7) may be any of an E-form double bond and a Z-form double bond. $R^{17B}$ in formula (7) represents a sulfur atom or a group represented by formula (9).

When $R^{17B}$ represents a sulfur atom, at least one of $R^{15B}$ and $R^{16B}$ is preferably an aliphatic group, an aromatic group or a heterocyclic group, each having an acidic group, and $R^{15}$ and $R^{16}$ may be different from each other. Specific preferred examples of the acidic group include carboxylic acid, sulfonic acid, phosphoric acid, a phosphoric acid ester, and the like. A more preferred example of the acidic group is carboxylic acid. The carbon-carbon double bond in formula (7) may be any of an E-form double bond and a Z-form double bond.

In formula (9B), $R^{20B}$ and $R^{21B}$ each independently represents a cyano group or an acidic group, and $R^{20B}$ and $R^{21B}$ may be the same as or different from each other. Specific preferred examples of the acidic group include a carboxylic acid group, a sulfonic acid group, a phosphoric acid group, a phosphoric acid ester group, and the like. A more preferred example of the acidic group is a carboxylic acid group. The carbon-carbon double bond in formula (9B) may be any of an E-form double bond and a Z-form double bond.

In formula (8B), $R^{18B}$ and $R^{19B}$ each independently represent a cyano group or an acidic group, and $R^{18B}$ and $R^{19B}$ may be the same as or different from each other. Specific preferred examples of the acidic group include a carboxylic acid group, a sulfonic acid group, a phosphoric acid group, a phosphoric acid ester group, and the like. A more preferred example of the acidic group is a carboxylic acid group. The carbon-carbon double bond in formula (8B) may be any of an E-form double bond and a Z-form double bond.

The group represented by formula (7B) may be a group represented by formula (10B). Here, $R^{16B}$ represents an aliphatic group, an aromatic group or a heterocyclic group, each of which may have an acidic group.

Formula (10B)

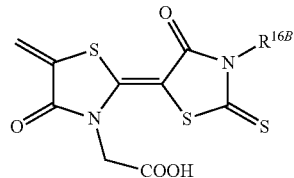

Furthermore, in formulas (3B) to (6B), $R^{12B}$ may be a group represented by formula (11B).

Formula (11B)

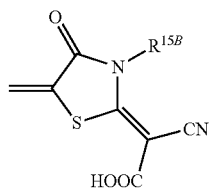

In formula (11B), $R^{15B}$ represents an aliphatic group, an aromatic group or a heterocyclic group (each of which may have an acidic group).

Furthermore, in formulas (3B) to (6B), $R^{12B}$ may be a group represented by formula (12B).

Formula (12B)

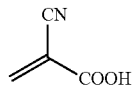

Specific examples of the dye (dye compound) used in the present invention are shown in the followings, but the present invention is not limited thereto.

A1

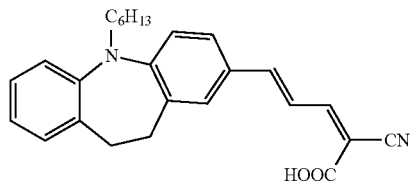

A2

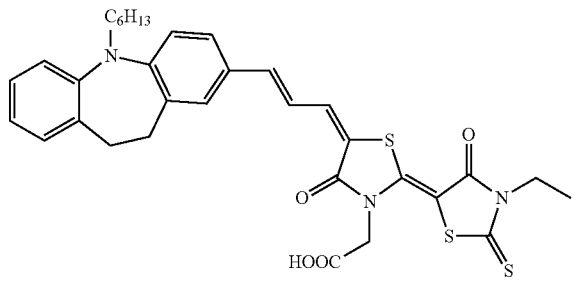

A3

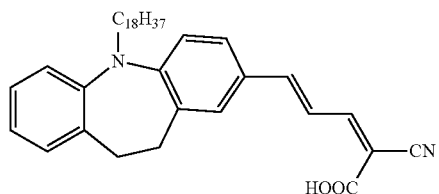

A4

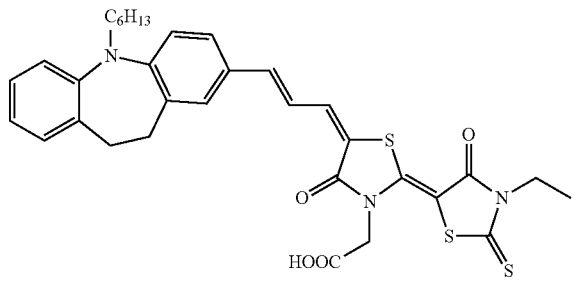

A5

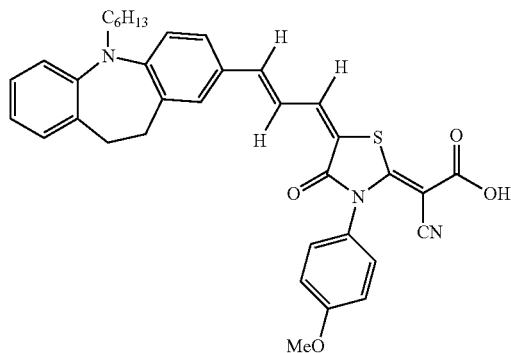

A6

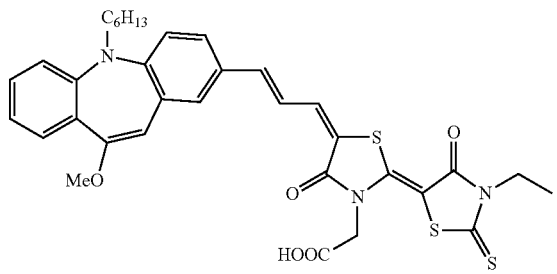

-continued
A7
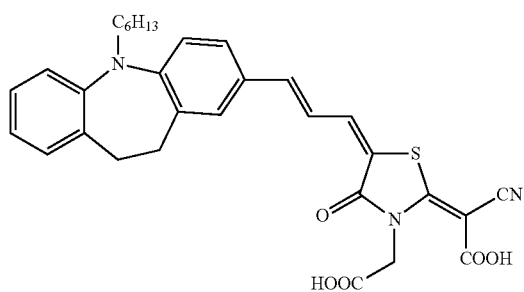
A8
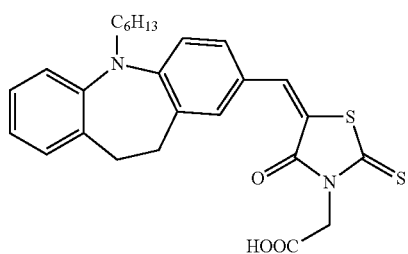
A9
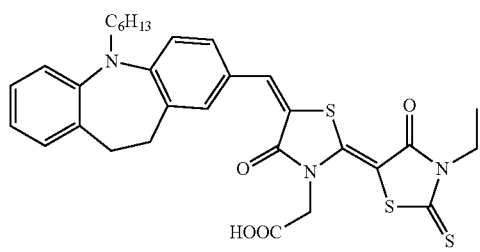
A10
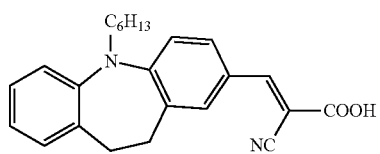
A11
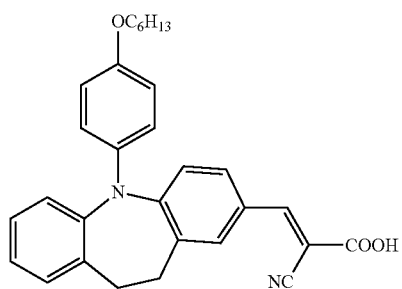
A12
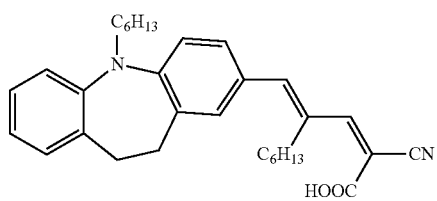
A13
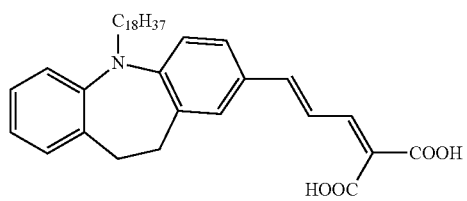
A14
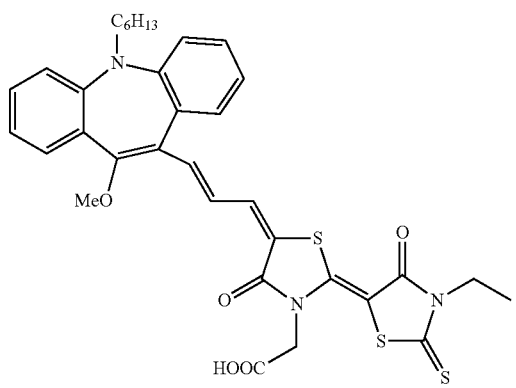
A15
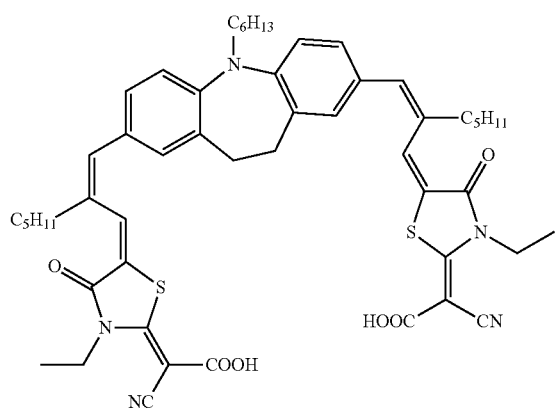
A16
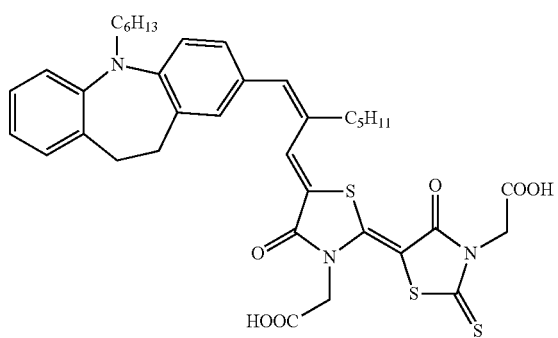

-continued
A17
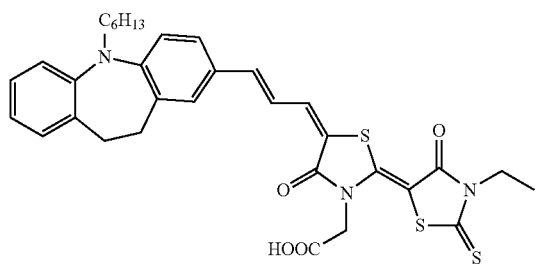
A18
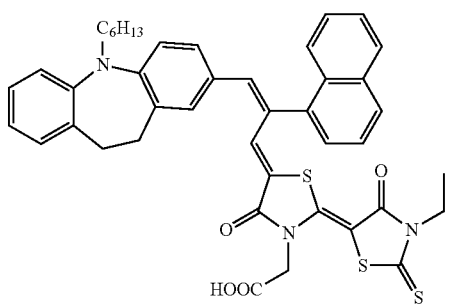
A19
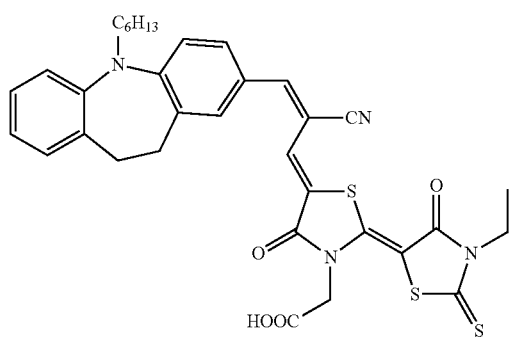
A20
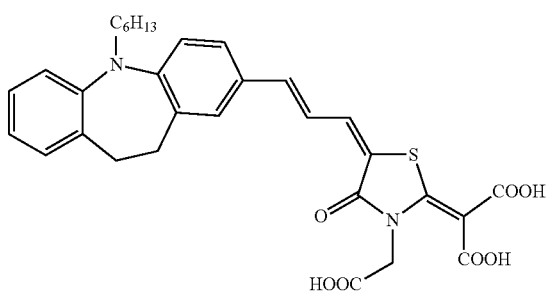
A21
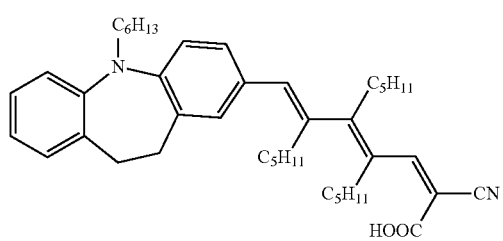
A22
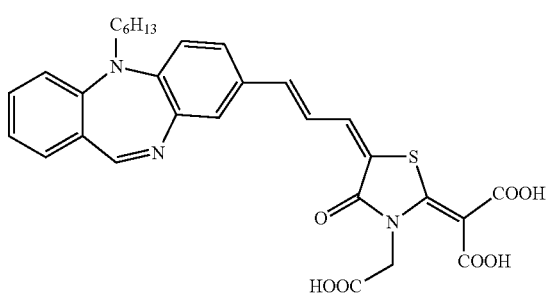
A23
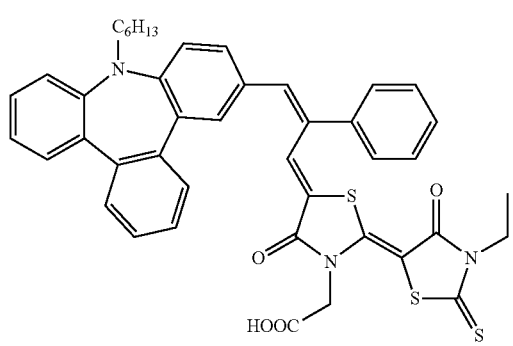
A24
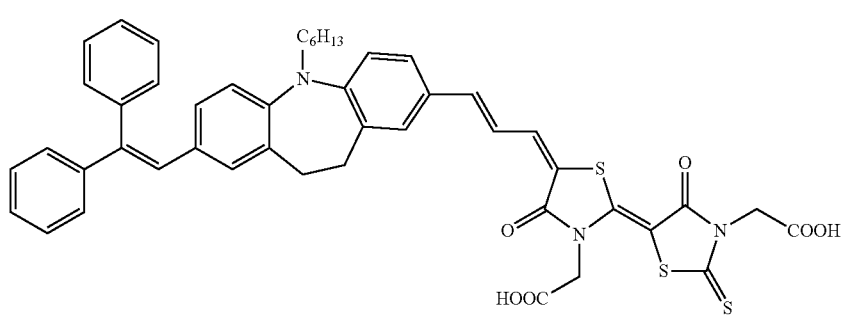

-continued
A25
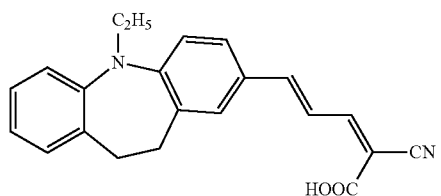
A26
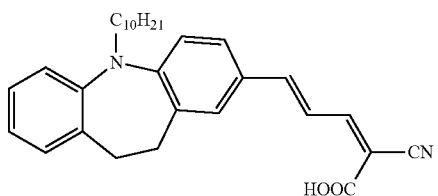
A27
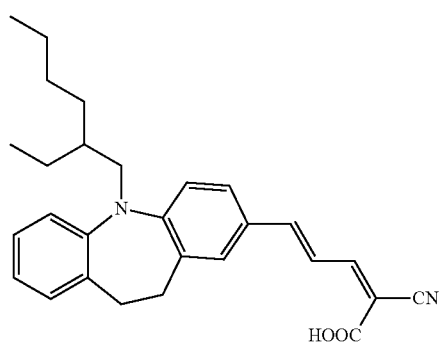
A28
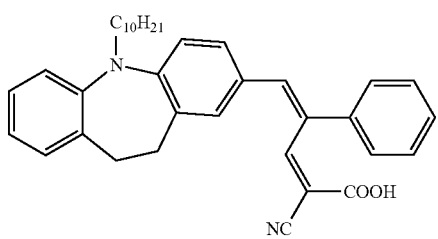
A29
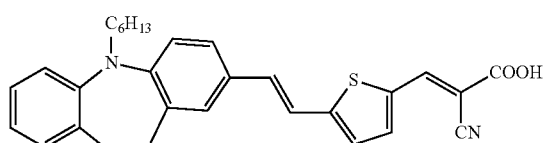
A30
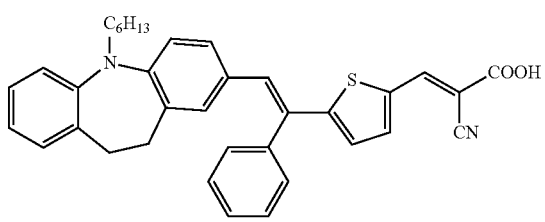
A31
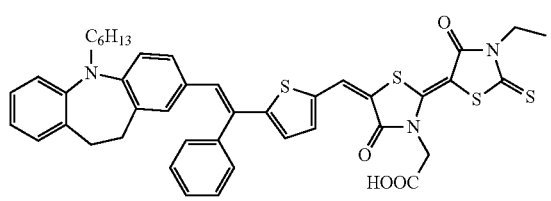
A32
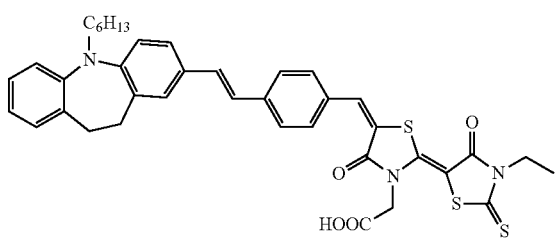
A33
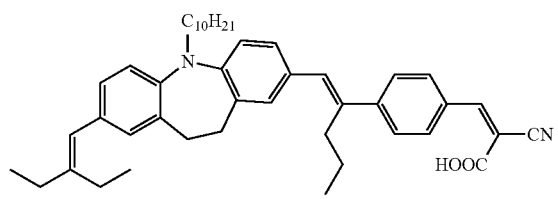
A34
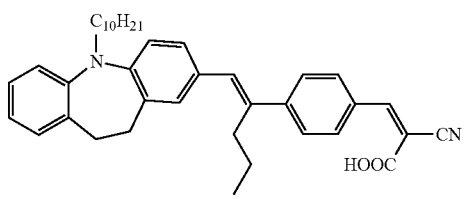
A35
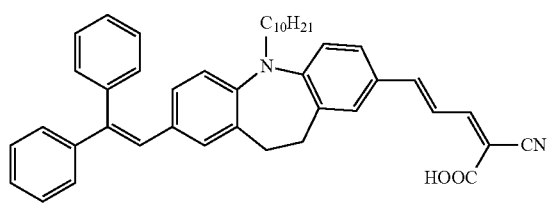
A36
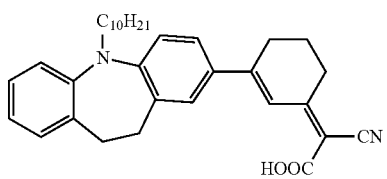

-continued
| A37 | A38 |
|---|---|
| 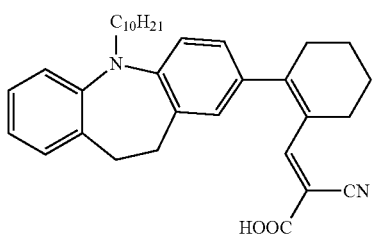 | 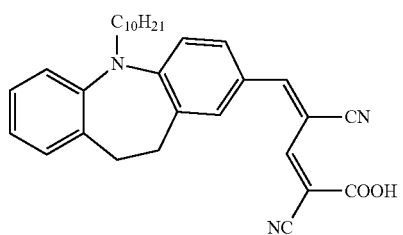 |
| A39 | A40 |
| 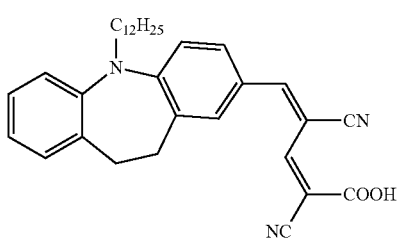 | 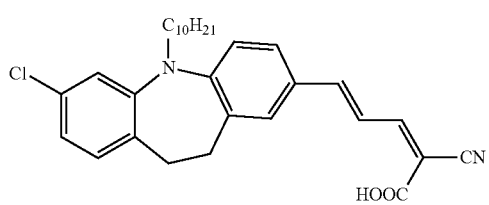 |
| A41 | A42 |
| 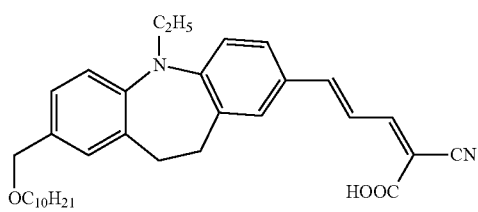 | 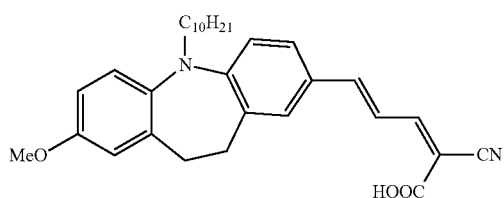 |
| A43 | A44 |
| 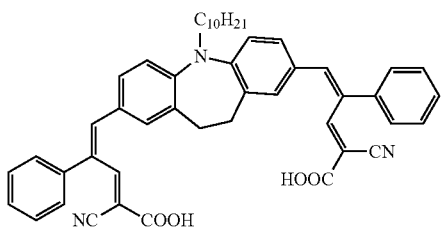 | 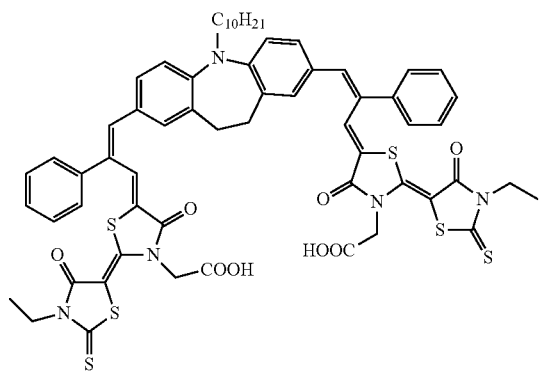 |
| A45 | A46 |
| 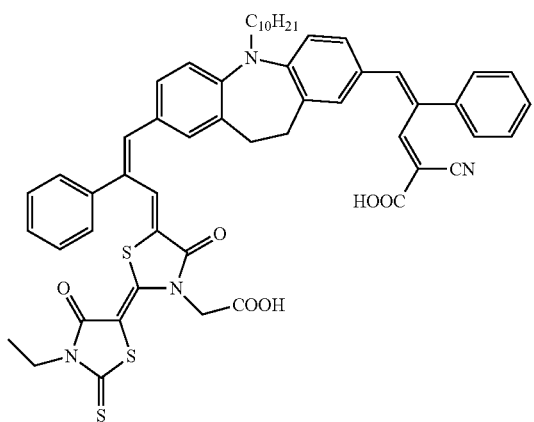 | 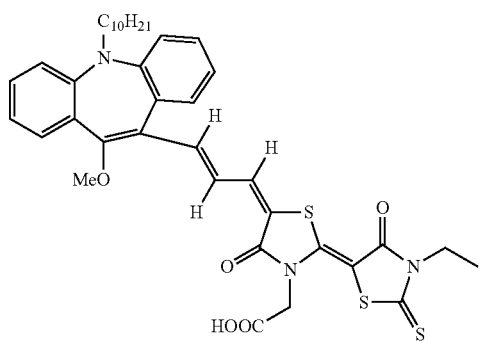 |

-continued
A47
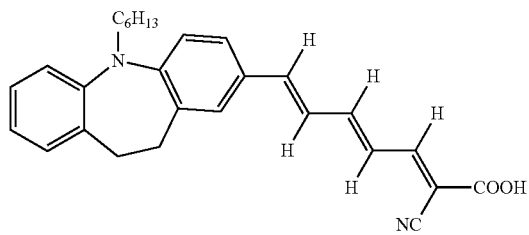
A48
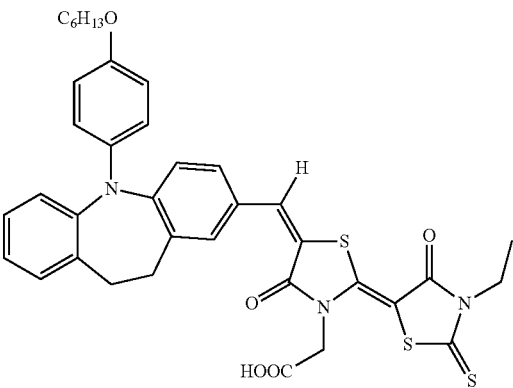
A49
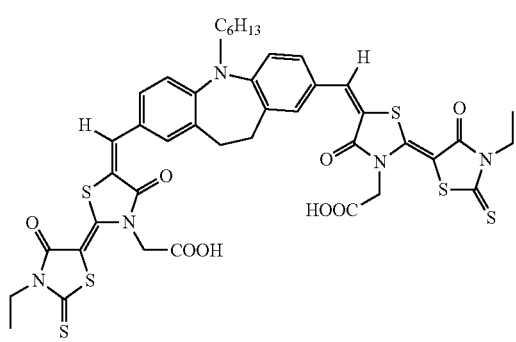
A50
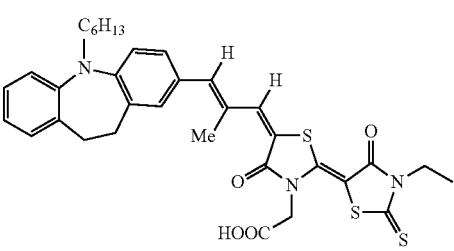
A51
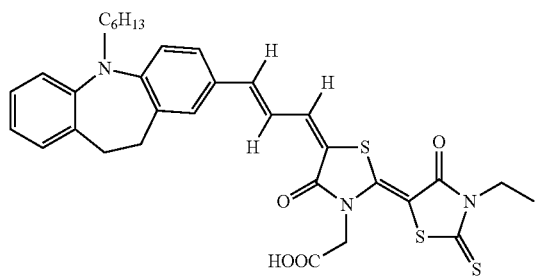
A52
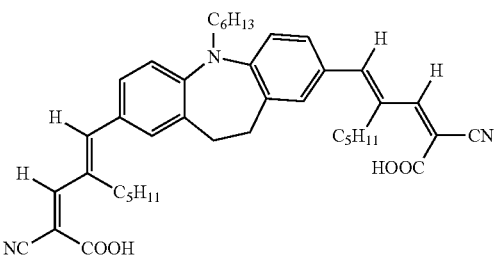
A53
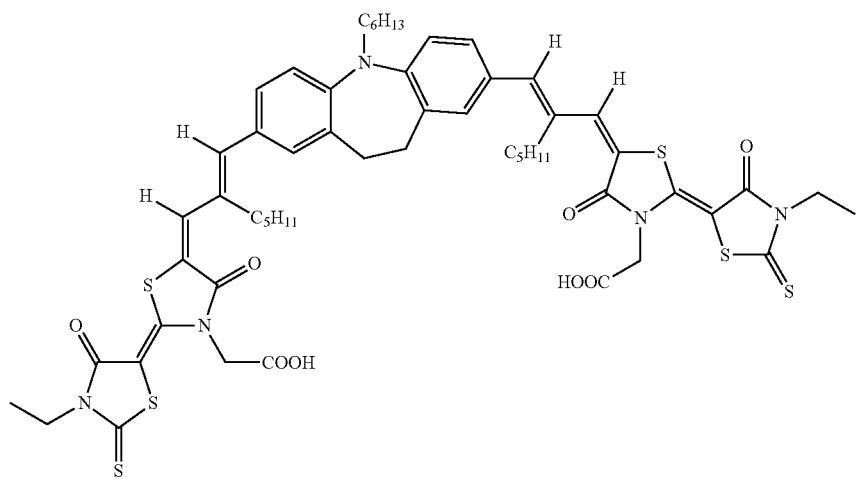

The dye of the first embodiment of the present invention has a maximum absorption wavelength in a solution in a range of preferably from 350 nm to 1,000 nm, more preferably from 370 nm to 700 nm, and still more preferably from 390 nm to 650 nm.

Next, the dye for use in the third embodiment of the present invention is described. The dye of the third embodiment of the present invention has a structure represented by formula (1C).

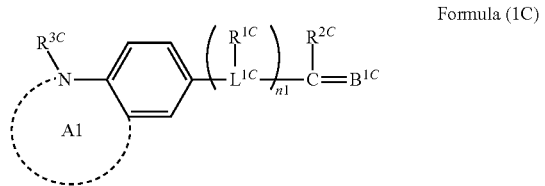

Formula (1C)

In formula (1C), $A^1$ represents a 6- or 7-membered nitrogen-containing heterocycle formed by linking with the benzene ring. Examples of the 6-membered or 7-membered nitrogen-containing heterocycle represented by $A^1$ preferably include: a 6-membered or 7-membered nitrogen-containing heterocycle that is formed by at least one kind atom selected from the group consisting of a carbon atom, a sulfur atom and an oxygen atom, in addition to a nitrogen atom; more preferably a 6-membered or 7-membered nitrogen-containing heterocycle that is formed by at least one kind atom selected from the group consisting of a carbon atom and a sulfur atom, in addition to a nitrogen atom; and especially more preferably a 7-membered nitrogen-containing heterocycle that is formed by only carbon atom(s) in addition to a nitrogen atom. $A^1$ may be a condensed ring or a substituted ring. Further, $A^1$ may have a substituent. Examples of the condensed ring include a ring condensed with a benzene ring, a pyridine ring, a pyrrol ring, a furane ring, and a thiophene ring.

$L^{1C}$ represents an electron transfer-linking group containing at least one hetero ring selected from the group consisting of a thiophene ring, a furane ring, a pyrrole ring, a selenophene ring, and a hetero ring in which at least two of those are condensed with each other. $L^{1C}$ is preferably an electron transfer-linking group containing at least one kind of hetero rings selected from the group consisting of a thiophene ring, a pyrrol ring, and a hetero ring condensed thereof, and more preferably an electron transfer-linking group containing at least one kind of hetero rings selected from a thiophene ring, or a heterocyclic ring condensed thereof. Examples of the condensed rings include heterocyclic rings condensed with a benzene ring, a pyridine ring, a pyrrol ring, a furane ring, a thiophene ring, or the like.

In formula (1C), $R^{1C}$ and $R^{3C}$ each independently represent a hydrogen atom or a substituent. $R^{1C}$ and $R^{3C}$ each are preferably at least one kind of substituent selected from the group consisting of a hydrogen atom, an alkyl group, an alkoxy group and an aryl group; further preferably at least one kind of substituent selected from the group consisting of an alkyl group, an alkoxy group and an aryl group; particularly preferably at least one kind of substituent selected from the group consisting of an alkyl group and an aryl group; and further preferably an alkyl group.

When $R^{1C}$ and $R^{3C}$ each represent an alkyl group, preferred examples of the alkyl group include a substituted or unsubstituted linear, branched, or cyclic alkyl group, and which includes an alkyl group (preferably an alkyl group having 1 to 30 carbon atoms, e.g. methyl, ethyl, n-propyl, isopropyl, t-butyl, n-hexyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, e.g. cyclohexyl, cyclopentyl, or 4-n-dodecylcyclohexyl), a bicycloalkyl group (preferably a substituted or unsubstituted bicycloalkyl group having 5 to 30 carbon atoms, i.e. a monovalent group obtained by removing one hydrogen atom from a bicycloalkane having 5 to 30 carbon atoms, e.g. bicyclo[1,2,2]heptan-2-yl or a bicyclo[2,2,2]octan-3-yl), and a tricyclo or higher structure having three or more ring structures. Further preferred examples of the alkyl group include an alkyl group having 1 to 30 carbon atoms (e.g., methyl, ethyl, n-propyl, isopropyl, t-butyl, n-hexyl, n-octyl, eicosyl, 2-chloroethyl, 2-cyanoethyl, or 2-ethylhexyl) and a cycloalkyl group (preferably a substituted or unsubstituted cycloalkyl group having 3 to 30 carbon atoms, e.g. cyclohexyl, cyclopentyl, or 4-n-dodecylcyclohexyl); and particularly preferred examples include an alkyl group having 1 to 20 carbon atoms, such as methyl, ethyl, n-propyl, isopropyl, t-butyl, n-hexyl, n-octyl, eicosyl, 2-chloroethyl, 2-cyanoethyl and 2-ethylhexyl.

When each of $R^{1C}$ and $R^{3C}$ represents an aryl group, preferred examples of the aryl group include a phenyl group, a naphthyl group, a thienyl group, a furyl group, a pyrryl group, or condensed rings of these groups; and especially preferably a phenyl group, a thienyl group, or condensed rings of these groups. Examples of the condensed ring include a benzene ring, a pyridine ring, a pyrrol ring, a furane ring, and a thiophene ring.

When $R^{1C}$ and $R^{3C}$ each represent an alkoxy group, preferred examples of the alkoxy group include a substituted or unsubstituted alkoxy group having 1 to 30 carbon atoms, e.g. methoxy, ethoxy, isopropoxy, t-butoxy, n-octyloxy or 2-methoxyethoxy; further preferred examples include a substituted or unsubstituted alkoxy group having 1 to 20 carbon atoms, e.g. methoxy, ethoxy, isopropoxy, t-butoxy, n-octyloxy or 2-methoxyethoxy; and particularly preferred examples include a substituted or unsubstituted alkoxy group having 1 to 10 carbon atoms.

$R^{2C}$ represents a hydrogen atom or a substituent. $R^{2C}$ is preferably a hydrogen atom. When $R^{2C}$ represents a substituent, examples of the substituent include the substituent $W_C$ described below. Preferred examples of the substituent include a halogen atom, an alkyl group, an alkenyl group, an alkynyl group, an aromatic group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group, an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic-azo group, an imido group, a phosphino group, a phosphinyl group, a phosphinyloxy group, a phosphinylamino group, and a silyl group. Further preferred examples include an alkyl group, an alkenyl group, an alkynyl group, an aromatic group, a heterocyclic group, a cyano group, a hydroxyl group, a nitro group, a carboxyl group, an alkoxy group, an aryloxy group, an alkylthio group, an arylthio group, a heterocyclic thio group, a sulfamoyl group, a sulfo group, an alkyl- or aryl-sulfinyl group, an alkyl- or aryl-sulfonyl group, a phosphino group, a phosphinyl group, a phosphinyloxy group, a phosphinylamino group, and a silyl group. Particularly preferred examples include an alkyl group, an alkenyl group, an alkynyl group, an aromatic group, a heterocyclic group, a cyano group, a hydroxyl group, a nitro group, a carboxyl group, an alkoxy group, an aryloxy group, an alkylthio group, an arylthio group, and a heterocyclic thio group.

$B^{1C}$ represents a heterocyclic acidic nucleus, or a methylene group substituted with an electron-withdrawing group; and $B^{1C}$ has at least one acidic group. Examples of the heterocyclic acidic nucleus include those described in, for example, T. H. James, "The Theory of the Photographic Process, 4th edition", Macmillan publishing, 1977, p. 199. More preferred examples of the heterocyclic acidic nucleus include rhodanine, hydantoin, thiohydantoin, barbituric acid, thiobarbituric acid, pyrazolidinedione, pyrazolone, indanedione or isoxazolone; even more preferred examples include rhodanine, hydantoin, thiohydantoin, barbituric acid or thiobarbituric acid; and a particularly preferred example is rhodanine.

When $B^{1C}$ is a methylene group substituted with an electron-withdrawing group, examples of the electron-withdrawing group include substituents having the following effects.

In general, an electron-withdrawing group attenuates the electron density at a particular position of a molecule. The electron-withdrawing property or electron-donating property cannot be explained only by the difference in the electronegativity. That is, since an excitation effect, a mesomeric effect and the like work together in a compositive manner, the manifestation of the electron-withdrawing property or the electron-donating property can vary with the aromaticity, presence of a conjugated system, or a topological positional relationship. As an experimental rule for quantitatively evaluating and predicting these effects on the basis of the acid dissociation constant of para- and meta-substituted benzoic acid, there is known Hammett's rule. In the case of the excitation effect, the electron-withdrawing effect is referred to as the –I effect, while the electron-donating effect is referred to as the +I effect, and an atom having higher electronegativity than carbon exhibits the –I effect. Furthermore, an anion exhibits the +I effect, while a cation exhibits the –I effect. In the case of the mesomeric effect, the electron-withdrawing effect is referred to as the –M effect, while the electron-donating effect is referred to as the +M effect. Examples of the electron-withdrawing group are shown below.

Excitation Effect
(–I effect)
—O$^+$R$_2$>—N$^+$R$_3$
—N$^+$R$_3$>—P$^+$R$_3$> . . . .
—O$^+$R$_2$>—S$^+$R$_2$> . . . .
—N$^+$R$_3$>—NO$_2$>—SO$_2$R>—SOR
—SO$_2$R>—SO$_3$R
—N$^+$R$_3$>—NR$_2$
—O$^+$R$_2$>—OR
—S$^+$R$_2$>—SR
—F>—Cl>—Br>—I
═O>═NR>═CR$_2$
═O>—OR
═N>═CR
═N>═NR>—NR$_2$
—C═CR>—CR═CR$_2$>—CR$_2$CR$_3$ Mesomeric Effect
(–M effect)
═N$^+$R$_3$>═NR
═O>═NR>═CR$_2$
═S>═O>═N Preferred examples of the electron-withdrawing group include a cyano group, a nitro group, a sulfonyl group, a sulfoxy group, an acyl group, an alkoxycarbonyl group and a carbamoyl group; more preferred examples include a cyano group, a nitro group and a sulfonyl group; and a particularly preferred example is a cyano group.

In formula (1C) according to the present invention, a heterocyclic ring acidic nucleus or a methylene group substituted with an electron-withdrawing group, each of which has at least one acidic group. The term "acidic group" means a group in which the pKa value of the most acidic hydrogen atom among the hydrogen atoms constituting the acidic group is 13 or less. Examples of the acidic group include a carboxylic acid group, a sulfonic acid group, a phosphonic acid group, a phenolic hydroxyl group, an alkylsulfonylcarbamoyl group and a phosphoric acid group. Preferred examples include a carboxylic acid group, a sulfonic acid group, a phosphonic acid group and a phenolic hydroxyl group; more preferred examples include a carboxylic acid group and a sulfonic acid group; and particularly preferred examples include a carboxylic acid group.

In formula (1C), n1 represents an integer of 1 to 12. n1 is preferably an integer of 1 to 10; further preferably an integer of 2 to 8; and particularly preferably an integer of 2 to 6.

The dye represented by formula (1C) is preferably a dye represented by formula (2C).

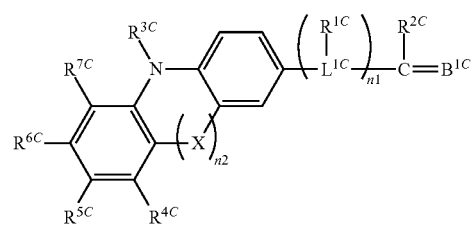

Formula (2C)

In formula (2C), X represents a group of atoms necessary for forming a 6- or 7-membered nitrogen-containing heterocycle by linking with the benzene rings. Here, the term "group of non-metallic atoms" means a group of atoms bonded by at least one kind of member selected from the group consisting of carbon, oxygen, nitrogen and sulfur atoms.

The 6-membered or 7-membered nitrogen-containing heterocycle represented by X preferably include a 6-membered or 7-membered nitrogen-containing heterocycle formed by at least one kind atom selected from a group consisting of a carbon atom, a sulfur atom and an oxygen atom, in addition to the nitrogen atom. Preferred examples of the ring include a 6-membered or 7-membered nitrogen-containing heterocycle formed by at least one kind atom selected from a carbon atom and a sulfur atom, in addition to the nitrogen atom; especially preferred examples include a 7-membered nitrogen-containing heterocycle formed by at least one kind atom selected from the carbon atoms and a sulfur atom(s), in addition to the nitrogen atom; and further preferred examples include a 7-membered nitrogen-containing heterocycle formed by the carbon atoms and a sulfur atom(s), in addition to the nitrogen atom.

X may be a condensed ring or a substituted ring. Further, X may have a substituent group. Examples of the condensed ring include a benzene ring, a pyridine ring, a pyrrol ring, a furane ring, and a thiophene ring.

In formula (2C), $R^{4C}$ to $R^{7C}$ each independently represent at least one kind of substituent selected from the group consisting of a hydrogen atom, an alkyl group, an alkoxy group and an aryl group. $R^{4C}$ to $R^{7C}$ each are preferably a hydrogen atom or an alkyl group.

When $R^{4C}$ to $R^{7C}$ each represent an alkyl group, preferred examples of the alkyl group include a substituted or unsubstituted linear, branched, or cyclic alkyl group, and which includes an alkyl group (preferably an alkyl group having 1 to 30 carbon atoms, e.g. methyl, ethyl, n-propyl, isopropyl, t-butyl, n-hexyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, e.g. cyclohexyl, cyclopentyl, or 4-n-dodecyl-cyclohexyl), a bicycloalkyl group (preferably a substituted or unsubstituted bicycloalkyl group having 5 to 30 carbon atoms, i.e. a monovalent group obtained by removing one hydrogen atom from a bicycloalkane having 5 to 30 carbon atoms, e.g. bicyclo[1,2,2]heptan-2-yl or a bicyclo[2,2,2]octan-3-yl), and a tricyclo or higher structure having three or more ring structures. Further preferred examples of the alkyl group include an alkyl group having 1 to 30 carbon atoms (e.g., methyl, ethyl, n-propyl, isopropyl, t-butyl, n-hexyl, n-octyl, eicosyl, 2-chloroethyl, 2-cyanoethyl, or 2-ethylhexyl) and a cycloalkyl group (preferably a substituted or unsubstituted cycloalkyl group having 3 to 30 carbon atoms, e.g. cyclohexyl, cyclopentyl, or 4-n-dodecylcyclohexyl); and particularly preferred examples include an alkyl group having 1 to 20 carbon atoms, such as methyl, ethyl, n-propyl, isopropyl, t-butyl, n-hexyl, n-octyl, eicosyl, 2-chloroethyl, 2-cyanoethyl and 2-ethylhexyl. When each of $R^{3C}$ to $R^{7C}$ represents an aryl group, preferred examples of the aryl group include a phenyl group, a naphthyl group, a thienyl group, a furyl group, a pyrryl group, or condensed rings of these groups; and especially preferably a phenyl group, a thienyl group, or condensed rings of these groups. Examples of the condensed ring include a benzene ring, a pyridine ring, a pyrrol ring, a furane ring, and a thiophene ring.

When $R^{3C}$ to $R^{7C}$ each represent an alkoxy group, preferred examples of the alkoxy group include a substituted or unsubstituted alkoxy group having 1 to 30 carbon atoms, e.g. methoxy, ethoxy, isopropoxy, t-butoxy, n-octyloxy or 2-methoxyethoxy; further preferred examples include a substituted or unsubstituted alkoxy group having 1 to 20 carbon atoms, e.g. methoxy, ethoxy, isopropoxy, t-butoxy, n-octyloxy or 2-methoxyethoxy; and particularly preferred examples include a substituted or unsubstituted alkoxy group having 1 to 10 carbon atoms.

In formula (2C), n2 represents an integer of 1 or 2. n2 is preferably an integer of 2.

In formulae (1C) and (2C), $B^{1C}$ is preferably a group represented by formula (3C) or (4C).

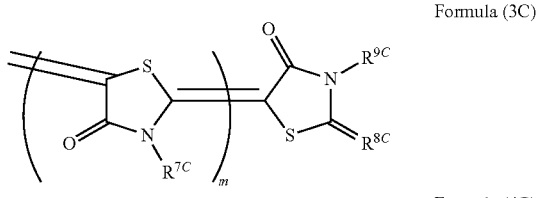

Formula (3C)

Formula (4C)

In formula (3C), $R^{7C}$ and $R^{9C}$ each independently represent an aliphatic group, an aromatic group or a heterocyclic group (at least one functional group thereof may have the acidic group described above). $R^{7C}$ and $R^{9C}$ each are preferably an aliphatic group or an aromatic group; further preferably an aliphatic group or an aromatic group; and particularly preferably an aliphatic group.

Examples of the aliphatic group include an alkyl group (e.g. methyl, ethyl, n-propyl, isopropyl, t-butyl, n-octyl, eicosyl, 2-chloroethyl, 2-cyanoethyl, or 2-ethylhexyl) and a cycloalkyl group (preferably a substituted or unsubstituted cycloalkyl group having 3 to 30 carbon atoms, e.g. cyclohexyl, cyclopentyl, or 4-n-dodecylcyclohexyl). A preferable aliphatic group is an alkyl group or an alkenyl group, each of which has from 1 to 30 carbon atoms, more preferably from 1 to 25 carbon atoms, and still more preferably from 1 to 20 carbon atoms, and may have a substituent.

Examples of the aromatic group include a benzene ring, a furane ring, a pyrrol ring, a pyridine ring, a thiophene ring, an imidazole ring, an oxazole ring, a thiazole ring, a pyrazole ring, an isoxazole ring, an isothiazole ring, a pyrimidine ring, a pyrazine ring, and condensed rings of these rings, each of which may be substituted. Among these rings, a benzene ring, a pyrrol ring, a pyridine ring, and a thiophene ring are preferred, and a benzene ring and a thiophene ring are more preferred. Especially, a benzene ring is preferred. These rings may be substituted.

Examples of the heterocyclic group include a substituted or unsubstituted 3- to 6-membered heterocyclic group, more preferably an unsubstituted 5- or 6-membered heterocyclic group, and still more preferably a 6-membered heterocyclic group (for example, piperidine, morpholine). These groups may have a substituent.

In formula (3C), m represents 0 or 1. m is preferably 1.

The carbon-carbon double bonds in formula (3C) may be any of an E-form or a Z-form. $R^{8C}$ in formula (3C) represents a sulfur atom or a group represented by formula (5C). The carbon-carbon double bond in formula (5C) may be any of an E-form or a Z-form. $R^{12C}$ and $R^{13C}$ in formula (5C) each independently represent a cyano group or an acidic group, and may be the same as or different from each other. And, the carbon-carbon double bond in formula (5C) may be any of an E-form or a Z-form.

Formula (5C)

In formula (4C), $R^{10C}$ and $R^{11C}$ each independently represent a cyano group or an acidic group, and may be the same as or different from each other. The carbon-carbon double bond in formula (4C) may be any of an E-form or a Z-form.

The group represented by formula (3C) is preferably a group represented by formula (6C). In formula (6C), $R^{9C}$ represents an aliphatic group, an aromatic group or a heterocyclic group (each of which may have an acidic group).

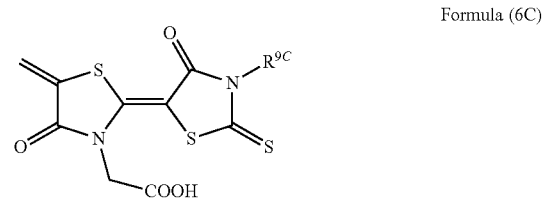

Formula (6C)

In formula (1C) or (2C), $B^{1C}$ is preferably represented by formula (7C). In formula (7C), $R^{7C}$ represents an aliphatic group, an aromatic group or a heterocyclic group (each of which may have an acidic group).

Further, in formula (1C) or (2C), $B^{1C}$ is preferably a group represented by formula (8C).

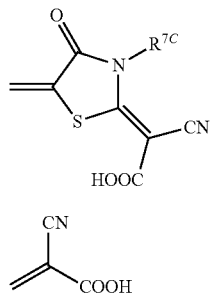

Formula (7C)

Formula (8C)

According to the present invention, the substituent (hereinafter, referred to as substituent $W_C$) include, for example, a halogen atom (e.g. a fluorine atom, a chlorine atom, a bromine atom, or an iodine atom); an alkyl group [which represents a substituted or unsubstituted linear, branched, or cyclic alkyl group, and which includes an alkyl group (preferably an alkyl group having 1 to 30 carbon atoms, e.g. a methyl group, an ethyl group, an n-propyl group, an isopropyl group, a t-butyl group, an n-octyl group, an eicosyl group, a 2-chloroethyl group, a 2-cyanoethyl group, or a 2-ethylhexyl group), a cycloalkyl group (preferably a substituted or unsubstituted cycloalkyl group having 3 to 30 carbon atoms, e.g. a cyclohexyl group, a cyclopentyl group, or a 4-n-dodecylcyclohexyl group), a bicycloalkyl group (preferably a substituted or unsubstituted bicycloalkyl group having 5 to 30 carbon atoms, i.e. a monovalent group obtained by removing one hydrogen atom from a bicycloalkane having 5 to 30 carbon atoms, e.g. a bicyclo[1.2.2]heptan-2-yl group or a bicyclo[2.2.2]octan-3-yl group), and a tricyclo or higher structure having three or more ring structures; and an alkyl group in substituents described below (e.g. an alkyl group in an alkylthio group) represents such an alkyl group of the above concept]; an alkenyl group [which represents a substituted or unsubstituted linear, branched, or cyclic alkenyl group, and which includes an alkenyl group (preferably a substituted or unsubstituted alkenyl group having 2 to 30 carbon atoms, e.g. a vinyl group, an allyl group, a prenyl group, a geranyl group, or an oleyl group), a cycloalkenyl group (preferably a substituted or unsubstituted cycloalkenyl group having 3 to 30 carbon atoms, i.e. a monovalent group obtained by removing one hydrogen atom from a cycloalkene having 3 to 30 carbon atoms, e.g. a 2-cyclopenten-1-yl group or a 2-cyclohexen-1-yl group), and a bicycloalkenyl group (which represents a substituted or unsubstituted bicycloalkenyl group, preferably a substituted or unsubstituted bicycloalkenyl group having 5 to 30 carbon atoms, i.e. a monovalent group obtained by removing one hydrogen atom from a bicycloalkene having one double bond, e.g. a bicyclo[2.2.1]hept-2-en-1-yl group or a bicyclo[2.2.2]oct-2-en-4-yl group)]; an alkynyl group (preferably a substituted or unsubstituted alkynyl group having 2 to 30 carbon atoms, e.g. an ethynyl group, a propargyl group, or a trimethylsilylethynyl group); an aryl group (preferably a substituted or unsubstituted aryl group having 6 to 30 carbon atoms, e.g. a phenyl group, a p-tolyl group, a naphthyl group, an m-chlorophenyl group, or an o-hexadecanoylaminophenyl group); an aromatic group (e.g. a benzene ring, a furan ring, a pyrrole ring, a pyridine ring, a thiophene ring, an imidazole ring, an oxazole ring, a thiazole ring, a pyrazole ring, an isoxazole ring, an isothiazole ring, a pyrimidine ring, a pyrazine ring, or rings formed by condensation of the foregoing rings); a heterocyclic group (preferably a monovalent group obtained by removing one hydrogen atom from a substituted or unsubstituted 5- or 6-membered aromatic or nonaromatic heterocyclic compound; more preferably a 5- or 6-membered aromatic heterocyclic group having 3 to 30 carbon atoms, e.g. a 2-furyl group, a 2-thienyl group, a 2-pyrimidinyl group, a 2-benzothiazolyl group); a cyano group; a hydroxyl group; a nitro group; a carboxyl group; an alkoxy group (preferably a substituted or unsubstituted alkoxy group having 1 to 30 carbon atoms, e.g. a methoxy group, an ethoxy group, an isopropoxy group, a t-butoxy group, an n-octyloxy group, or a 2-methoxyethoxy group); an aryloxy group (preferably a substituted or unsubstituted aryloxy group having 6 to 30 carbon atoms, e.g. a phenoxy group, a 2-methylphenoxy group, a 4-t-butylphenoxy group, a 3-nitrophenoxy group, or a 2-tetradecanoylaminophenoxy group); a silyloxy group (preferably a silyloxy group having 3 to 20 carbon atoms, e.g. a trimethylsilyloxy group or a t-butyldimethylsilyloxy group); a heterocyclic oxy group (preferably a substituted or unsubstituted heterocyclic oxy group having 2 to 30 carbon atoms, e.g. a 1-phenyltetrazol-5-oxy group or a 2-tetrahydropyranyloxy group); an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, e.g. a formyloxy group, an acetyloxy group, a pivaloyloxy group, a stearoyloxy group, a benzoyloxy group, or a p-methoxyphenylcarbonyloxy group); a carbamoyloxy group (preferably a substituted or unsubstituted carbamoyloxy group having 1 to 30 carbon atoms, e.g. an N,N-dimethylcarbamoyloxy group, an N,N-diethylcarbamoyloxy group, a morpholinocarbonyloxy group, an N,N-di-n-octylaminocarbonyloxy group, or an N-n-octylcarbamoyloxy group); an alkoxycarbonyloxy group (preferably a substituted or unsubstituted alkoxycarbonyloxy group having 2 to 30 carbon atoms, e.g. a methoxycarbonyloxy group, an ethoxycarbonyloxy group, a t-butoxycarbonyloxy group, or an n-octylcarbonyloxy group); an aryloxycarbonyloxy group (preferably a substituted or unsubstituted aryloxycarbonyloxy group having 7 to 30 carbon atoms, e.g. a phenoxycarbonyloxy group, a p-methoxyphenoxycarbonyloxy group, or a p-n-hexadecyloxyphenoxycarbonyloxy group); an amino group (preferably an amino group, a substituted or unsubstituted alkylamino group having 1 to 30 carbon atoms, or a substituted or unsubstituted arylamino group having 6 to 30 carbon atoms, e.g. an amino group, a methylamino group, a dimethylamino group, an anilino group, an N-methyl-anilino group, or a diphenylamino group); an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, e.g. a formylamino group, an acetylamino group, a pivaloylamino group, a lauroylamino group, a benzoylamino group, or a 3,4,5-tri-n-octyloxyphenylcarbonylamino group); an aminocarbonylamino group (preferably a substituted or unsubstituted aminocarbonylamino group having 1 to 30 carbon atoms, e.g. a carbamoylamino group, an N,N-dimethylaminocarbonylamino group, an N,N-diethylaminocarbonylamino group, or a morpholinocarbonylamino group); an alkoxycarbonylamino group (preferably a substituted or unsubstituted alkoxycarbonylamino group having 2 to 30 carbon atoms, e.g. a methoxycarbonylamino group, an ethoxycarbonylamino group, a t-butoxycarbonylamino group, an n-octadecyloxycarbonylamino group, or an N-methyl-methoxycarbonylamino group); an aryloxycarbonylamino group (preferably a substituted or unsubstituted aryloxycarbonylamino group having 7 to 30 carbon atoms, e.g. a phenoxycarbonylamino group, a p-chlorophenoxycarbonylamino group, or an m-n-octyloxyphenoxycarbonylamino group); a sulfamoylamino group (preferably a substituted or unsubstituted sulfamoylamino group having 0 to 30 carbon atoms, e.g. a sulfamoylamino group, an N,N-dimethylaminosulfonylamino group, or an N-n-octylaminosulfonylamino group); an alkyl- or aryl-sulfonylamino group (preferably a substituted or unsubstituted alkylsulfonylamino group having 1 to 30 carbon atoms, or a substituted or unsubstituted arylsulfonylamino group having 6 to 30 carbon atoms, e.g. a methylsulfonylamino group, a butylsulfonylamino group, a phenylsulfonylamino group, a 2,3,5-trichlorophenylsulfonylamino group, or a p-methylphenylsulfonylamino group); a mercapto group; an alkylthio group (preferably a substituted or unsubstituted alkylthio group having 1 to 30 carbon atoms, e.g. a methylthio group, an ethylthio group, or an n-hexadecylthio group); an arylthio group (preferably a substituted or unsubstituted arylthio group having 6 to 30 carbon atoms, e.g. a phenylthio group, a p-chlorophenylthio group, or an m-methoxyphenylthio group); a heterocyclic thio group (preferably a substituted or unsubstituted heterocyclic thio group having 2 to 30 carbon atoms, e.g. a 2-benzothiazolylthio group or a 1-phenyltetrazol-5-ylthio group); a sulfamoyl group (preferably a substituted or unsubstituted sulfamoyl group having 0 to 30 carbon atoms, e.g. an N-ethylsulfamoyl group, an N-(3-dodecyloxypropyl)sulfamoyl group, an N,N-dimethylsulfamoyl group, an N-acetylsulfamoyl group, an N-benzoylsulfamoyl group, or an N—(N'-phenylcarbamoyl)sulfamoyl group); a sulfo group; an alkyl- or aryl-sulfinyl group (preferably a substituted or unsubstituted alkylsulfinyl group having 1 to 30 carbon atoms, or a substituted or unsubstituted arylsulfinyl group having 6 to 30 carbon atoms, e.g. a methylsulfinyl group, an ethylsulfinyl group, a phenylsulfinyl group, or a p-methylphenylsulfinyl group); an alkyl- or aryl-sulfonyl group (preferably a substituted or unsubstituted alkylsulfonyl group having 1 to 30 carbon atoms, or a substituted or unsubstituted arylsulfonyl group having 6 to 30 carbon atoms, e.g. a methylsulfonyl group, an ethylsulfonyl group, a phenylsulfonyl group, or a p-methylphenylsulfonyl group); an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms, which is bonded to said carbonyl group through a carbon atom, e.g. an acetyl group, a pivaloyl group, a 2-chloroacetyl group, a stearoyl group, a benzoyl group, a p-n-octyloxyphenylcarbonyl group, a 2-pyridylcarbonyl group, or a 2-furylcarbonyl group); an aryloxycarbonyl group (preferably a substituted or unsubstituted aryloxycarbonyl group having 7 to 30 carbon atoms, e.g. a phenoxycarbonyl group, an o-chlorophenoxycarbonyl group, an m-nitrophenoxycarbonyl group, or a p-t-butylphenoxycarbonyl group); an alkoxycarbonyl group (preferably a substituted or unsubstituted alkoxycarbonyl group having 2 to 30 carbon atoms, e.g. a methoxycarbonyl group, an ethoxycarbonyl group, a t-butoxycarbonyl group, or an n-octadecyloxycarbonyl group); a carbamoyl group (preferably a substituted or unsubstituted carbamoyl group having 1 to 30 carbon atoms, e.g. a carbamoyl group, an N-methylcarbamoyl group, an N,N-dimethylcarbamoyl group, an N,N-di-n-octylcarbamoyl group, or an N-(methylsulfonyl)carbamoyl group); an aryl- or heterocyclic-azo group (preferably a substituted or unsubstituted aryl azo group having 6 to 30 carbon atoms, or a substituted or unsubstituted heterocyclic azo group having 3 to 30 carbon atoms, e.g. a phenylazo group, a p-chlorophenylazo group, or a 5-ethylthio-1,3,4-thiadiazol-2-ylazo group); an imido group (preferably an N-succinimido group or an N-phthalimido group); a phosphino group (preferably a substituted or unsubstituted phosphino group having 2 to 30 carbon atoms, e.g. a dimethylphosphino group, a diphenylphosphino group, or a methylphenoxyphosphino group); a phosphinyl group (preferably a substituted or unsubstituted phosphinyl group having 2 to 30 carbon atoms, e.g. a phosphinyl group, a dioctyloxyphosphinyl group, or a diethoxyphosphinyl group); a phosphinyloxy group (preferably a substituted or unsubstituted phosphinyloxy group having 2 to 30 carbon atoms, e.g. a diphenoxyphosphinyloxy group or a dioctyloxyphosphinyloxy group); a phosphinylamino group (preferably a substituted or unsubstituted phosphinylamino group having 2 to 30 carbon atoms, e.g. a dimethoxyphosphinylamino group or a dimethylaminophosphinylamino group); and a silyl group (preferably a substituted or unsubstituted silyl group having 3 to 30 carbon atoms, e.g. a trimethylsilyl group, a t-butyldimethylsilyl group, or a phenyldimethylsilyl group).

The substituent may be further substituted. In that case, examples of the substituent include the substituent $W_C$ mentioned above.

Specific examples of the dye (dye compound) of the present invention are shown in the followings, but the present invention is not limited thereto.

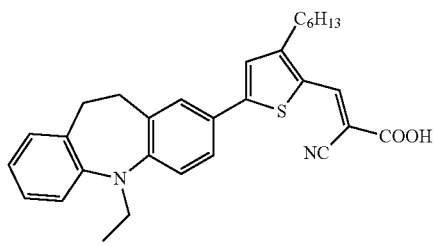

CA-1

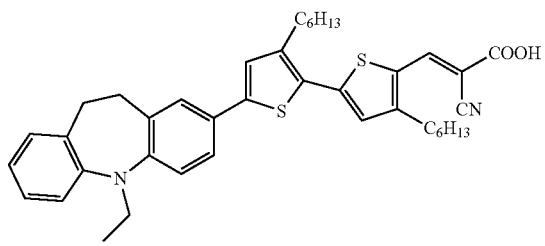

CA-2

-continued
CA-3
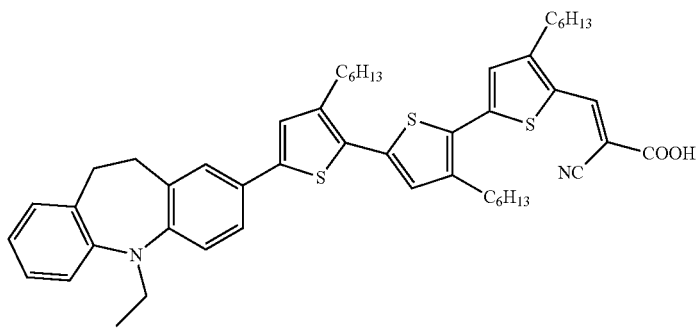
CA-4
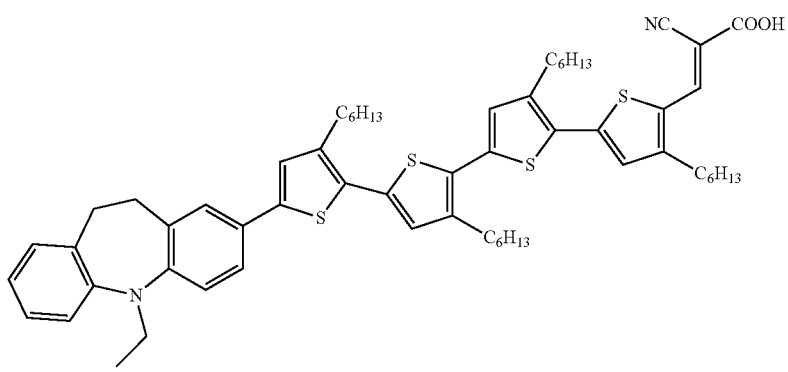
CA-5
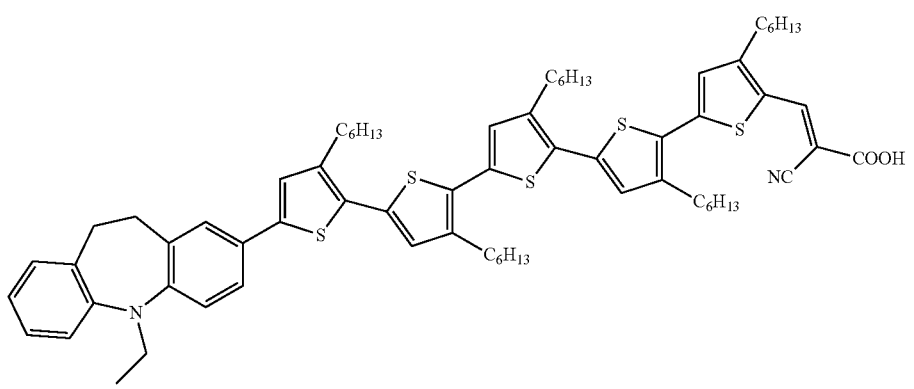
CA-6
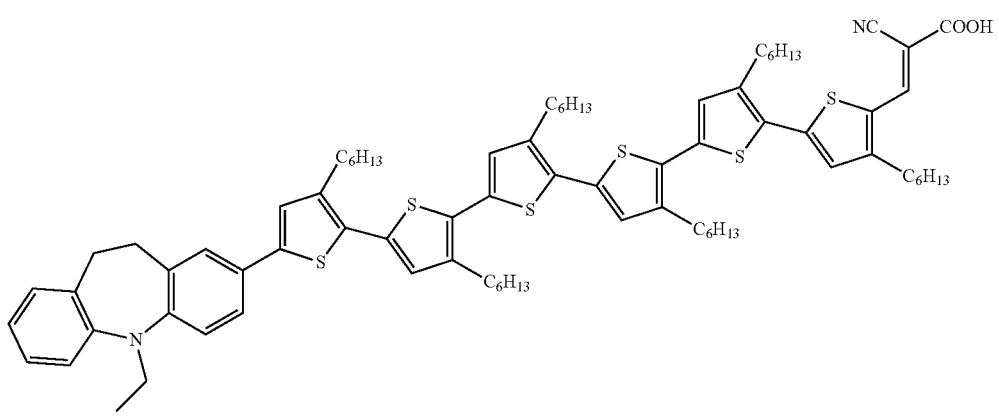

-continued
CB-1
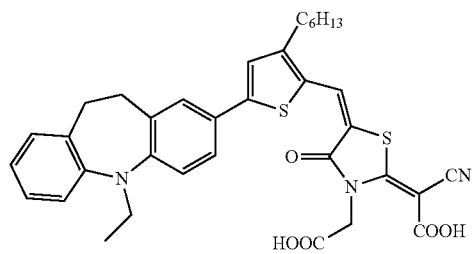
CB-2
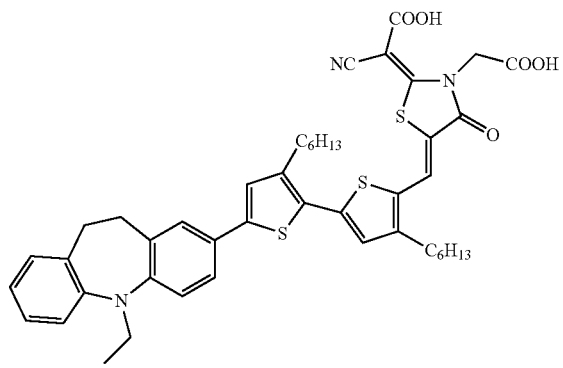
CB-3
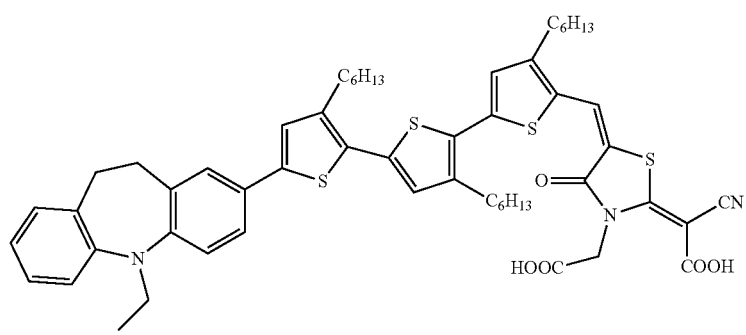
CB-4
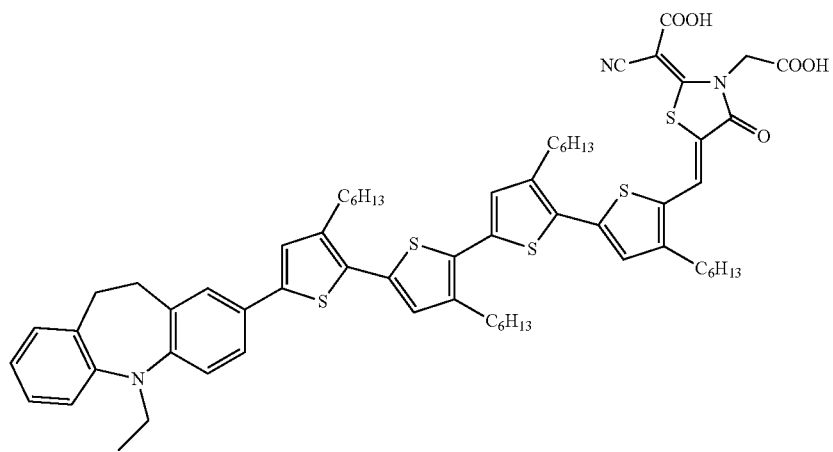
CB-5
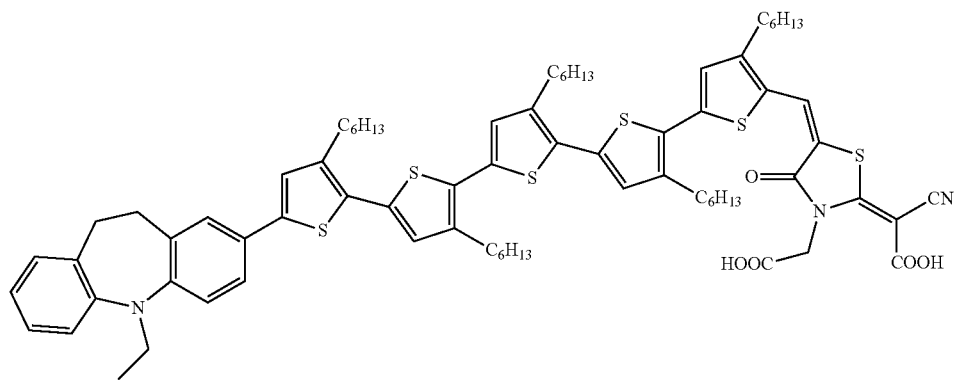

-continued
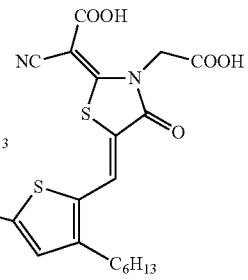
CB-6
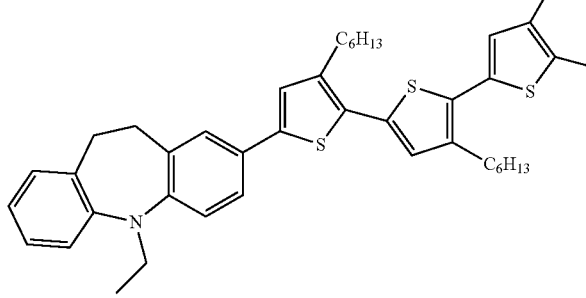
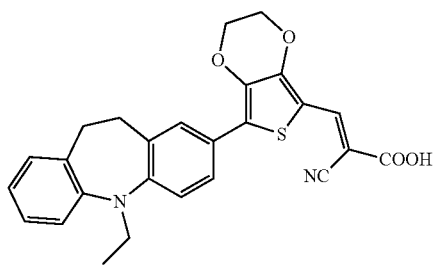
CC-1
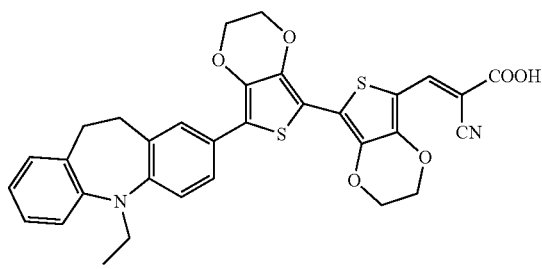
CC-2
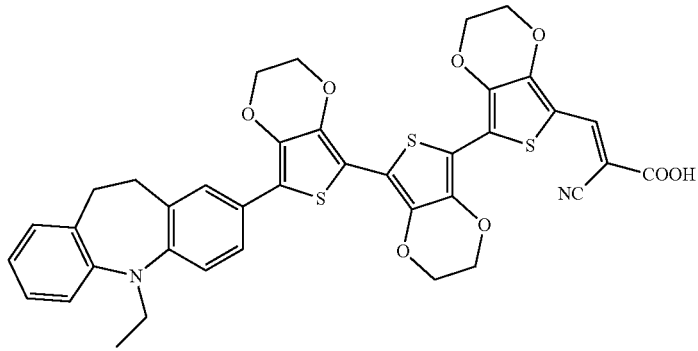
CC-3
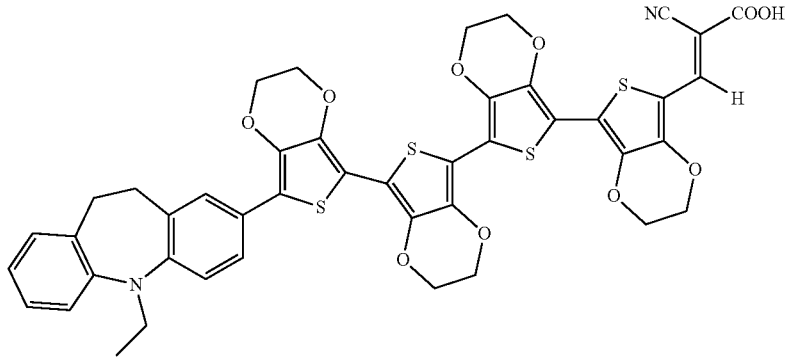
CC-4

-continued
CC-5
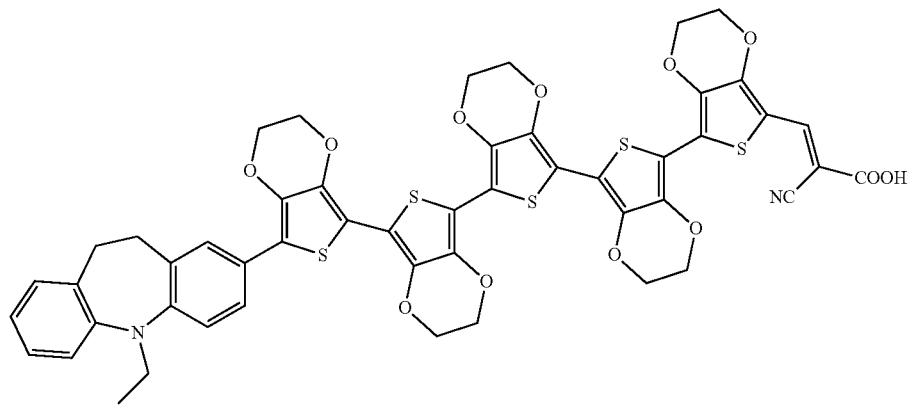
CC-6
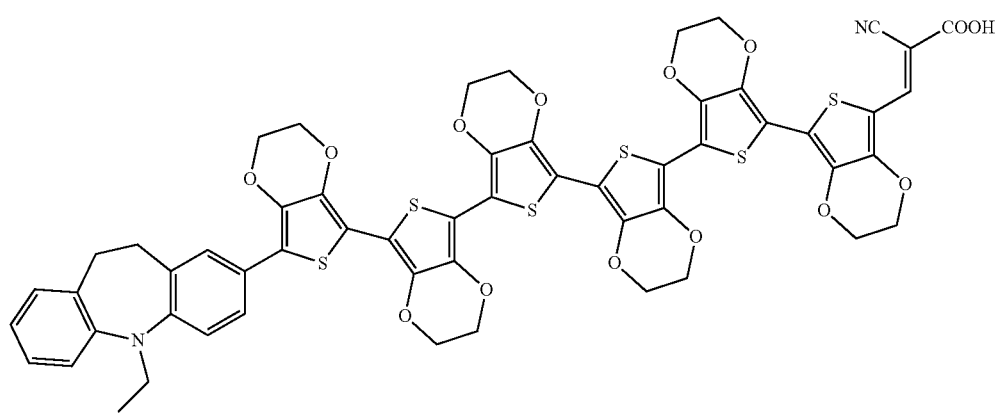
CD-1
CD-2
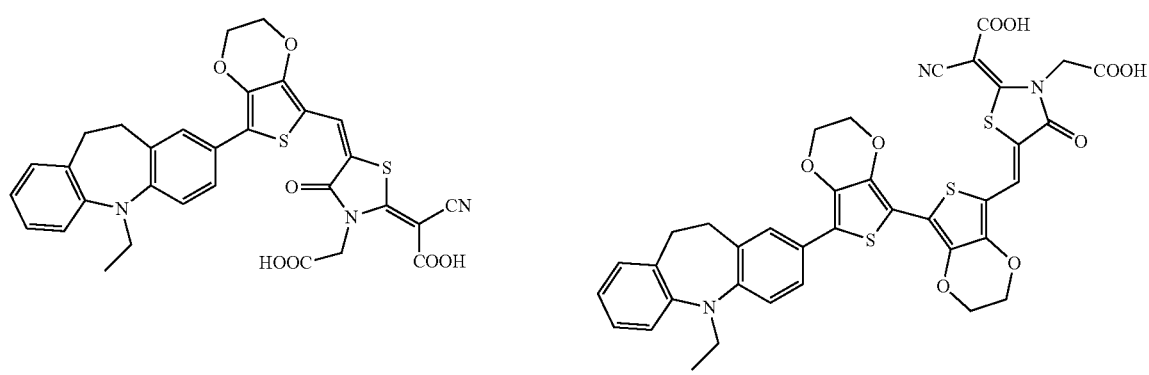
CD-3
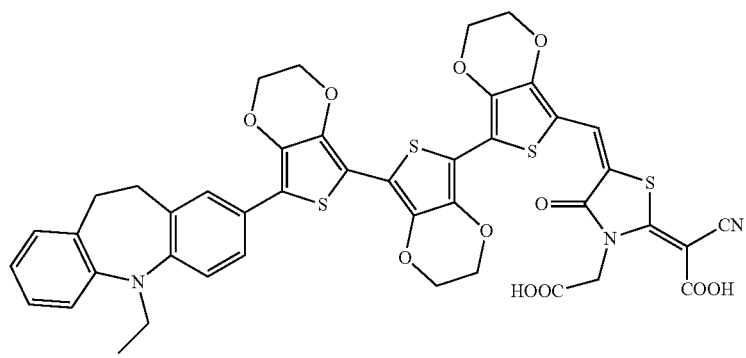

-continued
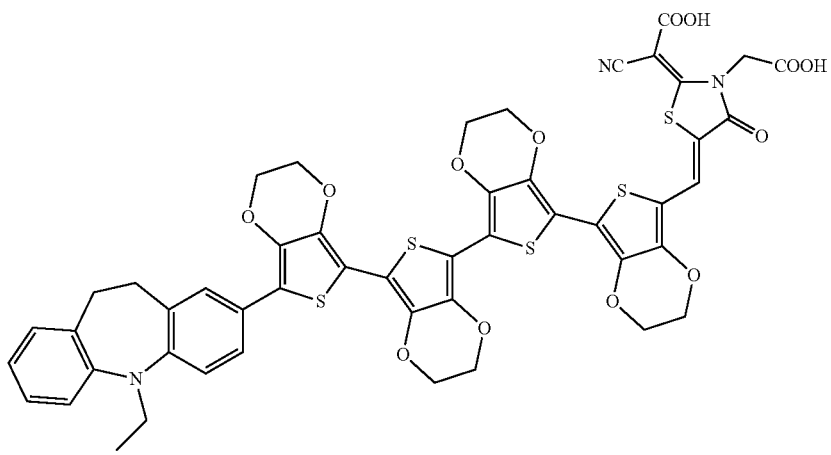
CD-4
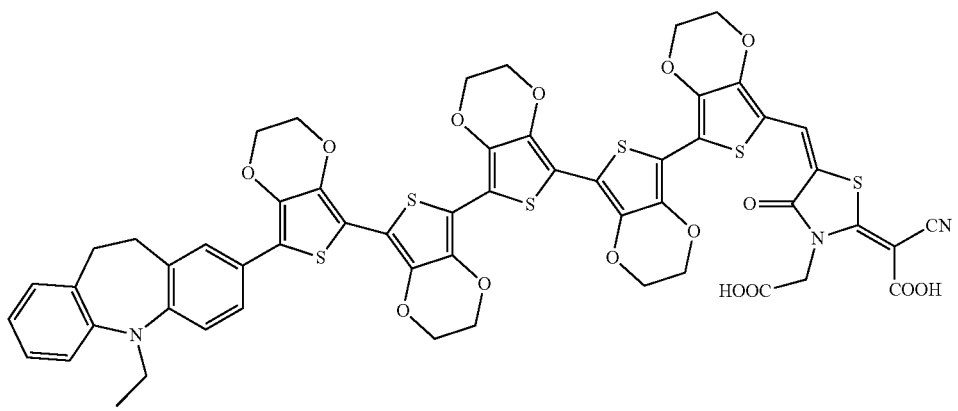
CD-5
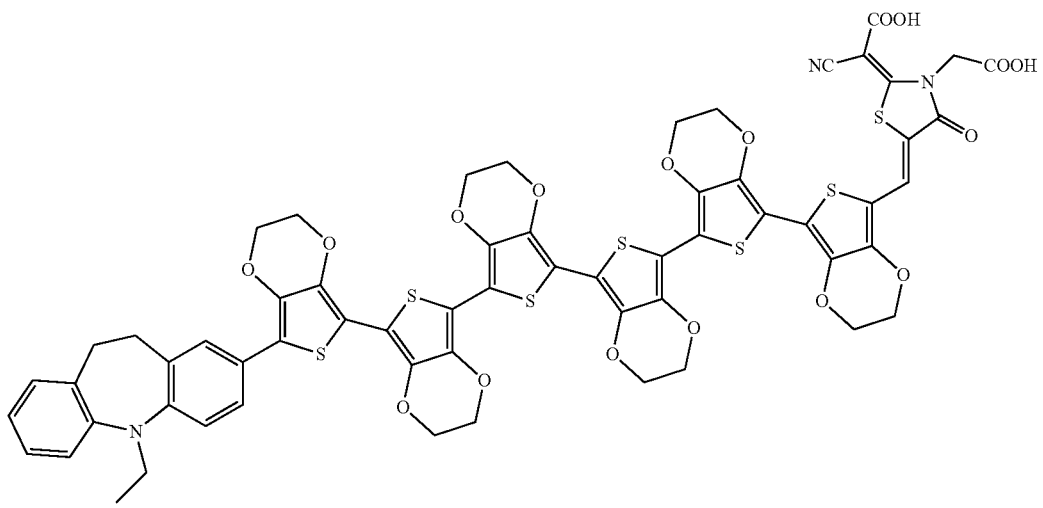
CD-6
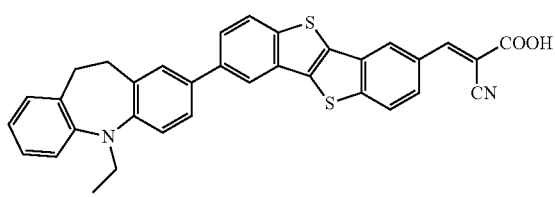
E-1
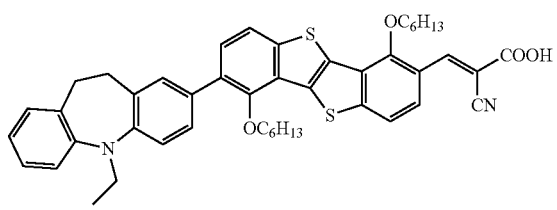
E-2

-continued
F-1
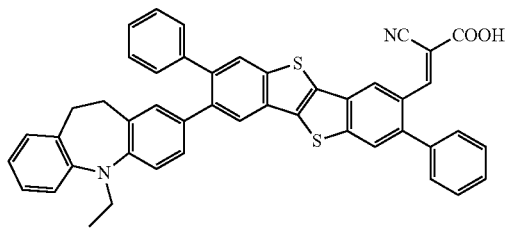
F-2
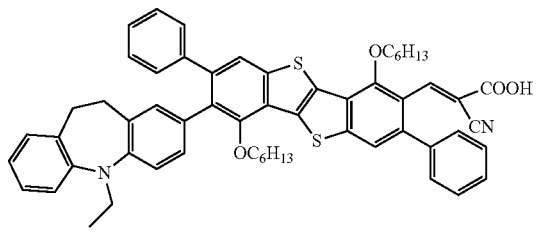
G-1
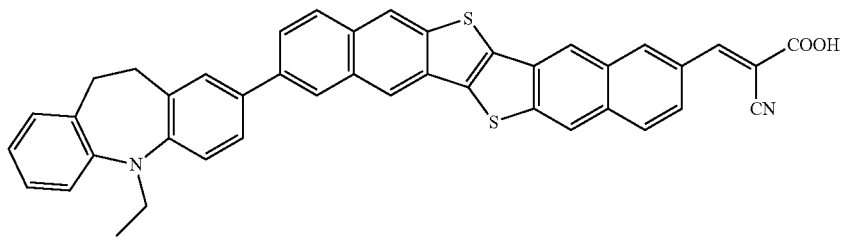
G-2
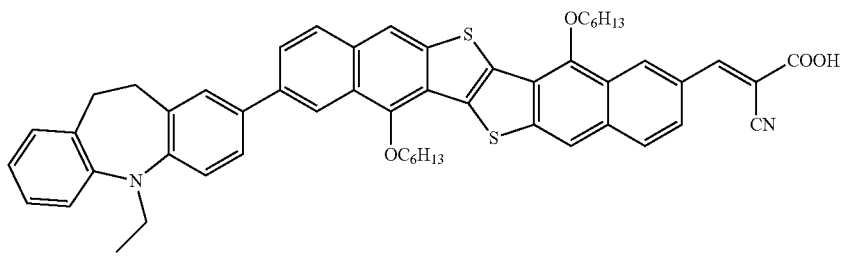
H-1
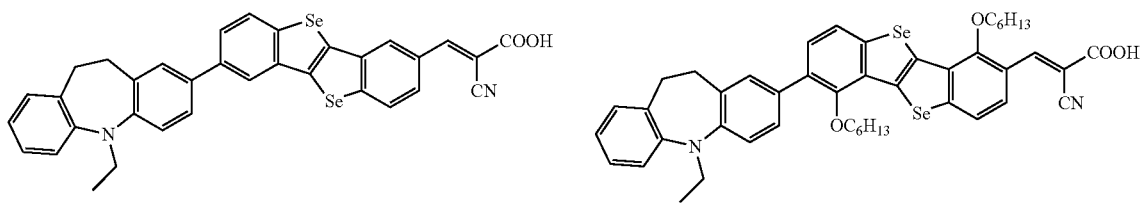
H-2
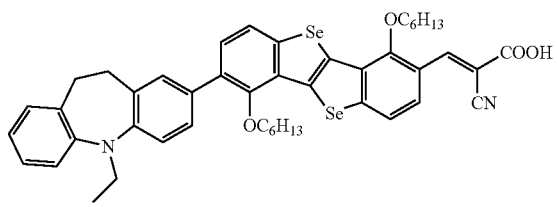
CI-1
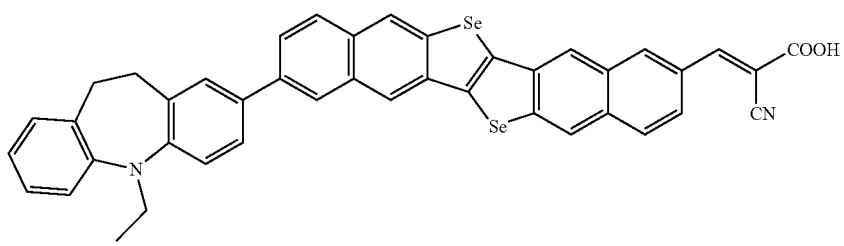
CI-2
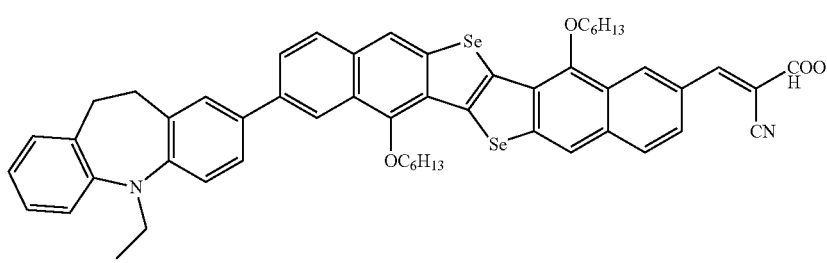

-continued
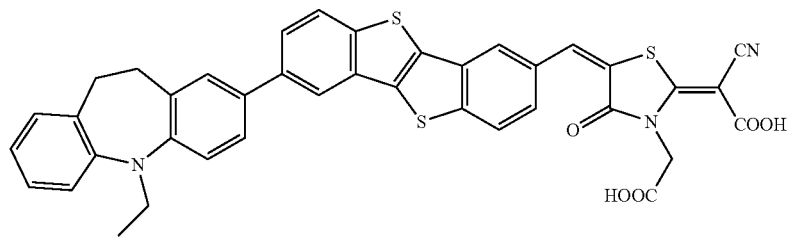
J-1
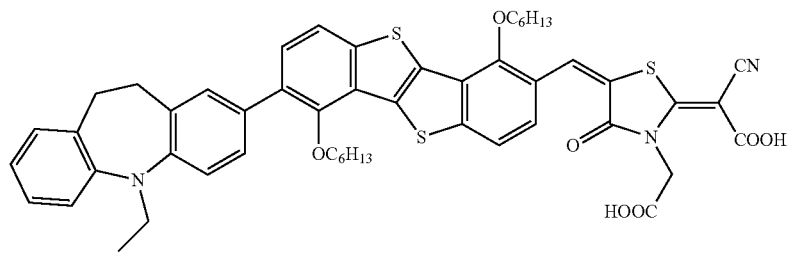
J-2
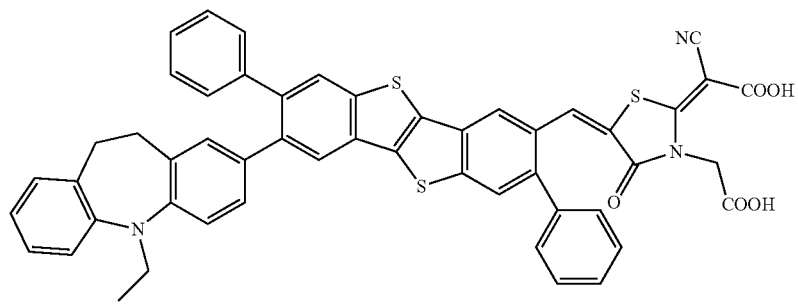
K-1
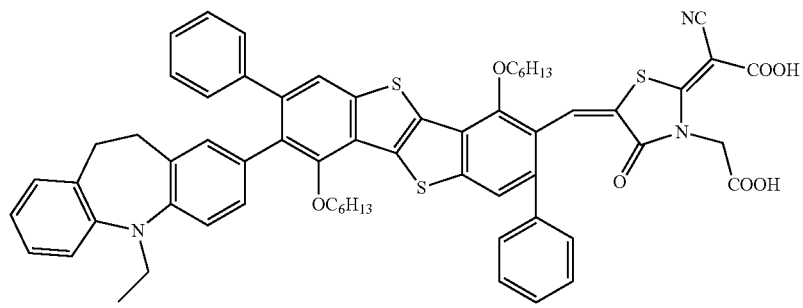
K-2
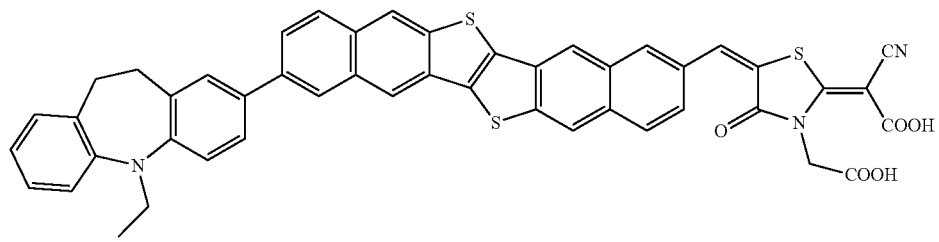
CL-1
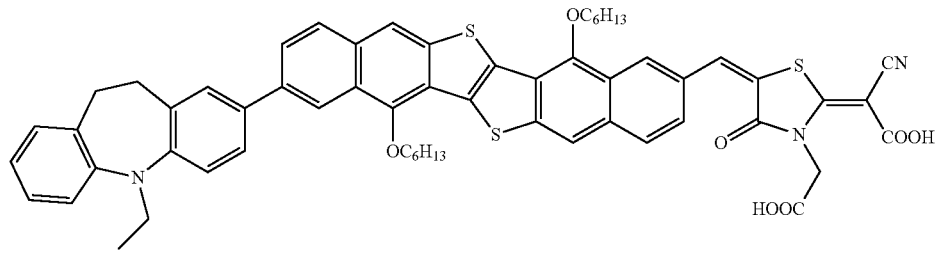
CL-2

-continued
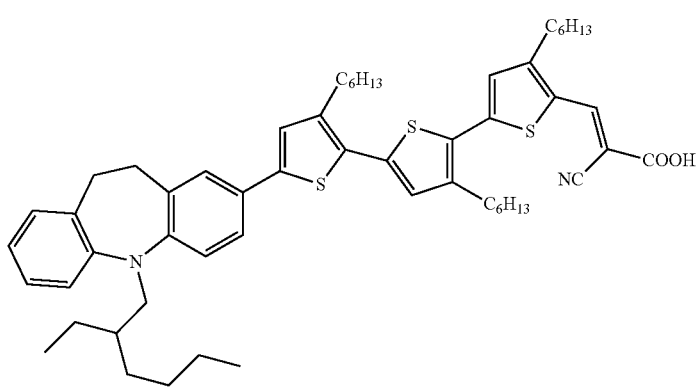
M-1
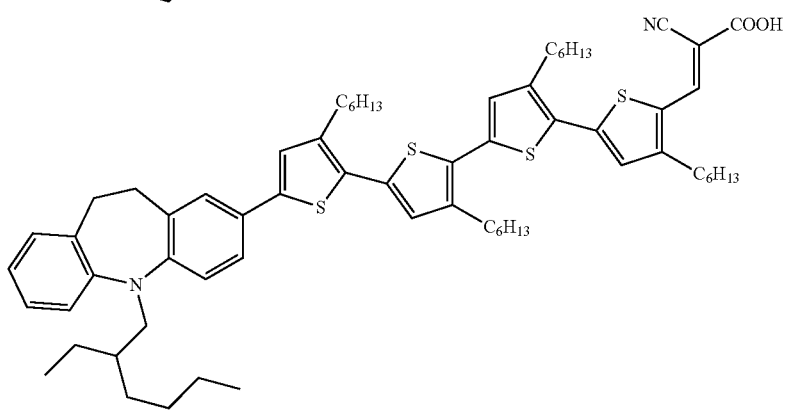
M-2
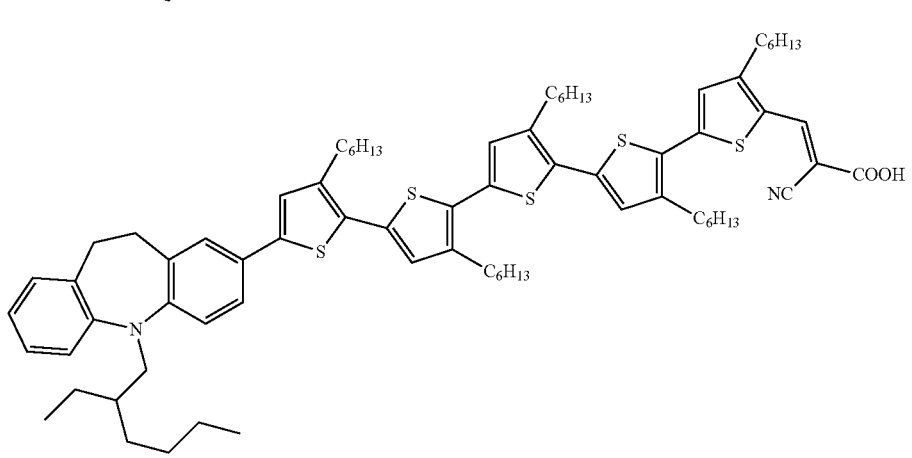
M-3
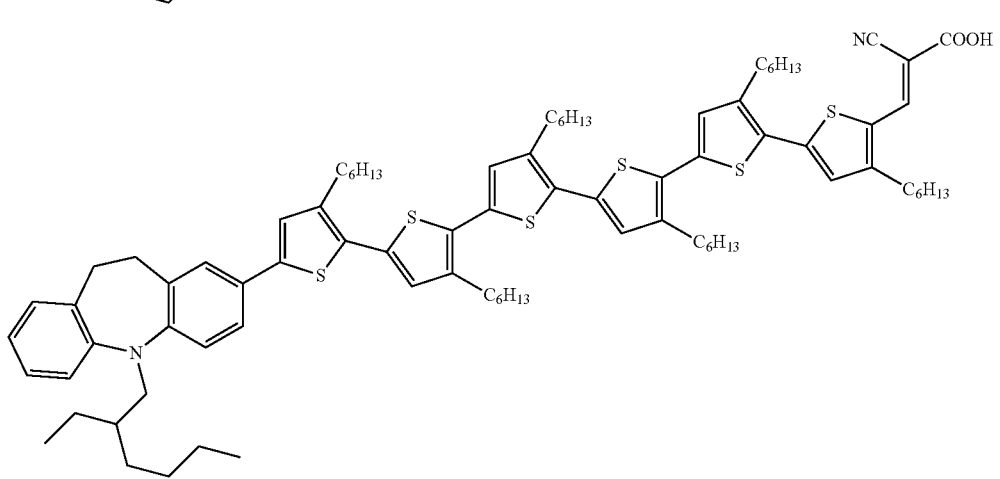
M-4

-continued
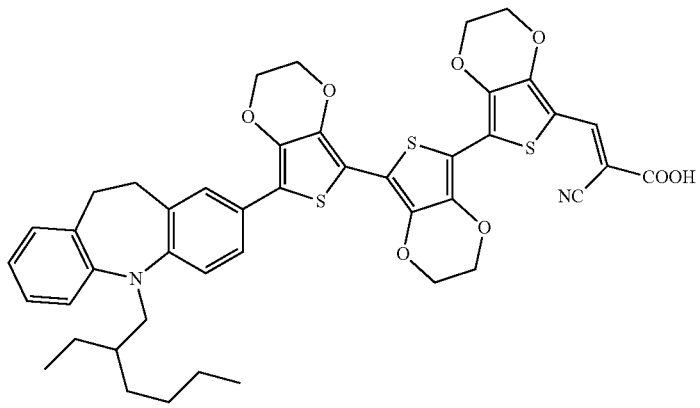
N-1
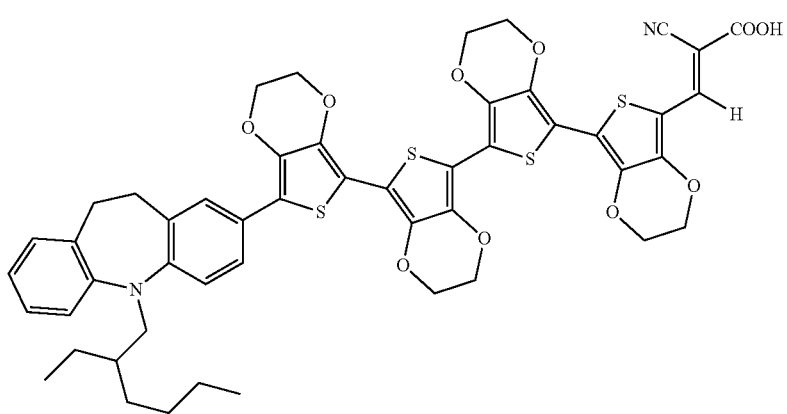
N-2
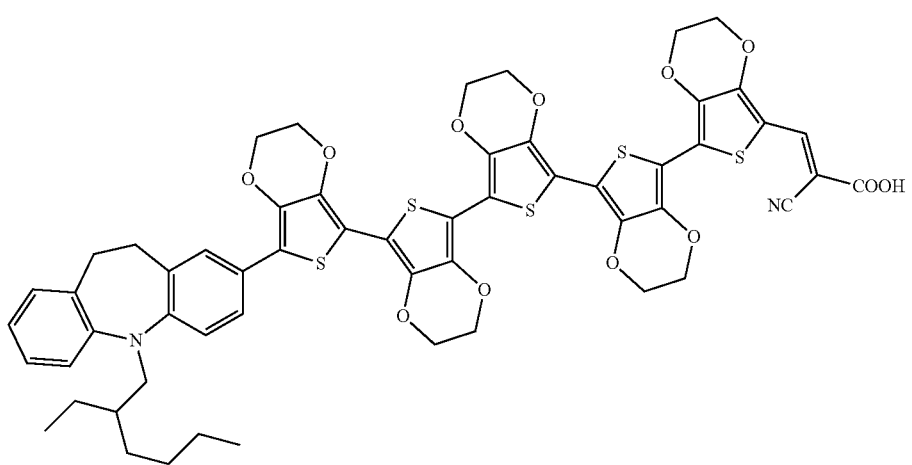
N-3

-continued
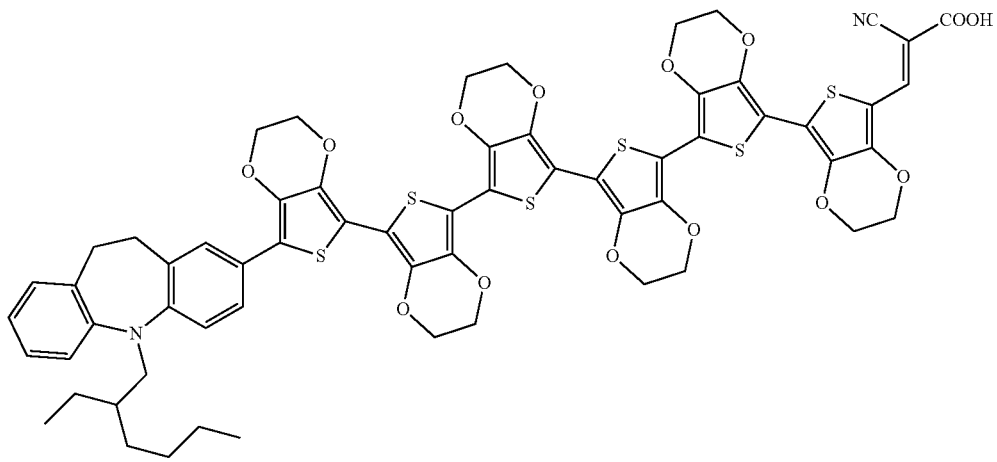
N-4
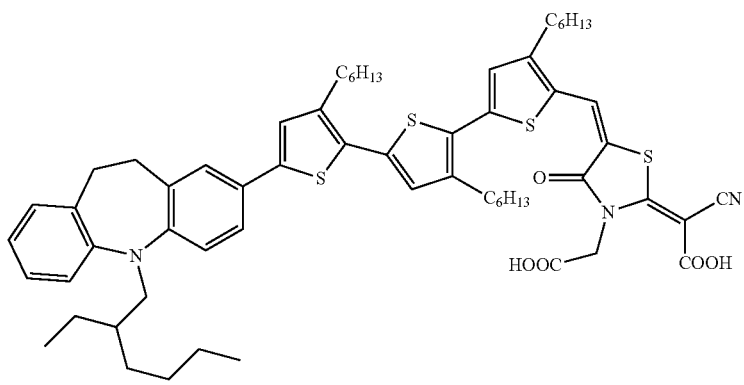
O-1
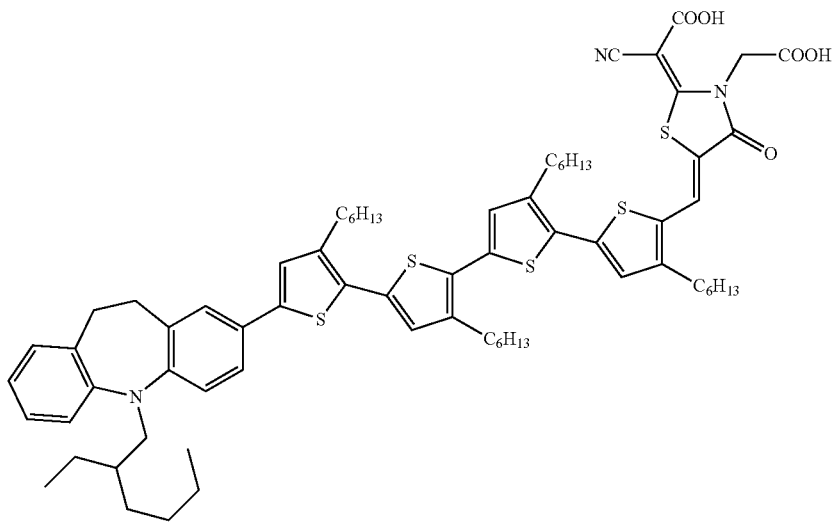
O-2
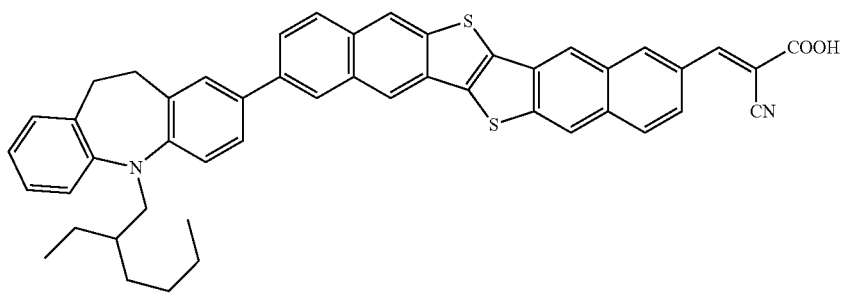
P-1

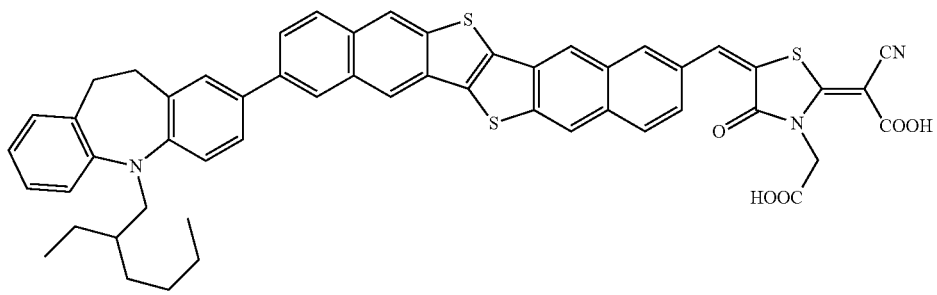
Q-1
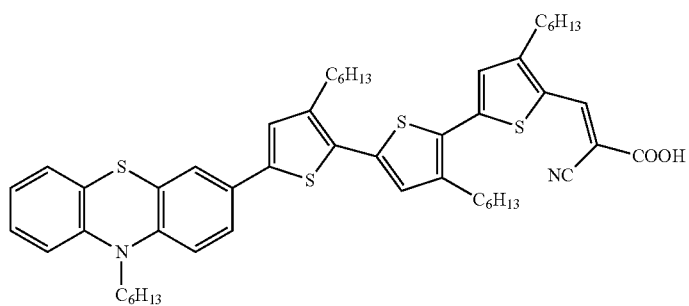
R-1
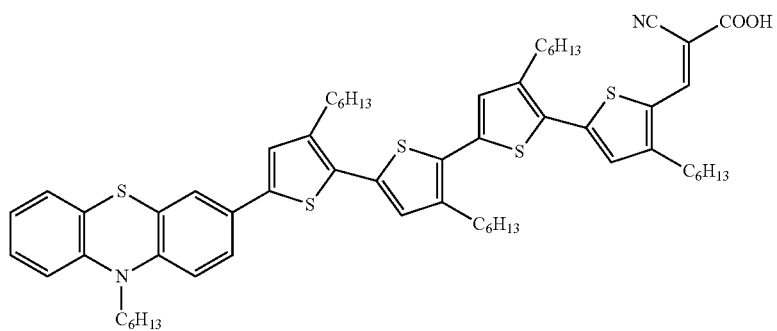
R-2
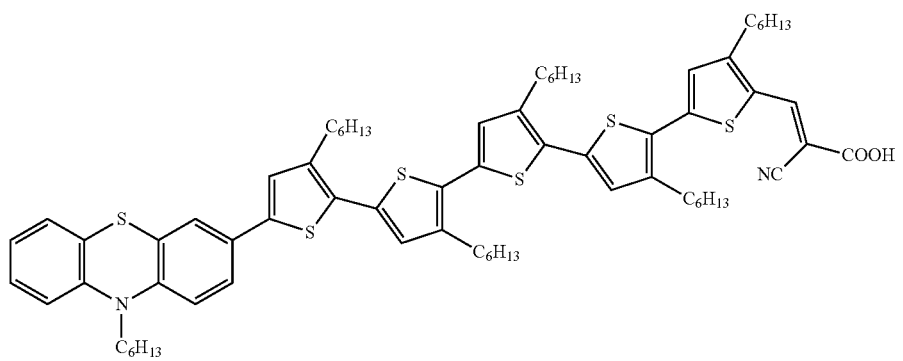
R-3

-continued
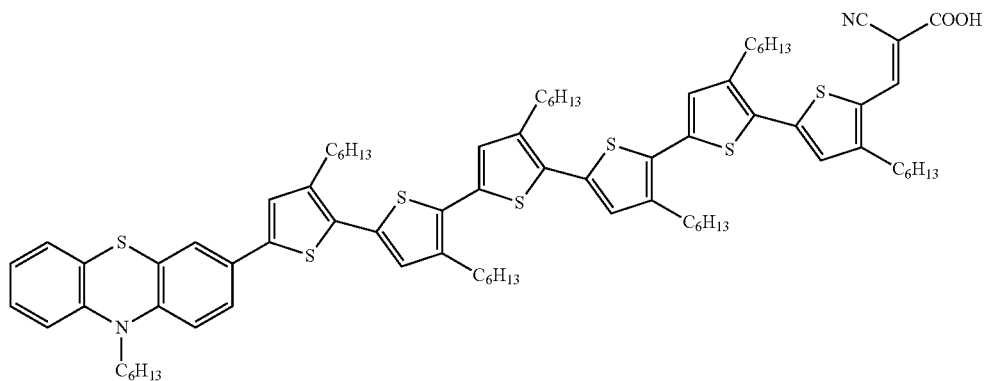
R-4
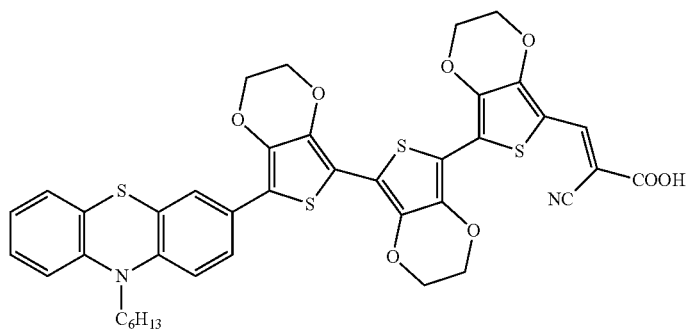
S-1
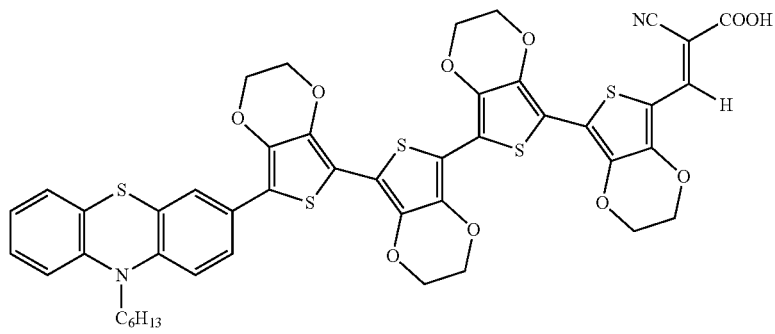
S-2
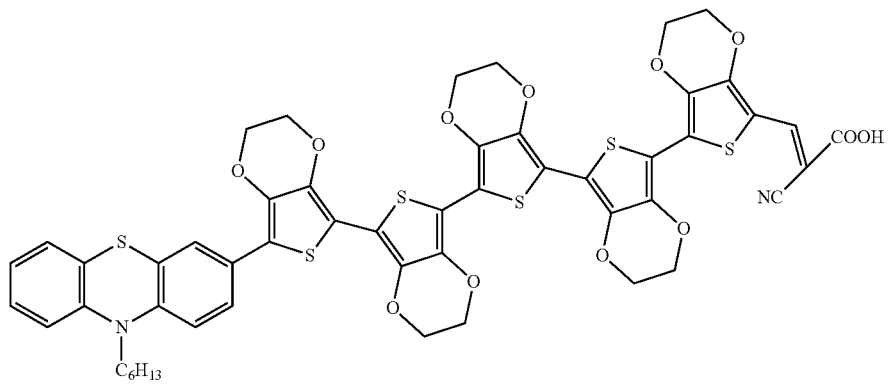
S-3

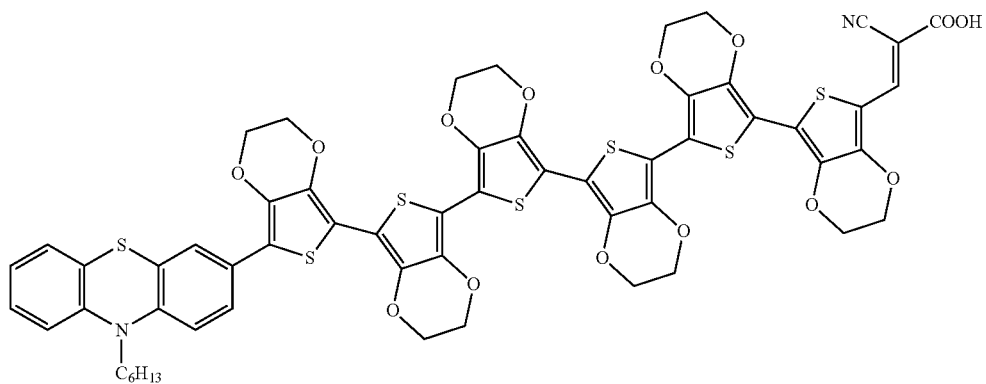
S-4
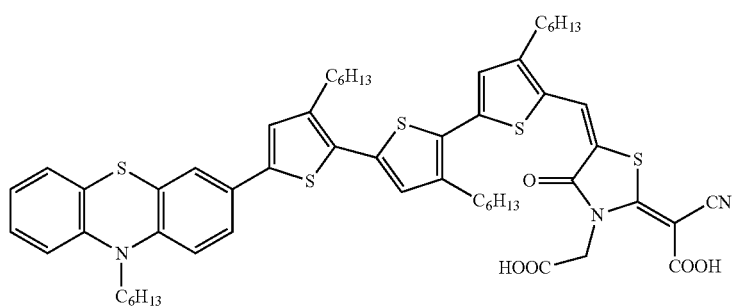
T-1
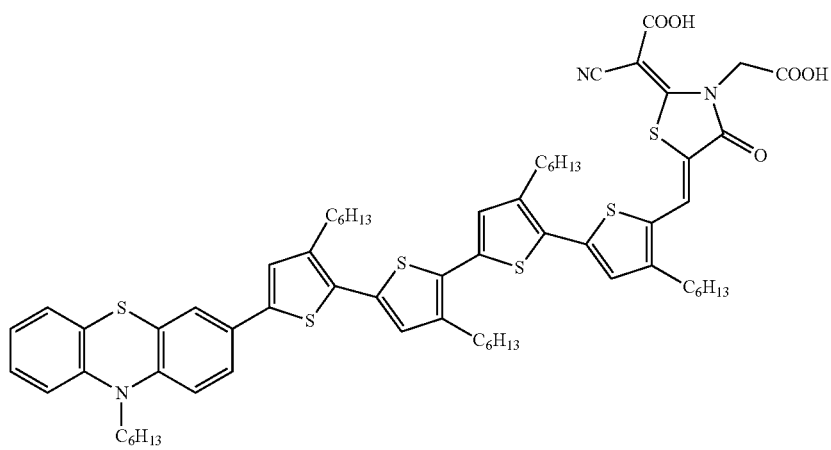
T-2
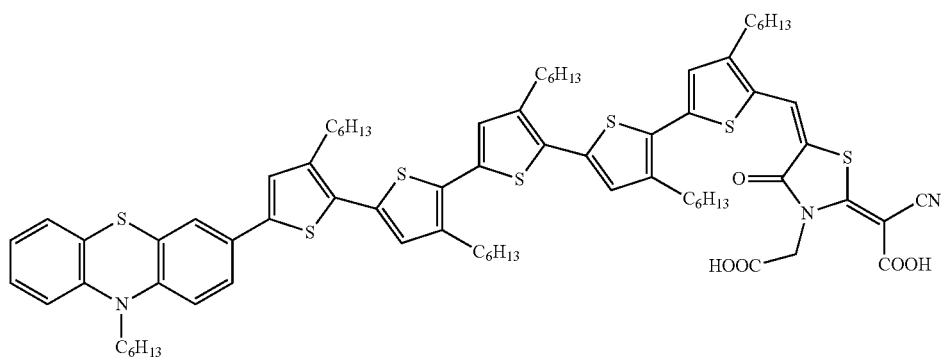
T-3

-continued
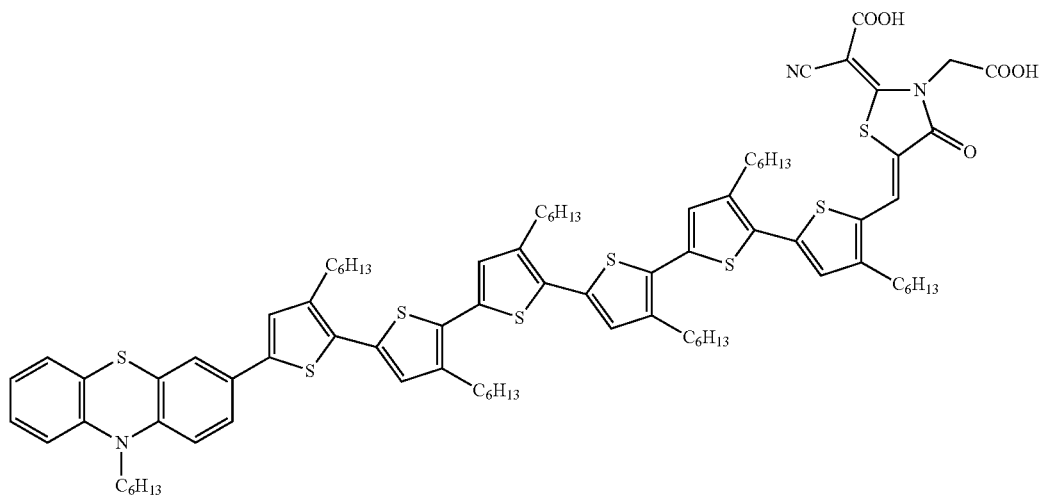
T-4
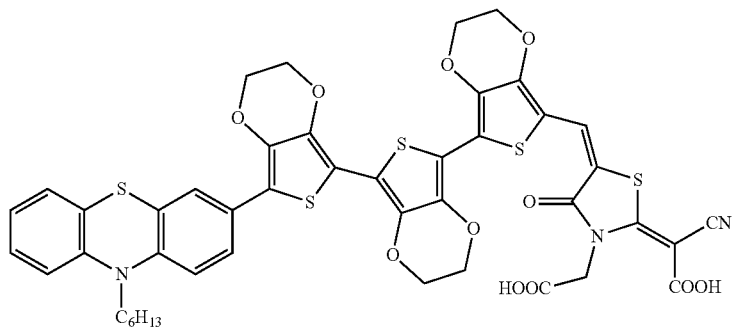
U-1
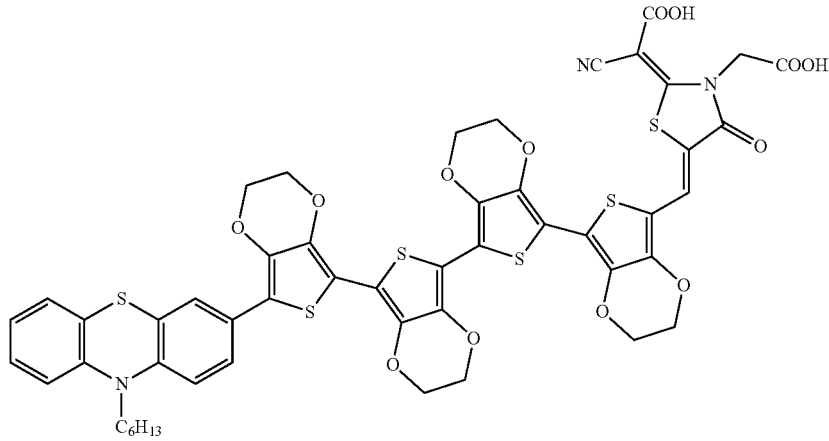
U-2
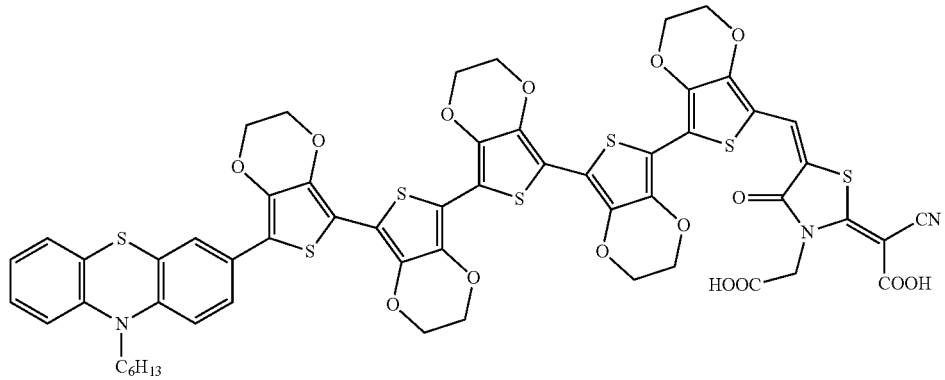
U-3

-continued
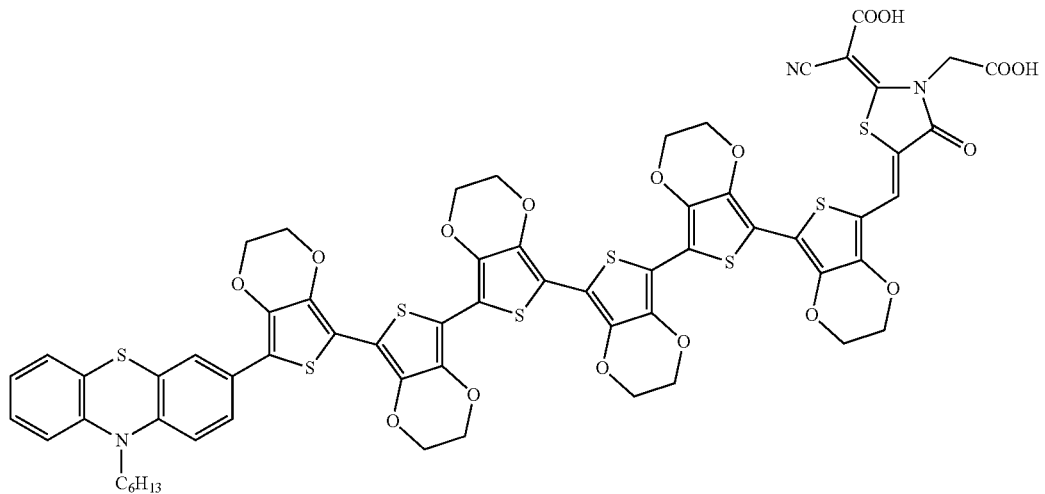
U-4
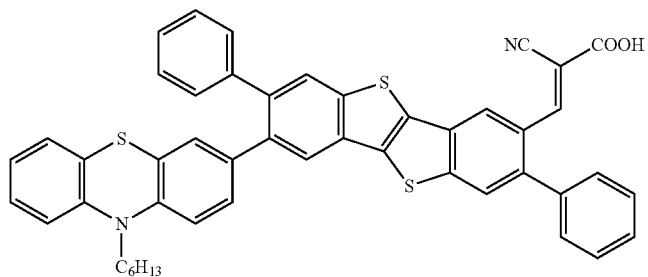
V-1
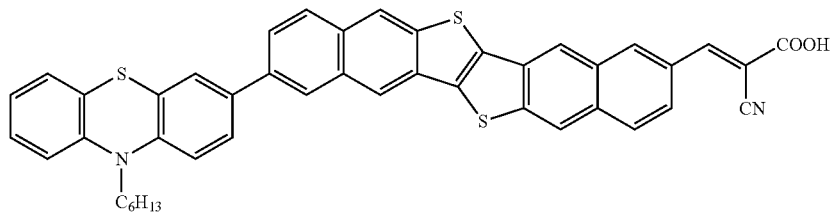
W-1
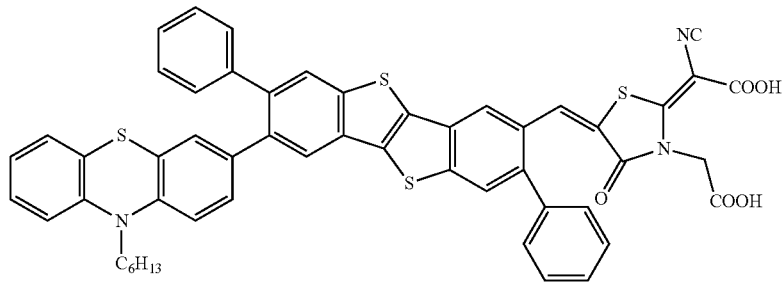
X-1
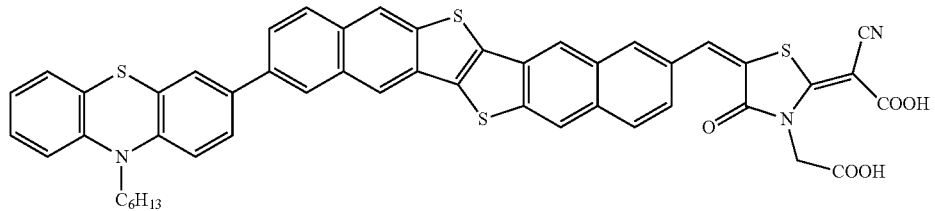
Y-1

-continued
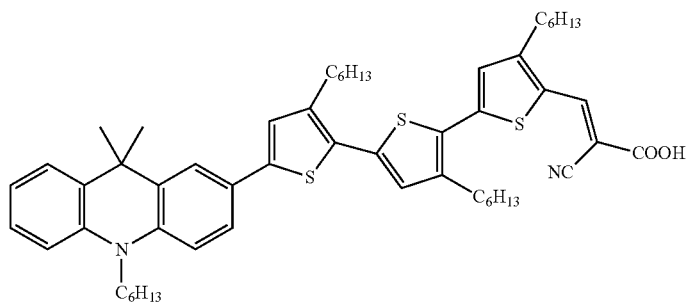
Z-1
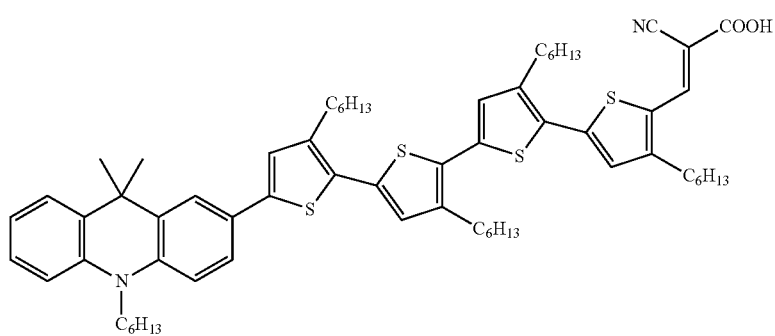
Z-2
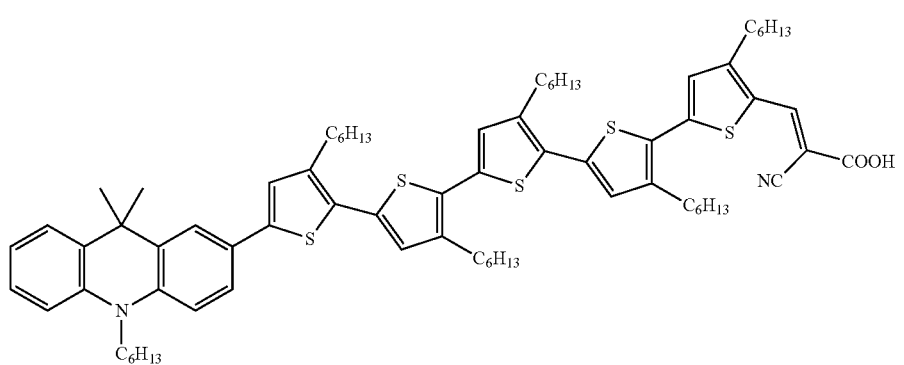
Z-3
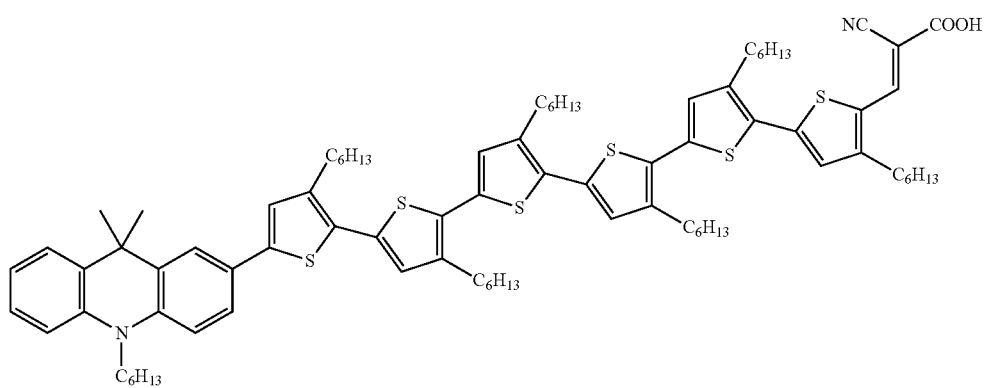
Z-4

-continued
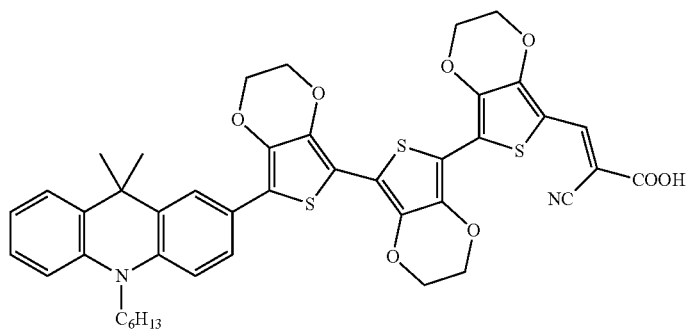
α-1
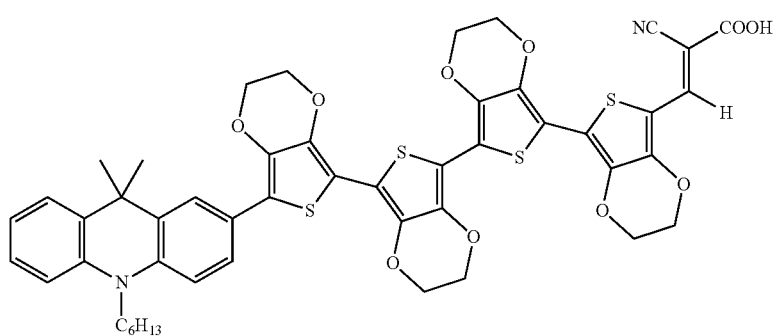
α-2
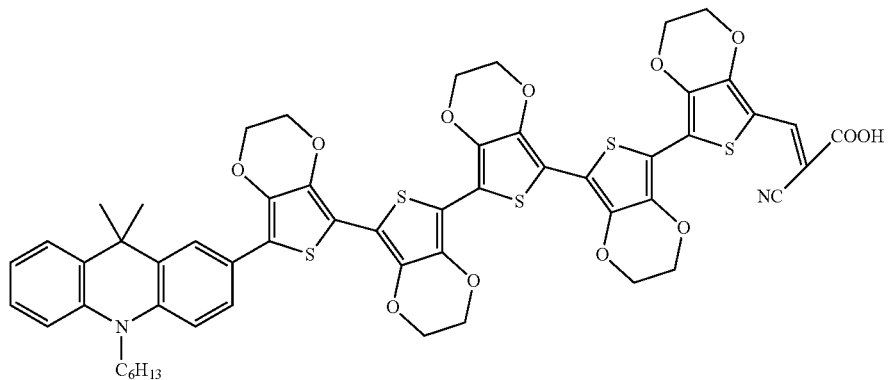
α-3
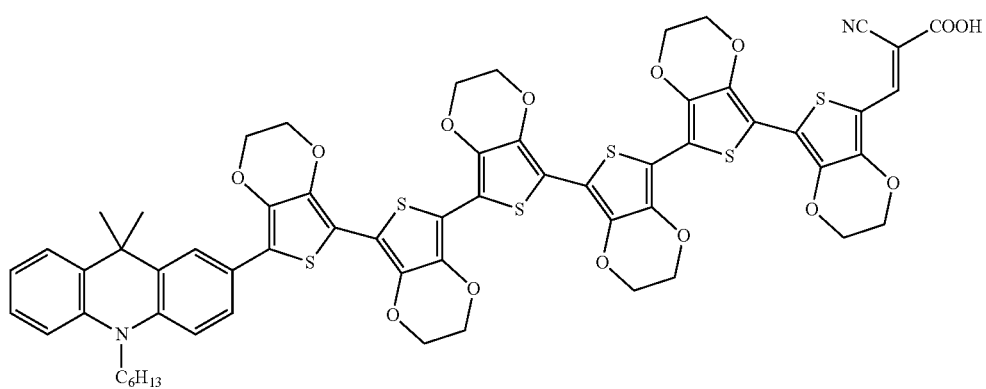
α-4

-continued
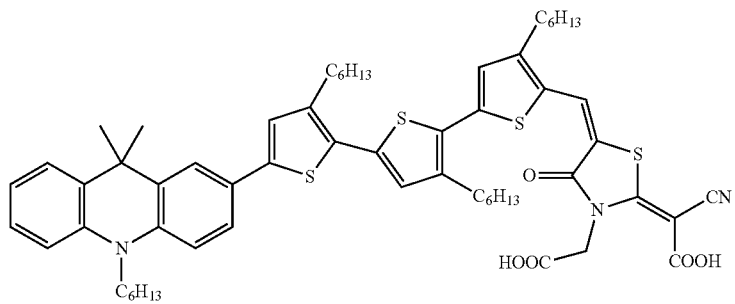
β-1
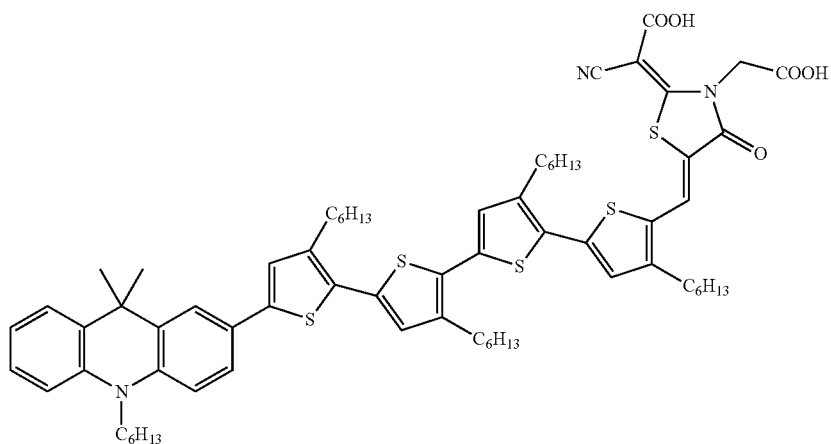
β-2
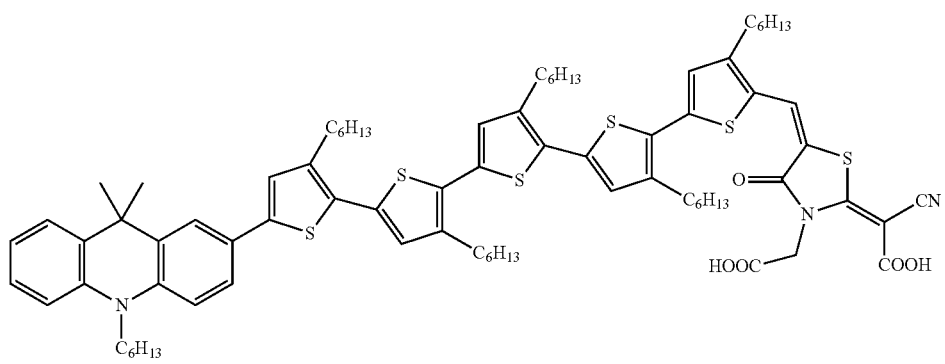
β-3
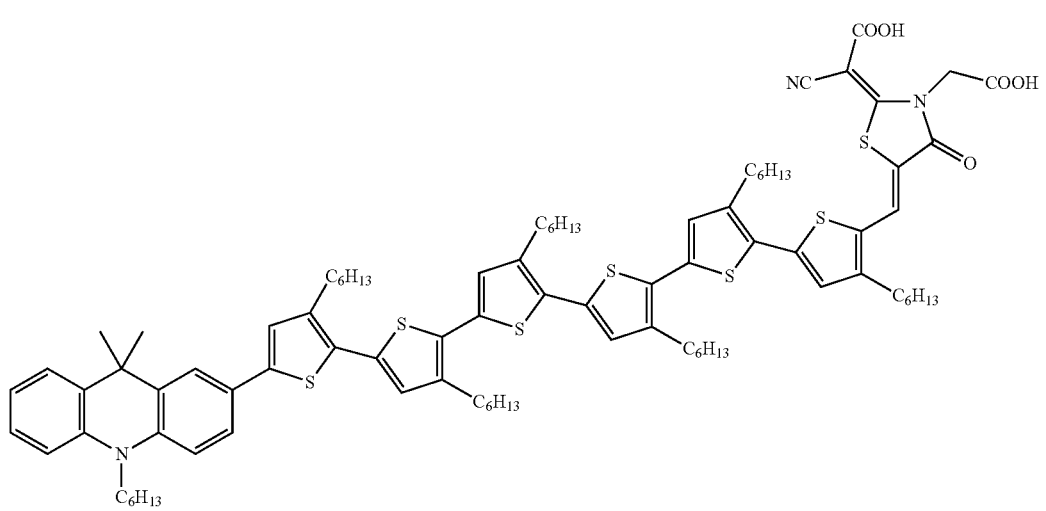
β-4

-continued
γ-1
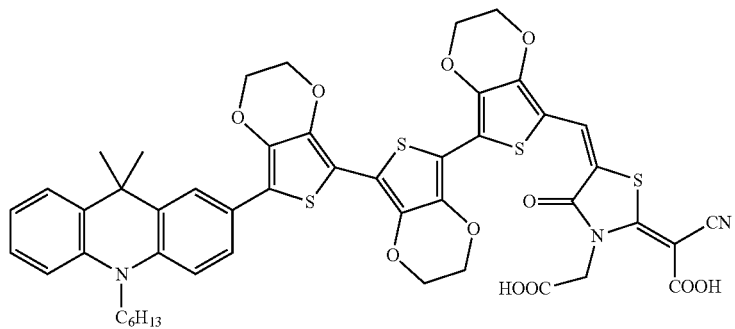
γ-2
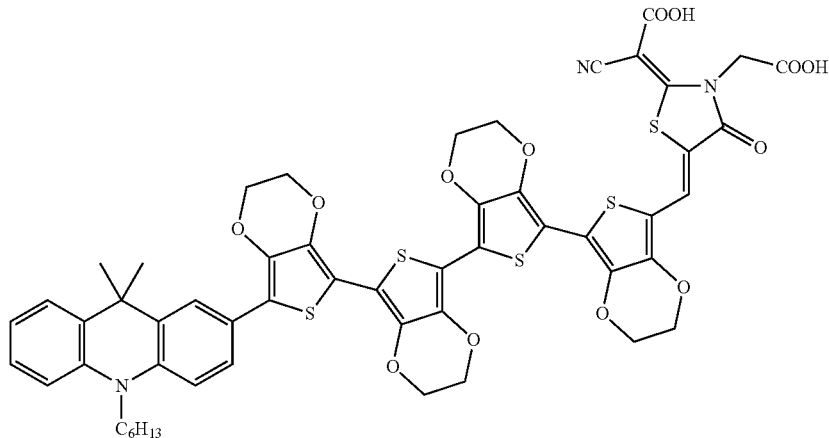
γ-3
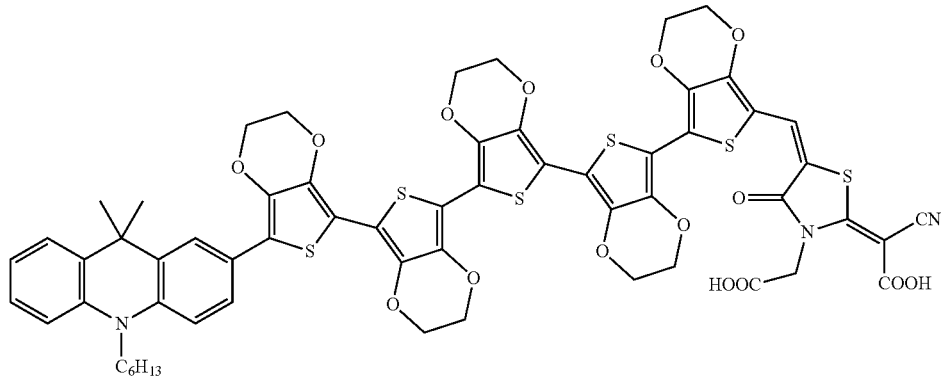
γ-4
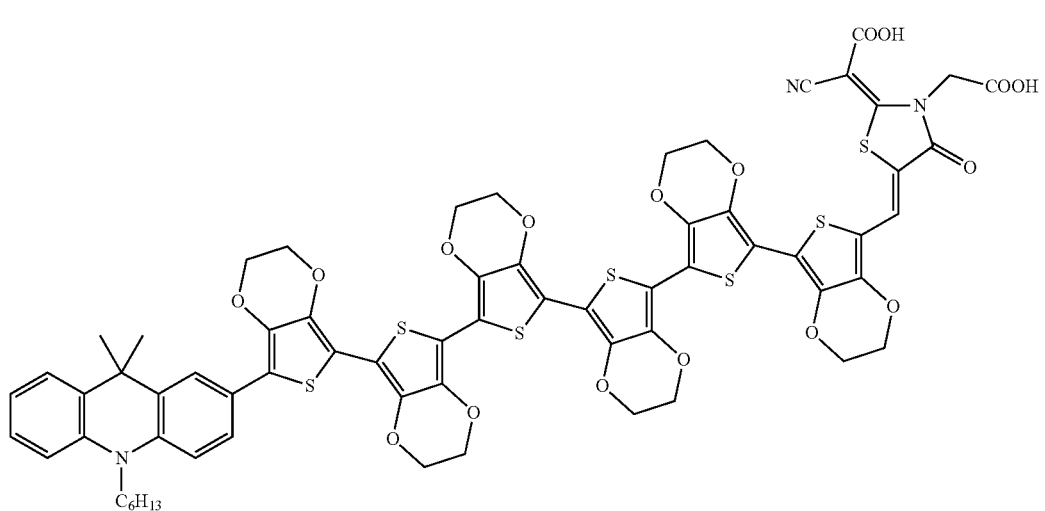

-continued
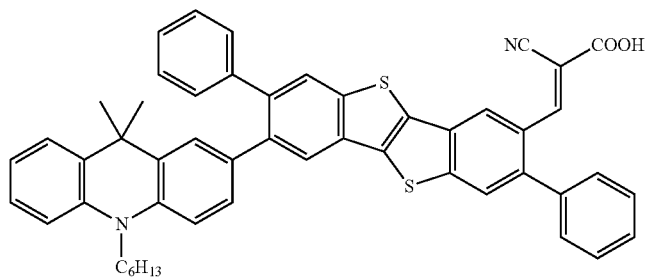
δ-1
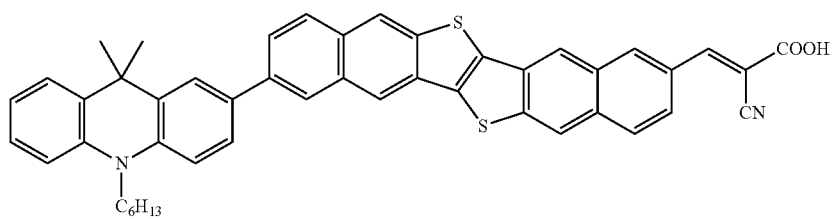
θ-1
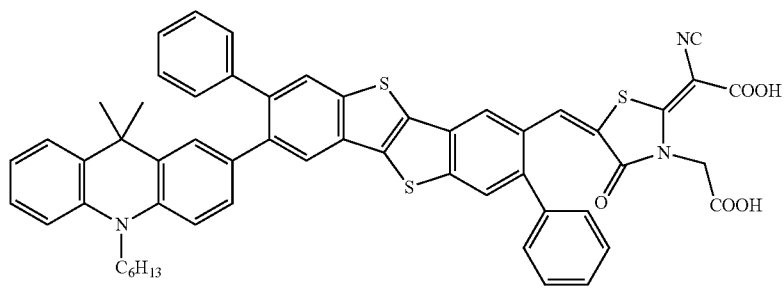
λ-1
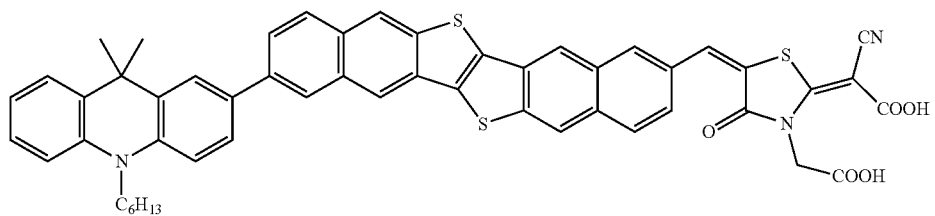
π-1
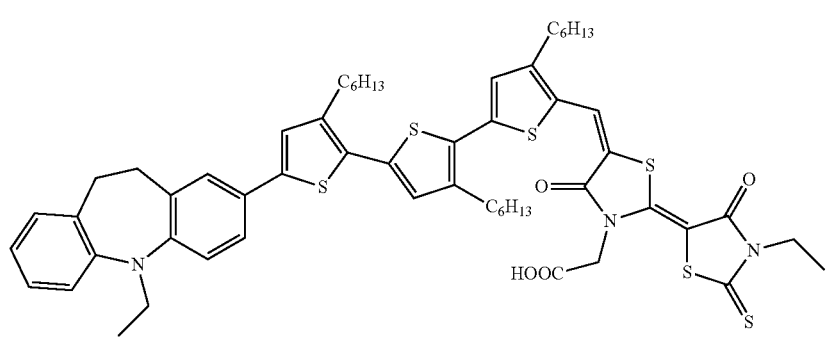
ρ-1

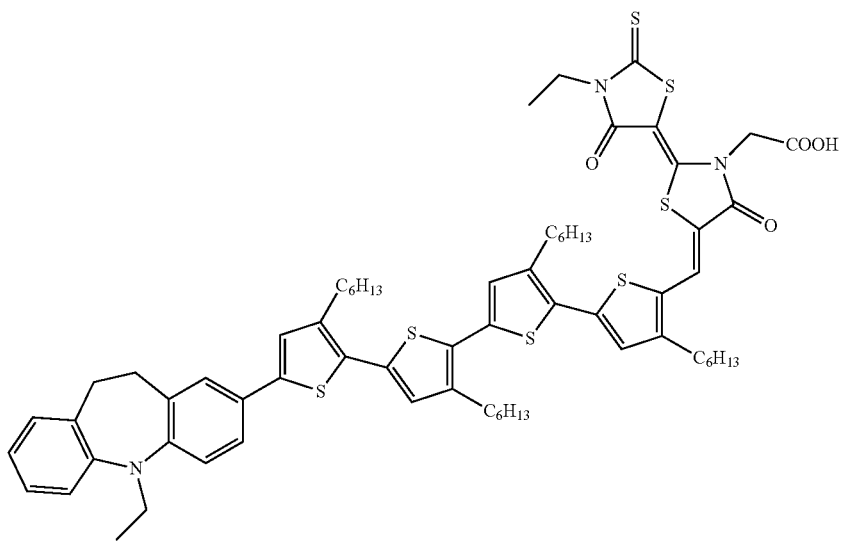
ρ-2
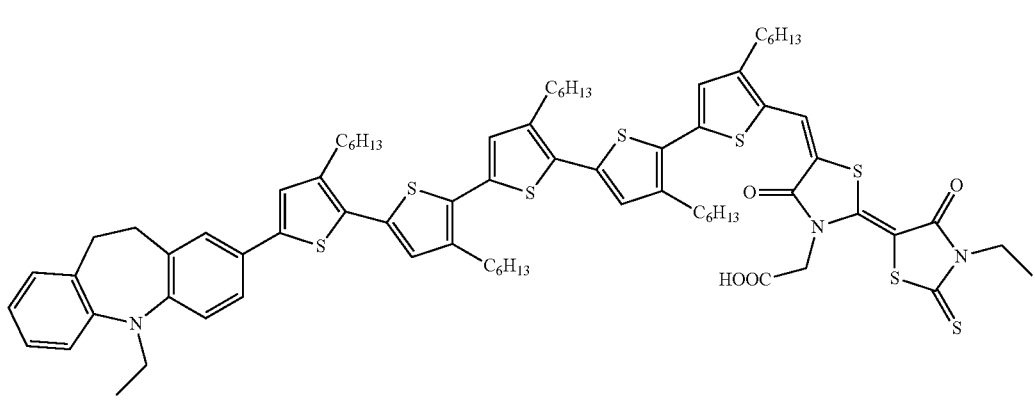
ρ-3
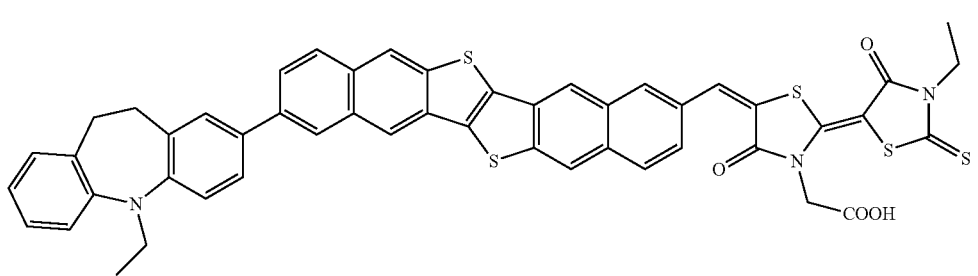
τ-1
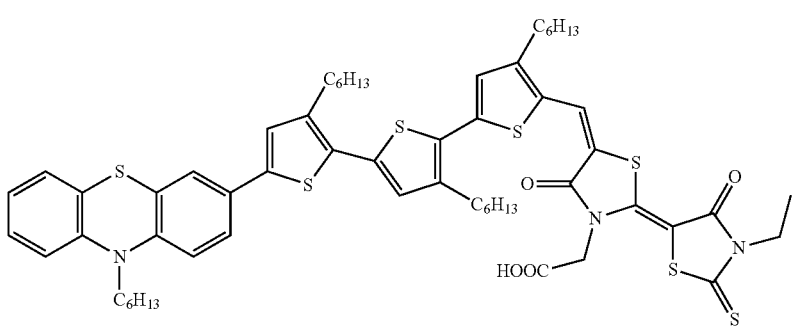
ω-1

The dye of the third invention has a maximum absorption wavelength in a solution in a range of preferably from 350 nm to 1,000 nm, more preferably from 370 nm to 700 nm, and especially still more preferably from 390 nm to 650 nm.

Specific examples of the photoelectric conversion element using any of the dyes of the first invention to the third invention include optical sensors, copying machines, and photoelectrochemical cells. A photoelectrochemical cell is preferred. In the photoelectrochemical cell, the dyes of the present invention act as a sensitizing dye.

A preferred exemplary embodiment of the photoelectric conversion element of the present invention will be explained with reference to the drawing. As shown in FIG. 1, the photoelectric conversion element 10 includes an electrically conductive support 1; a photosensitive layer 2 provided on the electrically conductive support 1, the photosensitive layer having porous semiconductor fine particles to which a dye has been adsorbed; a charge transfer layer 3; and a counter electrode 4. The electrically conductive support 1 having a photosensitive layer 2 provided thereon functions as a working electrode in the photoelectric conversion element 10. This photoelectric conversion element 10 can be operated as a photoelectrochemical cell (not depicted) by making the element usable in a cell application where the cell is made to work with an external circuit 6.

A light-receiving electrode 5 is an electrode comprising an electrically conductive support 1; and a photosensitive layer (semiconductor film layer) 2 coated on the electrically conductive support, the layer containing semiconductor fine particles 22 to which a dye 21 has been adsorbed. A light incident to the photosensitive layer 2 excites the dye. The excited dye has electrons with high energy, and these electrons are transported from the dye 21 to the conduction band of the semiconductor fine particles 22 and further reach the electrically conductive support 1 by diffusion. At this time, the molecules of the dye 21 are in an oxide form; however, in a photoelectrochemical cell, the electrons on the electrode return to the oxide of the dye while working in the external circuit, while the light-receiving electrode 5 works as a negative electrode of this cell.

Regarding materials used for a photoelectric conversion element and a photoelectrochemical cell, and a method of producing each member in the present invention, ordinary ones in this art may be used, and these materials and methods may be referred to, for example, U.S. Pat. No. 5,463,057, U.S. Pat. No. 5,525,440, JP-A-7-249790, JP-A-2004-220974 and JP-A-2008-135197. Hereinafter, principal members are described appropriately with reference to the drawing.

(A) Electrically Conductive Support

As shown in FIG. 1, the photoelectric conversion element of the present invention makes use of an electrically conductive support 1. As the electrically conductive support, a support having electroconductivity per se, such as a metal, or a glass or polymeric material having an electrically conductive layer on the surface can be used. It is preferable that the electrically conductive support is substantially transparent. The terms "substantially transparent" means that the transmittance of light is 10% or more, preferably 50% or more, particularly preferably 80% or more. As the electrically conductive support, a support formed from glass or a polymeric material and coated with an electrically conductive metal oxide can be used. In this case, the amount of coating of the conductive metal oxide is preferably 0.1 to 100 g per square meter of the support made of glass or a polymeric material. In the case of using a transparent conductive support, it is preferable that light is incident from the support side. Examples of the polymeric material that may be preferably used include tetraacetylcellulose (TAC), polyethylene terephthalate (PET), polyethylene naphthalate (PEN), syndiotactic polystyrene (SPS), polyphenylene sulfide (PPS), polycarbonate (PC), polyarylate (PAR), polysulfone (PSF), polyester sulfone (PES), polyether imide (PEI), cyclic polyolefin, and phenoxy bromide. The electrically conductive support may be provided with a light management function at the surface, and for example, the anti-reflective film having a high refractive index film and a low refractive index oxide film alternately laminated as described in JP-A-2003-123859, and the light guide function as described in JP-A-2002-260746 may be mentioned.

In addition to the above, a metallic support can also be preferably used. Examples thereof include titanium, aluminum, copper, nickel, iron, stainless steel and copper. These metals may be alloys. Among these, titanium, aluminum and copper are further preferable; and titanium and aluminum are particularly preferable.

It is preferable to provide the electrically conductive support with a function of blocking ultraviolet light. For instance, there may be mentioned a method of adopting a fluorescent material that is capable of changing ultraviolet light to visible light as described in JP-A-2001-185242, within the transparent support or on the surface of the transparent support. As another preferred method, a method of using an ultraviolet absorbent may also be used. Preferred examples thereof include those described in, for example, JP-A-11-345991, JP-A-2002-25634, JP-A-2003-21769, JP-A-2004-227843, JP-A-2004-349129, JP-A-2002-134178 and JP-A-2003-100358.

The conductive support may also be imparted with the functions described in JP-A-11-250944, JP-A-2003-308892 and JP-A-2003-282163.

Preferred examples of the electrically conductive film include films of metals (for example, platinum, gold, silver, copper, aluminum, rhodium, and indium), carbon, and electrically conductive metal oxides (for example, indium-tin composite oxide, and fluorine-doped tin oxide). Preferred examples of the electrically conductive film and the producing method of the same include those described in, for example, JP-A-2003-151355, JP-A-2004-311174, JP-A-2004-311175, JP-A-2004-311176, JP-A-2005-85699, JP-A-2005-85670, JP-A-2005-116391, JP-A-2003-323818, JP-A-2004-165080, and JP-A-2005-141981.

The thickness of the conductive film layer is preferably 0.01 to 30 µm, more preferably 0.03 to 25 µm, and particularly preferably 0.05 to 20 µm.

In the present invention, an electrically conductive support having lower surface resistance is preferred. The surface resistance is preferably in the range of 50 $\Omega/cm^2$ or less, and more preferably 10 $\Omega/cm^2$ or less. The lower limit of the surface resistance is not particularly limited, but the lower limit is usually about 0.1 $\Omega/cm^2$.

Since the resistance value of the electrically conductive film is increased as the cell area increases, a collecting electrode may be disposed. Preferred examples of the shape and material of the collecting electrode include those described in, for example, JP-A-11-266028, JP-A-2005-108467, JP-A-2003-203681, JP-A-2004-146425, JP-A-2004-128267, JP-A-2004-164970, JP-A-2004-327226, JP-A-2004-164950, JP-A-2005-78857, JP-A-2005-197176, JP-A-2004-164950, JP-A-2000-285977, JP-A-2002-314108, and JP-A-2003-123858.

As described in JP-A-2000-285974, a gas barrier film and/or an ion diffusion preventing film may be disposed between the support and the transparent conductive film.

The gas barrier layer may be any of a resin film (see, for example, JP-A-2000-282163 or JP-A-2005-142086) or an inorganic film (see, for example, JP-A-2005-142086).

Furthermore, a transparent electrode and a porous semiconductor electrode photocatalyst-containing layer may also be provided, as described in JP-A-2005-142084 or JP-A-2005-142085.

The transparent conductive layer may have a laminate structure, and preferred examples of the production method include the method of laminating FTO on ITO as described in JP-A-2003-323818, as well as the methods described in JP-A-2005-44544, JP-A-2005-142088, JP-A-2005-19205, JP-A-2004-241228 and JP-A-2004-319872.

(B) Semiconductor Fine Particles

As shown in FIG. 1, in the photoelectric conversion element of the present invention, the photosensitive layer 2 in which the dye 2 is adsorbed on the porous semiconductor fine particles 22 is formed on the electrically conductive support 1. As described below, for example, a dispersion liquid of semiconductor fine particles is coated on the above-described electrically conductive support and dried, and then the resultant support is soaked in a solution of the dye of the present invention, thereby making it possible to produce a photosensitive layer.

Regarding the semiconductor fine particles, fine particles of chalcogenides of metals (for example, oxides, sulfides and selenides), or fine particles of perovskites may be used with preference. Preferred examples of the chalcogenides of metals include oxides of titanium, tin, zinc, tungsten, zirconium, hafnium, strontium, indium, cerium, yttrium, lanthanum, vanadium, niobium or tantalum, cadmium sulfide, and cadmium selenide. Preferred examples of the perovskites include strontium titanate, and calcium titanate. Among these, titanium oxide, zinc oxide, tin oxide, and tungsten oxide are particularly preferred.

Semiconductors are classified into n-type semiconductors in which the carrier associated with conduction is electron, or p-type semiconductors in which the carrier is a hole. It is preferable to use an n-type semiconductor in the present invention, in view of the conversion efficiency. The n-type semiconductors include an intrinsic semiconductor (or true semiconductor) which does not have an impurity level, and has equal concentrations of the carriers consisting of the conduction band electrons and the valence band holes, as well as an n-type semiconductor having a higher concentration of the electron carrier due to the structural defect originating from impurities. Examples of the n-type inorganic semiconductors that may be preferably used in the present invention include $TiO_2$, $TiSrO_3$, $ZnO$, $Nb_2O_3$, $SnO_2$, $WO_3$, $Si$, $CdS$, $CdSe$, $V_2O_5$, $ZnS$, $ZnSe$, $SnSe$, $KTaO_3$, $FeS_2$, $PbS$, $InP$, $GaAs$, $CuInS_2$, and $CuInSe_2$. Among these, most preferred examples of the n-type semiconductors include $TiO_2$, $ZnO$, $SnO_2$, $WO_3$ and $Nb_2O_3$. A composite semiconductor material composed of plural kinds of these semiconductors is also used with preference.

The particle size of the semiconductor fine particles is such that, for the purpose of maintaining the viscosity of the semiconductor fine particle dispersion liquid high, the average particle size of the primary particles is preferably from 2 nm to 50 nm, and it is more preferable that the semiconductor fine particles are ultrafine particles having an average particle size of the primary particles of from 2 nm to 30 nm. Two or more kinds of fine particles having different particle size distributions may be used in mixture, and in this case, it is preferable that the average size of the smaller particles is 5 nm or less. Also, for the purpose of enhancing the light-capturing rate by scattering the incident light, large particles having an average particle size of more than 50 nm can be added at a low proportion based on the ultrafine particles described above. In this case, the content of the large particles is preferably 50% or less, and more preferably 20% or less, by mass of the content of the particles having an average particle size of 50 nm or less. The average particle size of the large particles that are added and mixed for the purpose described above is preferably 100 nm or more, and more preferably 250 nm or more.

In regard to the method for producing semiconductor fine particles, sol-gel methods described in, for example, Sakka, Sumio, "Science of Sol-Gel Processes", Agne Shofu Publishing, Inc. (1998) and Technical Information Institute Co., Ltd., "Thin Film Coating Technology Based on Sol-Gel Processes" (1995); and a gel-sol method described in, for example, Sugimoto, Tadao, "Synthesis of Monodisperse Particles and Control of Size and Shape by Gel-Sol Process, a New Synthesis Method", Materia Japan, Vol. 35, No. 9, pp. 1012-1018 (1996), are preferred. It is also preferable to use a method developed by Degussa GmbH, in which a chloride is hydrolyzed at high temperature in an acid hydride salt to produce an oxide. When the semiconductor fine particles are titanium oxide, the sol-gel method, the gel-sol method, and the method of hydrolyzing a chloride in an acid hydride salt at high temperature, are all preferred, and the sulfuric acid method and chlorine method described in Seino, Manabu, "Titanium Oxide: Material Properties and Application Technologies", Gihodo Shuppan Co., Ltd. (1997) may also be used. Other preferred examples of the sol-gel method include the method described in Barbe et al., Journal of American Ceramic Society, Vol. 80, No. 12, pp. 3157-3171 (1997), and the method described in Burnside et al., Chemistry of Materials, Vol. 10, No. 9, pp. 2419-2425.

In addition to these, examples of the method of producing the semiconductor fine particles include, as preferred methods for producing titania nanoparticles, a method based on flame hydrolysis of titanium tetrachloride (see, for example, JP-T-6-511113 ("JP-T" means searched and published International patent publication)), a method of combusting titanium tetrachloride (see, for example, JP-A-2003-327432), a method of hydrolyzing a stable chalcogenide complex (see, for example, JP-A-2001-85076), hydrolysis of orthotitanic acid (see, for example, JP-A-2004-161589 and JP-A-2004-238213), a method of forming semiconductor fine particles from a soluble portion and an insoluble portion, and then removing by dissolving the soluble portion (see, for example, JP-A-2002-246620), hydrothermal synthesis of an aqueous peroxide solution (see, for example, JP-A-2003-92154), and a method of producing titanium oxide fine particles having a core-shell structure according to a sol-gel method (see, for example, JP-A-2004-10403).

Examples of the crystal structure of titania include structures of anatase type, brookite type and rutile type, and anatase type and brookite type structures are preferred in the present invention. Preferred examples include the structure examples described in JP-A-11-339867, JP-A-2001-43907, and JP-A-2001-43907. Preferred examples of the properties of titanium oxide include the examples described in EP 1 338 563, US 2004/0161380, U.S. Pat. No. 6,075,203, U.S. Pat. No. 6,444,189, U.S. Pat. No. 6,720,202, Chinese Patent 1540772(A), JP-A-2001-283942, and JP-A-2001-212457.

It is also acceptable to mix a titania nanotube/nanowire/nanorod with the titania fine particles. Preferred examples thereof include those described in, for example, JP-A-2003-168495, JP-A-2003-251194, JP-A-2004-175586, JP-A-

2004-175587, JP-A-2004-175588, JP-A-2004-311354, JP-A-2004-311355, JP-A-2004-319661, and JP-A-2005-162584.

Titania may be doped with a non-metallic element or the like. Preferred examples thereof include those described in, for example, JP-A-2000-235874, JP-A-2003-252624, JP-A-2002-25637, JP-A-2003-187881, JP-A-2003-187882, JP-A-2003-179244, JP-A-2004-87148, JP-A-2004-119279, JP-A-2005-93944, JP-A-2005-64493, JP-A-2003-257507, and JP-A-2003-323920. In addition to the dopants, as additives used with titania, a binder for improving necking, or a surface additive for preventing reverse electron transfer may also be used. Preferred examples of the additives include ITO or SnO particles (see, for example, JP-A-11-283682 and JP-A-2001-345125), whiskers (see, for example, JP-A-2003-163037), a fibrous graphite/carbon nanotube (see, for example, JP-A-2003-163037), a zinc oxide necking coupler (see, for example, JP-A-2003-273381), fibrous materials such as celluloses (see, for example, JP-A-2003-123861), metals (see, for example, JP-A-2000-285975 and JP-A-2001-35551), organosilicon (see, for example, JP-A-2000-294304), dodecyl benzenesulfonate (see, for example, JP-A-2000-260493), charge transfer coupling molecules of silane compounds or the like (see, for example, JP-A-2000-323192 and JP-A-2001-102103), and a potential gradient type dendrimer (see, for example, JP-A-2004-213908).

For the purpose of eliminating surface defects of titania, or the like, titania may be subjected to an acid base treatment or an oxidation reduction treatment before the adsorption of a dye. Preferred examples of the acid base treatment include those described in, for example, JP-A-2000-101106, JP-A-2002-293541, JP-A-2003-297441, JP-A-2003-297442, and JP-A-2004-235240. Furthermore, titania may also be subjected to etching, an oxidation treatment, a hydrogen peroxide treatment, a dehydrogenation treatment, UV-ozone, oxygen plasma or the like, as described in JP-A-8-81222, JP-A-2000-285980, JP-A-2004-158243, JP-A-2004-247104, and the like.

(C) Semiconductor Fine Particle Dispersion Liquid

Porous semiconductor fine particles-coated layer can be obtained by applying a semiconductor fine particle dispersion liquid in which the content of solids excluding semiconductor fine particles is 10% by mass or less of the total amount of the semiconductor fine particle dispersion liquid, on the electrically conductive support mentioned above, and appropriately heating the coated support.

Examples of the method of producing a semiconductor fine particle dispersion liquid include, in addition to the sol-gel method described above, a method of precipitating the semiconductor in the form of fine particles in a solvent upon synthesis and directly using the fine particles; a method of ultrasonicating fine particles, and thereby pulverizing the fine particles into ultrafine particles; a method of mechanically grinding a semiconductor using a mill or a mortar, and pulverizing the ground semiconductor; and the like. As a dispersion solvent, water and/or various organic solvents can be used. Examples of the organic solvent include alcohols such as methanol, ethanol, isopropyl alcohol, citronellol and terpineol; ketones such as acetone; esters such as ethyl acetate; dichloromethane, and acetonitrile.

At the time of dispersing the fine particles, for example, a polymer such as polyethylene glycol, hydroxyethylcellulose or carboxymethylcellulose; a surfactant, an acid or a chelating agent may be used in a small amount as a dispersing aid, as necessary. It is preferable that such a dispersing aid is mostly eliminated before the step of forming a film on the electrically conductive support, by a filtration method, a method of using a separating membrane, or a centrifugation method. The semiconductor fine particle dispersion liquid is such that the content of solids excluding semiconductor fine particles is 10% by mass or less based on the total amount of the dispersion liquid. This concentration is preferably 5% or less, more preferably 3% or less, further preferably 1% or less, furthermore preferably 0.5% or less, and particularly preferably 0.2% or less. In other words, the semiconductor fine particle dispersion liquid may contain a solvent and solids excluding semiconductor fine particles in an amount of 10% by mass or less based on the total amount of the semiconductor fine particle dispersion liquid. In the present, it is preferable that the semiconductor fine particle dispersion liquid is substantially composed of semiconductor fine particles and a dispersion solvent.

If the viscosity of the semiconductor fine particle dispersion liquid is too high, the dispersion liquid undergoes aggregation, and film formation cannot be achieved. On the other hand, if the viscosity of the semiconductor fine particle dispersion liquid is too low, the liquid flows out, and film formation cannot be achieved in some cases. Therefore, the viscosity of the dispersion liquid is preferably 10 to 300 N·s/m$^2$ at 25° C., and more preferably 50 to 200 N·s/m$^2$ at 25° C.

In regard to the method of applying the semiconductor fine particle dispersion liquid, a roller method, a dipping method or the like can be used as a method involving application. Furthermore, an air knife method, a blade method or the like can be used as a method involving metering. As a method that can equally utilize a method involving application and a method involving metering, a wire bar method disclosed in JP-B-58-4589 ("JP-B" means examined Japanese patent publication), an extrusion method, a curtain method and a slide hopper method described in U.S. Pat. No. 2,681,294, U.S. Pat. No. 2,761,419 and U.S. Pat. No. 2,761,791, and the like are preferred. It is also preferable to apply the dispersion liquid by a spinning method or a spray method, using a versatile machine. Preferred examples of a wet printing method include the three major printing methods of relief printing, offset printing and gravure printing, as well as intaglio printing, rubber plate printing, screen printing and the like. Among these, a preferable film forming method is selected in accordance with the liquid viscosity or the wet thickness. Furthermore, since the semiconductor fine particle dispersion liquid used in the present invention has high viscosity and has viscidity, the fine particle dispersion liquid often has a strong cohesive power, and may not have good affinity to the support upon coating. Under such circumstances, when surface cleaning and hydrophilization are carried out through a UV-ozone treatment, the affinity between the applied semiconductor fine particle dispersion liquid and the surface of the electrically conductive support increases, and thus it becomes easier to apply the semiconductor fine particle dispersion liquid.

The thickness of the entire semiconductor fine particle layer is preferably 0.1 to 100 μm, more preferably 1 to 30 μm, and even more preferably 2 to 25 μm. The amount of the coated semiconductor fine particles per square meter of the support is preferably 0.5 to 400 g, and more preferably 5 to 100 g.

The applied layer of semiconductor fine particles is subjected to a heating treatment, for the purpose of reinforcing the electronic contact between semiconductor fine particles and enhancing the adhesiveness of the semiconductor fine particles to the support, and also in order to dry the applied semiconductor fine particle dispersion liquid. The porous semiconductor fine particle layer can be formed by this heating treatment.

Furthermore, light energy can also be used in addition to the heating treatment. For example, when titanium oxide is used for the semiconductor fine particles, the surface may be activated by providing the light that is absorbed by the semiconductor fine particles, such as ultraviolet light, or only the surface of the semiconductor fine particles can be activated with a laser light or the like. When the semiconductor fine particles are irradiated with a light that is absorbed by the fine particles, the impurities adsorbed to the particle surfaces are decomposed as a result of activation of the particle surfaces, and a state preferable for the purpose described above can be attained. In the case of using the heating treatment and ultraviolet light in combination, the heating is carried out at a temperature of preferably from 100° C. to 250° C., more preferably from 100° C. to 150° C., while the semiconductor fine particles are irradiated with the light that is absorbed by the fine particles. As such, by inducing photoexcitation of the semiconductor fine particles, the impurities incorporated in the fine particle layer can be washed away by photodecomposition, and the physical bonding between the fine particles can be reinforced.

In addition to the processes of applying the semiconductor fine particle dispersion liquid on the electrically conductive support and subjecting the semiconductor fine particles to heating or light irradiation, other treatments may also be carried out. Preferred examples of such treatments include the passage of electric current, chemical treatment, and the like.

It is also acceptable to apply pressure after coating, and examples of the method of applying pressure include the methods described in JP-T-2003-500857, JP-A-2002-93475, JP-A-2003-282160 and JP-A-2004-214129. Examples of the light irradiation method include the methods described in JP-A-2001-357896, JP-A-11-219734, JP-A-2004-314313, JP-A-2005-142446, and JP-A-2001-247314. Examples of the methods utilizing plasma, microwaves or electric current include the methods described in JP-A-2002-353453, JP-A-2003-308893, JP-A-2004-265662, JP-A-2004-327369, JP-A-2004-342319, JP-A-2005-116415, JP-A-2005-139498, and JP-A-2004-273770. Examples of the chemical treatment include the methods described in JP-A-2001-357896, JP-A-2002-280327, JP-A-2003-281947, JP-T-2005-520314 and JP-A-2003-297442.

The method of coating the semiconductor fine particles on the electrically conductive support is included in the (1) wet methods, such as a method of applying a semiconductor fine particle dispersion liquid on an electrically conductive support; and a method of applying a precursor of the semiconductor fine particles on an electrically conductive support, hydrolyzing the precursor under the action of the moisture in air, and thereby obtaining a semiconductor fine particle film, as described in Japanese Patent No. 2664194. In regard to the production methods under the class of wet method, examples of the method of preparing a dispersion liquid of semiconductor fine particles include, in addition to the methods described above, a method of pulverizing fine particles in a mortar; a method of dispersing fine particles while pulverizing the particles using a mill; a method of precipitating fine particles in a solvent upon synthesizing a semiconductor, and directly using the precipitates; and the like. Preferred examples thereof include those described in, for example, JP-A-11-144772, JP-A-2005-100792, EP 1 300 897 A1, JP-A-2002-324591, JP-A-2002-145615, JP-A-2003-176130, and JP-A-2004-79610. The dispersion medium for the coating liquid used in the (1) wet methods may be water, or various organic solvents (for example, methanol, ethanol, t-butanol, dichloromethane, acetone, acetonitrile and ethyl acetate). Preferred examples thereof include those described in, for example, JP-T-6-511113, CN Patent No. 144292, JP-A-11-11912, JP-A-2000-294814, JP-A-2000-319018, JP-A-2000-319018, JP-A-2000-319018, JP-A-2002-145614, JP-A-2002-75477, JP-A-2004-193321, WO 02/067357, JP-A-2004-207205, JP-A-2004-111348, JP-A-2004-186144, JP-A-2003-282162, JP-A-2005-142011, JP-A-2005-174695, JP-A-2005-85500, JP-A-11-343118, JP-A-11-354169, JP-A-2000-106222, JP-A-2003-246621, JP-A-2003-51345, JP-A-2004-158551, JP-A-2001-358348, and JP-A-2003-217693. Upon dispersing the semiconductor fine particles, a polymer, a surfactant, an acid, a chelating agent or the like may be used as a dispersing aid as necessary, if used in a small amount.

As the method of coating semiconductor fine particles on an electrically conductive support, (2) dry methods and (3) other methods may be used together with the (1) wet methods described above.

Preferred examples of the (2) dry methods include the methods described in JP-A-2000-231943, JP-A-2002-170602, JP-A-2001-345124, JP-A-2003-197280, JP-A-2003-123854, JP-A-2003-123852, JP-A-2003-123853, JP-A-2005-39013, JP-A-2004-39286, and JP-A-2005-104760.

Preferred examples of the (3) other methods include the methods described in JP-A-2002-134435, US 2004/0123896, JP-A-2004-327265, JP-A-342397, JP-T-2003-500857, JP-A-2005-85491, JP-A-2003-98977, JP-A-2002-299665, JP-A-2003-243053, JP-A-2004-253331, JP-A-11-310898, JP-A-2003-257507, JP-A-2003-323920, US 2004/0084080, US 2004/0121068, JP-A-2004-319873, JP-A-10-112337, JP-A-11-6098, JP-A-2000-178791, JP-A-2000-178792, JP-A-2004-103420, and JP-A-2003-301283.

It is preferable for the semiconductor fine particles to have a large surface area, so that a large amount of dye can adsorb to the surface. For example, while the semiconductor fine particles have been coated on the support, the surface area is preferably 10 times or more, and more preferably 100 times or more, relative to the projected surface area. The upper limit of this value is not particularly limited, but the upper limit is usually about 5000 times. Preferred examples of the structure of the semiconductor fine particles include the structures disclosed in JP-A-2001-93591, JP-A-2001-257012, JP-A-2001-196106, JP-A-2001-273936, and EP No. 1207572 A1.

In general, as the thickness of the semiconductor fine particle layer increases, the amount of dye that can be supported per unit area increases, and therefore, the light absorption efficiency is increased. However, since the diffusion distance of generated electrons increases along, the loss due to charge recombination is also increased. Although a preferred thickness of the semiconductor fine particle layer may vary with the utility of the element, the thickness is typically 0.1 to 100 μm. In the case of using the photoelectric conversion element for a photoelectrochemical cell, the thickness of the semiconductor fine particle layer is preferably 1 to 50 μm, and more preferably 3 to 30 μm. The semiconductor fine particles may be calcined after being applied on the support, at a temperature of 100 to 800° C. for 10 minutes to 10 hours, so as to bring about cohesion of the particles. When a glass support is used, the film forming temperature is preferably 400 to 600° C.

When a polymer material is used as the support, it is preferable to form a film at 250° C. or less. The method of forming a film in this case may be any of (1) a wet method, (2) a dry method, and (3) an electrophoresis method (including an electrocrystallization method); preferably (1) a wet method or (2) a dry method; and further preferably (1) a wet method.

The wet method is a method of forming a film on a plastic film by applying a semiconductor layer or a precursor thereof in a wet manner or the like, and further activating the semiconductor layer. Examples of the wet method include the method of heating a mixture of a semiconductor and an electrically conductive compound at low temperature as described in JP-A-10-290018; a method of utilizing a precursor (examples of the precursor include $(NH_4)_2TiF_6$ described in JP-A-2001-110462; titanium peroxide described in JP-A-2001-247314; and a metal alkoxide, a metal complex and an organic acid metal salt described in JP-A-11-219734); a method of applying a slurry additionally containing a metal organic oxide (alkoxide or the like), and forming a semiconductor film by a heating treatment, a light treatment or the like, as described in JP-T-2005-520314; and a method of characterizing the pH of the slurry additionally containing an inorganic precursor described in JP-A-2003-2819847, and the slurry described in JP-A-2005-56627, and the properties and state of the dispersed titania particles.

These slurries may be added with a small amount of binder. Examples of the binder include the celluloses described in JP-A-2003-109678 or JP-A-2003-123861; the fluoropolymers described in JP-A-2003-272722; the cross-linked rubber described in JP-A-2004-47261; the polybutyl titanate described in JP-T-2005-516365; and the carboxymethylcellulose described in JP-A-2005-135798.

Examples of the technique related to the formation of a layer of a semiconductor or a precursor thereof include a method of hydrophilizing the layer by a physical method using corona discharge, plasma, UV or the like; a chemical treatment based on an alkali (see, for example, JP-A-2004-119120) or on polyethylene dioxythiophene and polystyrenesulfonic acid (see, for example, JP-A-2005-169228) or the like; formation of an intermediate film for bonding of polyaniline or the like as described in JP-A-2003-297443.

Examples of the dry method include deposition, sputtering, an aerosol deposition method, and the like. Preferred examples thereof include methods described in, for example, JP-A-2005-39013, JP-A-2004-074609, Japanese Patent No. 3265481, JP-A-2003-100359, and JP-A-2004-39286.

Furthermore, the electrophoresis method and the electrocrystallization method described in JP-A-2002-100146 and JP-A-2004-311354 may also be used.

Furthermore, a method of first preparing a coating film on a heat resistant base, and then transferring the film to a film made of plastic or the like, may be used. Preferably, a method of transferring a layer through EVA as described in JP-A-2002-184475; a method of forming a semiconductor layer and a conductive layer on a sacrificing base containing an inorganic salt that can be removed by ultraviolet rays or a water-based solvent, subsequently transferring the layers to an organic base, and removing the sacrificing base as described in JP-A-2003-98977; and the like may be used.

The amount of coating of the semiconductor fine particles per square meter of the support is preferably 0.5 to 500 g, and more preferably 5 to 100 g.

(D) Photosensitive Layer

In the photoelectric conversion element of the present invention, a photosensitive layer can be obtained by adsorbing the dye of the present invention to a porous semiconductor fine particle layer which has been obtained by applying the semiconductor fine particle dispersion liquid described above, on the electrically conductive support described above, and heating the semiconductor fine particle layer. The photosensitive layer is designed according to the purpose, and may have a single layer constitution or a multilayer constitution. Furthermore, the dye in the photosensitive layer may be of one kind or may be a mixture of plural kinds, but the above-described dye of the present invention is used for at least one kind of the plural kinds. The photosensitive layer of the photoelectric conversion element produced by the method of the present invention contains semiconductor fine particles having this dye adsorbed thereto, and has high sensitivity. When the photoelectric conversion element is used for a photoelectrochemical cell, a high conversion efficiency can be obtained.

The dye (dye compound) of the present invention can be synthesized by, for example, methods described or cited in F. M. Harmer, "Heterocyclic Compounds—Cyanine Dyes and Related Compounds", John Wiley & Sons, New York and London, 1994, or methods similar thereto.

In order to adsorb a dye to semiconductor fine particles, it is preferable to immerse semiconductor fine particles that have been thoroughly dried, in a dye solution for dye adsorption formed from a solvent and the dye of the present invention. In regard to the solvent that is used in the dye solution for dye adsorption, any solvent capable of dissolving the dye of the present invention can be used without any particular limitation. For example, ethanol methanol, isopropanol, toluene, t-butanol, acetonitrile, acetone or n-butanol can be used. Among them, ethanol and toluene can be preferably used.

The dye solution for dye adsorption formed from a solvent and the dye of the present invention may be heated if necessary, at 50° C. to 100° C. Adsorption of the dye may be carried out before or after the process of applying the semiconductor fine particles. Adsorption of the dye may also be conducted by simultaneously applying the semiconductor fine particles and the dye. Any unadsorbed dye is removed by washing. In the case of performing calcination of the coating film, it is preferable to carry out the adsorption of the dye after calcination. After calcination has been performed, it is particularly preferable to perform the adsorption of the dye rapidly before water adsorbs to the surface of the coating film. The dye to be adsorbed may be composed of a single kind, or a mixture of plural kinds of dyes may also be used. In the case of using a mixture, two or more kinds of dyes of the present invention may be mixed, or the dye of the present invention may be mixed with a complex dye described in U.S. Pat. No. 4,927,721, U.S. Pat. No. 4,684,537, U.S. Pat. No. 5,084,365, U.S. Pat. No. 5,350,644, U.S. Pat. No. 5,463,057, U.S. Pat. No. 5,525,440, and JP-A-7-249790. The dyes are selected so that the wavelength region for photoelectric conversion can be made as broad as possible when the dyes are mixed. In the case of using a mixture of dyes, it is required to prepare a dye solution for dye adsorption by dissolving all of the dyes used therein.

The overall amount of use of the dye is preferably 0.01 to 100 millimoles, more preferably 0.1 to 50 millimoles, and particularly preferably 0.1 to 10 millimoles, per square meter of the support. In this case, the amount of use of the dye of the present invention is preferably adjusted to 5% by mole or more.

The amount of the dye adsorbed to the semiconductor fine particles is preferably 0.001 to 1 millimole, and more preferably 0.1 to 0.5 millimoles, based on 1 g of the semiconductor fine particles.

When the amount of the dye is adjusted to such a range, the sensitization effect for the semiconductor can be sufficiently obtained. On the other hand, if the amount of the dye is too smaller, the sensitization effect is insufficient, and if the amount of the dye is excessive, the portion of the dye that is not attached to the semiconductor is suspended, and causes a decrease in the sensitization effect.

For the purpose of reducing the interaction between dye molecules such as association, a colorless compound may be co-adsorbed. Examples of the hydrophobic compound that is co-adsorbed include steroid compounds having a carboxyl group (for example, cholic acid and pivaloyl acid).

After the dye has been adsorbed, the surface of the semiconductor fine particles may be treated using amines. Preferred examples of the amines include 4-tert-butylpyridine, and polyvinylpyridine. These may be used directly when the compounds are liquids, or may be used in a state of being dissolved in an organic solvent.

Hereinafter, the charge transfer layer and the counter electrode will be explained in detail. The charge transfer layer is a layer having a function of supplementing electrons to an oxidant of the dye, and is provided between the light-receiving electrode and the counter electrode. Representative examples of the material forming the charge transfer layer include a liquid prepared by dissolving a redox pair in an organic solvent, a so-called gel electrolyte obtained by impregnating a polymer matrix with a liquid prepared by dissolving a redox pair in an organic solvent, and a molten salt containing a redox pair.

Examples of the redox pair include a combination of iodine and an iodide (for example, lithium iodide, tetrabutylammonium iodide, or tetrapropylammonium iodide), a combination of an alkylviologen (for example, methylviologen chloride, hexylviologen bromide, or benzylviologen tetrafluoroborate) and a reductant thereof, a combination of a polyhydroxybenzene (for example, hydroquinone or naphthohydroquinone) and an oxidant thereof, and a combination of a divalent iron complex and a trivalent iron complex (for example, potassium ferricyanide and potassium ferrocyanide). Among these, a combination of iodine and an iodide is preferred. Examples of the organic solvent that dissolves these materials include aprotic polar solvents (for example, acetonitrile, propylene carbonate, ethylene carbonate, dimethylformamide, dimethylsulfoxide, sulfolane, 1,3-dimethylimidazolinone, and 3-methyloxazolidinone); the water-containing electrolyte liquid described in JP-A-2002-110262; and the electrolyte solvents described in JP-A-2000-36332, JP-A-2000-243134 and WO 00/54361. Among these, preferred organic solvents are acetonitrile, methoxypropionitrile, propylene carbonate and γ-butyrolactone.

Examples of the additives that are added to the electrolyte include 4-tert-butylpyridine mentioned above, as well as the pyridine and pyridine-based compounds described in JP-A-2003-331986; the aminopyridine-based compounds described in JP-A-2004-47229, JP-A-2004-171821 and the like; the benzimidazole-based compounds described in JP-A-2004-273272; the aminotriazole-based compounds and aminothiazole-based compounds described in JP-A-2005-38711; the imidazole-based compounds described in JP-A-2005-108663; quinoline-based compounds (see, for example, JP-A-2005-135782); aminotriazine-based compounds (see, for example, JP-A-2005-183166); urea derivatives (see, for example, JP-A-2003-168493); amide compounds (see, for example, JP-A-2004-103404); pyrimidine-based compounds (see, for example, JP-A-2004-247158); and heterocycles that do not contain nitrogen (see, for example, JP-A-2005-166612, JP-A-2005-166613 and JP-A-2005-16615).

It is also preferable to employ a method of controlling the water content of the electrolyte liquid, in order to enhance the efficiency. Preferred examples of the method of controlling the water content include a method of controlling the concentration (see, for example, JP-A-2000-323189 and JP-A-2001-76774), and a method of adding a dehydrating agent (see, for example, JP-A-2002-237335 and JP-A-2002-237335).

In order to reduce the toxicity of iodine, a clathrate compound of iodine with cyclodextrin may be used as described in JP-A-2004-235011. Alternatively, a method of supplying moisture on a steady basis may be used as described in JP-A-2003-25709. Furthermore, a cyclic amidine may be used as described in Japanese Patent No. 3462115; or an oxidation inhibitor (see, for example, JP-A-2004-39292), a hydrolysis inhibitor (see, for example, JP-A-2004-111276), a decomposition inhibitor (see, for example, JP-A-2004-111277) or zinc iodide (see, for example, JP-A-2004-152613) may be added.

A molten salt may also be used as the electrolyte, and preferred examples of the molten salt include an ionic liquid containing an imidazolium or triazolium type cation (see, for example, JP-T-9-507334, JP-A-8-259543, JP-A-2003-31270, JP-A-2005-112733, JP-A-2005-116367, JP-A-2005-112733, JP-A-2003-68374, JP-A-2003-92153, JP-A-2004-241378, JP-A-2005-85587 and JP-A-2004-87387); an oxazolium-based salt (see, for example, JP-A-2000-53662); a pyridinium-based salt (see, for example, JP-A-2000-58891, JP-A-2001-23705, JP-A-2001-167630, JP-A-2001-256828, and JP-A-2001-266962); a guanidium-based salt (see, for example, JP-A-2001-35253); and combinations of these (see, for example, JP-A-2000-90991 and JP-A-2001-35552). These cations may be used in combination with particular anions, and examples of the anions are those described in JP-A-2002-75442, JP-A-2001-75443, JP-A-2002-170426, JP-A-2002-298913, JP-A-2002-367426, JP-A-2003-17148 and the like. Additives may be added these molten salts, and preferred examples of the additives include those described in JP-A-2001-67931, JP-A-2001-160427, JP-A-2002-289267, JP-A-2002-289268, JP-A-2000-90991, JP-A-2000-100485, JP-A-2001-283943, and the like. As described in JP-A-2002-319314 or JP-A-2002-343440, the molten salt may have a substituent having liquid crystalline properties. Furthermore, the quaternary ammonium salt-based molten salt described in JP-A-2005-104845, JP-A-2005-104846, JP-A-2005-179254 and the like may also be used.

Molten salts other than those described above include, for example, the molten salts described in JP-A-2005-139100 and JP-A-2005-145927, as well as a molten salt to which fluidity at room temperature has been imparted by mixing lithium iodide and at least one kind of other lithium salt (for example, lithium acetate or lithium perchlorate) with polyethylene oxide. The amount of addition of the polymer in this case is 1 to 50% by mass. Furthermore, the electrolyte liquid may contain γ-butyrolactone, and this γ-butyrolactone increases the diffusion efficiency of iodide ions, and thereby, the conversion efficiency is enhanced.

The electrolyte may be quasi-solidified by adding a gelling agent to an electrolyte liquid formed from an electrolyte and a solvent, and gelling the electrolyte liquid thereby. Examples of the gelling agent include an organic compound having a molecular weight of 1000 or less (see, for example, JP-A-11-185836, JP-A-2000-36608 and JP-A-2000-58140); an Si-containing compound having a molecular weight in the range of 500 to 5000 (see, for example, JP-A-2003-203520); an organic salt obtained from a particular acidic compound and a particular basic compound (see, for example, JP-A-2003-203520); a sorbitol derivative (see, for example, JP-A-2003-346928); and polyvinylpyridine (see, for example, JP-A-2004-227920 and JP-A-2005-93370).

Furthermore, a method of confining a matrix polymer, a crosslinked type polymer compound or monomer, a crosslinking agent, an electrolyte and a solvent, in a polymer may be used.

Preferred examples of the matrix polymer include a polymer having a nitrogen-containing heterocyclic ring in a repeating unit in the main chain or in a side chain, and a crosslinked structure formed by reacting the polymer with an electrophilic compound (see, for example, JP-A-11-12691 and JP-A-2000-86724); a polymer having a triazine structure and a polymer having a ureide structure (see, for example, JP-A-2000-251532); a polymer containing a liquid crystalline compound (see, for example, JP-A-2000-319260 and JP-A-2002-246066), a polymer having an ether bond (see, for example, JP-A-2000-150006, JP-A-2002-63813, JP-A-2001-338700, and JP-A-2002-75480); a polyvinylidene fluoride-based polymer (see, for example, JP-A-2003-303628); a methacrylate/acrylate-based polymer (see, for example, JP-A-2001-28276 and JP-A-2001-210390); a thermosetting resin (see, for example, JP-A-2002-363414 and JP-A-2002-305041); crosslinked polysiloxane (see, for example, JP-A-2002-216861); PVA (see, for example, JP-A-2002-175841); a clathrate compound of polyalkylene glycol and dextrin (see, for example, JP-A-2004-327271); a system incorporated with an oxygen-containing or sulfur-containing polymer (see, for example, JP-A-2005-108845); and a naturally occurring polymer (see, for example, JP-A-2005-71688). An alkali-swellable polymer (see, for example, JP-A-2002-175482), a polymer having a component capable of forming a charge transfer complex with a cation moiety and iodine within one polymer molecule (see, for example, JP-A-2005-63791), or the like may be added to those matrix polymers.

A system containing, as a matrix polymer, a crosslinked polymer formed by reacting a bifunctional or higher-functional isocyanate as one component with a functional group such as a hydroxyl group, an amino group or a carboxyl group, may also be used. Examples of this system are described in JP-A-2000-228234, JP-A-2002-184478, JP-A-2002-289271 and JP-A-2003-303630. Furthermore, a crosslinked polymer based on a hydrosilyl group and a double-bonded compound (see, for example, JP-A-2003-59548), a crosslinking method involving reacting polysulfonic acid, polycarboxylic acid or the like with a divalent or higher-valent metal ion compound (see, for example, JP-A-2003-86258), and the like may also be used.

Examples of the solvent that can be used with preference in combination with the quasi-solid electrolyte described above, include particular phosphates (see, for example, JP-A-2000-100486 and JP-A-2003-16833); a mixed solvent containing ethylene carbonate (see, for example, JP-A-2004-87202); a solvent having a particular relative permittivity (see, for example, JP-A-2004-335366); and the solvents described in JP-A-2003-16833 and JP-A-2003-264011.

A liquid electrolyte solution may be retained in a solid electrolyte membrane or in pores, and preferred examples of the method include the usage of an electrically conductive polymer membrane (JP-A-11-339866), a fibrous solid (JP-A-2000-357544), and a fabric-like solid such as filter (JP-A-2001-345125). It is also acceptable to use the particular combination of a gel electrolyte and an electroconductive resin counter electrode described in JP-A-2003-157914.

A solid charge transport system such as a p-type semiconductor or a hole transporting material may also be used instead of the liquid electrolytes and quasi-solid electrolytes described above. Preferred examples of the p-type semiconductor include CuI (see, for example, JP-A-2001-156314, JP-A-2001-185743, JP-A-2001-185743, JP-A-2001-230434, JP-A-2003-273381, JP-A-2003-234485, JP-A-2003-243681, and JP-A-2003-234486), CuSCN and p-SbA1 (see, for example, JP-A-2003-258284). Preferred examples of the producing method of the hole transporting material include those described in JP-A-2003-331938, JP-A-2001-168359, JP-A-2001-196612, JP-A-2001-257370, JP-A-2002-246623, JP-A-2002-246624, and JP-A-2003-289151.

A photoelectrochemical cell having high conversion efficiency can be obtained by using a laminate in which a hole transporter is provided adjacent to a photosensitive layer of the semiconductor fine particles having the dye of the present invention adsorbed thereto. The hole transporter is not particularly limited, but an organic hole transporting material can be used. Preferred examples of the hole transporter include electrically conductive polymers such as polythiophene (see, for example, JP-A-2000-106223 and JP-A-2003-364304), polyaniline (see, for example, JP-A-2003-264304), polypyrrole (see, for example, JP-A-2000-106224 and JP-A-2003-264304), and polysilane (see, for example, JP-A-2001-53555 and JP-A-2001-203377); a spiro compound in which two rings share a central element adopting a tetrahedral structure, such as C and Si (see, for example, JP-T-11-513522 and JP-T-2001-525108); aromatic amine derivatives such as triarylamine (see, for example, JP-A-11-144773, JP-A-11-339868, JP-A-2003-123856, JP-A-2003-197942 and JP-A-2004-356281); triphenylene derivatives (see, for example, JP-A-11-176489); nitrogen-containing heterocycle derivatives (see, for example, JP-A-2001-85077 and JP-A-2001-85713); and liquid crystalline cyano derivatives (see, for example, Japanese Patent No. 3505381).

The redox pair serves as a carrier for electrons, and thus is required at a certain concentration. A preferred overall concentration is 0.01 moles/liter or more, more preferably 0.1 moles/liter or more, and particularly preferably 0.3 moles/liter or more. In this case, the upper limit of the concentration is not particularly limited, but is usually about 5 moles/liter.

The counter electrode is an electrode working as a positive electrode in the photoelectrochemical cell. The counter electrode usually has the same meaning as the electrically conductive support described above, but in a construction which is likely to maintain a sufficient strength, a support is not necessarily required. However, a construction having a support is advantageous in terms of sealability. Examples of the material for the counter electrode include platinum, carbon, and electrically conductive polymers. Preferred examples include platinum (see, for example, JP-A-2001-102102), carbon (see, for example, JP-A-2002-298936, JP-A-2003-297446, JP-A-2004-127849, JP-A-2004-152747, JP-A-2004-165015, JP-A-2004-111216, JP-A-2004-241228, and JP-A-2004-319872), and electrically conductive polymers (see, for example, JP-A-2003-317814, JP-A-2004-319131, and JP-A-2005-116301). Materials described in JP-A-2001-43908, JP-A-2003-142168, JP-A-2004-127849 and JP-A-2004-152747 may also be used.

A preferred structure of the counter electrode is a structure having a high charge collecting effect. Preferred examples thereof include those described in JP-A-10-505192, JP-A-2004-296669, JP-A-2005-11609, JP-A-2005-141996, JP-A-2005-142090, JP-A-2005-158470, JP-A-2000-348784, JP-A-2005-158379, JP-A-2000-294305, JP-A-2001-243995, JP-A-2004-241228, JP-A-2004-296203, JP-A-2004-319872, and JP-A-2005-197097.

In regard to the light-receiving electrode, a composite electrode of titanium oxide and tin oxide ($TiO_2/SnO_2$) or the like may be used. Examples of mixed electrodes of titania include those described in JP-A-2000-113913, JP-A-2004-95387, JP-A-2001-155791, JP-A-2003-272723, JP-A-05-504023, JP-A-2000-114563, JP-A-2002-75476, JP-A-2002-8741, CN 1350334(A), JP-A-2003-272724, JP-A-2003-308891, JP-A-2005-174934, JP-A-2001-358348, JP-A-2003-123862, JP-A-2004-103420, JP-A-2005-39013 and JP-A-2003-317815. Examples of mixed electrodes of materials other than titania include those described in JP-A-2001-185243, JP-A-2003-282164, JP-A-2003-289151, JP-A-2003-321299, JP-A-2002-93471, JP-A-2002-141115, JP-A-2002-184476, JP-A-2002-356400, JP-A-2002-246623, JP-A-2002-246624, JP-A-2002-261303, JP-A-2003-243053, JP-A-2004-6235, JP-A-2003-323920, JP-A-2004-277197, JP-A-2004-210605, JP-A-2005-135798, JP-A-2005-135799, JP-A-2001-196105, JP-A-2002-100418, JP-A-2002-100419, JP-A-2002-280084, JP-A-2003-272724, JP-A-2004-124124, JP-A-9-237641, JP-A-11-273755, and JP-A-2004-247105.

The light-receiving electrode may be a tandem type electrode so as to increase the utility ratio of the incident light, or the like. Preferred examples of the tandem type construction include those described in JP-A-2002-90989, JP-A-2002-222971, JP-A-2003-168496, JP-A-2003-249275, JP-A-2005-166313, JP-A-11-273753, JP-A-2002-167808, JP-A-2005-129259, JP-A-2002-231324, JP-A-2005-158620, JP-A-2005-158621, JP-A-2005-191137 and JP-A-2003-333757.

The light-receiving electrode may be provided with the photo management function by which light scattering and reflection are efficiently achieved inside the light-receiving electrode layer. Preferred examples thereof include those described in JP-A-2002-93476, JP-A-2004-296373, JP-A-2002-352868, JP-A-2003-142170, JP-A-2003-59549, JP-A-2002-289274, JP-A-2002-222968, JP-A-2003-217688, JP-A-2004-172110, JP-A-2003-303629, JP-A-2004-343071, JP-A-2005-116302, JP-A-9-259943, JP-A-10-255863, JP-A-2003-142171, JP-A-2002-110261, and JP-A-2004-311197.

It is preferable to form a short circuit preventing layer between the electrically conductive support and the porous semiconductor fine particle layer, so as to prevent reverse current due to a direct contact between the electrolyte liquid and the electrode. Preferred examples thereof include those described in JP-T-6-507999, JP-A-6-51113, JP-A-2000-178792, JP-A-11-312541, JP-A-2000-285974, JP-A-2000-285979, JP-A-2001-143771, JP-A-2001-156314, JP-A-2001-307785, JP-A-2002-151168, JP-A-2002-75471, JP-A-2003-163359, JP-A-2003-163360, JP-A-2003-123856, WO 03/038909, JP-A-2002-289270, JP-A-2002-319439, JP-A-2003-297443, JP-A-2004-87622, JP-A-2003-331934, JP-A-2003-243054, JP-A-2004-319130, JP-A-2004-363069, JP-A-2005-71956, JP-A-2005-108807, JP-A-2005-108836, and JP-A-2005-142087.

It is preferable to employ a spacer or a separator so as to prevent the contact between the light-receiving electrode and the counter electrode. Preferred examples thereof include those described in JP-A-2001-283941, JP-A-2003-187883, JP-A-2000-294306, JP-A-2002-175844, JP-A-2002-367686, and JP-A-2004-253333.

EXAMPLES

The present invention will be described in more detail based on examples given below, but the invention is not meant to be limited by these.

Synthesis Examples of Dyes of First Invention

Firstly, D-1 and D-3 as the dye of the first invention were prepared according to the production method of the first invention.

Synthesis Example 1-1

Preparation of Exemplified Dye D-1

The exemplified dye D-1 was prepared according to the method shown in the following scheme 1.

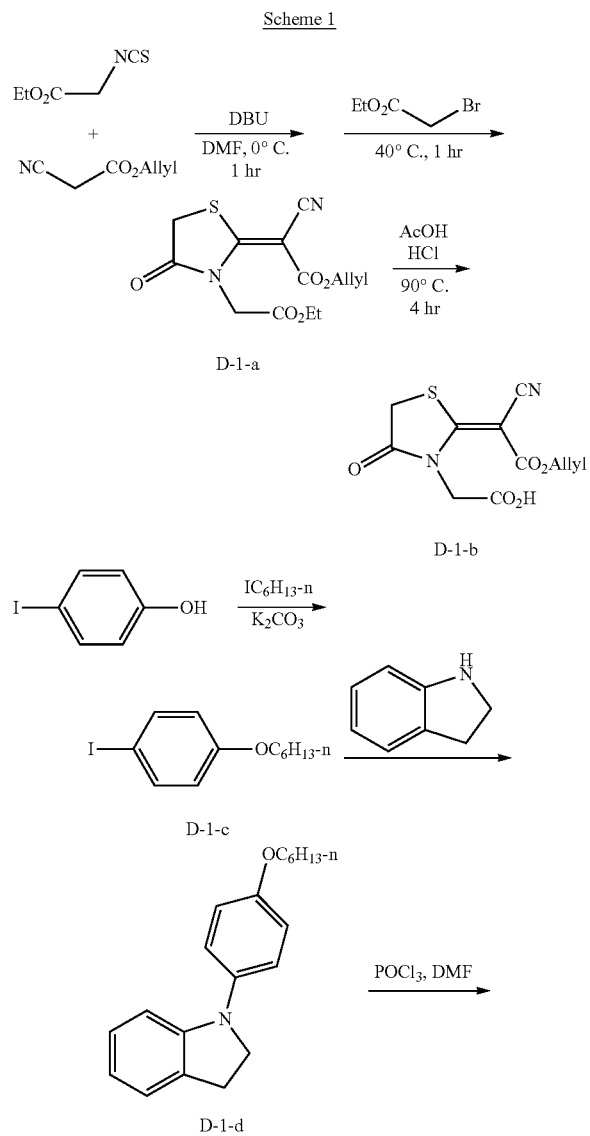

Scheme 1

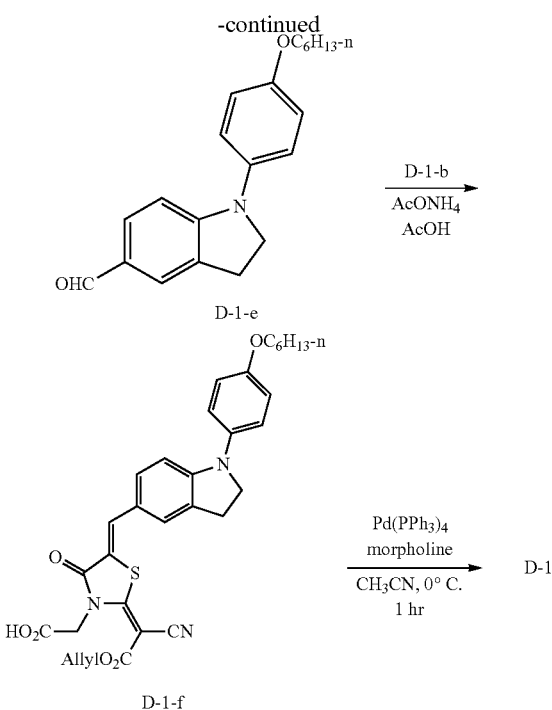

(i) Preparation of Compound D-1-a

To 600 mL of DMF containing 62.0 g of allyl cyanoacetate and 71.9 g of ethyl isothiocyanatoacetate, 77.7 g of DBU was added dropwise at 0° C., and then the mixture was stirred for 1 hour. 82.7 g of ethyl bromoacetate was added to the mixture, and the resultant was stirred at 40° C. for 1 hour. Then, the temperature of the reaction mixture was reduced to room temperature and then water was added. The precipitated crystals were collected by filtration. By crystallization from methanol, 142.1 g of Compound D-1-a was obtained.

(ii) Preparation of Compound D-1-b

Was stirred 10 g of Compound D-1-a in acetic acid/hydrochloric acid=2/1 for 2 hours. After the temperature of the reaction mixture was adjusted to room temperature, water and ethyl acetate were added thereto. The extracted organic layer was washed with water and saturated saline, and then concentrated. Then, by crystallization from ethyl acetate/hexane system, 8.2 g of Compound D-1-b was obtained.

(iii) Preparation of Compound D-1-c

Were dissolved 9.9 g of 4-iodophenol and 11.7 g of 1-iodohexane in 50 mL of dimethylacetamide (DMAc) under stirring at room temperature, and 9.3 g of potassium carbonate was added thereto. The mixture was stirred for 3.5 hours at room temperature. Water and hexane were added thereto, and the mixture was partitioned. The organic layer was concentrated and purified by column chromatography. Thus, 12.8 g of Compound D-1-c was obtained.

(iv) Preparation of Compound D-1-d

Were dissolved 3.5 g of indoline, 7.6 g of Compound D-1-c, 4.2 g of potassium carbonate, and 1.4 g of copper bromide in 10 mL of sulfolane under stirring, and the mixture was stirred for 3.5 hours at an externally preset temperature of 200° C. The mixture was subjected to extraction with water and ethyl acetate and the concentrate was purified by column chromatography. Thus, 5.6 g of Compound D-13-d was obtained.

(v) Preparation of Compound D-1-e

Was added 2 mL of phosphorus oxychloride to 6 mL of DMF under ice cooling, and the solution was stirred for 15 minutes. Thereto 1.0 g of Compound D-1-d was added, and the mixture was stirred for 3 hours at room temperature. Water was added to the reaction liquid, and the mixture was stirred. A 10% aqueous solution of sodium hydroxide was further added thereto, and the mixture was stirred for one hour. The mixture was subjected to extraction with ethyl acetate. After concentration, recrystallization from methanol was performed. Thus, 0.98 g of Compound D-1-e was obtained.

(vi) Preparation of Compound D-1-f

Were dissolved 540 mg of Compound D-1-e and 380 mg of Compound D-1-b in 10 mL of acetic acid under stirring at room temperature. Thereto 158 mg of ammonium acetate was added, and the mixture was heated and stirred at 90° C. for 4 hours. The mixture was cooled, and then water was added thereto. Precipitated crystals were collected by filtration, and were recrystallized from a methanol/CH$_2$Cl$_2$ system. Thus, 640 mg of Compound D-1-f was obtained.

(vii) Preparation of Exemplified Dye D-1

540 mg of Compound D-1-f was dissolved in 10 ml of acetonitrile while stirring at 0° C. To the resultant solution, 20 mg of tetrakis (triphenylphosphine) palladium and 2 ml of morpholine were added and stirred for 1 hour. Then, water was added and filtration was conducted. Then, 1-normal hydrochloric acid was added dropwise to the filtrate. Resultantly precipitated crystals were collected by filtration. By recrystallization from a methanol/CH$_2$Cl$_2$ system, 420 mg of Exemplified dye D-1 was obtained.

The yield of D-1 in the whole process from (i) to (vii) as described above was 12.3%.

Synthesis Example 2-1

Preparation of Exemplified Dye D-3

The exemplified dye D-3 was prepared in the same manner as in the above-described exemplified dye D-1, according to the method shown in the following scheme 2.

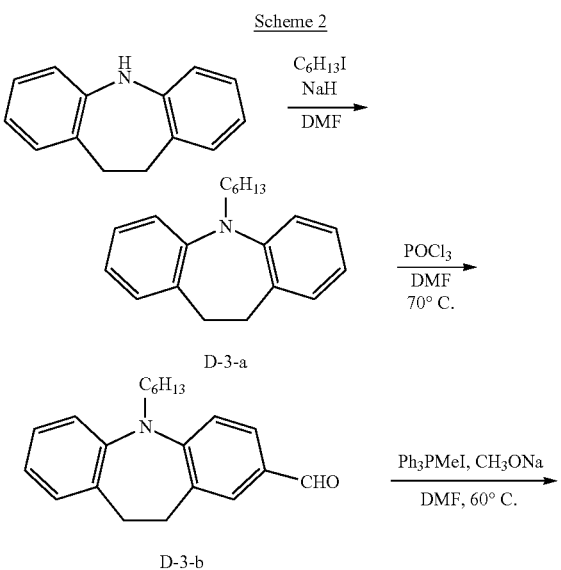

-continued

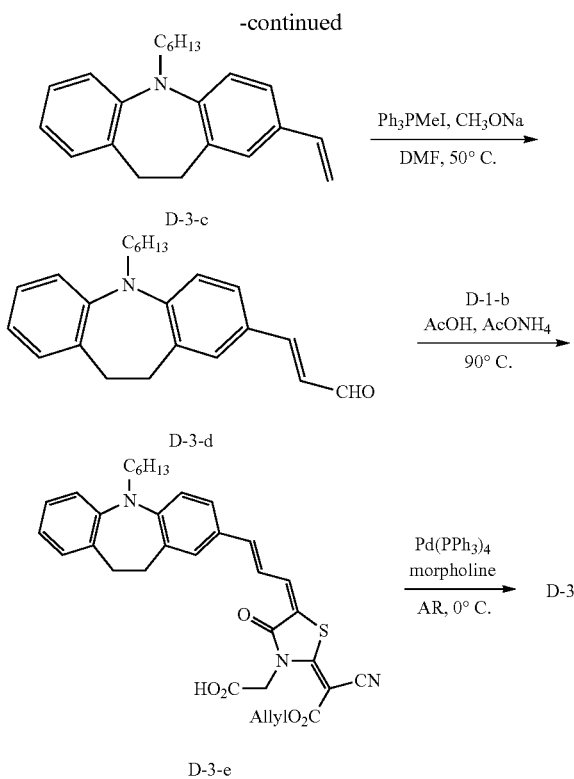

(i) Preparation of Compound D-3-a

Were dissolved 15.0 g of 10,11-dihydro-5H-dibenz[b,f]azepine and 21.0 g of 1-iodohexane in 60 mL of DMF under stirring at room temperature, and then the mixture was cooled with ice. Thereto, 7.5 g of 50% to 70% sodium hydride was added in divided portions, and the mixture was stirred for 1.5 hours at an internal temperature of 10° C. or lower. After completion of the reaction, water was added dropwise to the reaction liquid to deactivate remaining sodium hydride, and hexane was added to perform partition. The organic layer was concentrated and purified by column chromatography, and thus 20.4 g of Compound D-3-a was obtained.

(ii) Preparation of Compound D-3-b

Was added 20 mL of phosphorus oxychloride to 60 mL of DMF under ice cooling, and the solution was stirred for 30 minutes. Thereto, 9.5 g of Compound D-3-a was added, and the resulting mixture was heated to 60° C. and stirred for 3 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 9.9 g of Compound D-3-b was obtained.

(iii) Preparation of Compound D-3-c

Were dissolved 15.0 g of Compound D-3-b and 23.7 g of methyltriphenylphosphonium iodide in 150 mL of DMF under stirring at room temperature, and then 11.8 g of a 28% methanol solution of sodium methoxide was added dropwise thereto. Subsequently, the mixture was heated to an externally set temperature of 60° C. and stirred for 2 hours. The reaction liquid was left to cool to room temperature, and then water was added to the reaction liquid. Hexane was further added to the mixture, and then partition was performed. The organic layer was concentrated and then purified by column chromatography, and thus 14.2 g of Compound D-3-c was obtained.

(iv) Preparation of Compound D-3-d

Was added 20 mL of phosphorus oxychloride to 70 mL of DMF under ice cooling, and the solution was stirred for 30 minutes. Thereto, 13.5 g of Compound D-3-c was added, and the resulting mixture was heated to 50° C. and stirred for 1 hour. The mixture was left to cool to room temperature, subsequently water was added to the reaction liquid, and the mixture was stirred. Further, a 20% aqueous solution of sodium hydroxide was added to the mixture, and the resulting mixture was stirred for one hour. The mixture was subjected to extraction with ethyl acetate. After concentration, column purification was performed, and thus 14.7 g of Compound D-3-d was obtained.

(v) Preparation of Compound D-3-e

Were dissolved 1.0 g of Compound D-3-d and 846 mg of Compound D-1-b in 30 mL of acetic acid under stirring at room temperature. Thereto 462 mg of ammonium acetate was added, and the mixture was heated and stirred at 90° C. for 2 hours. The mixture was cooled, and then 60 mL of water was added thereto. Precipitated crystals were collected by filtration, and were recrystallized from a methanol/CH$_2$Cl$_2$ system. Thus, 1.62 g of Compound D-3-e was obtained.

(vi) Preparation of Exemplified Dye D-3

Was dissolved 1.20 g of Compound D-3-e in 40 ml of acetonitrile while stirring at 0° C. To the resultant mixture, 116 mg of tetrakis (triphenylphosphine) palladium and 3 ml of morpholine were added and stirred for 1 hour. Then, water was added and filtration was conducted. Then, 1-normal hydrochloric acid was added dropwise to the filtrate. Resultantly precipitated crystals were collected by filtration. By recrystallization from an ethyl acetate/hexane system, 1.02 g of Exemplified dye D-3 was obtained.

The yield of D-3 in the whole process from (i) to (vi) as described above was 17.5%, and almost no by-product was generated.

(Synthesis of Other Exemplified Dyes)

The exemplified dyes D-2 and D-4 to D-16 were synthesized in the same manner as in Synthesis Examples 1-1 and 2-1.

Comparative Synthesis Example 1

Preparation of Exemplified Dye D-1

The exemplified dye D-1 was prepared according to the method shown in the following scheme 3.

Scheme 3

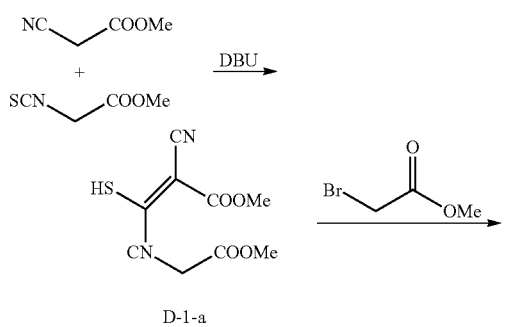

D-1-a

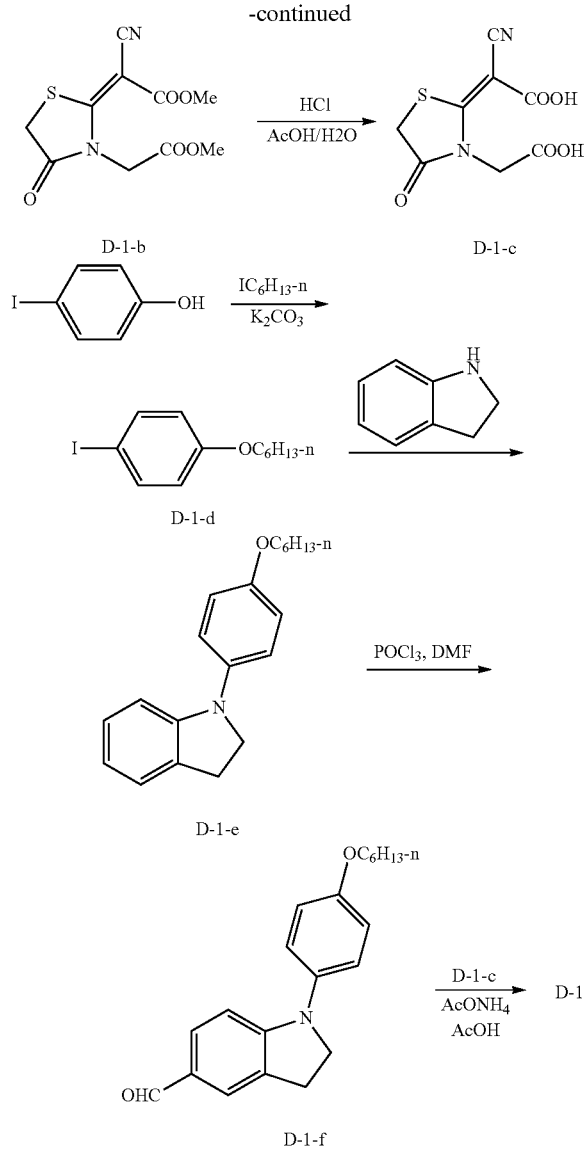

(i) Preparation of Compound D-1-b

Were stirred 112 g of methyl cyanoacetate and methyl thioisocyanatoacetate in DMF for 2 hours at 0° C., and then methyl bromoacetate was added thereto. The mixture was stirred for 2 hours at 70° C. The mixture was subjected to extraction with ethyl acetate. The extract was concentrated and crystallized from methanol. Thus, 11.2 g of Compound D-1-b was obtained.

(ii) Preparation of Compound D-1-c

Compound D-1-b in an amount of 5 g was stirred in acetic acid/hydrochloric acid=1/1, and was purified by column chromatography. Thus, 0.2 g of Compound D-1-c was obtained.

(iii) Preparation of Compound D-1-d

Were dissolved 9.9 g of 4-iodophenol and 11.7 g of 1-iodohexane in 50 mL of DMAc under stirring at room temperature, and 9.3 g of potassium carbonate was added thereto. The mixture was stirred for 3.5 hours at room temperature. Water and hexane were added thereto, and the mixture was partitioned. The organic layer was concentrated and purified by column chromatography. Thus, 12.8 g of Compound D-1-d was obtained.

(vi) Preparation of Compound D-1-e

Were dissolved 3.5 g of indoline, 7.6 g of Compound D-1-d, 4.2 g of potassium carbonate, and 1.4 g of copper bromide in 10 mL of sulfolane under stirring, and the mixture was stirred for 3.5 hours at an externally preset temperature of 200° C. The mixture was subjected to extraction from water with ethyl acetate, and the concentrate was purified by column chromatography. Thus, 1.7 g of Compound D-13-e was obtained.

(vii) Preparation of Compound D-1-f

Was added 2 mL of phosphorus oxychloride to 6 mL of DMF under ice cooling, and the solution was stirred for 15 minutes. Thereto 1.0 g of Compound D-13-b was added, and the mixture was stirred for 3 hours at room temperature. Water was added to the reaction liquid, and the mixture was stirred. A 10% aqueous solution of sodium hydroxide was further added thereto, and the mixture was stirred for one hour. The mixture was subjected to extraction with ethyl acetate. After concentration, recrystallization from MeOH was performed. Thus, 0.98 g of Compound D-1-f was obtained.

(v) Preparation of Exemplified Dye D-1

Were dissolved 540 mg of Compound D-1-f and 380 mg of Compound D-1-c in 25 mL of acetic acid under stirring at room temperature. Thereto 158 mg of ammonium acetate was added, and the mixture was heated and stirred at 90° C. for 4 hours. The mixture was cooled, and then water was added thereto. Precipitated crystals were collected by filtration, and were recrystallized from a MeOH/$CH_2Cl_2$ system. Thus, Exemplified Dye D-1 was obtained.

The yield of D-1 in the whole process from (i) to (v) as described above was 2.5%.

As seen above, large differences occurred in yield of the product between production methods, even in the case where D-1 of the dye of the first invention was produced in accordance with the method of producing a dye of the first invention.

Synthesis Examples of Dyes of Second Invention

Next, A-1, A-4, A-5, A-26, A-3, A-2, A-46, A-9, A-10, A-16, A-29, A-47, A-48, A-50, A-51, A-52 and A-53 were prepared as the dye of the second invention.

Synthesis Example 1-2

Preparation of Exemplified Dye A-1

The exemplified dye A-1 was prepared according to the method shown below.

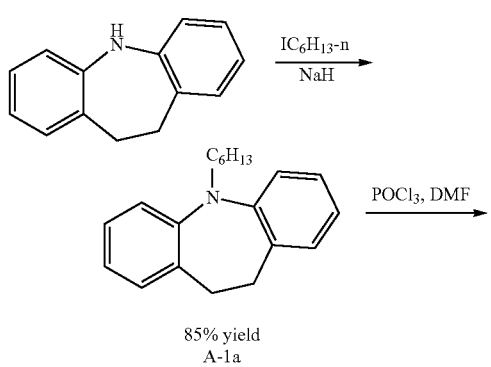

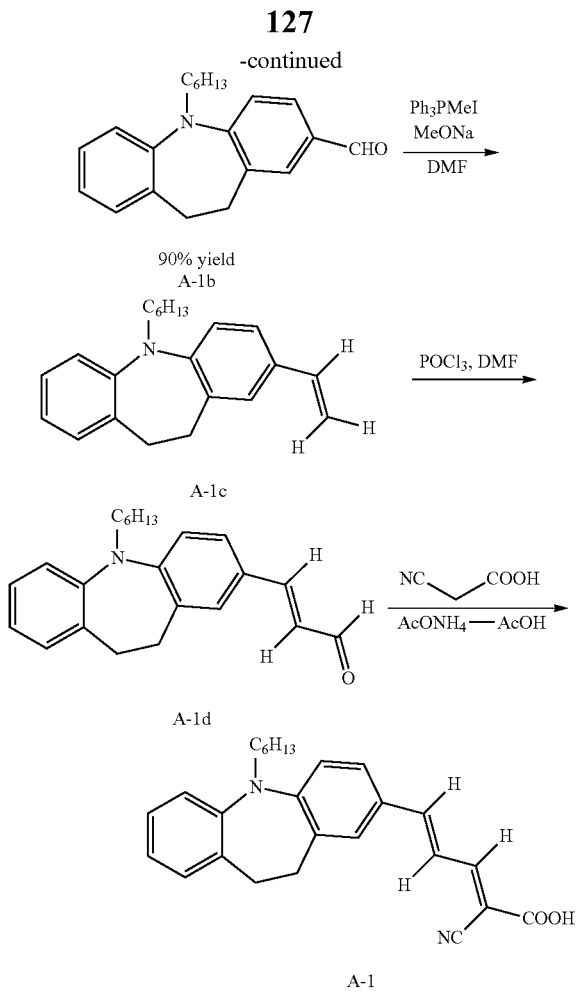

(1) Preparation of Compound A-1a

Were dissolved 15.0 g of 10,11-dihydro-5H-dibenz[b,f]azepine and 21.0 g of 1-iodohexane in 60 mL of DMF under stirring at room temperature, and then the mixture was cooled with ice. Thereto, 7.5 g of 50% to 70% sodium hydride was added in divided portions, and the mixture was stirred for 1.5 hours at an internal temperature of 10° C. or lower. After completion of the reaction, water was added dropwise to the reaction liquid to deactivate remaining sodium hydride, and hexane was added to perform partition. The organic layer was concentrated and purified by column chromatography, and thus 18.3 g of Compound A-1a was obtained.

(2) Preparation of Compound A-1b

Was added 20 mL of phosphorus oxychloride to 60 mL of DMF under ice cooling, and the solution was stirred for 30 minutes. Thereto, 9.5 g of Compound A-1a was added, and the resulting mixture was heated to 60° C. and stirred for 3 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour.

The mixture was subjected to extraction with ethyl acetate. After concentration, column purification was performed, and thus 9.4 g of Compound A-1b was obtained.

(3) Preparation of Compound A-1c

Were dissolved 2.0 g of Compound A-1b and 3.2 g of methyltriphenylphosphonium iodide in 20 mL of DMF under stirring at room temperature, and then 1.5 g of a 28% methanol solution of sodium methoxide was added dropwise thereto. Subsequently, the mixture was heated to 60° C. and stirred for 2 hours. The reaction liquid was left to cool to room temperature, and then water was added to the reaction liquid. Hexane was further added to the mixture, and then partition was performed. The organic layer was concentrated and then purified by column chromatography, and thus 1.9 g of Compound A-1c was obtained.

(4) Preparation of compound A-1d

Was added 5 mL of phosphorus oxychloride to 10 mL of DMF under ice cooling, and the solution was stirred for 30 minutes. Thereto, 1.9 g of Compound A-1c was added, and the resulting mixture was heated to 60° C. and stirred for 3 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 2.0 g of Compound A-1d was obtained.

(5) Synthesis of Exemplified Dye A-1

Were added 1.0 g of A-1d and 0.25 g of cyanoacetic acid to 20 mL of acetic acid, and the mixture was stirred for 30 minutes. Subsequently, 0.5 g of ammonium acetate was added thereto, and the mixture was heated to 90° C. and stirred for 3 hours. The reaction liquid was left to cool to room temperature, and then water was added to the reaction liquid. The mixture was subjected to extraction with ethyl acetate and the extract was concentrated. Crystals thus obtained were purified by recrystallization, and thus 0.6 g of the exemplified dye A-1 was obtained.

Synthesis Example 2-2

Preparation of Exemplified Dye A-4

The exemplified dye A-4 was prepared according to the method shown below.

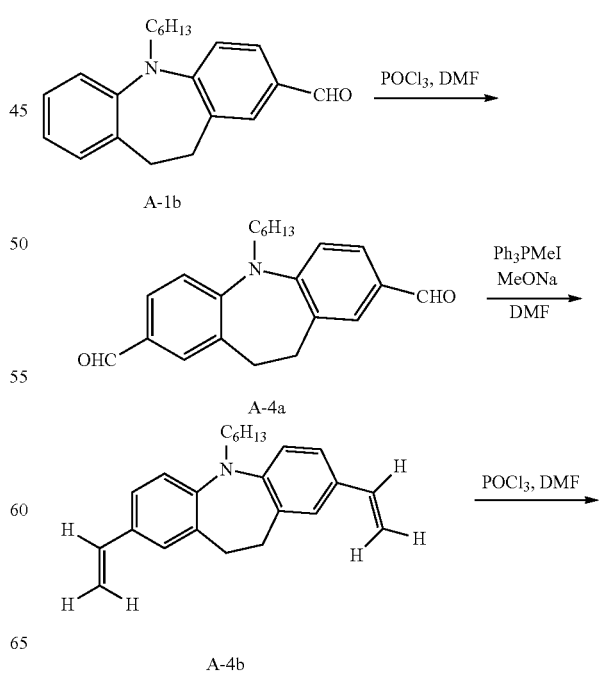

129

-continued

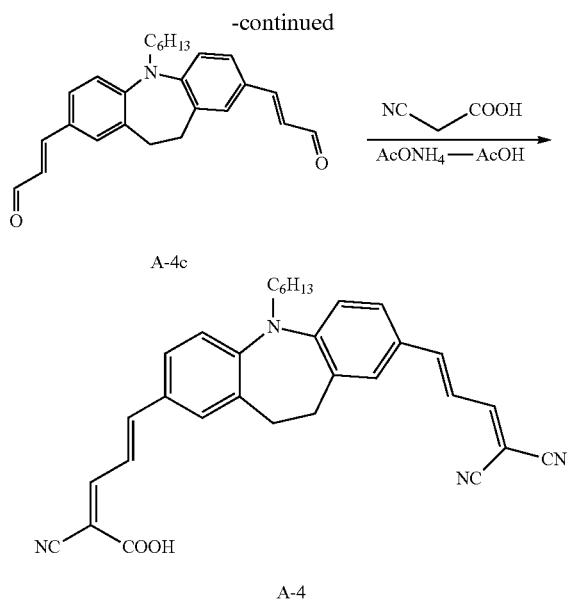

A-4c (1) Preparation of Compound A-4-a

Was added 15 mL of phosphorus oxychloride to 30 mL of DMF under ice cooling, and the solution was stirred for 30 minutes. Was added 5.8 g of Compound A-1b to this mixture, and the resulting mixture was heated to 60° C. and stirred for 4 hours. The reaction liquid was left to cool to room temperature, subsequently water was added thereto, and the mixture was stirred. The reaction liquid was added dropwise to a 10% aqueous solution of sodium hydroxide under ice cooling, and the mixture was stirred for one hour. The reaction liquid was subjected to extraction with ethyl acetate. After concentration, column purification was performed, and thus 3.3 g of Compound A-1b was obtained.

(3) Preparation of Compound A-4-b

Were dissolved 1.7 g of Compound A-4a and 4.9 g of methyltriphenylphosphonium iodide in 20 mL of DMF under stirring at room temperature, and then 2.3 g of a 28% methanol solution of sodium methoxide was added dropwise thereto. Subsequently, the mixture was heated to 60° C. and stirred for 2 hours. The reaction liquid was left to cool to room temperature, and then water was added to the reaction liquid. Hexane was further added to the mixture, and then partition was performed. The organic layer was concentrated and then purified by column chromatography, and thus 1.4 g of Compound A-4-b was obtained.

(4) Preparation of Compound A-4-c

Was added 10 mL of phosphorus oxychloride to 20 mL of DMF under ice cooling, and the solution was stirred for 30 minutes. Was added 1.3 g of Compound A-4-b to this mixture, and the resulting mixture was heated to 60° C. and stirred for 2 hours. The reaction liquid was left to cool to room temperature, subsequently water was added thereto, and the mixture was stirred. The reaction liquid was added dropwise to a 10% aqueous solution of sodium hydroxide under ice cooling, and the mixture was stirred for one hour. The reaction liquid was subjected to extraction with ethyl acetate. After concentration, column purification was performed, and thus 1.5 g of Compound A-4-c was obtained.

130

(5) Synthesis of Exemplified Dye A-4

Were added 1.4 g of Compound A-4-c and 0.6 g of cyanoacetic acid were added to 20 ml of acetic acid, and the mixture was stirred for 30 minutes. Subsequently, 1.1 g of ammonium acetate was added thereto, and the mixture was heated to 90° C. and stirred for 4 hours. The reaction liquid was left to cool to room temperature, and then water was added to the reaction liquid. The mixture was subjected to extraction with ethyl acetate and the extract was concentrated. Crystals thus obtained were purified by recrystallization, and thus 1.5 g of the Exemplified Dye A-4 was obtained.

Synthesis Example 3-2

Preparation of Exemplified Dye A-5

As shown below, the exemplified dye A-5 was prepared by making the intermediate B-1 prepared separately react with A-1d.

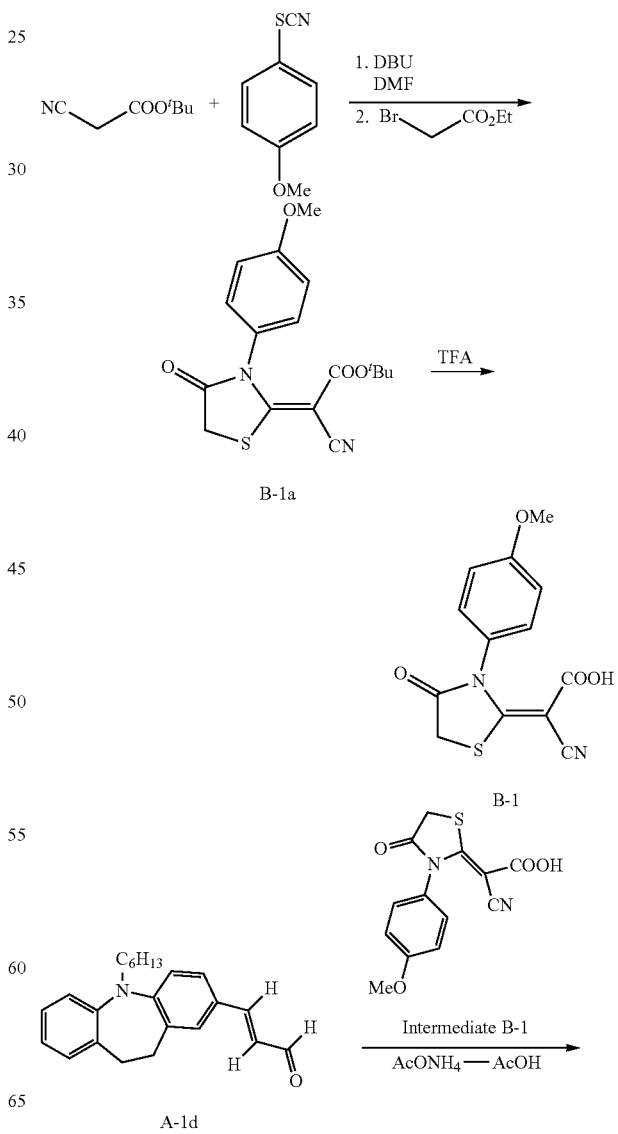

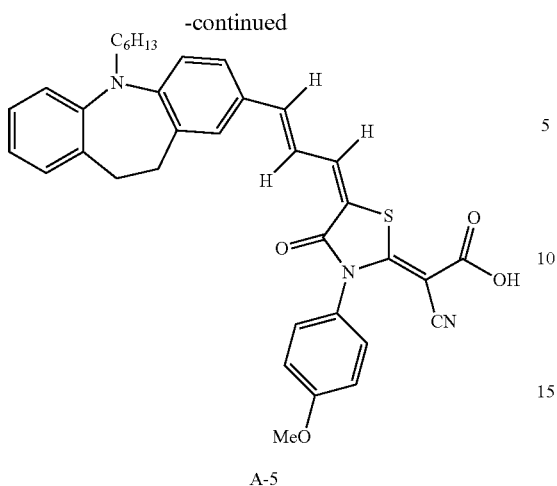

A-5

(1) Preparation of Intermediate B-1
(i) Preparation of Compound B-1a
Were added 8.5 g of t-butyl cyanoacetate and 10.0 g of 4-methoxyphenyl isothiocyanate to 30 mL of DMF, and the mixture was stirred in an ice bath. Subsequently, 9.7 g of DBU was added dropwise thereto. The mixture was stirred for 4 hours, and then 10.1 g of ethyl bromoacetate was added thereto. The mixture was heated to 65° C. and was stirred for 4 hours. Subsequently, the mixture was left to cool to room temperature. Water was added thereto and precipitated crystals were collected by filtration, to obtain 19.7 g of B-1a.
(ii) Preparation of Intermediate B-1
Was added 1.1 g of B-1a to 10 mL of TFA, and the solution was stirred at room temperature for one hour. Then, water was added to the reaction liquid and precipitated crystals were collected by filtration. The crystals thus obtained were purified by recrystallization, and thus 0.8 g of Intermediate B-1 was obtained.
(2) Preparation of Exemplified Dye A-5
Were added 1.7 g of Compound A-1d and 1.5 g of Intermediate B-1 to 20 mL of acetic acid, and the mixture was stirred for 30 minutes. Subsequently, 0.7 g of ammonium acetate was added thereto, and the mixture was heated to 90° C. and stirred for 4 hours. The reaction liquid was left to cool to room temperature, and then water was added to the reaction liquid. The mixture was subjected to extraction with ethyl acetate and the extract was concentrated. The crystals thus obtained were purified by recrystallization, and thus 1.5 g of Exemplified Dye A-5 was obtained.

Synthesis Example 4-2

Preparation of Exemplified Dye A-8

The exemplified dye A-8 was prepared according to the method shown below.

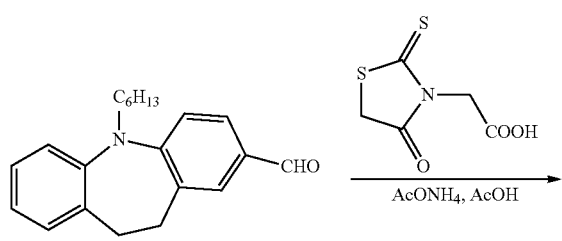

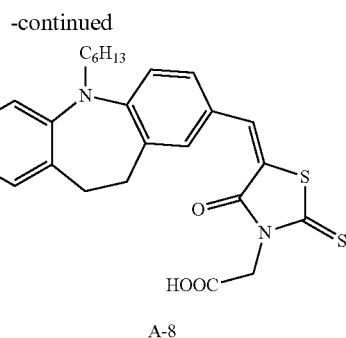

A-8

Were dissolved 1.0 g of Compound A-1b and 0.6 g of 3-carboxymethylrhodanine in 20 mL of acetic acid under stirring at room temperature. Was added 0.5 g of ammonium acetate to this solution, and the mixture was heated to 90° C. and stirred for 4 hours. After the mixture was cooled, water was added thereto, and precipitated crystals were collected by filtration and were recrystallized from a MeOH/CH$_2$Cl$_2$ system. Thus, 1.0 g of the exemplified dye A-1 was obtained.

Synthesis Example 5-2

Preparation of Exemplified Dye A-26

The exemplified dye A-26 was prepared according to the method shown below.

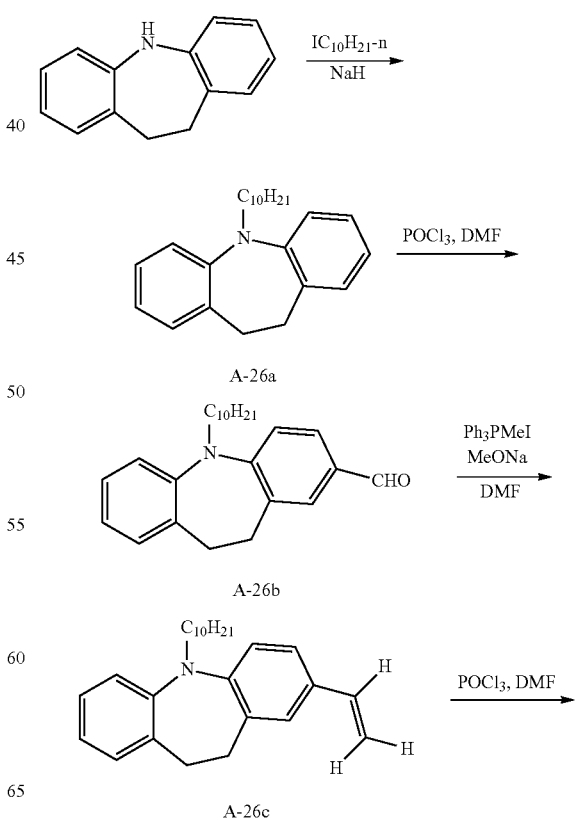

133

-continued

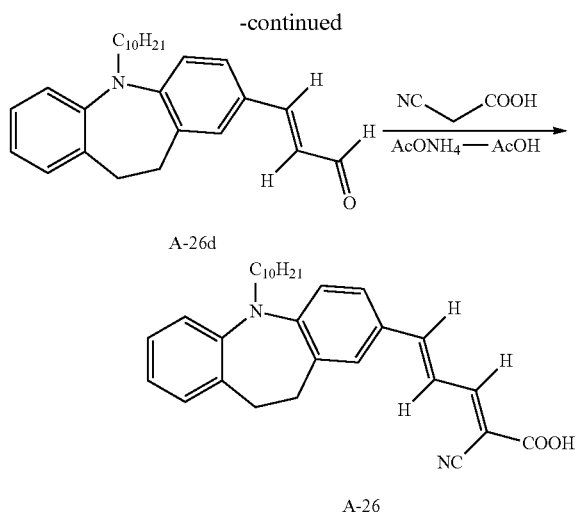

(1) Preparation of Compound A-26a

Were dissolved 5.0 g of 10,11-dihydro-5H-dibenz[b,f]azepine and 10.3 g of 1-iododecane in 20 mL of DMF under stirring at room temperature, and then the mixture was cooled with ice. Thereto, 2.5 g of 50% to 70% sodium hydride was added in divided portions, and the mixture was stirred for 3.0 hours at an internal temperature of 10° C. or lower. After completion of the reaction, water was added dropwise to the reaction liquid to deactivate remaining sodium hydride, and hexane was added to perform partition. The organic layer was concentrated and purified by column chromatography, and thus 8.6 g of Compound A-26a was obtained.

(2) Preparation of Compound A-26b

Was added 10 mL of phosphorus oxychloride to 20 mL of DMF under ice cooling, and the solution was stirred for 30 minutes. Thereto, 3.5 g of Compound A-24a was added, and the resulting mixture was heated to 60° C. and stirred for 2.5 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 2.0 g of Compound A-26b was obtained.

(3) Preparation of Compound A-26c

Were dissolved 2.2 g of Compound A-26b and 2.9 g of methyltriphenylphosphonium iodide in 20 mL of DMF under stirring at room temperature, and then 1.4 g of a 28% methanol solution of sodium methoxide was added dropwise thereto. Subsequently, the mixture was heated to 60° C. and stirred for 3 hours. The reaction liquid was left to cool to room temperature, and then water was added to the reaction liquid. Hexane was further added to the mixture, and then partition was performed. The organic layer was concentrated and then purified by column chromatography, and thus 2.0 g of Compound A-26c was obtained.

(4) Preparation of Compound A-26d

Was added 10 mL of phosphorus oxychloride to 20 mL of DMF under ice cooling, and the solution was stirred for 30 minutes. Was added 2.0 g of Compound A-26c to this solution, and the resulting mixture was heated to 60° C. and stirred for 0.5 hour. The mixture was left to cool to room temperature, subsequently water was added to the reaction liquid, and the mixture was stirred. Further, a 10% aqueous

134 solution of sodium hydroxide was added to the mixture, and the resulting mixture was stirred for one hour. The reaction liquid was subjected to extraction with ethyl acetate. After concentration, column purification was performed, and thus 2.1 g of Compound A-26d was obtained.

(5) Synthesis of Exemplified Dye A-26

Were added 1.5 g of Compound A-24d and 0.3 g of cyanoacetic acid to 20 mL of AcOH, and the mixture was stirred for 30 minutes. Subsequently, 0.6 g of ammonium acetate was added thereto, and the mixture was heated to 90° C. and stirred for 5 hours. The reaction liquid was left to cool to room temperature, and then water was added to the reaction liquid. The mixture was subjected to extraction with ethyl acetate and the extract was concentrated. The crystals thus obtained were purified by recrystallization, and thus 0.6 g of the exemplified dye A-26 was obtained.

Synthesis Example 6-2

Preparation of Exemplified Dye A-3

The exemplified dye A-3 was prepared according to the method shown below.

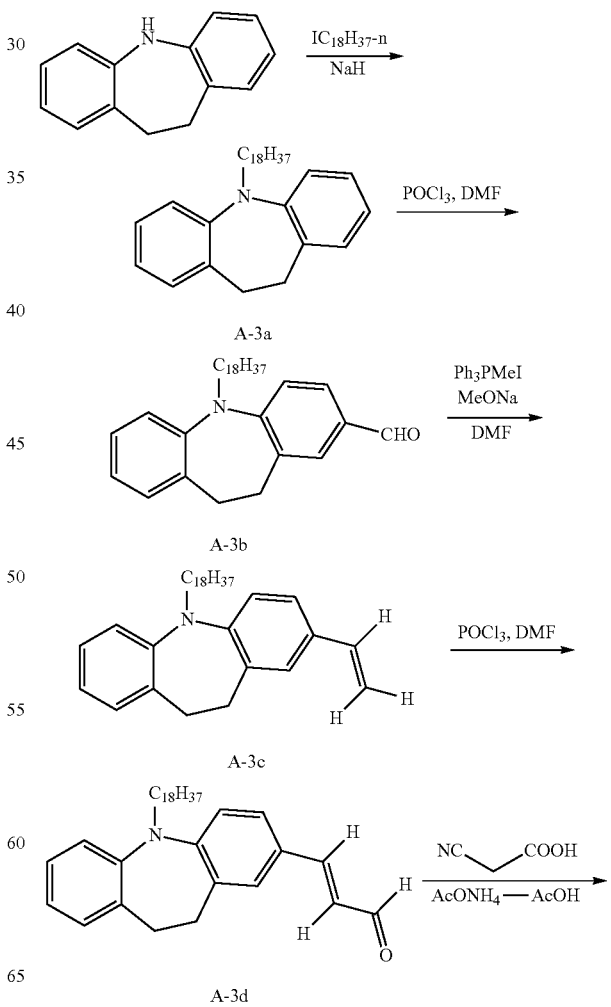

-continued

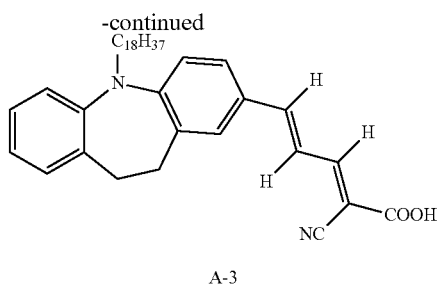

A-3

(1) Preparation of Compound A-3a

Were dissolved 5.0 g of 10,11-dihydro-5H-dibenz[b,f]azepine and 12.7 g of 1-iodooctadecane in 20 mL of DMF under stirring at room temperature, and then the mixture was cooled with ice. Thereto, 2.5 g of 50% to 70% sodium hydride was added in divided portions, and the mixture was stirred for 0.5 hours at an internal temperature of 10° C. or lower and further stirred for 3 hours at room temperature. After completion of the reaction, water was added dropwise to the reaction liquid to deactivate remaining sodium hydride, and hexane was added to perform partition. The organic layer was concentrated and purified by column chromatography, and thus 7.7 g of Compound A-3a was obtained.

(2) Preparation of Compound A-3b

Was added 10 mL of phosphorus oxychloride to 20 mL of DMF under ice cooling, and the solution was stirred for 30 minutes. Thereto, 5.0 g of Compound A-3a was added, and the resulting mixture was heated to 60° C. and stirred for 7 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 4.6 g of Compound A-3b was obtained.

(3) Preparation of Compound A-3c

Were dissolved 4.5 g of Compound A-3b and 4.6 g of methyltriphenylphosphonium iodide in 20 mL of DMF under stirring at room temperature, and then 2.2 g of a 28% methanol solution of sodium methoxide was added dropwise thereto. Subsequently, the mixture was heated to 60° C. and stirred for 5 hours. The reaction liquid was left to cool to room temperature, and then water was added to the reaction liquid. Hexane was further added to the mixture, and then extraction was performed. The organic layer was concentrated and then purified by column chromatography, and thus 4.3 g of Compound A-3c was obtained.

(4) Preparation of Compound A-3d

Was added 15 mL of phosphorus oxychloride to 30 mL of DMF under ice cooling, and the solution was stirred for 30 minutes. Thereto, 4.3 g of Compound A-3c was added, and the resulting mixture was heated to 60° C. and stirred for 5 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 1.8 g of Compound A-3d was obtained.

(5) Synthesis of Exemplified Dye A-3

Were added 1.4 g of Compound A-3d and 0.2 g of cyanoacetic acid to 20 mL of acetic acid, and the mixture was stirred for 30 minutes. Subsequently, 0.4 g of ammonium acetate was added thereto, and the mixture was heated to 90° C. and stirred for 4 hours. The reaction liquid was left to cool to room temperature, and then water was added to the reaction liquid. The mixture was subjected to extraction with ethyl acetate and the extract was concentrated. The crystals thus obtained were purified by recrystallization, and thus 1.3 g of the exemplified dye A-3 was obtained.

Synthesis Example 7-2

Preparation of Exemplified Dye A-2

As shown below, the exemplified dye A-2 was prepared by making Intermediate B-2 prepared separately react with A-2d.

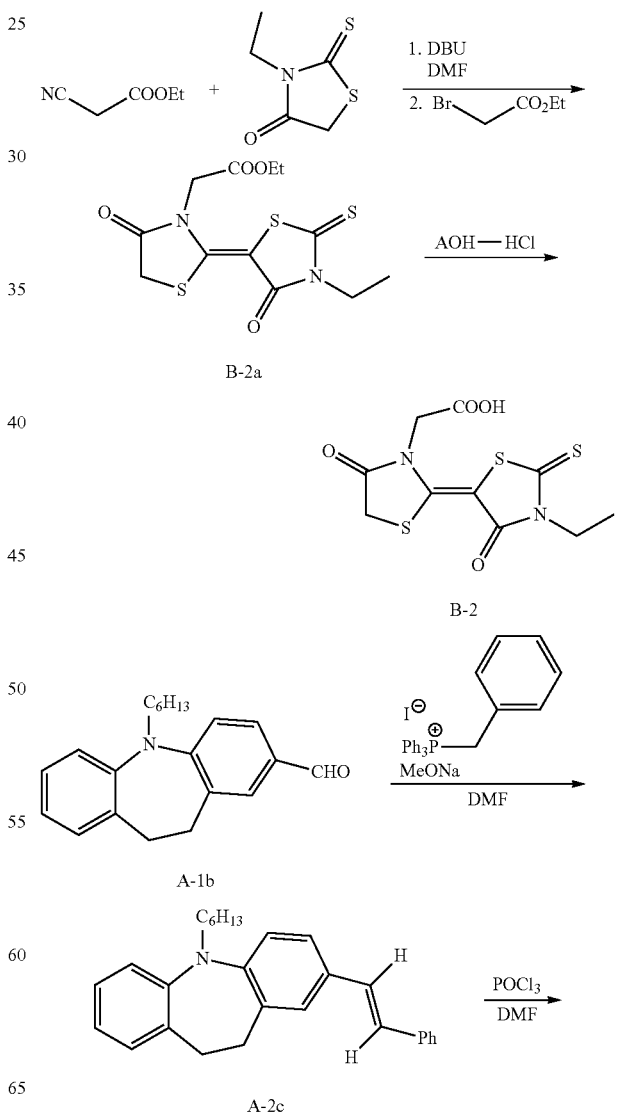

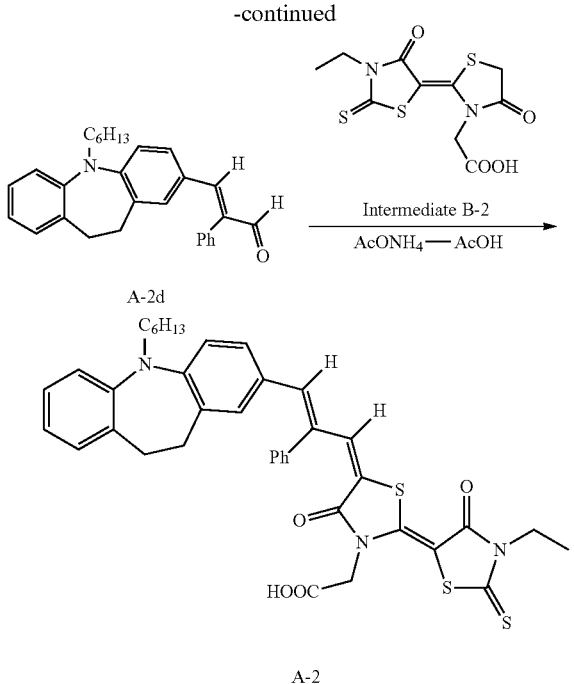

A-2d

A-2

(1) Preparation of Intermediate B-2
(i) Preparation of Compound B-2a

Were added 5.6 g of 3-ethyl rhodamine and 5.0 g of ethyl isothiocyanatoacetate to 40 mL of DMF, and the mixture was stirred on an ice bath. Subsequently, 5.5 g of DBU was added dropwise thereto. The mixture was stirred for 2 hours, and then 5.7 g of ethyl bromoacetate was added thereto. The mixture was heated to 80° C. and was stirred for 4 hours. The reaction liquid was left to cool to room temperature. Water was added thereto and extraction was performed with ethyl acetate. After concentration, purification by a column chromatography was performed, and thus 7.2 g of B-2a was obtained.

(ii) Preparation of Intermediate B-2

Were added 7.2 g of B-2a and 30 mL of concentrated hydrochloric acid to 60 mL of acetic acid, and the mixture was heated to 90° C. and stirred for 4 hours. Water was added to the reaction liquid thereto and precipitated crystals were collected by filtration, and the thus-obtained crystals were purified by recrystallization, to obtain 5.5 g of Intermediate B-2.

(2) Preparation of Exemplified Dye A-2
(i) Preparation of Compound A-2c

Were dissolved 2.0 g of Compound A-1b and 2.8 g of benzyltriphenylphosphonium bromide in 20 mL of DMF under stirring at room temperature, and then 1.5 g of a 28% methanol solution of sodium methoxide was added dropwise thereto. Subsequently, the mixture was heated to 60° C. and stirred for 3 hours. The reaction liquid was left to cool to room temperature, and then water was added to the reaction liquid. Hexane was further added to the mixture, and then extraction was performed. The organic layer was concentrated and then purified by column chromatography, and thus 1.6 g of Compound A-3c was obtained.

(ii) Preparation of Compound A-2d

Was added 15 mL of phosphorus oxychloride to 30 mL of DMF under ice cooling, and the solution was stirred for 30 minutes. Was added 2.9 g of Compound A-2c to this mixture, and the resulting mixture was heated to 50° C. and stirred for 4 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The reaction liquid was subjected to extraction with ethyl acetate. After concentration, column purification was performed, and thus 2.5 g of Compound A-2d was obtained.

(iii) Synthesis of Exemplified Dye A-2

Were added 0.60 g of Compound A-2d and 0.57 g of Intermediate B-2 to 20 mL of acetic acid, and the mixture was stirred for 30 minutes. Subsequently, 0.2 g of ammonium acetate was added thereto, and the mixture was heated to 90° C. and stirred for 4 hours. The reaction liquid was left to cool to room temperature, and then water was added to the reaction liquid and precipitated crystals were collected by filtration. The crystals thus obtained were purified by recrystallization, and thus 0.9 g of the exemplified dye A-2 was obtained.

Synthesis Example 8-2

Preparation of Exemplified Dye A-46

The exemplified dye A-46 was prepared according to the method shown below.

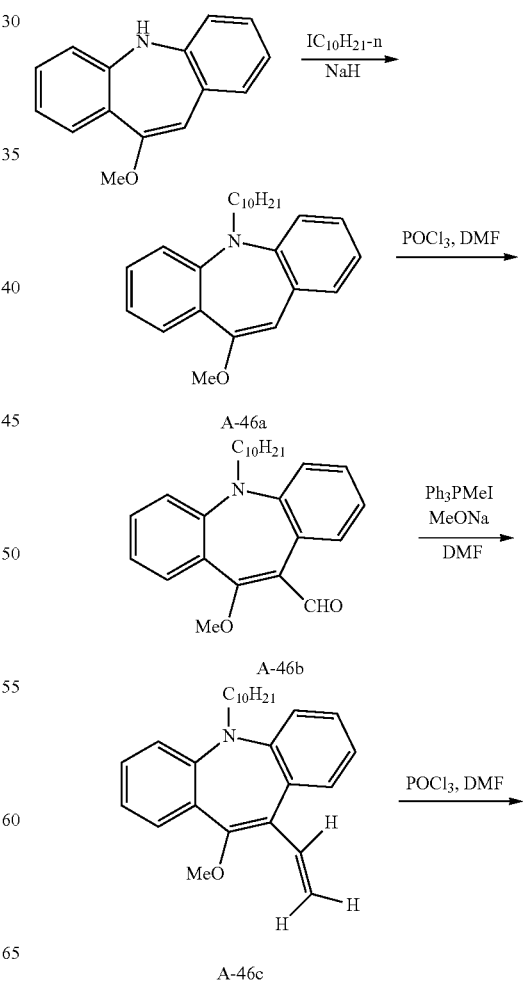

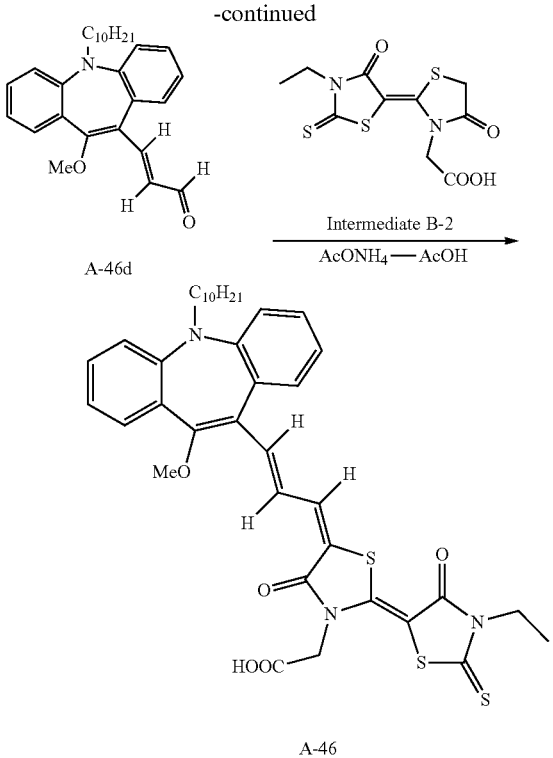

A-46d

A-46

(1) Preparation of Compound A-46a

Were added and dissolved 5.0 g of 10-methoxy-5H-dibenz[b,f]azepine and 9.3 g of 1-iododecane in 20 mL of DMF under stirring at room temperature, and then the mixture was cooled with ice. Thereto, 2.0 g of 50% to 70% sodium hydride was added in divided portions, and the mixture was stirred for 5.0 hours at an internal temperature of 10° C. or lower. After completion of the reaction, water was added dropwise to the reaction liquid to deactivate remaining sodium hydride, and hexane was added to perform partition. The organic layer was concentrated and purified by column chromatography, and thus 8.4 g of Compound A-46a was obtained.

(2) Preparation of Compound A-46b

Was added 10 mL of phosphorus oxychloride to 20 mL of DMF under ice cooling, and the solution was stirred for 30 minutes. Thereto, 3.5 g of Compound A-46a was added, and the resulting mixture was heated to 60° C. and stirred for 2.5 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 3.7 g of Compound A-46b was obtained.

(3) Preparation of Compound A-46c

Were dissolved 3.5 g of Compound A-46b and 4.3 g of methyltriphenylphosphonium iodide in 20 mL of DMF under stirring at room temperature, and then 2.0 g of a 28% MeOH solution of sodium methoxide was added dropwise thereto. Subsequently, the mixture was heated to 60° C. and stirred for 4 hours. The reaction liquid was left to cool to room temperature, and then water was added to the reaction liquid. Hexane was further added to the mixture, and then partition was performed. The organic layer was concentrated and then purified by column chromatography, and thus 2.7 g of Compound A-46c was obtained.

(4) Preparation of Compound A-46d

Was added 10 mL of phosphorus oxychloride to 20 mL of DMF under ice cooling, and the solution was stirred for 30 minutes. Was added 2.7 g of Compound A-46c to this mixture, and the resulting mixture was heated to 60° C. and stirred for one hour. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The reaction liquid was subjected to extraction with ethyl acetate. After concentration, column purification was performed, and thus 2.5 g of Compound A-46d was obtained.

(5) Synthesis of Exemplified Dye A-46

Were added 0.6 g of Compound A-46d and 0.5 g of Intermediate B-2 to 30 mL of acetic acid, and the mixture was stirred for 30 minutes. Subsequently, 0.2 g of ammonium acetate was added thereto, and the mixture was heated to 90° C. and stirred for 4 hours. The reaction liquid was left to cool to room temperature, and then water was added to the reaction liquid and precipitated crystals were collected by filtration. The crystals thus obtained were purified by recrystallization, and thus 0.2 g of the exemplified dye A-46 was obtained.

Synthesis Example 9-2

Preparation of Exemplified Dye A-17

The exemplified dye A-17 was prepared according to the method shown below.

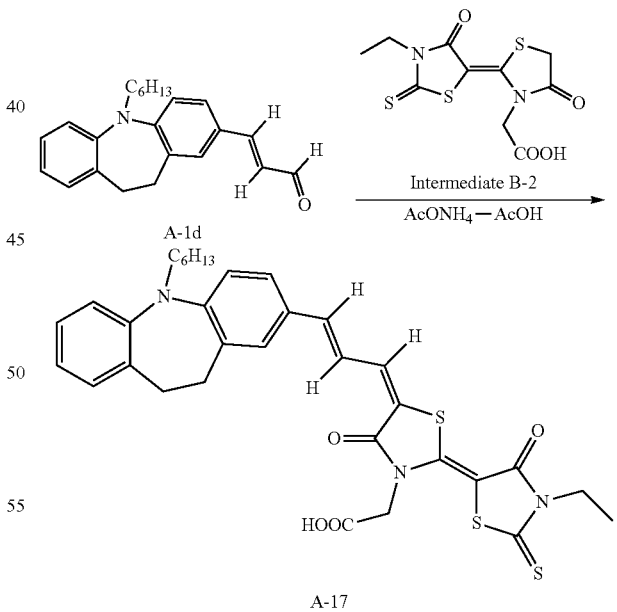

A-1d

A-17

Were added 0.50 g of A-1d and 0.48 g of Intermediate B-2 to 20 mL of acetic acid, and the mixture was stirred for 30 minutes. Subsequently, 0.23 g of ammonium acetate was added thereto, and the mixture was heated to 90° C. and stirred for 4 hours. The reaction liquid was left to cool to room temperature, and then water was added to the reaction liquid and precipitated crystals were collected by filtration.

The crystals thus obtained were purified by recrystallization, and thus 0.9 g of A-17 was obtained.

Synthesis Example 10-2

Preparation of Exemplified Dye A-9

The exemplified dye A-9 was prepared according to the method shown below.

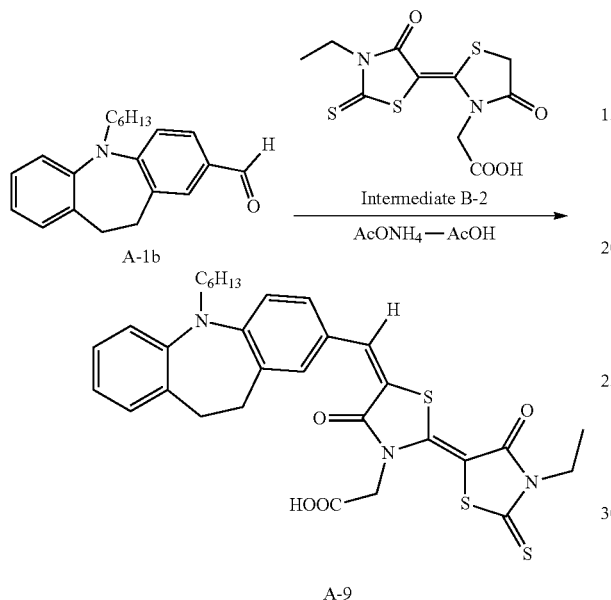

Were added 0.58 g of A-1b and 0.6 g of Intermediate B-2 to 20 mL of acetic acid, and the mixture was stirred for 30 minutes. Subsequently, 0.33 g of ammonium acetate was added thereto, and the mixture was heated to 90° C. and stirred for 2 hours. The reaction liquid was left to cool to room temperature, and then water was added to the reaction liquid and precipitated crystals were collected by filtration. The crystals thus obtained were purified by recrystallization, and thus 0.94 g of A-9 was obtained.

Synthesis Example 11-2

Preparation of Exemplified Dye A-10

The exemplified dye A-10 was prepared according to the method shown below.

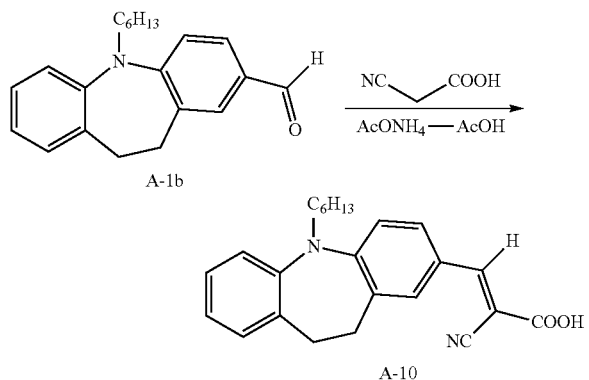

Were added 1.8 g of A-1b and 0.5 g of Intermediate B-2 to 20 mL of acetic acid, and the mixture was stirred for 30 minutes. Subsequently, 1.0 g of ammonium acetate was added thereto, and the mixture was heated to 90° C. and stirred for 4 hours. The reaction liquid was left to cool to room temperature, and then water was added to the reaction liquid and precipitated crystals were collected by filtration. The crystals thus obtained were purified by recrystallization, and thus 1.9 g of A-10 was obtained.

Synthesis Example 12-2

Preparation of Exemplified Dye A-16

The exemplified dye A-16 was prepared according to the method shown below.

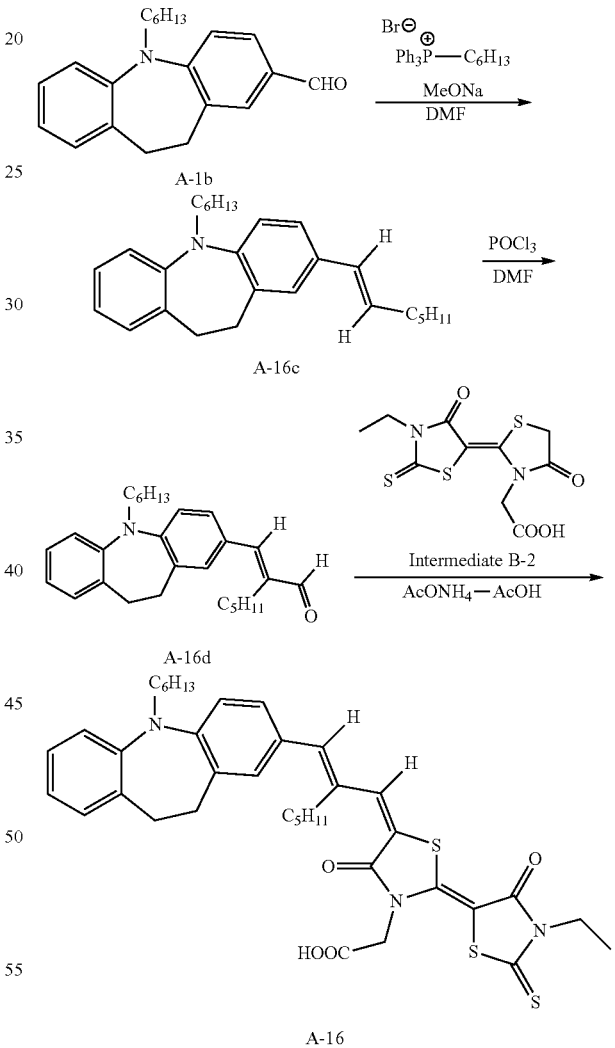

(1) Preparation of Compound A-16c

Were dissolved 3.1 g of Compound A-1b and 5.2 g of hexyltriphenylphosphonium bromide in 20 mL of DMF under stirring at room temperature, and then 2.5 g of a 28% methanol solution of sodium methoxide was added dropwise thereto. Subsequently, the mixture was heated to 60° C. and stirred for 2 hours. The reaction liquid was left to cool to room temperature, and then water was added to the reaction liquid. Hexane was further added to the mixture, and then partition was performed. The organic layer was concentrated and then purified by column chromatography, and thus 3.3 g of Compound A-16c was obtained.

(4) Preparation of Compound A-16d

Was added 10 mL of phosphorus oxychloride to 20 mL of DMF under ice cooling, and the solution was stirred for 30 minutes. Was added 3.2 g of Compound A-16c to this mixture, and the resulting mixture was heated to 35° C. and stirred for 6 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The reaction liquid was subjected to extraction with ethyl acetate. After concentration, column purification was performed, and thus 2.5 g of Compound A-16d was obtained.

(5) Synthesis of Exemplified Dye A-16

Were added 0.75 g of A-16d and 0.60 g of the above-described Intermediate B-2 to 20 mL of AcOH, and the mixture was stirred for 30 minutes. Subsequently, 0.44 g of ammonium acetate was added thereto, and the mixture was heated to 90° C. and stirred for 5 hours. The reaction liquid was left to cool to room temperature, and then water was added to the reaction liquid and precipitated crystals were collected by filtration. The crystals thus obtained were purified by recrystallization, and thus 0.95 g of A-2 was obtained.

Synthesis Example 13-2

Preparation of Exemplified Dye A-29

The exemplified dye A-29 was prepared according to the method shown below.

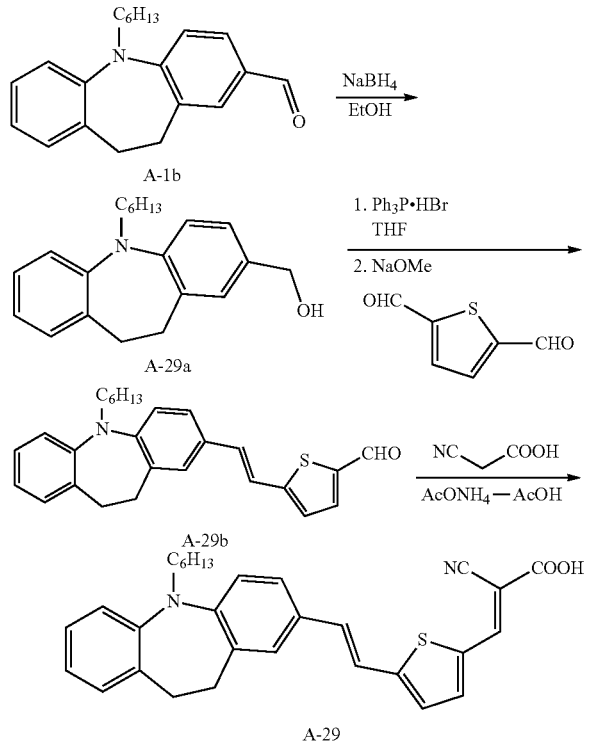

(1) Preparation of Compound A-29a

Were added 3.0 g of Compound A-1b and 0.4 g of sodium borohydride to 30 mL of EtOH under ice cooling, and the mixture was stirred for 2 hours. Water was added to the reaction liquid and the mixture was stirred. Then, the reaction liquid was subjected to extraction with ethyl acetate. After concentration, purification by column chromatography was performed, and thus 2.9 g of Compound A-29a was obtained.

(2) Preparation of Compound A-29b

Were stirred 1.7 g of Compound A-29b and 1.9 g of triphenylphosphine-hydrogen bromide salt in 30 ml of THF at 90° C. for 4.5 hours. Then, the mixture was allowed to cool down to room temperature. To this, 0.9 g of 2,5-thiophene dicarboxyaldehyde and 1.3 g of a 28% methanol solution of sodium methoxide were added dropwise. Subsequently, the mixture was heated to 40° C. and stirred for 3 hours. The reaction liquid was left to cool to room temperature, and then water was added to the reaction liquid. The reaction liquid was subjected to extraction with ethyl acetate. After concentration, purification by column chromatography was performed, and thus 1.9 g of Compound A-29b was obtained.

(3) Synthesis of Compound A-29

Were added 0.60 g of Compound A-29b and 0.14 g of cyanoacetic acid to 20 mL of acetic acid, and the mixture was stirred for 30 minutes. Subsequently, 0.28 g of ammonium acetate was added thereto, and the mixture was heated to 90° C. and stirred for 11 hours. The reaction liquid was left to cool to room temperature, and then water was added to the reaction liquid. The mixture was subjected to extraction with ethyl acetate and the extract was concentrated. The crystals thus obtained were purified by column chromatography, and thus 0.2 g of A-29 was obtained.

Synthesis Example 14-2

Preparation of Exemplified Dye A-47

The exemplified dye A-47 was prepared according to the method shown below.

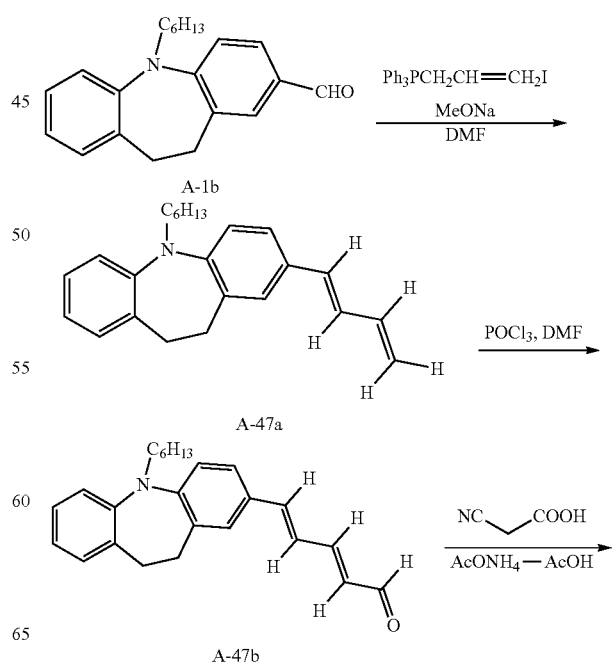

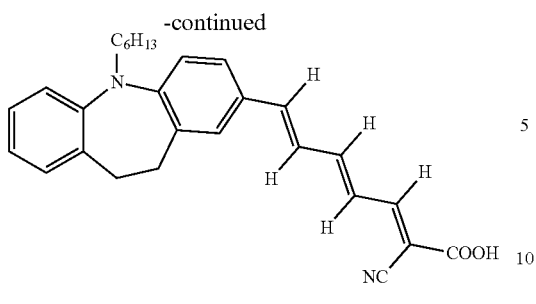

A-47

(1) Preparation of Compound A-47a

Were dissolved 3.0 g of Compound A-1b and 4.5 g of allyltriphenylphosphonium bromide in 30 mL of DMF under stirring at room temperature, and then 2.3 g of a 28% methanol solution of sodium methoxide was added dropwise thereto. Subsequently, the mixture was heated to 60° C. and stirred for 5 hours. The reaction liquid was left to cool to room temperature, and then water was added to the reaction liquid. Hexane was further added to the mixture, and then partition was performed. The organic layer was concentrated and then purified by column chromatography, and thus 2.1 g of Compound A-47a was obtained.

(2) Preparation of Compound A-47b

Was added 5 mL of phosphorus oxychloride to 10 mL of DMF under ice cooling, and the solution was stirred for 30 minutes. Was added 2.1 g of Compound A-47a to this mixture, and the resulting mixture was heated to 60° C. and stirred for 1.5 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The reaction liquid was subjected to extraction with ethyl acetate. After concentration, column purification was performed, and thus 1.0 g of Compound A-47b was obtained.

(3) Synthesis of Exemplified Dye A-47

Were added 0.93 g of A-47b and 0.22 g of cyanoacetic acid to 15 mL of acetic acid, and the mixture was stirred for 30 minutes. Subsequently, 0.4 g of ammonium acetate was added thereto, and the mixture was heated to 90° C. and stirred for 4 hours. The reaction liquid was left to cool to room temperature, and then water was added to the reaction liquid. The mixture was subjected to extraction with ethyl acetate and the extract was concentrated. The crystals thus obtained were purified by recrystallization, and thus 0.70 g of A-47 was obtained.

Synthesis Example 15-2

Preparation of Exemplified Dye A-48

As shown below, the exemplified dye A-48 was prepared by using the intermediate B-3 prepared separately.
(1) Preparation of Intermediate B-3

First, the intermediate B-3 was prepared according to the method shown below.

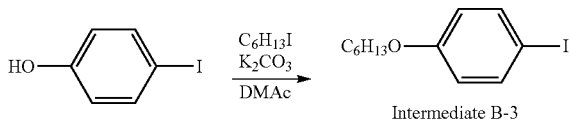

Were added 22.7 g of iodophenol, 21.9 g of iodohexane and 21.3 g of potassium carbonate to 100 mL of dimethylacetamide (DMAc), and the mixture was stirred for 4 hours. Water was added to the reaction liquid, and then the reaction liquid was subjected to extraction with ethyl acetate. After concentration, purification by column chromatography was performed, and thus 28 g of Intermediate B-3 was obtained.

Next, as shown below, the exemplified dye A-48 was prepared by using the thus-obtained intermediate B-3.

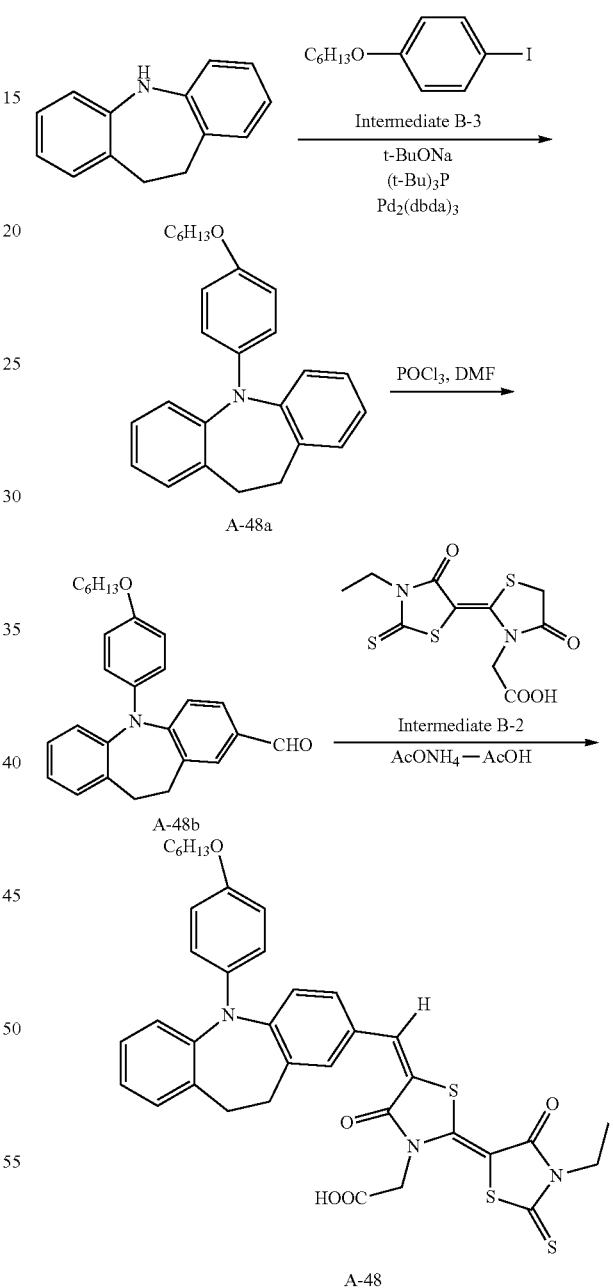

(2) Preparation of Compound A-48a

Were added 0.5 g of 10,11-dihydro-5H-dibenz[b,f]azepine, 0.73 g of sodium t-butoxide, 0.66 g of intermediate B-3, one drop of tri-t-butylphosphine and a catalytic amount of tris (dibenzylideneacetone) palladium to 20 ml of toluene; and the mixture was heated to 110° C. and stirred for 4 hours. Thereafter, water was added to the reaction liquid to terminate the reaction. Ethyl acetate was added to this liquid to perform partition. The organic layer was concentrated and then purified by column chromatography, and thus 0.67 g of Compound A-48a was obtained.

(3) Preparation of Compound A-48b

Was added 20 mL of phosphorus oxychloride to 90 mL of DMF under ice cooling, and the solution was stirred for 30 minutes. Thereto, 11.1 g of Compound A-48b was added, and the resulting mixture was heated to 70° C. and stirred for 5 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 6.0 g of Compound A-48b was obtained.

(4) Synthesis of Exemplified Dye A-48

Were added 0.71 g of A-48b and 0.57 g of Intermediate B-2 to 30 mL of acetic acid, and the mixture was stirred for 30 minutes. Subsequently, 0.27 g of ammonium acetate was added thereto, and the mixture was heated to 90° C. and stirred for 4.5 hours. The reaction liquid was left to cool to room temperature, and then water was added to the reaction liquid and precipitated crystals were collected by filtration. The crystals thus obtained were purified by recrystallization, and thus 1.1 g of A-48 was obtained.

Synthesis Example 16-2

Preparation of Exemplified Dye A-49

As shown below, the exemplified dye A-49 was prepared by using Intermediate B-2 prepared separately.

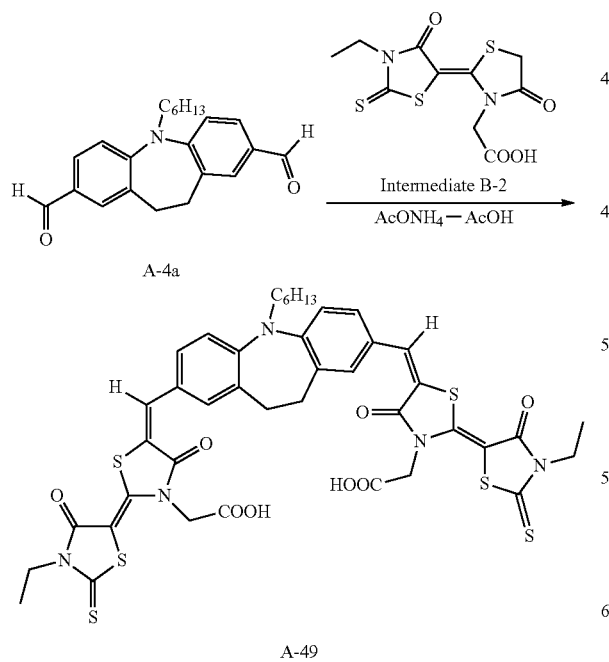

Were added 0.51 g of A-4a and 0.97 g of Intermediate B-2 to 50 mL of acetic acid, and the mixture was stirred for 30 minutes. Subsequently, 0.47 g of ammonium acetate was added thereto, and the mixture was heated to 90° C. and stirred for 6 hours. The reaction liquid was left to cool to room temperature, and then water was added to the reaction liquid and precipitated crystals were collected by filtration. The crystals thus obtained were purified by recrystallization, and thus 1.1 g of the exemplified dye A-49 was obtained.

Synthesis Example 17-2

Preparation of Exemplified Dye A-50

As shown below, the exemplified dye A-50 was prepared by using Intermediate B-2 prepared separately.

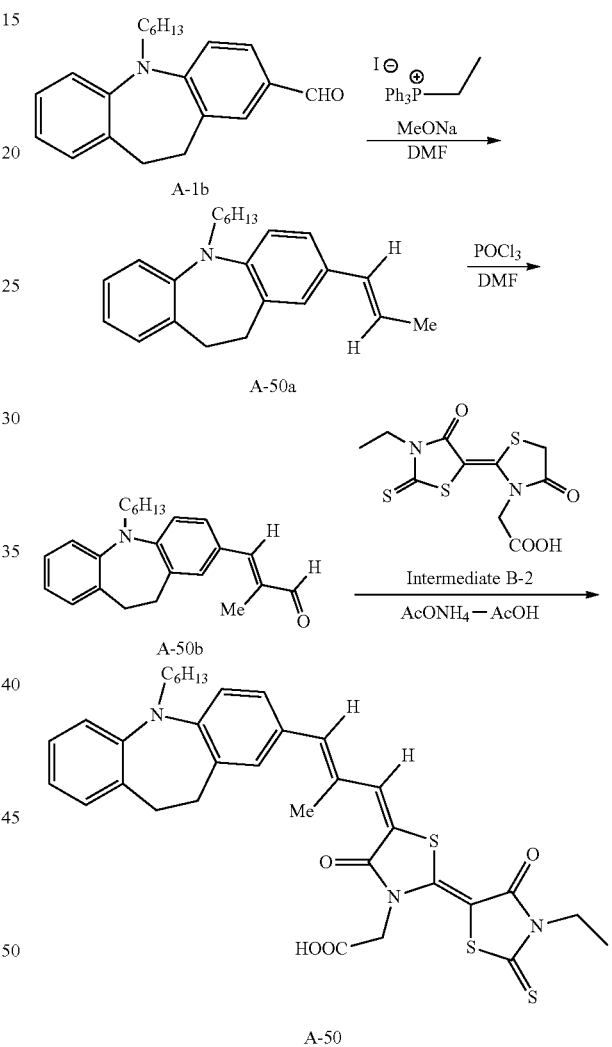

(1) Preparation of Compound A-50a

Were dissolved 2.0 g of Compound A-1b and 3.0 g of ethyltriphenylphosphonium iodide in 25 mL of DMF under stirring at room temperature, and then 1.5 g of a 28% methanol solution of sodium methoxide was added dropwise thereto. Subsequently, the mixture was heated to 60° C. and stirred for 4 hours. The reaction liquid was left to cool to room temperature, and then water was added to the reaction liquid. Hexane was further added to the mixture, and then partition was performed. The organic layer was concentrated and then purified by column chromatography, and thus 1.9 g of Compound A-50a was obtained.

(2) Preparation of Compound A-50b

Was added 10 mL of phosphorus oxychloride to 20 mL of DMF under ice cooling, and the solution was stirred for 30 minutes. Thereto, 2.9 g of Compound A-50b was added, and the resulting mixture was heated to 50° C. and stirred for 4 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate. After concentration, column purification was performed, and thus 1.3 g of Compound A-50b was obtained.

(3) Synthesis of Exemplified Dye A-50

Were added 0.70 g of A-50b and 0.67 g of Intermediate B-2 to 20 mL of acetic acid, and the mixture was stirred for 30 minutes. Subsequently, 0.32 g of ammonium acetate was added thereto, and the mixture was heated to 90° C. and stirred for 5 hours. The reaction liquid was left to cool to room temperature, and then water was added to the reaction liquid and precipitated crystals were collected by filtration. The crystals thus obtained were purified by recrystallization, and thus 0.9 g of A-50 was obtained.

Synthesis Example 18-2

Preparation of Exemplified Dye A-51

As shown below, the exemplified dye A-51 was prepared by using Intermediate B-2 prepared separately.

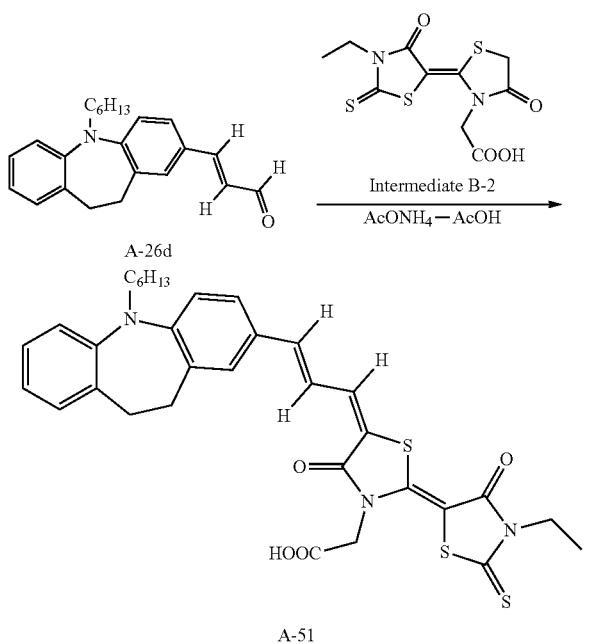

Were added 0.48 g of A-26d and 0.38 g of Intermediate B-2 to 20 mL of acetic acid, and the mixture was stirred for 30 minutes. Subsequently, 0.19 g of ammonium acetate was added thereto, and the mixture was heated to 90° C. and stirred for 4 hours. The reaction liquid was left to cool to room temperature, and then water was added to the reaction liquid and precipitated crystals were collected by filtration. The crystals thus obtained were purified by recrystallization, and thus 0.7 g of A-51 was obtained.

Synthesis Example 19-2

Preparation of Exemplified Dye A-52

The exemplified dye A-52 was prepared according to the method shown below.

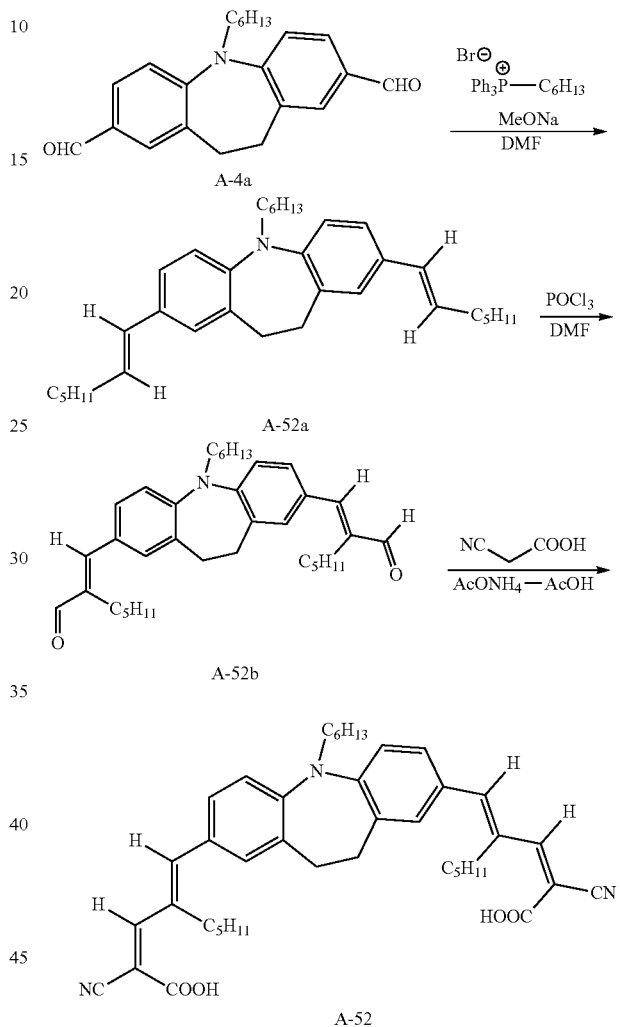

(1) Synthesis of Compound A-52a

Were dissolved 3.3 g of Compound A-4a and 8.7 g of hexyltriphenylphosphonium iodide in 30 mL of DMF under stirring at room temperature, and then 3.9 g of a 28% methanol solution of sodium methoxide was added dropwise thereto. Subsequently, the mixture was heated to 60° C. and stirred for 2 hours. The reaction liquid was left to cool to room temperature, and then water was added to the reaction liquid. Hexane was further added to the mixture, and then partition was performed. The organic layer was concentrated and then purified by column chromatography, and thus 4.2 g of Compound A-52b was obtained.

(2) Synthesis of Compound A-52b

Was added 15 mL of phosphorus oxychloride to 30 mL of DMF under ice cooling, and the solution was stirred for 30 minutes. Thereto, 4.2 g of Compound A-52a was added, and the resulting mixture was heated to 60° C. and stirred for 4 hours. The mixture was left to cool to room temperature, subsequently water was added to the reaction liquid, and the mixture was stirred. Further, the reaction liquid was added dropwise to a 10% aqueous solution of sodium hydroxide, and the resulting mixture was stirred for one hour. The mixture was subjected to extraction with ethyl acetate. After concentration, column purification was performed, and thus 3.8 g of Compound A-52b was obtained.

(3) Synthesis of Exemplified Dye A-52

Were added 0.90 g of A-52b and 0.30 g of cyanoacetic acid to 20 mL of acetic acid, and the mixture was stirred for 30 minutes. Subsequently, 0.26 g of ammonium acetate was added thereto, and the mixture was heated to 90° C. and stirred for 4 hours. The reaction liquid was left to cool to room temperature, and then water was added to the reaction liquid. The mixture was subjected to extraction with ethyl acetate and the extract was concentrated. The crystals thus obtained were purified by recrystallization, and thus 1.0 g of A-52 was obtained.

Synthesis Example 20-2

Preparation of Exemplified Dye A-53

As shown below, the exemplified dye A-53 was prepared by using Intermediate B-2 prepared separately.

Were added 0.77 g of A-52b and 0.92 g of Intermediate B-2 to 50 mL of acetic acid, and the mixture was stirred for 30 minutes. Subsequently, 0.45 g of ammonium acetate was added thereto, and the mixture was heated to 90° C. and stirred for 6 hours. The reaction liquid was left to cool to room temperature, and then water was added to the reaction liquid and precipitated crystals were collected by filtration. The crystals thus obtained were purified by recrystallization, and thus 1.1 g of A-53 was obtained.

(Preparation of Other Exemplified Compounds of Second Invention)

Next, other dyes shown in Table 1-2 as the dye of the second invention were also prepared in the same manner as described in the above-described Synthesis Examples.

Synthesis Examples of Dyes of Third Invention

Next, CA-1 and CA-4 were prepared as the dyes of the third invention.

Synthesis Example 1-3

Preparation of Exemplified Dye CA-1

The exemplified dye CA-1 was prepared according to the method shown in the following scheme.

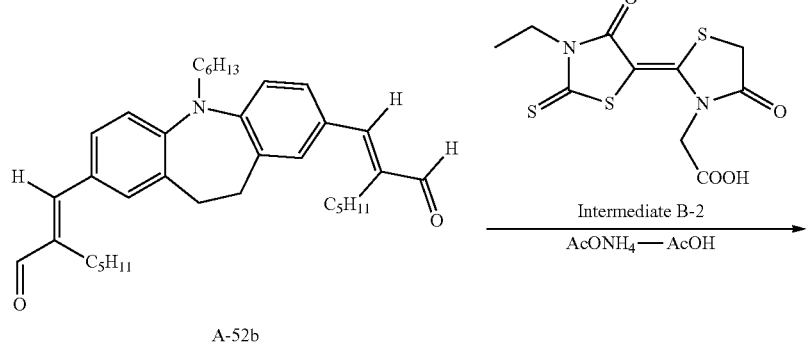

A-52b

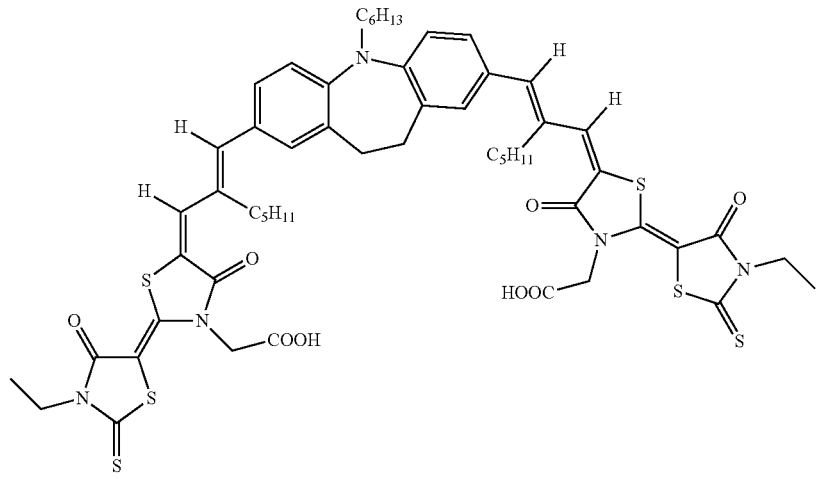

A-53

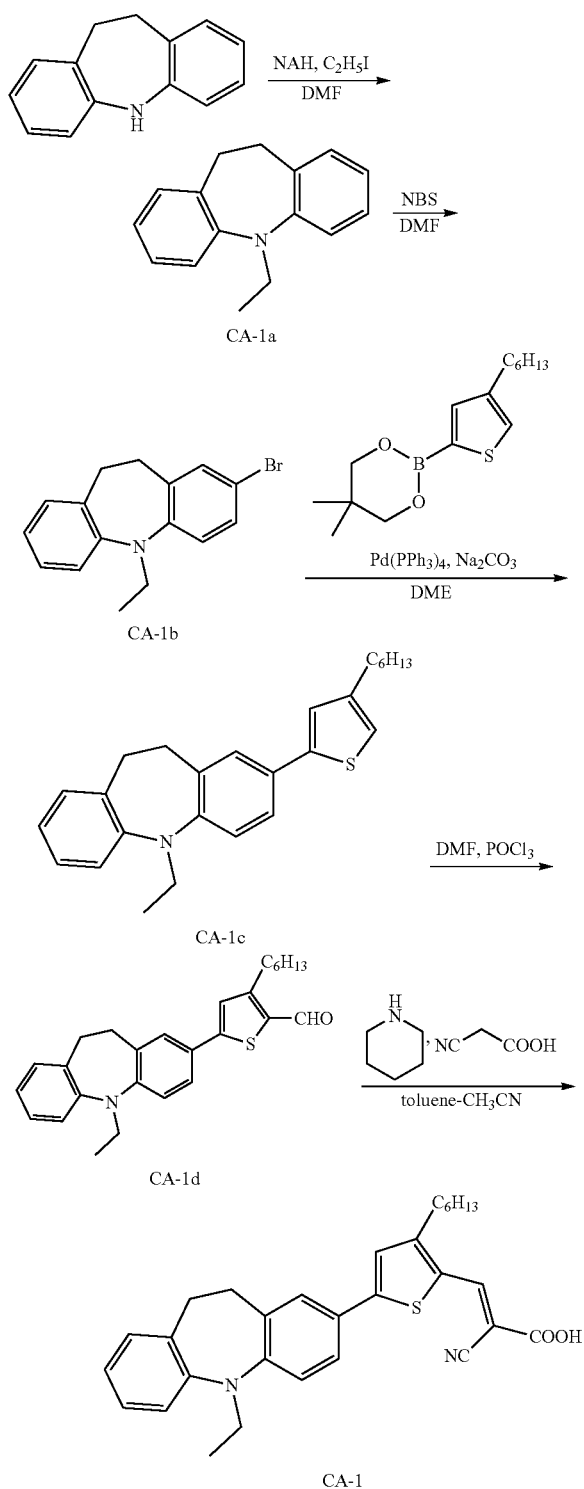

(1) Preparation of Compound CA-1a

Was dissolved 50.0 g of 10,11-dihydro-5H-dibenz[b,f] azepine in 130 mL of DMF under stirring at room temperature, and then the solution was cooled with ice. Thereto, 18.4 g of 50% to 70% sodium hydride was added in four divided portions, and the mixture was stirred for 0.5 hour at an internal temperature of 5° C. or lower. To the mixture, 70.3 g of 1-iodoethane was added dropwise over 20 minutes, and the remaining amount of 1-iodoethane was washed with 20 ml of DMF to incorporate the remainder therein. Then, rising the temperature thereof to room temperature, the mixture was subjected to reaction for 2.5 hours. After the end of reaction, water was added dropwise to the reaction liquid and ethyl acetate was added to conduct extraction. After partition, the extracted ethyl acetate layer was washed with 1 N-hydrochloric acid, sodium bicarbonate water, and water in this order, and then preliminarily dried with anhydrous sodium sulfate. After removal of magnesium sulfate, concentration was conducted. The resultant crude product was purified by column chromatography (solvent:hexane), and thus 41.7 g of Compound A-1a was obtained.

(2) Preparation of Compound CA-1b

Was dissolved 10.0 g of Compound CA-1a in 180 mL of DMF while stirring at room temperature, and then the mixture was cooled on ice. Thereto, 10.1 g of N-bromosuccinimide was added in four divided portions, and stirring was continued for 1 hour, as it is. After the end of reaction, an aqueous solution of sodium thiosulfate and ethyl acetate were added to the reaction solution in order to conduct extraction and partition. After that, the extracted ethyl acetate layer was washed by addition of water. After partition, the ethyl acetate layer was preliminarily dried with anhydrous sodium sulfate, and then filtration and concentration were conducted. The resultant crude product was roughly purified by column chromatography (solvent: hexane), and further purified by liquid chromatography. Thus, 6.5 g of CA-1b was obtained.

(3) Preparation of Compound CA-1c

In 40 mL of DME, 1.21 g of Compound CA-1b, 2.25 g of 4-hexyl-2-boronic acid ester, and 6 mL of 10 wt % solution of sodium carbonate were dissolved, and then the reaction system was substituted with nitrogen gas. To this solution, 234 mg of tetrakis (triphenylphosphine) palladium was added, and reflux by heating was conducted for 3.5 hours. After cooling down to room temperature, the reaction solution was diluted with ethyl acetate, and the resultant organic layer was washed with water twice. After drying with magnesium sulfate, a solvent was distilled away under the reduced pressure to obtain a crude product. The crude product was purified by column chromatography (solvent: ethyl acetate/hexane=1/15), and thus 1.54 g of CA-1c was obtained.

(4) Preparation of Compound CA-1d

Was dissolved 039 g of Compound CA-1c in 10 mL of DMF, and cooled on ice. To this solution, a Vilsmeier reagent that had been previously prepared from 1.32 mL of DMF and 0.34 mL of phosphorous oxychloride was added dropwise, and stirred at room temperature for 1 hour. Thereafter, temperature was increased to 70° C. and stirring was further continued for 1 hour and 20 minutes.

After the end of reaction, the reaction solution was added to a 14 wt % aqueous solution of sodium acetate, and stirred at room temperature for 30 minutes. The resultant solution was extracted twice with ethyl acetate. The ethyl acetate extracts were mixed together, and washed with water. After drying with magnesium sulfate, a solvent was distilled away under reduced pressure to obtain a crude product. The crude product was roughly purified by column chromatography (solvent:ethyl acetate/hexane=1/10), and further purified by liquid chromatography. Thus, 0.28 g of CA-1d was obtained.

(5) Preparation of Compound CA-1

Was dissolved 0.20 g of Compound CA-1d in 3.5 ml of acetonitrile and 3 ml of toluene. To this solution, 81.5 mg of cyanoacetic acid and 2 ml of piperidine were added and heated at 70° C. while stirring 8.5 hours. After cooling, dichloromethane was added to the reaction solution, and then the resultant organic layer was washed twice with a dilute hydrochloric acid and water. After drying with sodium sulfate, a solvent was distilled away under reduced pressure to obtain a crude product. The crude product was recrystallized with methanol/dichloromethane to roughly purify it. Then, purification was performed by column chromatography (solvent:dichloromethane→dichloromethane/methanol=10/1). Thus, 0.12 g of CA-1 was obtained.

By measurement of an UV-VIS spectrum of ethanol solution of this compound, the maximum absorption wavelength was confirmed to be 437.5 nm.

Synthesis Example 2-3

Preparation of Exemplified Dye CA-4

In accordance with the method of the following scheme, Exemplified Dye CA-4 was prepared using CA-1d prepared in the above Synthesis Example 1-3.

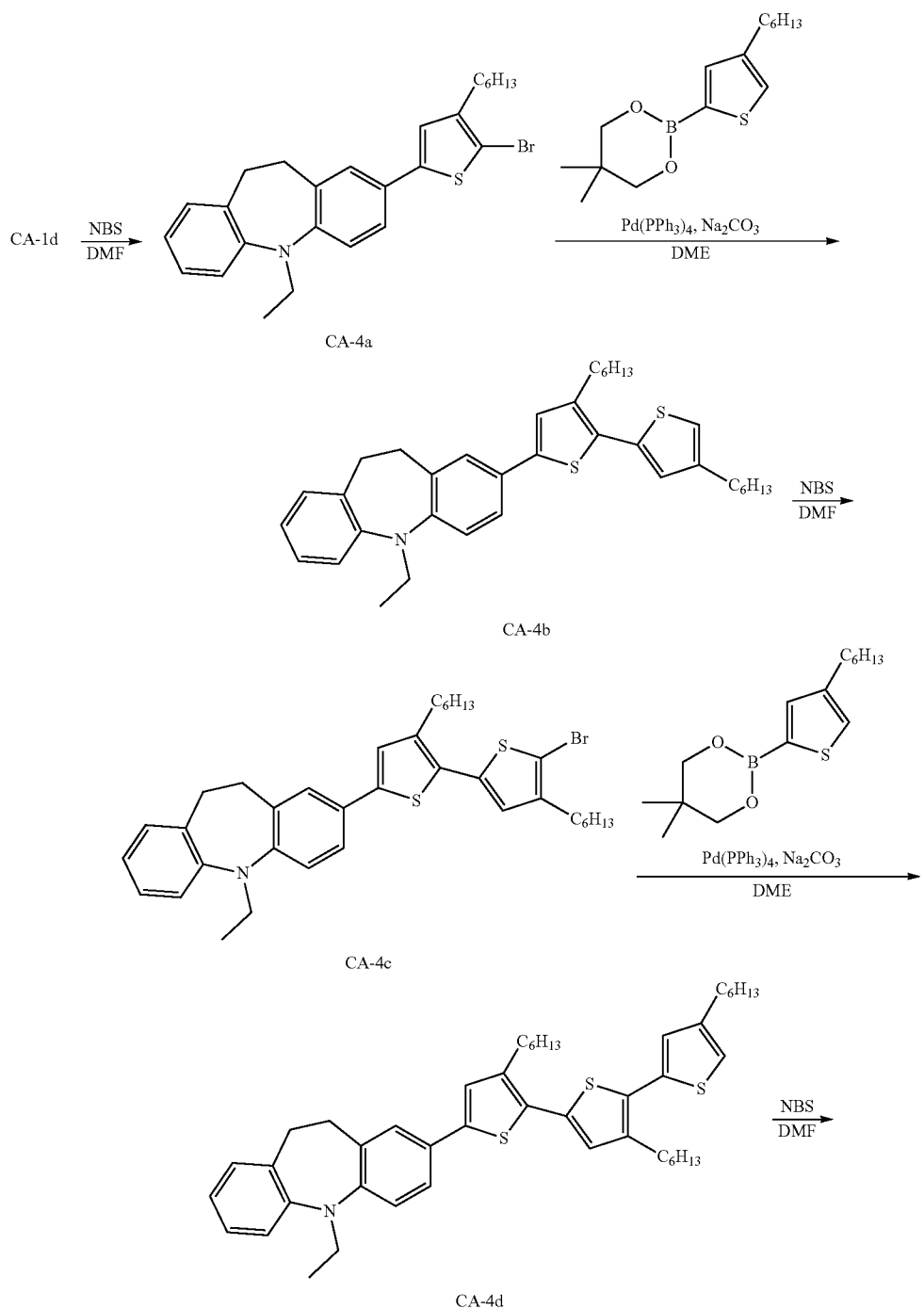

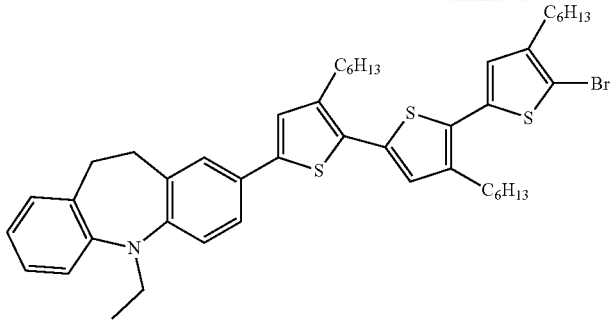

CA-4e

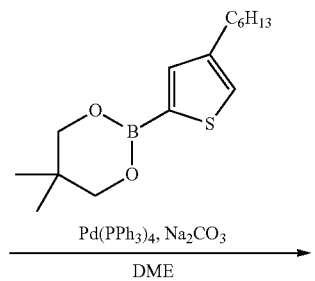

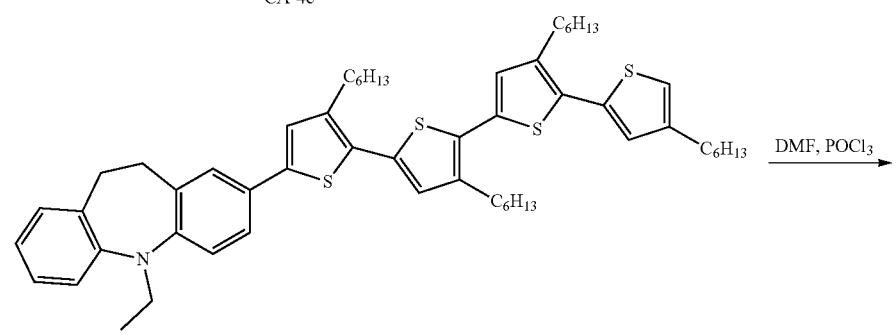

CA-4f

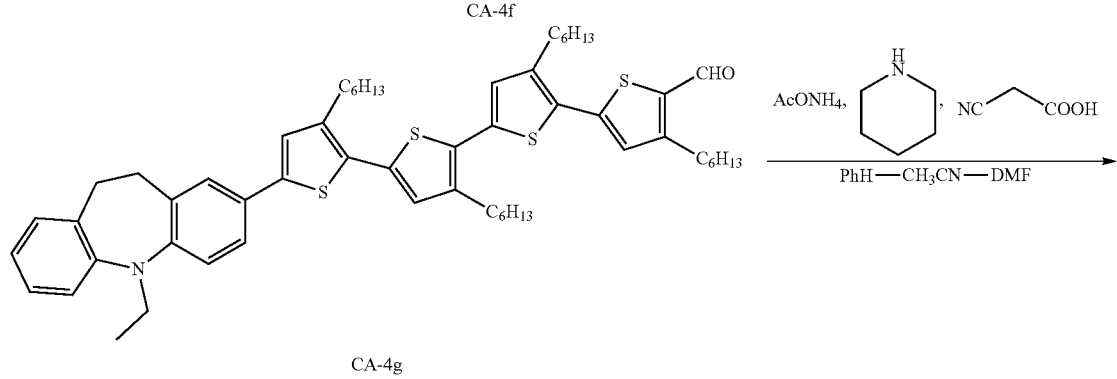

CA-4g

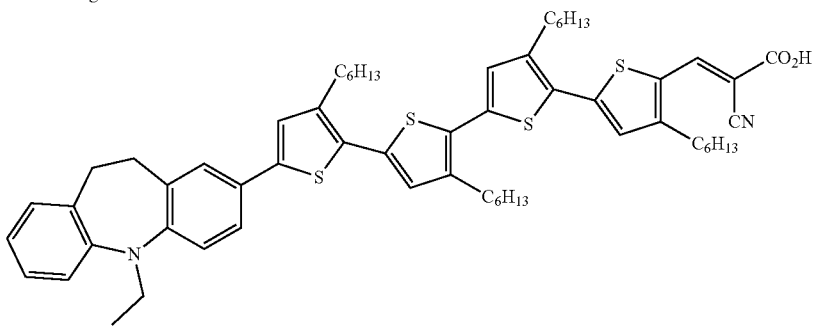

CA-4

(6) Preparation of Compound CA-4-a

Was dissolved 0.7 g of Compound CA-1d in 10 mL of DMF while stirring at room temperature, and then the mixture was cooled on ice. Was introduced 0.265 g of N-bromosuccinimide to the solution in divided portions; and stirring was continued for 1 hour. After the end of reaction, an aqueous solution of sodium thiosulfate and ethyl acetate were added to the reaction solution in order to conduct extraction and partition. After that, the extracted ethyl acetate layer was washed by addition of water. After partition, the ethyl acetate layer was preliminarily dried with anhydrous sodium sulfate, and then filtration and concentration were conducted. The resultant crude product was roughly purified by column chromatography (solvent: hexane), and further purified by liquid chromatography. Thus, 0.51 g of CA-4-d was obtained.

By repeating the Suzuki coupling reaction described in the above paragraph {0076} and the bromination reaction described in the above paragraph {0079}, each of azepine derivatives in which two of the hexyl-substituted thiophene rings represented by A-4-b are linked together, azepine derivatives in which three of the hexyl-substituted thiophene rings represented by A-4-d are linked together, and azepine derivatives in which four of the hexyl-substituted thiophene rings represented by A-4-f are linked together, can be synthesized.

(7) Preparation of Compound CA-4

0.21 g of Compound CA-4-g was dissolved in solution containing 3.5 mL of acetonitrile, 3 mL of benzene and 0.2 ml of DMF. To the solution, 42.1 mg of cyanoactic acid, 0.6 mL of piperidine and 42.5 mg of ammonium acetate were added. Then, reflux by heating was conducted for 33 hours using a Dean-Stark apparatus. After cooling, dichloromethane was added to the reaction solution, and then the resultant organic layer was washed twice with a dilute hydrochloric acid and water. After drying with sodium sulfate, a solvent was distilled away under reduced pressure to obtain a crude product. The crude product was roughly purified by column chromatography (solvent:dichloromethane→dichloromethane/methanol=20/1) and then, purification was performed by liquid chromatography. Thus, 0.11 g of CA-4 was obtained.

By measurement of an UV-VIS spectrum of the objective compound in an ethanol/THF mixed solution (3:2, volume ratio), the maximum absorption wavelength was confirmed to be 450.5 nm.

The dyes, shown in Tables 1-3 to 1-5, that are other than the above-described dyes were prepared in the same manner as described above.

The following Examples were carried out using the dyes prepared as described above.

Example 1-1

Production of Photoelectric Conversion Element

A photoelectric conversion element such as shown in FIG. 1 was produced as follows.

On a glass substrate, a film of tin oxide doped with fluorine was formed by sputtering as a transparent conductive film, and this film was scribed with a laser to partition the transparent conductive film into two parts.

Subsequently, 32 g of anatase type titanium oxide (P-25 (trade name) manufactured by Nippon Aerosil Co., Ltd.) was incorporated into 100 ml of a mixed solvent composed of water and acetonitrile at a volume ratio of 4:1, and the mixture was uniformly dispersed and mixed using a mixing conditioner of rotation/revolution combination type. Thus, a dispersion liquid of semiconductor fine particles was obtained. This dispersion liquid was applied on the transparent conductive film and heated, and thus a light-receiving electrode was produced.

Thereafter, a dispersion liquid containing silica particles and rutile type titanium oxide at a ratio of 40:60 (mass ratio) was similarly prepared, and this dispersion liquid was applied on the light-receiving electrode described above and heated. Thus, an insulating porous body was formed. Subsequently, a carbon electrode was formed as a counter electrode.

Next, the glass substrate having the insulating porous body formed thereon was immersed for 48 hours in an ethanol solution of each of the sensitizing dyes indicated in the following Table 1-1 ($3 \times 10^{-4}$ mol/L). The glass dyed with the sensitizing dye was immersed for 30 minutes in a 10% ethanol solution of 4-tert-butylpyridine, and then the glass was washed with ethanol and naturally dried. The photosensitive layer thus obtained had a thickness of 10 μm, and the application amount of the semiconductor fine particles was 20 g/m².

For an electrolytic liquid, a methoxypropionitrile solution of dimethylpropylimidazolium iodide (0.5 mol/L) and iodine (0.1 mol/L) was used.

(Measurement of Maximum Absorption Wavelength of Sensitizing Dye)

The maximum absorption wavelength of the sensitizing dye used was measured. The results are presented in Table 1-1. The measurement was carried out using a spectrophotometer (U-4100, manufactured by Hitachi High-Technologies Corp.), and an ethanol solution was used.

(Measurement of Photoelectric Conversion Efficiency)

Pseudo-sunlight which did not include ultraviolet radiation was generated by passing the light of a 500-W xenon lamp (manufactured by Ushio, Inc.) through an AM1.5G filter (manufactured by Oriel Instruments Corp.) and a sharp cutoff filter (Kenko L-42, trade name). The intensity of this light was 89 mW/cm². The produced photoelectric conversion element was irradiated with this light, and the electricity thus generated was measured with a current-voltage measuring device (Keithley-238 type, trade name). The results of measuring the conversion efficiencies of the photoelectrochemical cells thus determined are presented in the following Table 1-1. The results were evaluated such that one having a conversion efficiency of 5% or more was rated as "⊙"; one having a conversion efficiency of equal to or more than 2% and less than 5% was rated as "○"; one having a conversion efficiency of equal to or more than 0.5% and less than 2% was rated as "Δ"; and one having a conversion efficiency of less than 0.5% was rated as "x".

TABLE 1

| Sample No. | Dye | Maximum absorption wavelength (nm) | Conversion efficiency | Remarks |
|---|---|---|---|---|
| 1 | Exemplified Dye D-1 | 490 | ⊙ | This invention |
| 2 | Exemplified Dye D-2 | 470 | ⊙ | This invention |
| 3 | Exemplified Dye D-3 | 500 | ⊙ | This invention |
| 4 | Exemplified Dye D-4 | 480 | ○ | This invention |
| 5 | Exemplified Dye D-5 | 410 | ○ | This invention |
| 6 | Exemplified Dye D-6 | 441 | ○ | This invention |
| 7 | Exemplified Dye D-7 | 475 | ⊙ | This invention |
| 8 | Exemplified Dye D-8 | 503 | ⊙ | This invention |
| 9 | Exemplified Dye D-9 | 496 | ⊙ | This invention |
| 10 | Exemplified Dye D-10 | 423 | ○ | This invention |
| 11 | Exemplified Dye D-11 | 437 | ○ | This invention |
| 12 | Exemplified Dye D-12 | 516 | ○ | This invention |
| 13 | Exemplified Dye D-13 | — | ○ | This invention |
| 14 | Exemplified Dye D-14 | — | ○ | This invention |
| 15 | Exemplified Dye D-15 | — | ○ | This invention |
| 16 | Exemplified Dye D-16 | — | ○ | This invention |
| 17 | Exemplified Dye D-1 (containing 0.2 ppm of Compound I-1) | — | ⊙ | This invention |
| 18 | Exemplified Dye D-1 (containing 0.1 ppm of Pd) | — | ⊙ | This invention |
| 19 | Sensitizing dye A | 521 | Δ | Comparative example |

For Sample No. 13, the following sensitizing dye A described in JP-A-11-214730 was used. In the tables of the following Examples, all of the dyes referred to as sensitizing dye A are dyes represented by the following formula.

Sensitizing dye A

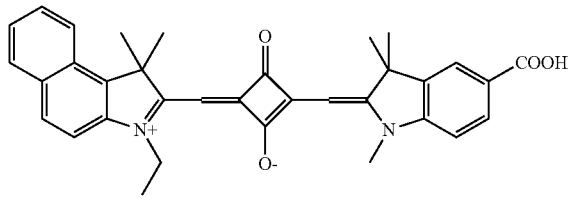

Electrochemical cells produced by using the dyes of the present invention exhibited conversion efficiency values as high as 5% or more, particularly when compounds D-1 to D-3 and D-7 to D-9 were used as the dye, as shown in Table 1-1. Even when other dyes of the present invention were used, the conversion efficiency was at a practically usable level of equal to or more than 2% and less than 5%. Even in the case where the compound I-1 was contained in D-1 in an amount of 0.2 ppm (Sample No. 17), the effect was negligible, and the conversion efficiency was 5% or more. Also, in the case where Pd attributable to the palladium complex used in the synthesis of D-1 was incorporated in an amount of 0.1 ppm (Sample No. 18), the effect was negligible, and the conversion efficiency was 5% or more.

On the contrary, the Comparative Example of Sample No. 17 had a conversion efficiency of equal to or more than 0.5% and less than 2%, and was unsatisfactory to be used in electrochemical cells.

Example 1-2

An evaluation was performed in the same manner as in Example 1-1, using the dye of the second embodiment of the present invention that was prepared as described above. The results were shown in Table 1-2.

TABLE 1-2

| Sample No. | Sensitizing dye | Maximum absorption wavelength (nm) | Conversion efficiency |
|---|---|---|---|
| 1 | A-1 | 396 | ⊙ |
| 2 | A-2 | 491 | ⊙ |
| 3 | A-3 | 395 | ⊙ |
| 4 | A-4 | 423 | ⊙ |
| 5 | A-5 | 470 | ⊙ |
| 6 | A-6 | 485 | ⊙ |
| 7 | A-7 | 463 | ⊙ |
| 8 | A-8 | 445 | ○ |
| 9 | A-9 | 478 | ○ |
| 10 | A-10 | 366 | ○ |
| 11 | A-11 | 375 | ○ |
| 12 | A-12 | 394 | ⊙ |
| 13 | A-13 | 391 | ⊙ |
| 14 | A-14 | 485 | ⊙ |
| 15 | A-15 | 475 | ⊙ |
| 16 | A-16 | 492 | ○ |
| 17 | A-17 | 490 | ○ |
| 18 | A-18 | 475 | ⊙ |
| 19 | A-19 | 482 | ⊙ |
| 20 | A-20 | 470 | ○ |
| 21 | A-21 | 435 | ⊙ |
| 22 | A-22 | 473 | ○ |
| 23 | A-23 | 482 | ○ |
| 24 | A-24 | 492 | ⊙ |
| 25 | A-25 | 395 | ○ |
| 26 | A-26 | 395 | ⊙ |
| 27 | A-27 | 392 | ⊙ |
| 28 | A-28 | 387 | ⊙ |
| 29 | A-29 | 422 | ⊙ |
| 30 | A-30 | 412 | ⊙ |
| 31 | A-31 | 510 | ⊙ |
| 32 | A-32 | 496 | ○ |
| 33 | A-33 | 405 | ⊙ |
| 34 | A-34 | 407 | ⊙ |
| 35 | A-35 | 393 | ⊙ |
| 36 | A-36 | 398 | ○ |
| 37 | A-37 | 397 | ○ |
| 38 | A-38 | 401 | ○ |
| 39 | A-39 | 403 | ○ |
| 40 | A-40 | 393 | ○ |
| 41 | A-41 | 399 | ⊙ |
| 42 | A-42 | 397 | ○ |
| 43 | A-43 | 407 | ⊙ |
| 44 | A-44 | 490 | ⊙ |
| 45 | A-45 | 470 | ○ |
| 46 | A-46 | 484 | ○ |
| 47 | A-47 | 415 | ○ |
| 48 | A-48 | 459 | ○ |
| 49 | A-49 | 492 | ○ |
| 50 | A-50 | 475 | ⊙ |
| 51 | A-51 | 490 | ○ |
| 52 | A-52 | 405 | ⊙ |
| 53 | A-53 | 473 | ⊙ |
| 54 | Sensitizing dye A | 636 | Δ |

Electrochemical cells produced by using the dye of the second embodiment exhibited conversion efficiency values as high as 5% or more, particularly when compounds A1 to A7, A12 to A15, A-18, A-19, A-21, A-24, A-26 to A-31, A-33 to A-35, A-41, A-43, A-44, A-50, A-52 and A-53 were used as the dye, as shown in Table 1-2. Even when other dyes of the present invention were used, the conversion efficiency was at a practically usable level of equal to or more than 2% and less than 5%.

On the contrary, the Comparative Example of Sample No. 54 had a conversion efficiency of equal to or more than 0.5% and less than 2%, and was unsatisfactory to be used in electrochemical cells.

Example 1-3

An evaluation was performed in the same manner as in Example 1-1, using the dye of the third embodiment of the present invention prepared as described above. The results are presented in Tables 1-3 to 1-5.

TABLE 1-3

| Sample No. | Used sensitizing dye | Conversion efficiency |
|---|---|---|
| 1 | CA-1 | ○ |
| 2 | CA-2 | ○ |
| 3 | CA-3 | ⊙ |
| 4 | CA-4 | ⊙ |
| 5 | CA-5 | ⊙ |
| 6 | CA-6 | ⊙ |
| 7 | CB-1 | ○ |
| 8 | CB-2 | ⊙ |
| 9 | CB-3 | ⊙ |
| 10 | CB-4 | ⊙ |
| 11 | CB-5 | ⊙ |
| 12 | CB-6 | ⊙ |
| 13 | CC-1 | ○ |
| 14 | CC-2 | ⊙ |
| 15 | CC-3 | ⊙ |
| 16 | CC-4 | ⊙ |
| 17 | CC-5 | ⊙ |
| 18 | CC-6 | ⊙ |
| 19 | CD-1 | ○ |
| 20 | CD-2 | ○ |
| 21 | CD-3 | ⊙ |

TABLE 1-3-continued

| Sample No. | Used sensitizing dye | Conversion efficiency |
|---|---|---|
| 22 | CD-4 | ⊙ |
| 23 | CD-5 | ⊙ |
| 24 | CD-6 | ⊙ |
| 25 | E-1 | ○ |
| 26 | E-2 | ○ |
| 27 | F-1 | ⊙ |
| 28 | F-2 | ⊙ |
| 29 | G-1 | ⊙ |
| 30 | G-2 | ○ |
| 31 | H-1 | ○ |
| 32 | H-2 | ○ |
| 33 | CI-1 | ○ |
| 34 | CI-2 | ○ |
| 35 | J-1 | ○ |
| 36 | J-2 | ○ |
| 37 | K-1 | ○ |
| 38 | K-2 | ○ |
| 39 | CL-1 | ○ |
| 40 | CL-2 | ○ |
| 41 | M-1 | ○ |

TABLE 1-4

| Sample No. | Used sensitizing dye | Conversion efficiency |
|---|---|---|
| 42 | M-2 | ⊙ |
| 43 | M-3 | ⊙ |
| 44 | M-4 | ⊙ |
| 45 | N-1 | ⊙ |
| 46 | N-2 | ⊙ |
| 47 | N-3 | ⊙ |
| 48 | N-4 | ⊙ |
| 49 | O-1 | ⊙ |
| 50 | O-2 | ○ |
| 51 | P-1 | ⊙ |
| 52 | Q-1 | ⊙ |
| 53 | R-1 | ⊙ |
| 54 | R-2 | ⊙ |
| 55 | R-3 | ⊙ |
| 56 | R-4 | ⊙ |
| 57 | S-1 | ⊙ |
| 58 | S-2 | ⊙ |
| 59 | S-4 | ○ |
| 60 | T-1 | ○ |
| 61 | T-2 | ⊙ |
| 62 | T-3 | ⊙ |
| 63 | T-4 | ○ |
| 64 | U-1 | ⊙ |
| 65 | U-2 | ⊙ |
| 66 | U-3 | ⊙ |
| 67 | U-4 | ○ |
| 68 | V-1 | ⊙ |
| 69 | W-1 | ○ |
| 70 | X-1 | ○ |
| 71 | Y-1 | ⊙ |
| 72 | Z-1 | ○ |
| 73 | Z-2 | ⊙ |
| 74 | Z-3 | ⊙ |
| 75 | Z-4 | ⊙ |
| 76 | α-1 | ○ |
| 77 | α-2 | ⊙ |
| 78 | α-3 | ⊙ |

TABLE 1-5

| Sample No. | Used sensitizing dye | Conversion efficiency |
|---|---|---|
| 79 | α-4 | ⊙ |
| 80 | β-1 | ○ |
| 81 | β-2 | ⊙ |
| 82 | β-3 | ⊙ |
| 83 | β-4 | ⊙ |
| 84 | γ-1 | ○ |
| 85 | γ-2 | ⊙ |
| 86 | γ-3 | ⊙ |
| 87 | γ-4 | ○ |
| 88 | δ-1 | ○ |
| 89 | θ-1 | ○ |
| 90 | λ-1 | ○ |
| 91 | π-1 | ○ |
| 92 | Sensitizing dye A | Δ |

Electrochemical cells produced by using the dyes of the present invention exhibited conversion efficiency values as high as 5% or more, particularly when compounds CA3 to CA6, CB2 to CB6, CC3 to CC6, CD3 to CD6, F1, F2, G1, M2 to M4, N1 to N4, O1, P1, Q1, R1 to R4, S1, S2, T2, T3, U1 to U3, V1, Z2 to Z4, α2 to α4, β2 to β4, γ2 and γ3 were used as the dye, as shown in Tables 1-3 to 1-5. Even when ones having other structure than the structures described above were used as the dye, the conversion efficiency was at a practically usable level of equal to or more than 2% and less than 5%.

On the contrary, the Comparative Example of Sample No. 92 had a conversion efficiency of equal to or more than 0.5% and less than 2%, and was unsatisfactory to be used in electrochemical cells.

Example 2-1

An ITO film was produced on a glass substrate, and an FTO film was laminated thereon. Thus, a transparent conductive film was produced. Thereafter, an oxide semiconductor porous film was formed on the transparent conductive film, and thus a transparent electrode plate was obtained. This transparent electrode plate was used, and the dye of the second embodiment of the present invention described above was used, to produce a photoelectrochemical cell. The conversion efficiencies of the photoelectrochemical cells were measured. The measurement is performed as described in the following steps (1) to (5).

(1) Preparation of Raw Material Compound Solution for ITO (Indium Tin Oxide) Film Were dissolved 5.58 g of indium(III) chloride tetrahydrate and 0.23 g of tin(II) chloride dihydrate in 100 ml of ethanol, and thus a raw material compound solution for ITO film was prepared.

(2) Preparation of Raw Material Compound Solution for FTO (Fluorine-Doped Tin Oxide) Film Was dissolved 0.701 g of tin(IV) chloride pentahydrate in 10 ml of ethanol, and 0.592 g of a saturated aqueous solution of ammonium fluoride was added thereto. This mixture was completely dissolved in an ultrasonic bath over about 20 minutes, and thus a raw material compound solution for FTO film was prepared.

(3) Production of ITO/FTO Transparent Conductive Film

The surface of a heat resistant glass plate having a thickness of 2 mm was subjected to chemical cleaning and was dried. Subsequently, this glass plate was placed in a reactor and was heated with a heater. When the heating temperature of the heater reached 450° C., the raw material compound solution for ITO film obtained in the step (1) was sprayed over the glass plate for 25 minutes through a nozzle having an aperture diameter of 0.3 mm at a pressure of 0.06 MPa with a distance to the glass plate of 400 mm.

After this raw material compound solution for ITO film was sprayed, the glass plate was left to stand for two minutes (during this time period, ethanol was continuously sprayed on the glass substrate surface so as to suppress an increase in the substrate surface temperature), and when the heating temperature of the heater reached 530° C., the raw material compound solution for FTO film obtained in the step (2) was sprayed thereon under the same conditions for 2 minutes and 30 seconds. Thus, there was obtained a transparent electrode plate in which an ITO film having a thickness of 530 nm and an FTO film having a thickness of 170 nm were sequentially formed on a heat resistant glass plate.

For a comparison, a transparent electrode plate having only an ITO film having a thickness of 530 nm formed on a heat resistant glass plate having a thickness of 2 mm, and a transparent electrode plate having only an FTO film having a thickness of 180 nm formed in the same manner were respectively produced.

These three kinds of transparent electrode plates were heated in a heating furnace at 450° C. for 2 hours.

(4) Production of Photoelectrochemical Cell

Subsequently, photoelectrochemical cells having a structure such as shown in FIG. 2 of Japanese Patent No. 4260494 were produced using the three kinds of transparent electrode plates. The formation of an oxide semiconductor porous film 15 was carried out by dispersing titanium oxide fine particles having an average particle size of about 230 nm in acetonitrile to prepare a paste, applying this paste on a transparent electrode 11 by a bar coating method to a thickness of 15 μm, drying the paste, and then calcining the paste at 450° C. for one hour. The dyes indicated in Table 2 were loaded in this oxide semiconductor porous film 15. The conditions for immersion in a dye solution were the same as those used in Example 1-1.

Furthermore, a conductive substrate produced by laminating an ITO film and an FTO film on a glass plate was used for the counter electrode 16, and an electrolytic liquid formed from a non-aqueous solution of iodine/iodide was used in the electrolyte layer 17. The plane dimension of the photoelectrochemical cell was 25 mm×25 mm.

(5) Evaluation of Photoelectrochemical Cell

These photoelectrochemical cells were irradiated with artificial sunlight (AM1.5), and their power generation efficiencies were determined. The results are presented in Table 2-1. The results are represented such that one having a conversion efficiency of 5% or more is indicated with "⊙"; one having a conversion efficiency of equal to or more than 2% and less than 5% is indicated with "○"; one having a conversion efficiency of equal to or more than 0.5% and less than 2% is indicated with "Δ"; and one having a conversion efficiency of less than 0.5% is indicated with "x".

It was found that Sample Nos. 15 to 17 which used the sensitizing dye A had low conversion efficiencies, whereas Sample Nos. 1 to 14 which used the exemplary dyes of the present invention exhibited satisfactory results. It was also found that the photoelectrochemical cells which used transparent electrode plates produced by laminating an ITO film and an FTO film exhibited particularly superior conversion efficiencies as compared with the cases of using transparent electrode plates produced by forming only an ITO film or only an FTO film, and the dyes of the present invention further enhanced the effect.

TABLE 2-1

| Sample No. | TCO | Used sensitizing dye | Conversion efficiency | Remarks |
|---|---|---|---|---|
| 1 | ITO only | Exemplified Dye D-1 | ○ | This invention |
| 2 | FTO only | Exemplified Dye D-1 | ○ | This invention |
| 3 | ITO + FTO | Exemplified Dye D-1 | ○ | This invention |
| 4 | ITO only | Exemplified Dye D-3 | ○ | This invention |
| 5 | FTO only | Exemplified Dye D-3 | ○ | This invention |
| 6 | ITO + FTO | Exemplified Dye D-3 | ⊙ | This invention |
| 7 | ITO only | Exemplified Dye D-7 | ○ | This invention |
| 8 | FTO only | Exemplified Dye D-7 | ⊙ | This invention |
| 9 | ITO + FTO | Exemplified Dye D-7 | ⊙ | This invention |
| 10 | ITO + FTO | Exemplified Dye D-8 | ⊙ | This invention |
| 11 | ITO + FTO | Exemplified Dye D-13 | ⊙ | This invention |
| 12 | ITO + FTO | Exemplified Dye D-14 | ⊙ | This invention |
| 13 | ITO + FTO | Exemplified Dye D-15 | ⊙ | This invention |
| 14 | ITO + FTO | Exemplified Dye D-16 | ⊙ | This invention |
| 15 | ITO only | Sensitizing dye A | X | Comparative example |
| 16 | FTO only | Sensitizing dye A | X | Comparative example |
| 17 | ITO + FTO | Sensitizing dye A | Δ | Comparative example |

Example 2-2

An evaluation was performed in the same manner as in Example 2-1, using the dye of the second embodiment of the present invention prepared as described above. The results are presented in Table 2-2.

TABLE 2-2

| Sample No. | TCO | Used sensitizing dye | Conversion efficiency | Remarks |
|---|---|---|---|---|
| 1 | ITO only | Exemplified Dye A-2 | ○ | This invention |
| 2 | FTO only | Exemplified Dye A-2 | ⊙ | This invention |
| 3 | ITO + FTO | Exemplified Dye A-2 | ⊙ | This invention |
| 4 | ITO only | Exemplified Dye A-9 | ○ | This invention |
| 5 | FTO only | Exemplified Dye A-9 | ○ | This invention |
| 6 | ITO + FTO | Exemplified Dye A-9 | ⊙ | This invention |
| 7 | ITO only | Exemplified Dye A-11 | ○ | This invention |
| 8 | FTO only | Exemplified Dye A-11 | ○ | This invention |
| 9 | ITO + FTO | Exemplified Dye A-11 | ⊙ | This invention |
| 11 | ITO only | Sensitizing dye A | X | Comparative example |
| 12 | FTO only | Sensitizing dye A | X | Comparative example |
| 13 | ITO + FTO | Sensitizing dye A | Δ | Comparative example |

It was found that Sample Nos. 11 to 13 which used the sensitizing dye A had low conversion efficiencies, whereas Sample Nos. 1 to 9 which used the exemplary dyes of the present invention exhibited satisfactory results. It was also found that the photoelectrochemical cells which used transparent electrode plates produced by laminating an ITO film and an FTO film exhibited particularly superior conversion efficiencies as compared with the cases of using transparent electrode plates produced by forming only an ITO film or only an FTO film, and the dyes of the present invention further enhanced the effect.

Example 2-3

An evaluation was performed in the same manner as in Example 2-1, using the dye of the third embodiment of the present invention prepared as described above. The results are presented in Table 2-3.

TABLE 2-3

| Sample No. | TCO | Used sensitizing dye | Conversion efficiency | Remarks |
|---|---|---|---|---|
| 1 | ITO only | Exemplified Dye CA-4 | ⊙ | This invention |
| 2 | FTO only | Exemplified Dye CA-4 | ⊙ | This invention |
| 3 | ITO + FTO | Exemplified Dye CA-4 | ⊙ | This invention |
| 4 | ITO only | Exemplified Dye CC-3 | ○ | This invention |
| 5 | FTO only | Exemplified Dye CC-3 | ○ | This invention |
| 6 | ITO + FTO | Exemplified Dye CC-3 | ⊙ | This invention |
| 7 | ITO only | Exemplified Dye CB-4 | ⊙ | This invention |
| 8 | FTO only | Exemplified Dye M-2 | ⊙ | This invention |
| 9 | ITO + FTO | Exemplified Dye O-1 | ⊙ | This invention |
| 11 | ITO only | Sensitizing dye A | X | Comparative example |
| 12 | FTO only | Sensitizing dye A | X | Comparative example |
| 13 | ITO + FTO | Sensitizing dye A | Δ | Comparative example |

It was found that Sample Nos. 11 to 13 which used the sensitizing dye A had low conversion efficiencies, whereas Sample Nos. 1 to 9 which used the exemplary dyes of the present invention exhibited satisfactory results. It was also found that the photoelectrochemical cells which used transparent electrode plates produced by laminating an ITO film and an FTO film exhibited particularly superior conversion efficiencies as compared with the cases of using transparent electrode plates produced by forming only an ITO film or only an FTO film, and the dyes of the present invention further enhanced the effect.

Example 3-1

A collector electrode was disposed on the FTO film, and thus a photoelectrochemical cell was produced. The conversion efficiency was evaluated. The dye of the first embodiment of the present invention prepared as described above was used as the dye. The evaluation was performed using two kinds of photoelectrochemical cells of a test cell (i) and a test cell (iv), as follows.

(Test Cell (i))

The surface of a heat resistant glass plate having a size of 100 mm×100 mm×2 mm was subjected to chemical cleaning and was dried. Subsequently, this glass plate was placed in a reactor and was heated with a heater. Subsequently, the raw material compound solution for FTO film (fluorine-doped tin oxide) used in Example 2-1 was sprayed on the glass plate for 25 minutes through a nozzle having an aperture diameter of 0.3 mm at a pressure of 0.06 MPa, with a distance to the glass plate of 400 mm, and thus an FTO film-attached glass plate was prepared. Grooves having a depth of 5 μm were formed on that surface in the form of a lattice circuit pattern by an etching method. A pattern was formed by photolithography, and then etching was performed using hydrofluoric acid. A metal conductive layer (seed layer) was formed thereon by a sputtering method for the purpose of enabling plating formation, and a metal wiring layer 3 was further formed thereon by additive plating. The metal wiring layer 3 was formed in a convex lens shape to a height of 3 μm from the surface of the transparent substrate 2. The circuit width was set to 60 μm. An FTO film was formed over the metal wiring layer 3 by a SPD method to a thickness of 400 nm as a shielding layer 5, and the final assembly was used as an electrode substrate (i). The cross-sectional shape of the electrode substrate (i) was as shown in FIG. 2 of JP-A-2004-146425.

A dispersion liquid of titanium oxide having an average particle size of 25 nm was applied and dried on the electrode substrate (i), and the electrode substrate was heated and sintered at 450° C. for one hour. This electrode substrate was immersed in each of the ethanol solutions of the dyes indicated in Table 3 to adsorb the dye. The conditions for immersion were the same as those used in Example 1. The electrode substrate and a platinum sputtered FTO substrate were arranged to face each other, with a thermoplastic polyolefin resin sheet having a thickness of 50 μm interposed therebetween, and the resin sheet portion was melted by heating to fix the two electrode substrates.

A methoxyacetonitrile solution containing an iodide salt at 0.5 M and iodine at 0.05 M as main components was injected through an injection port for electrolytic liquid, which had been kept open in advance on the platinum sputtered electrode side, and the methoxyacetonitrile solution was filled in between the electrodes. Furthermore, the peripheral areas and the electrolytic liquid injection port were fully sealed using an epoxy-based sealing resin, and a silver paste was applied on the collecting terminal portions. Thus, a test cell (i) was prepared. The photoelectric conversion characteristics of the test cell (i) were evaluated by using pseudo-sunlight of AM1.5. The results are presented in Table 3-1.

(Test Cell (iv))

An FTO film-attached glass substrate having a size of 100×100 mm was produced in the same manner as in the case of the test cell (i). A metal wiring layer 3 (gold circuit) was formed on that FTO glass substrate by an additive plating method. The metal wiring layer 3 (gold circuit) was formed in a lattice form on the substrate surface, and the metal wiring layer had a circuit width of 50 μm and a circuit thickness of 5 μm. An FTO film having a thickness of 300 nm was formed on this surface by an SPD method as a shielding layer 5, and thus the final assembly was used as a test cell (iv). The cross-section of the electrode substrate (iv) was examined using SEM-EDX, and there was slippage which was thought to be attributable to the footing of the plating resist at the wiring bottom, while FTO coating was not provided on shaded areas.

A test cell (iv) was produced in the same manner as in the case of the test cell (i), using the electrode substrate (iv). The photoelectric conversion characteristics of the test cell (iv) were evaluated by using pseudo-sunlight of AM1.5. The results are presented in Table 3. The results are represented such that one having a conversion efficiency of 5% or more is indicated with "⊙"; one having a conversion efficiency of equal to or more than 2% and less than 5% is indicated with "⊙"; one having a conversion efficiency of equal to or more than 0.5% and less than 2% is indicated with "Δ"; and one having a conversion efficiency of less than 0.5% is indicated with "x".

TABLE 3-1

| Sample No. | Test cell | Used dye | Conversion efficiency | Remarks |
|---|---|---|---|---|
| 1 | (i) | Exemplified Dye D-1 | ⊙ | This invention |
| 2 | (iv) | Exemplified Dye D-1 | ○ | This invention |
| 3 | (i) | Exemplified Dye D-3 | ⊙ | This invention |
| 4 | (iv) | Exemplified Dye D-3 | ○ | This invention |
| 5 | (i) | Exemplified Dye D-7 | ⊙ | This invention |
| 6 | (iv) | Exemplified Dye D-7 | ○ | This invention |
| 7 | (i) | Exemplified Dye D-10 | ⊙ | This invention |
| 8 | (iv) | Exemplified Dye D-10 | ○ | This invention |
| 9 | (i) | Exemplified Dye D-11 | ○ | This invention |
| 11 | (iv) | Exemplified Dye D-11 | ○ | This invention |
| 12 | (i) | Sensitizing dye A | Δ | Comparative example |
| 13 | (iv) | Sensitizing dye A | X | Comparative example |

As can be seen from Table 3-1, when the dyes of the present invention were used, the conversion efficiencies of the test cells (i) exhibited high values such as 5% or more.

Example 3-2

An evaluation was performed in the same manner as in Example 3-1, using the dye of the second embodiment of the present invention prepared as described above. The results are presented in Table 3-2.

TABLE 3-2

| Sample No. | Test cell | Used dye | Conversion efficiency | Remarks |
|---|---|---|---|---|
| 1 | (i) | Exemplified Dye A-2 | ⊙ | This invention |
| 2 | (iv) | Exemplified Dye A-2 | ○ | This invention |
| 3 | (i) | Exemplified Dye A-8 | ⊙ | This invention |
| 4 | (iv) | Exemplified Dye A-8 | ○ | This invention |
| 5 | (i) | Exemplified Dye A-9 | ⊙ | This invention |
| 6 | (iv) | Exemplified Dye A-9 | ○ | This invention |
| 7 | (i) | Exemplified Dye A-10 | ⊙ | This invention |
| 8 | (iv) | Exemplified Dye A-10 | ○ | This invention |
| 9 | (i) | Exemplified Dye A-11 | ○ | This invention |
| 11 | (iv) | Exemplified Dye A-11 | Δ | This invention |
| 12 | (i) | Sensitizing dye A | Δ | Comparative example |
| 13 | (iv) | Sensitizing dye A | X | Comparative example |

As can be seen from Table 3-2, when the dyes of the present invention were used, the conversion efficiencies of the test cells (i) exhibited high values such as 5% or more. On the other hand, in the instance where the test cell (iv) was used, when the dyes of the present invention were used, the conversion efficiency increased as compared with the case of using the dyes of the Comparative Examples. Accordingly, it was found that the degree of freedom in the selection of test cell increases when the dyes of the present invention are used (comparison between Sample No. 11 and Sample No. 13).

Example 3-3

An evaluation was performed in the same manner as in Example 3-1, using the dye of the third embodiment of the present invention prepared as described above. The results are presented in Table 3-3.

TABLE 3-3

| Sample No. | Test cell | Used dye | Conversion efficiency | Remarks |
|---|---|---|---|---|
| 1 | (i) | Exemplified Dye CA-4 | ⊙ | This invention |
| 2 | (iv) | Exemplified Dye CA-5 | ⊙ | This invention |
| 3 | (i) | Exemplified Dye E-2 | ⊙ | This invention |
| 4 | (iv) | Exemplified Dye F-1 | ⊙ | This invention |
| 5 | (i) | Exemplified Dye G-1 | ⊙ | This invention |
| 6 | (iv) | Exemplified Dye R-2 | ⊙ | This invention |
| 7 | (i) | Exemplified Dye N-3 | ○ | This invention |
| 8 | (iv) | Exemplified Dye P-1 | ⊙ | This invention |
| 9 | (i) | Exemplified Dye Q-1 | ⊙ | This invention |
| 11 | (iv) | Exemplified Dye M-2 | ⊙ | This invention |
| 12 | (i) | Sensitizing dye A | Δ | Comparative example |
| 13 | (iv) | Sensitizing dye A | X | Comparative example |

As can be seen from Table 3-3, when the dyes of the present invention were used, the conversion efficiencies of the test cells (i) exhibited high values such as 5% or more. Also, when the test cell (iv) was used, there were obtained values that were almost equal to the values obtained in the case of using the test cell (i) with the sensitizing dye A.

Example 4-1

A test was performed on the method for producing peroxotitanic acid and titanium oxide fine particles, and the method for producing an oxide semiconductor film using the fine particles, and photoelectrochemical cells were produced and evaluated. The dye of the first embodiment of the present invention prepared as described above was used as the dye.

(Photovoltaic Cell (A))
(1) Preparation of Coating Liquid (A) for Oxide Semiconductor Film Formation 5 g of titanium hydride was suspended in 1 liter of pure water, and 400 g of a 5 mass % hydrogen peroxide solution was added thereto over 30 minutes. Subsequently, the mixture was heated to 80° C. to dissolve, and thus a solution of peroxotitanic acid was prepared. A portion of 90% by volume was separated from the total amount of this solution, and concentrated aqueous ammonia was added thereto to adjust the portion to pH 9. The resultant was placed in an autoclave and was subjected to a hydrothermal treatment at 250° C. for 5 hours under saturated vapor pressure. Thus, titania colloidal particles (A) were prepared. The titania colloidal particles thus obtained were composed of anatase type titanium oxide having high crystallinity as determined by X-ray diffraction.

Subsequently, the titania colloidal particles (A) obtained as described above were concentrated to 10% by mass, and were mixed with the peroxotitanic acid solution. The amount of titanium in the mixed liquid was calculated in terms of $TiO_2$, hydroxypropyl cellulose was added to the mixture as a film forming aid, such that the amount of hydroxypropyl cellulose reached 30% by mass relative to the mass of $TiO_2$. Thus, a coating liquid for semiconductor film formation was prepared.

(2) Production of Oxide Semiconductor Film (A)

Subsequently, the coating liquid was applied on a transparent glass substrate on which fluorine-doped tin oxide was formed as an electrode layer, and was naturally dried. The coating liquid was then irradiated with ultraviolet radiation in an amount of 6000 mJ/cm$^2$ using a low pressure mercury lamp to decompose peroxo acid, and thereby the coating film was cured. The coating film was heated at 300° C. for 30 minutes, and thereby decomposition of hydroxypropyl cellulose and annealing were carried out. Thus, an oxide semiconductor film (A) was formed on the glass substrate.

(3) Adsorption of Dye on Oxide Semiconductor Film (A)

Next, an ethanol solution of a dye of the present invention at a concentration of $3 \times 10^{-4}$ mol/Liter was prepared as a spectral sensitizing dye. This dye solution was applied on the metal oxide semiconductor film (A) with a 100-rpm spinner, and was dried. This application and drying processes were repeated five times.

(4) Preparation of Electrolyte Solution

In a mixed solvent of acetonitrile and ethylene carbonate at a volume ratio of 1:5, tetrapropylammonium iodide was dissolved to a concentration of 0.46 mol/liter, and iodine to a concentration of 0.07 mol/liter. Thus, an electrolyte solution was prepared.

(5) Production of Photoelectric Cell (A)

The glass substrate produced in step (2), on which the oxide semiconductor film (A) adsorbed with a dye was formed, was used as one electrode, and a transparent glass substrate in which fluorine-doped tin oxide was formed as an electrode and platinum was supported thereon, was used as the other electrode, so that these electrodes were arranged to face each other. The lateral sides were sealed with a resin, and the electrolyte solution of step (4) was included between the electrodes. Furthermore, lead wires were connected between the electrodes, and thus a photoelectric cell (A) was produced.

(6) Evaluation of Photoelectric Cell (A)

The photoelectric cell (A) was irradiated with light with an intensity of 100 W/m² using a solar simulator, and 11 (conversion efficiency) was measured. The results are presented in Table 4-1.

(Photovoltaic Cell (B))

An oxide semiconductor film (B) was formed in the same manner as in the case of the oxide semiconductor film (A), except that the film was cured by irradiating with ultraviolet radiation to decompose peroxo acid, and then the film was irradiated with ions of Ar gas (manufactured by Nissin Electric Co., Ltd.:ion injection device, irradiated at 200 eV for 10 hours).

Adsorption of a dye on the oxide semiconductor film (B) was carried out in the same manner as in the case of the oxide semiconductor film (A).

Thereafter, a photoelectric cell (B) was produced by the same method as that used in Example 1, and 11 was measured. The results are presented in Table 4-1.

(Photovoltaic Cell (C))

Was diluted 18.3 g of titanium tetrachloride with pure water, and an aqueous solution containing 1.0% by mass of the titanium compound in terms of $TiO_2$ was obtained. While this aqueous solution was stirred, a 15 mass % aqueous ammonia solution was added thereto, and thus a white slurry at pH 9.5 was obtained. This slurry was filtered and washed, and thus a cake of hydrated titanium oxide gel at a concentration of 10.2% by mass in terms of $TiO_2$ was obtained. This cake was mixed with 400 g of a 5 mass % hydrogen peroxide solution, and then the mixture was heated to 80° C. to dissolve. Thus, a solution of peroxotitanic acid was prepared. A portion of 90% by volume was separated from the total amount of this solution, and concentrated aqueous ammonia was added thereto to adjust the portion to pH 9. The resultant was placed in an autoclave and was subjected to a hydrothermal treatment at 250° C. for 5 hours under saturated vapor pressure. Thus, titania colloidal particles (C) were prepared.

Subsequently, an oxide semiconductor film (C) was formed in the same manner as in the case of the oxide semiconductor film (A), using the peroxotitanic acid solution and the titania colloidal particles (C) obtained as described above. Adsorption of a dye of the present invention as a spectral sensitizing dye was carried out in the same manner as in the case of the metal oxide semiconductor film (A).

Thereafter, a photoelectric cell (C) was produced by the same method as that used for the photoelectric cell (A), and 11 was measured. The results are presented in Table 4-1.

(Photovoltaic Cell (D))

18.3 g of titanium tetrachloride was diluted with pure water, and an aqueous solution containing 1.0% by mass of the titanium compound in terms of $TiO_2$ was obtained. While this aqueous solution was stirred, a 15 mass % aqueous ammonia solution was added thereto, and thus a white slurry at pH 9.5 was obtained. This slurry was filtered and washed, and then was suspended in pure water. Thus, a slurry of hydrated titanium oxide gel at a concentration 0.6% by mass in terms of $TiO_2$ was obtained. Hydrochloric acid was added to this slurry to adjust the pH to 2. Subsequently, the slurry was placed in an autoclave, and was subjected to a hydrothermal treatment at 180° C. for 5 hours under saturated vapor pressure, and thus titania colloidal particles (D) were prepared.

Next, the titania colloidal particles (D) were concentrated to 10% by mass, and hydroxypropyl cellulose was added to the particles as a film forming aid such that the amount of hydroxypropyl cellulose reached 30% by mass in terms of $TiO_2$. Thus, a coating liquid for semiconductor film formation was prepared. Subsequently, the coating liquid was applied on a transparent glass substrate on which fluorine-doped tin oxide was formed as an electrode layer, and was naturally dried. Subsequently, the coating liquid was irradiated with ultraviolet radiation in an amount of 6000 mJ/cm² using a low pressure mercury lamp, and thereby the film was cured. The film was further heated at 300° C. for 30 minutes to perform decomposition of hydroxypropyl cellulose and annealing. Thus, an oxide semiconductor film (D) was formed.

Subsequently, adsorption of a dye of the present invention as a spectral sensitizing dye was carried out in the same manner as in the case of the oxide semiconductor film (A).

Thereafter, a photoelectric cell (D) was produced by the same method as that used for the photoelectric cell (A), and 11 was measured. The results are presented in Table 4-1. The results are represented such that one having a conversion efficiency of 5% or more is indicated with "⊙"; one having a conversion efficiency of equal to or more than 2% and less than 5% is indicated with "○"; one having a conversion efficiency of equal to or more than 0.5% and less than 2% is indicated with "Δ"; and one having a conversion efficiency of less than 0.5% is indicated with "x".

TABLE 4-1

| Sample No. | Test cell | Used dye | Conversion efficiency | Remarks |
|---|---|---|---|---|
| 1 | (A) | Exemplified Dye D-3 | ⊙ | This invention |
| 2 | (B) | Exemplified Dye D-3 | ⊙ | This invention |
| 3 | (C) | Exemplified Dye D-3 | ⊙ | This invention |
| 4 | (D) | Exemplified Dye D-3 | ○ | This invention |
| 5 | (A) | Exemplified Dye D-7 | ⊙ | This invention |
| 6 | (B) | Exemplified Dye D-7 | ⊙ | This invention |
| 7 | (C) | Exemplified Dye D-7 | ⊙ | This invention |
| 8 | (D) | Exemplified Dye D-7 | ○ | This invention |

TABLE 4-1-continued

| Sample No. | Test cell | Used dye | Conversion efficiency | Remarks |
|---|---|---|---|---|
| 9 | (A) | Sensitizing dye A | Δ | Comparative example |
| 11 | (B) | Sensitizing dye A | Δ | Comparative example |
| 12 | (C) | Sensitizing dye A | Δ | Comparative example |
| 13 | (D) | Sensitizing dye A | X | Comparative example |

From Table 4-1, it was found that in the case of the dye of the first embodiment of the present invention, the conversion efficiency was particularly higher when the test cells (A) to (C) were used.

Example 4-2

An evaluation was performed in the same manner as in Example 4-1, using the dye of the second embodiment of the present invention prepared as described above. The results are presented in Table 4-2.

TABLE 4-2

| Sample No. | Test cell | Dye | Conversion efficiency | Remarks |
|---|---|---|---|---|
| 1 | (A) | Exemplified Dye A-7 | ⊙ | This invention |
| 2 | (B) | Exemplified Dye A-7 | ⊙ | This invention |
| 3 | (C) | Exemplified Dye A-7 | ⊙ | This invention |
| 4 | (D) | Exemplified Dye A-7 | ○ | This invention |
| 5 | (A) | Exemplified Dye A-12 | ⊙ | This invention |
| 6 | (B) | Exemplified Dye A-12 | ⊙ | This invention |
| 7 | (C) | Exemplified Dye A-12 | ⊙ | This invention |
| 8 | (D) | Exemplified Dye A-12 | ○ | This invention |
| 9 | (A) | Sensitizing dye A | Δ | Comparative example |
| 11 | (B) | Sensitizing dye A | Δ | Comparative example |
| 12 | (C) | Sensitizing dye A | Δ | Comparative example |
| 13 | (D) | Sensitizing dye A | X | Comparative example |

From Table 4-2, it was found that in the case of the dye of the second embodiment of the present invention, the conversion efficiency was particularly higher when the test cells (A) to (C) were used.

Example 4-3

An evaluation was performed in the same manner as in Example 4-1, using the dye of the third embodiment of the present invention prepared as described above. The results are presented in Table 4-3.

TABLE 4-3

| Sample No. | Test cell | Used dye | Conversion efficiency | Remarks |
|---|---|---|---|---|
| 1 | (A) | Exemplified Dye S-1 | ○ | This invention |
| 2 | (B) | Exemplified Dye S-2 | ⊙ | This invention |
| 3 | (C) | Exemplified Dye R-3 | ○ | This invention |
| 4 | (D) | Exemplified Dye R-2 | ⊙ | This invention |
| 5 | (A) | Exemplified Dye P-1 | ⊙ | This invention |
| 6 | (B) | Exemplified Dye N-1 | ⊙ | This invention |
| 7 | (C) | Exemplified Dye CA-4 | ⊙ | This invention |
| 8 | (D) | Exemplified Dye CC-5 | Δ | This invention |
| 9 | (A) | Sensitizing dye A | Δ | Comparative example |
| 11 | (B) | Sensitizing dye A | Δ | Comparative example |
| 12 | (C) | Sensitizing dye A | Δ | Comparative example |
| 13 | (D) | Sensitizing dye A | X | Comparative example |

From Table 4-3, it was found that in the case of the dye of the present invention, the conversion efficiency was particularly higher when the test cells (A) to (C) were used. Even in the case of using the test cell (D), when the dyes of the present invention were used, higher conversion efficiencies were exhibited as compared with the cases of the Comparative Examples.

Example 5-1

The preparation or synthesis of titanium oxide was carried out by varying the method, and an oxide semiconductor film was produced from the titanium oxide thus obtained. A photoelectrochemical cell was produced using the oxide semiconductor film, and an evaluation of the cell was performed. The dye of the first embodiment of the present invention prepared as described above, was used as the dye.

(1) Preparation of Titanium Oxide According to Heat Treatment Method

Commercially available anatase type titanium oxide (manufactured by Ishihara Sangyo Kaisha, Ltd., trade name: ST-01) was used, and this product was heated to about 900° C. to convert it to brookite type titanium oxide, and was further heated to about 1,200° C. to convert it to rutile type titanium oxide. These compounds are referred to as comparative titanium oxide 1 (anatase type), titanium oxide 1 (brookite type), and comparative titanium oxide 2 (rutile type), respectively in this order.

(2) Synthesis of Titanium Oxide According to Wet Method (Titanium Oxide 2 (Brookite Type))

A reaction tank equipped with a reflux condenser was charged with 954 ml of distilled water, and the distilled water was heated to 95° C. While the stirring speed was maintained at about 200 rpm, 46 ml of an aqueous solution of titanium tetrachloride (Ti content: 16.3% by mass, specific gravity 1.59, purity 99.9%) was added dropwise to this distilled water in the reaction tank at a rate of about 5.0 ml/min. At this time, caution was taken to prevent the temperature of the reaction liquid from falling. As a result, the concentration of titanium tetrachloride was 0.25 mol/liter (2% by mass in terms of titanium oxide). In the reaction tank, the reaction liquid began to turn cloudy immediately after the dropwise addition, but the reaction liquid was maintained at that temperature. After completion of the dropwise addition, the temperature was further increased to heat the reaction liquid close to the boiling point (104° C.), and the reaction liquid was maintained in this state for 60 minutes to completely terminate the reaction.

A sol obtained by the reaction was filtered, and then the sol was made into a powder using a vacuum dryer at 60° C. This powder was quantitatively analyzed by an X-ray diffraction method. As a result, the ratio of (peak intensity of the brookite type 121 plane)/(peak intensity at the position where the three types overlap) was 0.38, and the ratio of (main peak intensity of the rutile type)/(peak intensity at the position where the three types overlap) was 0.05. From an analysis of these data, the titanium oxide was crystalline, composed of about 70.0% by mass of the brookite type, about 1.2% by mass of the rutile type, and about 28.8% by mass of the anatase type. Furthermore, the fine particles were observed with a transmission electron microscope, and the average particle size of the primary particles was 0.015 µm.

(Titanium Oxide 3 (Brookite Type))

An aqueous solution of titanium trichloride (Ti content: 28% by mass, specific gravity 1.5, purity 99.9%) was diluted with distilled water, and a solution at a concentration of 0.25 mol/L in terms of titanium was obtained. At this time, the solution was ice-cooled to prevent the temperature of the liquid from rising, and thus the solution was maintained at 50° C. or below. Subsequently, 500 ml of this solution was introduced into a reaction tank equipped with a reflux condenser, and while this solution was heated to 85° C., ozone gas with a purity of 80% generated from a ozone gas generating apparatus was bubbled into the solution at a rate of 1 L/min to induce an oxidation reaction. The system was maintained in this state for 2 hours, and thus the reaction was completely terminated. A sol thus obtained was filtered and dried in a vacuum to obtain a powder. This powder was quantitatively analyzed by an X-ray diffraction method. As a result, the ratio of (peak intensity of the brookite type 121 plane)/(peak intensity at the position where the three types overlapped) was 0.85, and the ratio of (main peak intensity of the rutile type)/(peak intensity at the position where the three types overlapped) was 0. From an analysis of these data, the titanium dioxide was composed of about 98% by mass of the brookite type, 0% by mass of the rutile type, 0% by mass of the anatase type, and about 2% of amorphous titanium dioxide. Furthermore, the fine particles were observed with a transmission electron microscope, and the average particle size of the primary particles was 0.05 µm.

(Production and Evaluation of Dye-Sensitized Photoelectric Conversion Element)

The titanium oxides prepared in the above-described sections "Titanium oxide 1" to "Titanium oxide 3" were used as semiconductor, and photoelectric conversion elements having a configuration as shown in FIG. 1 of JP-A-2000-340269 were produced as follows.

Fluorine-doped tin oxide was coated on a glass substrate, and this was used as a conductive transparent electrode. A paste containing each type of the titanium oxide particles as a raw material was prepared, and the paste was applied on the electrode surface by a bar coating method to a thickness of 50 µm. Subsequently, the paste was calcined at 500° C., and thus a thin layer having a thickness of about 20 µm was formed. An ethanol solution of the dye at a molar concentration of $3 \times 10$ M was prepared, and the glass substrate on which a thin layer of titanium oxide was formed was immersed in this ethanol solution and was maintained therein for 12 hours at room temperature. As a result, the dye was adsorbed on the thin layer of titanium oxide.

An acetonitrile solution of an iodide salt of tetrapropylammonium and lithium iodide was used as an electrolytic liquid, and platinum was used as a counter electrode. Thus, a photoelectric conversion element having the configuration shown in FIG. 1 of JP-A-2000-340269 was produced. For the photoelectric conversion, the element was irradiated with light from a high pressure mercury lamp (the infrared portion was cut with a filter) at a power of 160 W, and the conversion efficiency at that time was measured. The results are shown in Table 5-1. The results are represented such that one having a conversion efficiency of 5% or more is indicated with "⊙"; one having a conversion efficiency of equal to or more than 2% and less than 5% is indicated with "○"; one having a conversion efficiency of equal to or more than 0.5% and less than 2% is indicated with "Δ"; and one having a conversion efficiency of less than 0.5% is indicated with "x".

TABLE 5-1

| Sample No. | Titanium oxide | Used dye | Conversion efficiency | Remarks |
|---|---|---|---|---|
| 1 | Titanium oxide 1 | Exemplified Dye D-3 | ○ | This invention |
| 2 | Titanium oxide 4 | Exemplified Dye D-3 | ○ | This invention |
| 3 | Titanium oxide 2 | Exemplified Dye D-3 | ⊙ | This invention |
| 4 | Titanium oxide 3 | Exemplified Dye D-3 | ⊙ | This invention |
| 5 | Titanium oxide 5 | Exemplified Dye D-3 | ○ | This invention |
| 6 | Titanium oxide 6 | Exemplified Dye D-3 | ○ | This invention |
| 7 | Titanium oxide 1 | Exemplified Dye D-7 | ⊙ | This invention |
| 8 | Titanium oxide 4 | Exemplified Dye D-7 | ○ | This invention |
| 9 | Titanium oxide 2 | Exemplified Dye D-7 | ⊙ | This invention |
| 10 | Titanium oxide 3 | Exemplified Dye D-7 | ⊙ | This invention |
| 11 | Titanium oxide 5 | Exemplified Dye D-7 | ○ | This invention |
| 12 | Titanium oxide 6 | Exemplified Dye D-7 | ○ | This invention |
| 13 | Titanium oxide 1 | Sensitizing dye A | Δ | Comparative example |
| 14 | Titanium oxide 4 | Sensitizing dye A | X | Comparative example |
| 15 | Titanium oxide 2 | Sensitizing dye A | Δ | Comparative example |
| 16 | Titanium oxide 3 | Sensitizing dye A | Δ | Comparative example |
| 17 | Titanium oxide 5 | Sensitizing dye A | X | Comparative example |
| 18 | Titanium oxide 6 | Sensitizing dye A | X | Comparative example |

It was understood from Table 5-1 that the dyes of the present invention have high conversion efficiencies.

Example 5-2

An evaluation was performed in the same manner as in Example 5-1, using the dye of the second embodiment of the present invention prepared as described above. The results are presented in Table 5-2.

TABLE 5-2

| Sample No. | Titanium oxide | Dye | Conversion efficiency | Remarks |
|---|---|---|---|---|
| 1 | Titanium oxide 1 | Exemplified Dye A-8 | ○ | This invention |
| 2 | Titanium oxide 2 | Exemplified Dye A-8 | ○ | This invention |
| 3 | Titanium oxide 3 | Exemplified Dye A-8 | ⊙ | This invention |
| 4 | Titanium oxide 1 | Exemplified Dye A-10 | ⊙ | This invention |
| 5 | Titanium oxide 2 | Exemplified Dye A-10 | ⊙ | This invention |
| 6 | Titanium oxide 3 | Exemplified Dye A-10 | ⊙ | This invention |
| 7 | Titanium oxide 1 | Sensitizing dye A | Δ | Comparative example |

TABLE 5-2-continued

| Sample No. | Titanium oxide | Dye | Conversion efficiency | Remarks |
|---|---|---|---|---|
| 8 | Titanium oxide 2 | Sensitizing dye A | Δ | Comparative example |
| 9 | Titanium oxide 3 | Sensitizing dye A | Δ | Comparative example |

It was understood from Table 5-2 that the dyes of the second embodiment of the present invention have high conversion efficiencies.

Example 5-3

An evaluation was performed in the same manner as in Example 5-1, using the dye of the third embodiment of the present invention prepared as described above. The results are presented in Table 5-3.

TABLE 5-3

| Sample No. | Titanium oxide | Used dye | Conversion efficiency | Remarks |
|---|---|---|---|---|
| 1 | Titanium oxide 1 | Exemplified Dye M-1 | ⊙ | This invention |
| 2 | Titanium oxide 2 | Exemplified Dye CI-1 | ○ | This invention |
| 3 | Titanium oxide 3 | Exemplified Dye CD-4 | ⊙ | This invention |
| 4 | Titanium oxide 1 | Exemplified Dye CB-4 | ○ | This invention |
| 5 | Titanium oxide 2 | Exemplified Dye M-1 | ○ | This invention |
| 6 | Titanium oxide 3 | Exemplified Dye S-4 | ⊙ | This invention |
| 7 | Titanium oxide 1 | Sensitizing dye A | Δ | Comparative example |
| 8 | Titanium oxide 2 | Sensitizing dye A | Δ | Comparative example |
| 9 | Titanium oxide 3 | Sensitizing dye A | Δ | Comparative example |

It was understood from Table 5-3 that the dyes of the present invention still have high conversion efficiencies even if titanium oxide is changed.

Example 6-1

Photoelectrochemical cells were produced by using titanium oxide particles having different particle sizes for the semiconductor electrodes, and their characteristics were evaluated. The dye of the first embodiment of the present invention prepared as described above was used as the dye.
[Preparation of Paste]
First, a paste for forming a semiconductor layer or a light scattering layer for a semiconductor electrode that constitutes a photoelectrode, was prepared by the following procedure.
(Paste 1)
Spherical-shaped $TiO_2$ particles (anatase type, average particle size: 25 nm; hereinafter, referred to as spherical $TiO_2$ particles 1) were introduced into a nitric acid solution and stirred. Thus, a titania slurry was prepared. Subsequently, a cellulose-based binder was added to the titania slurry as a thickening agent, and the mixture was kneaded. Thus, a paste was prepared.
(Paste 2)
Spherical $TiO_2$ particles 1 and spherical-shaped $TiO_2$ particles (anatase type, average particle size: 200 nm; hereinafter, referred to as spherical $TiO_2$ particles 2) were introduced into a nitric acid solution and stirred. Thus, a titania slurry was prepared. Subsequently, a cellulose-based binder was added to the titania slurry as a thickening agent, and the mixture was kneaded. Thus, a paste (mass of the $TiO_2$ particles 1:mass of the $TiO_2$ particles 2=30:70) was prepared.
(Paste 3)
The paste 1 was mixed with rod-shaped $TiO_2$ particles (anatase type, diameter: 100 nm, aspect ratio: 5; hereinafter, referred to as rod-shaped $TiO_2$ particles 1), and thus a paste having a ratio of the mass of the rod-shaped $TiO_2$ particles 1 to the mass of the paste 1 of 10:90 was prepared.
(Paste 4)
The paste 1 was mixed with the rod-shaped $TiO_2$ particles 1, and thus a paste having a ratio of the mass of the rod-shaped $TiO_2$ particles 1 to the mass of the paste 1 of 30:70 was prepared.
(Paste 5)
The paste 1 was mixed with the rod-shaped $TiO_2$ particles 1, and thus a paste having a ratio of the mass of the rod-shaped $TiO_2$ particles 1 to the mass of the paste 1 of 50:50 was prepared.
(Paste 6)
The paste 1 was mixed with plate-shaped mica particles (diameter: 100 nm, aspect ratio: 6; hereinafter, referred to as plate-shaped mica particles 1), and thus a paste having a ratio of the mass of the plate-shaped mica particles 1 to the mass of the paste 1 of 20:80 was prepared.
(Paste 7)
The paste 1 was mixed with rod-shaped $TiO_2$ particles (anatase type, diameter: 30 nm, aspect ratio: 6.3; hereinafter, referred to as rod-shaped $TiO_2$ particles 2), and thus a paste having a ratio of the mass of the rod-shaped $TiO_2$ particles 2 to the mass of the paste 1 of 30:70 was prepared.
(Paste 8)
The paste 1 was mixed with rod-shaped $TiO_2$ particles (anatase type, diameter: 50 nm, aspect ratio: 6.1; hereinafter, referred to as rod-shaped $TiO_2$ particles 3), and thus a paste having a ratio of the mass of the rod-shaped $TiO_2$ particles 3 to the mass of the paste 1 of 30:70 was prepared.
(Paste 9)
The paste 1 was mixed with rod-shaped $TiO_2$ particles (anatase type, diameter: 75 nm, aspect ratio: 5.8; hereinafter, referred to as rod-shaped $TiO_2$ particles 4), and thus a paste having a ratio of the mass of the rod-shaped $TiO_2$ particles 4 to the mass of the paste 1 of 30:70 was prepared.
(Paste 10)
The paste 1 was mixed with rod-shaped $TiO_2$ particles (anatase type, diameter: 130 nm, aspect ratio: 5.2; hereinafter, referred to as rod-shaped $TiO_2$ particles 5), and thus a paste having a ratio of the mass of the rod-shaped $TiO_2$ particles 5 to the mass of the paste 1 of 30:70 was prepared.
(Paste 11)
The paste 1 was mixed with rod-shaped $TiO_2$ particles (anatase type, diameter: 180 nm, aspect ratio: 5; hereinafter, referred to as rod-shaped $TiO_2$ particles 6), and thus a paste having a ratio of the mass of the rod-shaped $TiO_2$ particles 6 to the mass of the paste 1 of 30:70 was prepared.
(Paste 12)
The paste 1 was mixed with rod-shaped $TiO_2$ particles (anatase type, diameter: 240 nm, aspect ratio: 5; hereinafter, referred to as rod-shaped $TiO_2$ particles 7), and thus a paste having a ratio of the mass of the rod-shaped $TiO_2$ particles 7 to the mass of the paste 1 of 30:70 was prepared.

(Paste 13)

The paste 1 was mixed with rod-shaped $TiO_2$ particles (anatase type, diameter: 110 nm, aspect ratio: 4.1; hereinafter, referred to as rod-shaped $TiO_2$ particles 8), and thus a paste having a ratio of the mass of the rod-shaped $TiO_2$ particles 8 to the mass of the paste 1 of 30:70 was prepared.

(Paste 14)

The paste 1 was mixed with rod-shaped $TiO_2$ particles (anatase type, diameter: 105 nm, aspect ratio: 3.4; hereinafter, referred to as rod-shaped $TiO_2$ particles 9), and thus a paste having a ratio of the mass of the rod-shaped $TiO_2$ particles 9 to the mass of the paste 1 of 30:70 was prepared.

(Photoelectrochemical Cell 1)

A photoelectrode having the same configuration as that of the photoelectrode 12 shown in FIG. 5 of JP-A-2002-289274 was produced by the procedure described below, and using this photoelectrode, a photoelectrochemical cell 1 which has a dimension of 10×10 mm and has the same configuration as that of the dye-sensitized solar cell 20 except for the photoelectrode, was produced.

A transparent electrode in which fluorine-doped $SnO_2$ conductive film (thickness: 500 nm) was formed on a glass substrate, was provided. On this $SnO_2$ conductive film, the above-described paste 2 was applied by screen printing, and then the paste was dried. Thereafter, the paste was calcined under the conditions of 450° C. in air. Furthermore, a semiconductor electrode having the same configuration as that of the semiconductor electrode 2 shown in FIG. 5 (area of light-receiving surface: 10 mm×10 mm, layer thickness: 10 μm, thickness of the semiconductor layer: 6 μm, thickness of the light scattering layer: 4 μm, and content of the rod-shaped $TiO_2$ particles 1 contained in the light scattering layer: 30% by mass) was formed on a $SnO_2$ conductive film by repeating these processes of screen printing and calcination using the paste 4. Thus, a photoelectrode which did not contain any sensitizing dye was produced.

Subsequently, a dye was adsorbed on the semiconductor electrode as follows. First, anhydrous ethanol which had been dehydrated with magnesium ethoxide was used as a solvent, and the dye of the present invention was dissolved in this anhydrous ethanol to a concentration of $3\times10^{-4}$ mol/L. Thus, a dye solution was prepared. Subsequently, the semiconductor electrode was immersed in this solution, and thereby, the dye was adsorbed on the semiconductor electrode in an amount of about 1.5 mmol/m². Thus, a photoelectrode 10 was completed.

Subsequently, a platinum electrode (thickness of Pt thin film: 100 nm) having the same shape and size as those of the photoelectrode described above was produced as a counter electrode, and an iodine-based redox solution containing iodine and lithium iodide was prepared as an electrolyte E. Furthermore, a spacer-S (trade name: "Surlyn") manufactured by DuPont Company, which had a shape matching the size of the semiconductor electrode, was prepared. As shown in FIG. 3 of JP-A-2002-289274, the photoelectrode 10 and the counter electrode CE were arranged to face each other, with the spacer-S interposed therebetween, and the electrolyte described above was filled in the inside. Thus, a photoelectrochemical cell 1 was completed.

(Photoelectrochemical Cell 2)

A photoelectrode having the same configuration as that of the photoelectrode 10 shown in FIG. 1 of JP-A-2002-289274, and a photoelectrochemical cell 2 having the same configuration as that of the dye-sensitized solar cell 20 shown in FIG. 3 of JP-A-2002-289274 were produced by the same procedure as that used for the photoelectrochemical cell 1, except that the production of the semiconductor electrode was carried out in the manner described below.

The paste 2 was used as a paste for semiconductor layer formation. The paste 2 was applied on the $SnO_2$ conductive film by screen printing, and then was dried. Subsequently, the paste was calcined under the conditions of 450° C. in air, and thus a semiconductor layer was formed.

The paste 3 was used as a paste for the innermost layer formation of the light scattering layer. Also, the paste 5 was used as a paste for the outermost layer formation of the light scattering layer. Then, a light scattering layer was formed on the semiconductor layer in the same manner as in the case of the dye-sensitized solar cell 1.

A semiconductor electrode (area of light-receiving surface: 10 mm×10 mm, layer thickness: 10 μm, thickness of semiconductor layer: 3 μm, thickness of the innermost layer: 4 μm, content ratio of the rod-shaped $TiO_2$ particles 1 contained in the innermost layer: 10% by mass, thickness of the outermost layer: 3 μm, and content ratio of the rod-shaped $TiO_2$ particles 1 contained in the innermost layer: 50% by mass) having the same configuration as that of the semiconductor electrode 2 shown in FIG. 1 of JP-A-2002-289274 was formed on the $SnO_2$ conductive film. Thus, a photoelectrode that did not contain a sensitizing dye was produced. In the same manner as in the case of the photoelectrochemical cell 1, the photoelectrode and the counter electrode CE were arranged to face each other, with the spacer-S interposed therebetween, and the electrolyte was filled inside. Thus, a photoelectrochemical cell 2 was completed.

(Photoelectrochemical Cell 3)

During the production of the semiconductor electrode, a photoelectrode having the same configuration as that of the photoelectrode 10 shown in FIG. 5, and a photoelectrochemical cell 3 having the same configuration as that of the photoelectrochemical cell 20 shown in FIG. 3 described in JP-A-2002-289274 were produced by the same procedure as that used for the photoelectrochemical cell 1, except that the paste 1 was used as the paste for semiconductor layer formation, and the paste 4 was used as the paste for light scattering layer formation. The semiconductor electrode had a configuration as follows: area of the light receiving surface: 10 mm×10 mm, layer thickness: 10 μm, thickness of the semiconductor layer: 5 μm, thickness of light scattering layer: 5 μm, and content ratio of the rod-shaped $TiO_2$ particles 1 contained in the light scattering layer: 30% by mass.

(Photoelectrochemical Cell 4)

During the production of the semiconductor electrode, a photoelectrode having the same configuration as that of the photoelectrode 10 shown in FIG. 5, and a photoelectrochemical cell 4 having the same configuration as that of the photoelectrochemical cell 20 shown in FIG. 3 described in JP-A-2002-289274 were produced by the same procedure as that used for the photoelectrochemical cell 1, except that the paste 2 was used as the paste for semiconductor layer formation, and the paste 6 was used as the paste for light scattering layer formation. The semiconductor electrode had a configuration as follows: area of the light receiving surface: 10 mm×10 mm, layer thickness: 10 μm, thickness of the semiconductor layer: 6.5 μm, thickness of light scattering layer: 3.5 μm, and content ratio of the plate-shaped mica particles 1 contained in the light scattering layer: 20% by mass.

(Photoelectrochemical Cell 5)

During the production of the semiconductor electrode, a photoelectrode and a photoelectrochemical cell 5 were produced by the same procedure as that used for the photoelectrochemical cell 1, except that the paste 2 was used as the paste for semiconductor layer formation, and the paste 8 was used as the paste for light scattering layer formation. The content ratio of the rod-shaped $TiO_2$ particles 3 contained in the light scattering layer of the semiconductor electrode: 30% by mass.

(Photoelectrochemical Cell 6)

During the production of the semiconductor electrode, a photoelectrode and a photoelectrochemical cell 6 were produced by the same procedure as that used for the photoelectrochemical cell 1, except that the paste 2 was used as the paste for semiconductor layer formation, and the paste 9 was used as the paste for light scattering layer formation. The content ratio of the rod-shaped $TiO_2$ particles 4 contained in the light scattering layer of the semiconductor electrode: 30% by mass.

(Photoelectrochemical Cell 7)

During the production of the semiconductor electrode, a photoelectrode and a photoelectrochemical cell 7 were produced by the same procedure as that used for the photoelectrochemical cell 1, except that the paste 2 was used as the paste for semiconductor layer formation, and the paste 10 was used as the paste for light scattering layer formation. The content ratio of the rod-shaped $TiO_2$ particles 5 contained in the light scattering layer of the semiconductor electrode: 30% by mass.

(Photoelectrochemical Cell 8)

During the production of the semiconductor electrode, a photoelectrode and a photoelectrochemical cell 8 were produced by the same procedure as that used for the photoelectrochemical cell 1, except that the paste 2 was used as the paste for semiconductor layer formation, and the paste 11 was used as the paste for light scattering layer formation. The content ratio of the rod-shaped $TiO_2$ particles 6 contained in the light scattering layer of the semiconductor electrode: 30% by mass.

(Photoelectrochemical Cell 9)

During the production of the semiconductor electrode, a photoelectrode and a photoelectrochemical cell 9 were produced by the same procedure as that used for the photoelectrochemical cell 1, except that the paste 2 was used as the paste for semiconductor layer formation, and the paste 13 was used as the paste for light scattering layer formation. The content ratio of the rod-shaped $TiO_2$ particles 8 contained in the light scattering layer of the semiconductor electrode: 30% by mass.

(Photoelectrochemical Cell 10)

During the production of the semiconductor electrode, a photoelectrode and a photoelectrochemical cell 10 were produced by the same procedure as that used for the photoelectrochemical cell 1, except that the paste 2 was used as the paste for semiconductor layer formation, and the paste 14 was used as the paste for light scattering layer formation. The content ratio of the rod-shaped $TiO_2$ particles 9 contained in the light scattering layer of the semiconductor electrode: 30% by mass.

(Photoelectrochemical Cell 11)

During the production of the semiconductor electrode, a photoelectrode and a comparative photoelectrochemical cell 1 were produced by the same procedure as that used for the photoelectrochemical cell 1, except that a semiconductor electrode (area of light-receiving surface: 10 mm×10 mm, and layer thickness: 10 µm) having only a semiconductor layer was produced using only the paste 2.

(Photoelectrochemical Cell 12)

During the production of the semiconductor electrode, a photoelectrode and a comparative photoelectrochemical cell 2 were produced by the same procedure as that used for the photoelectrochemical cell 1, except that the paste 2 was used as the paste for semiconductor layer formation, and the paste 7 was used as the paste for light scattering layer formation. The content ratio of the rod-shaped $TiO_2$ particles 2 contained in the light scattering layer of the semiconductor electrode: 30% by mass.

[Cell Characterization Test]

A cell characterization test was carried out, and the conversion efficiencies 11 of the photoelectrochemical cells 1 to 10, and comparative photoelectrochemical cells 1 and 2 were measured. The cell characteristics evaluation test was carried out using a solar simulator (manufactured by Wacom Electric Co., Ltd., WXS-85-H type), under the measurement conditions in which the condition for irradiation with pseudo-sunlight from a xenon lamp through an AM1.5 filter was set at 100 mW/cm². The current-voltage characteristics were measured using an I-V tester, and the energy conversion efficiency η[%] was determined. The results are shown in Table 6-1. The results are represented such that one having a conversion efficiency of 5% or more is indicated with "⊙"; one having a conversion efficiency of equal to or more than 2% and less than 5% is indicated with "○"; one having a conversion efficiency of equal to or more than 0.5% and less than 2% is indicated with "Δ"; and one having a conversion efficiency of less than 0.5% is indicated with "x".

TABLE 6-1

| Sample No. | | Used dye | Conversion efficiency | Remarks |
| --- | --- | --- | --- | --- |
| 1 | Photoelectrochemical cell 1 | Exemplified Dye D-6 | ○ | This invention |
| 2 | Photoelectrochemical cell 2 | Exemplified Dye D-6 | ⊙ | This invention |
| 3 | Photoelectrochemical cell 3 | Exemplified Dye D-6 | ⊙ | This invention |
| 4 | Photoelectrochemical cell 4 | Exemplified Dye D-6 | ⊙ | This invention |
| 5 | Photoelectrochemical cell 5 | Exemplified Dye D-6 | ○ | This invention |
| 6 | Photoelectrochemical cell 6 | Exemplified Dye D-6 | ○ | This invention |
| 7 | Photoelectrochemical cell 1 | Exemplified Dye D-9 | ⊙ | This invention |
| 8 | Photoelectrochemical cell 2 | Exemplified Dye D-9 | ⊙ | This invention |
| 9 | Photoelectrochemical cell 3 | Exemplified Dye D-9 | ⊙ | This invention |
| 10 | Photoelectrochemical cell 4 | Exemplified Dye D-9 | ⊙ | This invention |
| 11 | Photoelectrochemical cell 5 | Exemplified Dye D-9 | ⊙ | This invention |
| 12 | Photoelectrochemical cell 6 | Exemplified Dye D-9 | ⊙ | This invention |
| 13 | Photoelectrochemical cell 7 | Exemplified Dye D-9 | ⊙ | This invention |
| 14 | Photoelectrochemical cell 8 | Exemplified Dye D-9 | ⊙ | This invention |
| 15 | Photoelectrochemical cell 9 | Exemplified Dye D-9 | ⊙ | This invention |
| 16 | Photoelectrochemical cell 10 | Exemplified Dye D-9 | ⊙ | This invention |
| 17 | Photoelectrochemical cell 1 | Exemplified Dye A | Δ | Comparative example |
| 18 | Photoelectrochemical cell 2 | Sensitizing dye A | Δ | Comparative example |

TABLE 6-1-continued

| Sample No. | | Used dye | Conversion efficiency | Remarks |
|---|---|---|---|---|
| 19 | Photoelectrochemical cell 3 | Sensitizing dye A | Δ | Comparative example |
| 20 | Photoelectrochemical cell 4 | Sensitizing dye A | Δ | Comparative example |
| 21 | Photoelectrochemical cell 5 | Sensitizing dye A | Δ | Comparative example |
| 22 | Photoelectrochemical cell 6 | Sensitizing dye A | Δ | Comparative example |
| 23 | Photoelectrochemical cell 7 | Sensitizing dye A | Δ | Comparative example |
| 24 | Photoelectrochemical cell 8 | Sensitizing dye A | Δ | Comparative example |
| 25 | Photoelectrochemical cell 9 | Sensitizing dye A | Δ | Comparative example |
| 26 | Photoelectrochemical cell 10 | Sensitizing dye A | Δ | Comparative example |
| 27 | Photoelectrochemical cell 11 | Sensitizing dye A | X | Comparative example |
| 28 | Photoelectrochemical cell 12 | Sensitizing dye A | X | Comparative example |

It was understood from Table 6-1 that the dyes of the present invention have high conversion efficiencies.

Example 6-2

An evaluation was performed in the same manner as in Example 6-1, using the dye of the second embodiment of the present invention prepared as described above. The results are presented in Table 6-2.

TABLE 6-2

| Sample No. | Photoelectrochemical cell | Dye | Conversion efficiency | Remarks |
|---|---|---|---|---|
| 1 | Photoelectrochemical cell 1 | Exemplified Dye A-12 | ○ | This invention |
| 2 | Photoelectrochemical cell 2 | Exemplified Dye A-12 | ⊙ | This invention |
| 3 | Photoelectrochemical cell 3 | Exemplified Dye A-12 | ⊙ | This invention |
| 4 | Photoelectrochemical cell 4 | Exemplified Dye A-12 | ⊙ | This invention |
| 5 | Photoelectrochemical cell 5 | Exemplified Dye A-12 | ○ | This invention |
| 6 | Photoelectrochemical cell 6 | Exemplified Dye A-12 | ○ | This invention |
| 7 | Photoelectrochemical cell 1 | Exemplified Dye A-13 | ⊙ | This invention |
| 8 | Photoelectrochemical cell 2 | Exemplified Dye A-13 | ⊙ | This invention |
| 9 | Photoelectrochemical cell 3 | Exemplified Dye A-13 | ⊙ | This invention |
| 10 | Photoelectrochemical cell 4 | Exemplified Dye A-13 | ⊙ | This invention |
| 11 | Photoelectrochemical cell 5 | Exemplified Dye A-13 | ⊙ | This invention |
| 12 | Photoelectrochemical cell 6 | Exemplified Dye A-13 | ⊙ | This invention |
| 13 | Photoelectrochemical cell 7 | Exemplified Dye A-13 | ⊙ | This invention |
| 14 | Photoelectrochemical cell 8 | Exemplified Dye A-13 | ⊙ | This invention |
| 15 | Photoelectrochemical cell 9 | Exemplified Dye A-13 | ⊙ | This invention |
| 16 | Photoelectrochemical cell 10 | Exemplified Dye A-13 | ⊙ | This invention |
| 17 | Photoelectrochemical cell 1 | Sensitizing dye A | Δ | Comparative example |
| 18 | Photoelectrochemical cell 2 | Sensitizing dye A | Δ | Comparative example |
| 19 | Photoelectrochemical cell 3 | Sensitizing dye A | Δ | Comparative example |
| 20 | Photoelectrochemical cell 4 | Sensitizing dye A | Δ | Comparative example |
| 21 | Photoelectrochemical cell 5 | Sensitizing dye A | Δ | Comparative example |
| 22 | Photoelectrochemical cell 6 | Sensitizing dye A | Δ | Comparative example |
| 23 | Photoelectrochemical cell 7 | Sensitizing dye A | Δ | Comparative example |
| 24 | Photoelectrochemical cell 8 | Sensitizing dye A | Δ | Comparative example |
| 25 | Photoelectrochemical cell 9 | Sensitizing dye A | Δ | Comparative example |
| 26 | Photoelectrochemical cell 10 | Sensitizing dye A | Δ | Comparative example |
| 27 | Photoelectrochemical cell 11 | Sensitizing dye A | X | Comparative example |
| 28 | Photoelectrochemical cell 12 | Sensitizing dye A | X | Comparative example |

It was understood from the above Table that the dyes of the present invention have high conversion efficiencies.

Example 6-3

An evaluation was performed in the same manner as in Example 6-1, using the dye of the third embodiment of the present invention prepared as described above. The results are presented in Table 6-3.

TABLE 6-3

| Sample No. | | Used dye | Conversion efficiency | Remarks |
|---|---|---|---|---|
| 1 | Photoelectrochemical cell 1 | Exemplified Dye O-2 | ⊙ | This invention |
| 2 | Photoelectrochemical cell 2 | Exemplified Dye O-2 | ⊙ | This invention |
| 3 | Photoelectrochemical cell 3 | Exemplified Dye O-1 | ○ | This invention |
| 4 | Photoelectrochemical cell 4 | Exemplified Dye N-3 | ⊙ | This invention |

TABLE 6-3-continued

| Sample No. | | Used dye | Conversion efficiency | Remarks |
|---|---|---|---|---|
| 5 | Photoelectrochemical cell 5 | Exemplified Dye R-3 | ○ | This invention |
| 6 | Photoelectrochemical cell 6 | Exemplified Dye E-1 | ○ | This invention |
| 7 | Photoelectrochemical cell 1 | Exemplified Dye G-2 | ⊙ | This invention |
| 8 | Photoelectrochemical cell 2 | Exemplified Dye J-1 | ⊙ | This invention |
| 9 | Photoelectrochemical cell 3 | Exemplified Dye CB-3 | ⊙ | This invention |
| 10 | Photoelectrochemical cell 4 | Exemplified Dye CB-5 | ⊙ | This invention |
| 11 | Photoelectrochemical cell 5 | Exemplified Dye CC-5 | ○ | This invention |
| 12 | Photoelectrochemical cell 6 | Exemplified Dye CD-1 | ○ | This invention |
| 13 | Photoelectrochemical cell 7 | Exemplified Dye CD-6 | ○ | This invention |
| 14 | Photoelectrochemical cell 8 | Exemplified Dye S-4 | ⊙ | This invention |
| 15 | Photoelectrochemical cell 9 | Exemplified Dye S-3 | ⊙ | This invention |
| 16 | Photoelectrochemical cell 10 | Exemplified Dye CA-5 | ⊙ | This invention |
| 17 | Photoelectrochemical cell 1 | Sensitizing dye A | Δ | Comparative example |
| 18 | Photoelectrochemical cell 2 | Sensitizing dye A | Δ | Comparative example |
| 19 | Photoelectrochemical cell 3 | Sensitizing dye A | Δ | Comparative example |
| 20 | Photoelectrochemical cell 4 | Sensitizing dye A | Δ | Comparative example |
| 21 | Photoelectrochemical cell 5 | Sensitizing dye A | Δ | Comparative example |
| 22 | Photoelectrochemical cell 6 | Sensitizing dye A | Δ | Comparative example |
| 23 | Photoelectrochemical cell 7 | Sensitizing dye A | Δ | Comparative example |
| 24 | Photoelectrochemical cell 8 | Sensitizing dye A | Δ | Comparative example |
| 25 | Photoelectrochemical cell 9 | Sensitizing dye A | Δ | Comparative example |
| 26 | Photoelectrochemical cell 10 | Sensitizing dye A | Δ | Comparative example |
| 27 | Photoelectrochemical cell 11 | Sensitizing dye A | X | Comparative example |
| 28 | Photoelectrochemical cell 12 | Sensitizing dye A | X | Comparative example |

It was understood from Table 6-3 that the dyes of the present invention provide high conversion efficiencies.

Example 7-1

A metal alkoxide was added to the metal oxide fine particles, and the mixture was made into a slurry. The slurry was applied on a conductive substrate, and then the slurry was subjected to irradiation with UV ozone, irradiation with UV and/or drying, and thus electrodes were produced. Thereafter, photoelectrochemical cells were produced, and the conversion efficiencies were measured. The dye of the first embodiment of the present invention prepared as described above was used as the dye.

(Metal Oxide Fine Particles)

Titanium oxide was used for the metal oxide fine particles. As the titanium oxide, P25 powder (manufactured by Degussa GmbH, trade name) which is composed of 30% of the rutile type and 70% of the anatase type on a mass basis, and has an average particle size of 25 nm, was used.

(Pretreatment of Metal Oxide Fine Particle Powder)

The metal oxide fine particles were heat-treated in advance, and thereby organic materials and moisture on the surface were eliminated. In the case of titanium oxide fine particles, the particles were heated for 30 minutes in an oven at 450° C. in open air.

(Measurement of Amount of Moisture Contained in Metal Oxide Fine Particles)

The amounts of moisture contained in the titanium oxide and the P25 powder (manufactured by Degussa GmbH, trade name), which had been stored in an environment at a temperature of 26° C. and a humidity of 72%, were quantitatively measured by weight reduction during thermal weight measurement and by Karl Fischer titration of the amount of moisture desorbed when heated to 300° C.

The amounts of moisture desorbed when titanium oxide and the P25 powder (manufactured by Degussa GmbH, trade name) were heated to 300° C., were quantitatively measured by Karl Fischer titration, and 0.253 mg of water was contained in 0.1033 g of a titanium oxide fine powder. That is, since the titanium oxide fine powder contained about 2.5 wt % of moisture, the metal oxide fine particle powder was used after the powder was heat treated for 30 minutes in an oven at 450° C. prior to the mixing with a metal alkoxide, cooled, and then stored in a desiccator.

(Preparation of Metal Alkoxide Paste)

As the metal alkoxide that plays the role of binding the metal oxide fine particles, titanium (IV) tetraisopropoxide (TTIP) as a titanium raw material, zirconium (IV) tetra-n-propoxide as a zirconium raw material, and niobium (V) pentaethoxide as a niobium raw material (all manufactured by Sigma-Aldrich Company) were used.

The molar concentration ratio of the metal oxide fine particles and the metal alkoxide was appropriately adjusted in accordance with the metal oxide fine particle diameter, so that the amorphous layer produced as a result of hydrolysis of the metal alkoxide would not become excessively thick, and binding between the particles could be sufficiently achieved. The metal alkoxides were all used in the form of a 0.1 M ethanol solution. In the case of mixing the titanium oxide fine particles and titanium (IV) tetraisopropoxide (TTIP), 3.55 g of a 0.1 M TTIP solution was mixed with 1 g of the titanium oxide fine particles. At this time, the concentration of titanium oxide in the paste thus obtained was about 22% by mass, and the paste had a viscosity appropriate for application. Furthermore, at this time, the ratio of titanium oxide, TTIP and ethanol was 1:0.127:3.42 on a mass basis, and 1:0.036:5.92 on a molar basis.

Similarly, mixed pastes of titanium oxide fine particles and alkoxides other than TTIP were also prepared such that the concentration of the fine particles was 22% by mass. In the paste which used zinc oxide and titanium oxide fine particles, the concentration of the fine particles was set to 16% by mass. In the case of zinc oxide and tin oxide, the metal alkoxide solution was mixed at a ratio of 5.25 g to 1 g of the metal oxide fine particles.

The metal oxide fine particles and the metal alkoxide solution were stirred with a magnetic stirrer for 2 hours in a sealed container, and thus a uniform paste was obtained.

In regard to the method of applying the paste on a conductive substrate, a doctor blade method, a screen printing method, a spray coating method or the like can be used, and an appropriate paste viscosity was appropriately selected according to the application method. In this embodiment, a method of applying the paste with a glass rod (similar to the doctor blade method) was conveniently used. In this case, the concentration of the metal oxide fine particles that resulted in an appropriate paste viscosity was approximately in the range of 5% to 30% by mass.

The thickness of the layer of amorphous metal oxide that was produced as a result of decomposition of the metal alkoxide was in the range of about 0.1 to 0.6 nm in the present Example. Generally, the range of about 0.05 to 1.3 nm was appropriate for the film formation at room temperature according to the present technique.

(Application and Air Drying Treatment of Paste on Conductive Substrate)

On a polyethylene terephthalate (PET) film substrate attached with a tin-doped indium oxide (ITO) conductive film (20 $\Omega/cm^2$) or on a glass substrate attached with a fluorine-doped tin oxide (FTO) conductive film (10 $\Omega/cm^2$), two sheets of adhesive tape were adhered in parallel at a certain distance as spacers, and each of the pastes prepared according to the methods described above was uniformly applied on the substrate using a glass rod.

After the paste was applied, a porous film was produced, prior to dye adsorption, by changing the conditions on the presence or absence of a UV ozone treatment, a UV irradiation treatment and/or a drying treatment.

(Drying Treatment)

The film obtained after the application on the conductive substrate was air dried in open air at room temperature for about 2 minutes. During this process, the metal alkoxides in the pastes were hydrolyzed due to the moisture in air, and titanium oxide, zirconium oxide, and niobium oxide, all being amorphous, were formed respectively from Ti alkoxide, Zr alkoxide, and Nb alkoxide.

Since the amorphous metal oxides thus produced accomplished the role of adhering metal oxide fine particles to other metal oxide fine particles, and adhering the film to the conductive substrate, porous films having excellent mechanical strength and adhesiveness were obtained only by air drying.

(UV Ozone Treatment)

A UV ozone cleaner, NL-UV253, manufactured by Nippon Laser Electronics Lab Co., Ltd. was used for the UV ozone treatment. The UV light source included three 4.5-W mercury lamps each having emission lines at 185 nm and 254 nm, and the sample was disposed horizontally at a distance of about 6.5 cm from the light source. When an oxygen gas stream is introduced into the chamber, ozone is generated. In the present Example, this UV ozone treatment was carried out for 2 hours. No decrease was observed in the conductivity of the ITO film and the FTO film due to this UV ozone treatment.

(UV Treatment)

The UV treatment was carried out for 2 hours in the same manner as in the UV ozone treatment, except that the treatment was performed by purging the chamber with nitrogen. No decrease was observed in the conductivity of the ITO film and the FTO film due to this UV treatment.

(Dye Adsorption)

For the sensitizing dye, a 0.5 mM ethanol solution was prepared using a dye of the present invention. In the present Example, a porous film produced by the process described above was dried for one hour in an oven at 100° C., and then was immersed in a solution of the sensitizing dye. The porous film was left immersed at room temperature for 50 minutes, so that the sensitizing dye was adsorbed on the surface of titanium oxide. The sample after the adsorption of the sensitizing dye was washed with ethanol and was air dried.

(Production of Photoelectrochemical Cell and Evaluation of Cell Characteristics)

The conductive substrate in which a porous film was formed after dye adsorption was used as a photoelectrode, and this photoelectrode and an ITO/PET film or FTO/glass counter electrode which had been modified with platinum fine particles by sputtering, were arranged to face each other. Thus, a photoelectrochemical cell was produced. The effective area of the photoelectrode was adjusted to about 0.2 $cm^2$. A 3-methoxypropionitrile solution containing 0.5M LiI, 0.05M $I_2$, and 0.5M t-butylpyridine was used as an electrolyte solution, and this solution was introduced into the gap between the two electrodes by means of the capillary phenomenon.

The evaluation of the cell performance was carried out by the measurement of a photocurrent action spectrum under irradiation with a definite number of photons (1016 $cm^{-2}$), and by I-V measurement under irradiation with AM1.5 pseudo-sunlight (100 mW/$cm^2$). These measurements were carried out using a CEP-2000 type spectral response measurement apparatus manufactured by Bunkoukeiki Co., Ltd.

Obtained output characteristics values are shown in Table 7-1. The results are presented such that one having a conversion efficiency of 3% or more is indicated with "⊙"; one having a conversion efficiency of equal to or more than 2% and less than 5% is indicated with "○"; one having a conversion efficiency of equal to or more than 0.5% and less than 2% is indicated with "Δ"; and one having a conversion efficiency of less than 0.5% is indicated with "x".

TABLE 7-1

| Sample No. | TCO substrate | Pre-treatment of $TiO_2$ | Used dye | UV ozone | UV | Drying | Conversion efficiency | Remarks |
| --- | --- | --- | --- | --- | --- | --- | --- | --- |
| 1 | FTO/glass | Conducted | Exemplified Dye D-3 | ○ | X | ○ | ⊙ | This invention |
| 2 | FTO/glass | Conducted | Exemplified Dye D-3 | X | ○ | ○ | ⊙ | This invention |
| 3 | FTO/glass | Conducted | Exemplified Dye D-3 | X | X | ○ | ○ | This invention |
| 4 | FTO/glass | Conducted | Exemplified Dye D-3 | X | X | X | ○ | This invention |
| 5 | FTO/glass | Not conducted | Exemplified Dye D-3 | X | X | ○ | ○ | This invention |
| 6 | FTO/glass | Conducted | Exemplified Dye D-3 | ○ | X | ○ | ○ | This invention |
| 7 | ITO/PET | Conducted | Exemplified Dye D-3 | ○ | X | ○ | ⊙ | This invention |
| 8 | ITO/PET | Conducted | Exemplified Dye D-3 | X | X | ○ | ○ | This invention |
| 9 | FTO/glass | Conducted | Exemplified Dye D-12 | ○ | X | ○ | ⊙ | This invention |
| 10 | FTO/glass | Conducted | Exemplified Dye D-12 | X | ○ | ○ | ○ | This invention |
| 11 | FTO/glass | Conducted | Exemplified Dye D-12 | X | X | ○ | ○ | This invention |
| 12 | FTO/glass | Conducted | Exemplified Dye D-12 | X | X | X | ○ | This invention |
| 13 | FTO/glass | Not conducted | Exemplified Dye D-12 | X | X | ○ | ○ | This invention |
| 14 | FTO/glass | Conducted | Exemplified Dye D-12 | ○ | X | ○ | ○ | This invention |
| 15 | ITO/PET | Conducted | Exemplified Dye D-12 | ○ | X | ○ | ○ | This invention |

TABLE 7-1-continued

| Sample No. | TCO substrate | Pre-treatment of TiO₂ | Used dye | UV ozone | UV | Drying | Conversion efficiency | Remarks |
|---|---|---|---|---|---|---|---|---|
| 16 | ITO/PET | Conducted | Exemplified Dye D-12 | X | X | ○ | ○ | This invention |
| 17 | FTO/glass | Conducted | Sensitizing dye A | ○ | X | ○ | Δ | Comparative example |
| 18 | FTO/glass | Conducted | Sensitizing dye A | X | ○ | ○ | Δ | Comparative example |
| 19 | FTO/glass | Conducted | Sensitizing dye A | X | X | ○ | Δ | Comparative example |
| 20 | FTO/glass | Conducted | Sensitizing dye A | X | X | X | Δ | Comparative example |
| 21 | FTO/glass | Not conducted | Sensitizing dye A | X | X | ○ | X | Comparative example |
| 22 | FTO/glass | Conducted | Sensitizing dye A | ○ | X | ○ | X | Comparative example |
| 23 | ITO/PET | Conducted | Sensitizing dye A | ○ | X | ○ | Δ | Comparative example |
| 24 | ITO/PET | Conducted | Sensitizing dye A | X | X | ○ | X | Comparative example |

In Table 7-1, the columns for the items "UV ozone", "UV" and "Drying" represent the presence or absence of the UV ozone treatment, UV irradiation treatment and drying treatment, respectively, after the formation of the porous film and before the adsorption of the sensitizing dye. Treated samples are indicated with "○", and untreated samples are indicated with "x".

The column for the item "Pre-treatment of TiO₂" in Table 7-1 represents the presence or absence of a pretreatment (heat treatment for 30 minutes in an oven at 450° C.) of the titanium oxide fine particles. Samples 6, 14 and 22 represent samples obtained by using a paste with a high TTIP concentration (the molar ratio of titanium oxide:TTIP was 1:0.356). The other samples (samples 1 to 5, 7 to 13, 23 and 24) were all obtained by using a paste having a molar ratio of titanium oxide:TTIP of 1:0.0356.

From the results presented in the Table 7-1, it was found that when the dyes of the present invention were used, the conversion efficiencies of the photoelectrochemical cells were high, irrespective of the presence or absence of the UV ozone treatment, UV irradiation treatment, and drying treatment, after the formation of the porous film and before the adsorption of the sensitizing dye.

Example 7-2

An evaluation was performed in the same manner as in Example 7-1, using the dye of the second embodiment of the present invention that was prepared as described above. The results are presented in Table 7-2.

TABLE 7-2

| Sample No. | TCO substrate | Pre-treatment of TiO₂ | Used dye | UV ozone | UV | Drying | Conversion efficiency | Remarks |
|---|---|---|---|---|---|---|---|---|
| 1 | FTO/glass | Conducted | Exemplified Dye A-9 | ○ | X | ○ | ⊙ | This invention |
| 2 | FTO/glass | Conducted | Exemplified Dye A-9 | X | ○ | ○ | ⊙ | This invention |
| 3 | FTO/glass | Conducted | Exemplified Dye A-9 | X | X | ○ | ○ | This invention |
| 4 | FTO/glass | Conducted | Exemplified Dye A-9 | X | X | X | ○ | This invention |
| 5 | FTO/glass | Not conducted | Exemplified Dye A-9 | X | X | ○ | ○ | This invention |
| 6 | FTO/glass | Conducted | Exemplified Dye A-9 | ○ | X | ○ | ○ | This invention |
| 7 | ITO/PET | Conducted | Exemplified Dye A-9 | ○ | X | ○ | ⊙ | This invention |
| 8 | ITO/PET | Conducted | Exemplified Dye A-9 | X | X | ○ | ○ | This invention |
| 9 | FTO/glass | Conducted | Exemplified Dye A-13 | ○ | X | ○ | ⊙ | This invention |
| 10 | FTO/glass | Conducted | Exemplified Dye A-13 | X | ○ | ○ | ⊙ | This invention |
| 11 | FTO/glass | Conducted | Exemplified Dye A-13 | X | X | ○ | ⊙ | This invention |
| 12 | FTO/glass | Conducted | Exemplified Dye A-13 | X | X | X | ⊙ | This invention |
| 13 | FTO/glass | Not conducted | Exemplified Dye A-13 | X | X | ○ | ○ | This invention |
| 14 | FTO/glass | Conducted | Exemplified Dye A-13 | ○ | X | ○ | ○ | This invention |
| 15 | ITO/PET | Conducted | Exemplified Dye A-13 | ○ | X | ○ | ○ | This invention |
| 16 | ITO/PET | Conducted | Exemplified Dye A-13 | X | X | ○ | ○ | This invention |
| 17 | FTO/glass | Conducted | Sensitizing dye A | ○ | X | ○ | Δ | Comparative example |
| 18 | FTO/glass | Conducted | Sensitizing dye A | X | ○ | ○ | Δ | Comparative example |
| 19 | FTO/glass | Conducted | Sensitizing dye A | X | X | ○ | Δ | Comparative example |
| 20 | FTO/glass | Conducted | Sensitizing dye A | X | X | X | Δ | Comparative example |
| 21 | FTO/glass | Not conducted | Sensitizing dye A | X | X | ○ | X | Comparative example |
| 22 | FTO/glass | Conducted | Sensitizing dye A | ○ | X | ○ | X | Comparative example |
| 23 | ITO/PET | Conducted | Sensitizing dye A | ○ | X | ○ | Δ | Comparative example |
| 24 | ITO/PET | Conducted | Sensitizing dye A | X | X | ○ | X | Comparative example |

In Table 7-2, the columns for the items "UV ozone", "UV" and "Drying" represent the presence or absence of the UV ozone treatment, UV irradiation treatment and drying treatment, respectively, after the formation of the porous film and before the adsorption of the sensitizing dye. Treated samples are indicated with "o", and untreated samples are indicated with "x".

The column for the item "Pre-treatment of TiO₂" in Table 7-2 represents the presence or absence of a pretreatment (heat treatment for 30 minutes in an oven at 450° C.) of the titanium oxide fine particles. Samples 6, 14 and 22 represent samples obtained by using a paste with a high TTIP concentration (the molar ratio of titanium oxide:TTIP was 1:0.356). The other samples (samples 1 to 5, 7 to 13, 23 and 24) were all obtained by using a paste having a molar ratio of titanium oxide:TTIP of 1:0.0356.

From the results presented in the Table 7-2, it was found that when the dyes of the present invention were used, the conversion efficiencies of the photoelectrochemical cells were high, irrespective of the presence or absence of the UV ozone treatment, UV irradiation treatment, and drying treatment, after the formation of the porous film and before the adsorption of the sensitizing dye.

Example 7-3

An evaluation was performed in the same manner as in Example 7-1, using the dye of the third embodiment of the present invention that was prepared as described above. The results are presented in Table 7-3.

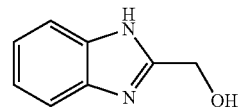

No. 1

TABLE 7-3

| Sample No. | TCO substrate | Pre-treatment of TiO$_2$ | Used dye | UV ozone | UV | Drying | Conversion efficiency | Remarks |
|---|---|---|---|---|---|---|---|---|
| 1 | FTO/glass | Conducted | Exemplified Dye CA-1 | ○ | X | ○ | ⊙ | This invention |
| 2 | FTO/glass | Conducted | Exemplified Dye CA-2 | X | ○ | ○ | ⊙ | This invention |
| 3 | FTO/glass | Conducted | Exemplified Dye CA-3 | X | X | ○ | ⊙ | This invention |
| 4 | FTO/glass | Conducted | Exemplified Dye CA-4 | X | X | X | ○ | This invention |
| 5 | FTO/glass | Not conducted | Exemplified Dye CA-5 | X | X | ○ | ⊙ | This invention |
| 6 | FTO/glass | Conducted | Exemplified Dye CA-6 | ○ | X | ○ | ⊙ | This invention |
| 7 | ITO/PET | Conducted | Exemplified Dye CB-1 | ○ | X | ○ | ⊙ | This invention |
| 8 | ITO/PET | Conducted | Exemplified Dye CB-2 | X | X | ○ | ⊙ | This invention |
| 9 | FTO/glass | Conducted | Exemplified Dye CB-3 | ○ | X | ○ | ⊙ | This invention |
| 10 | FTO/glass | Conducted | Exemplified Dye CB-4 | X | ○ | ○ | ⊙ | This invention |
| 11 | FTO/glass | Conducted | Exemplified Dye CB-5 | X | X | ○ | ○ | This invention |
| 12 | FTO/glass | Conducted | Exemplified Dye CB-6 | X | X | X | ○ | This invention |
| 13 | FTO/glass | Not conducted | Exemplified Dye CC-1 | X | X | ○ | ⊙ | This invention |
| 14 | FTO/glass | Conducted | Exemplified Dye CC-2 | ○ | X | ○ | ⊙ | This invention |
| 15 | ITO/PET | Conducted | Exemplified Dye CC-3 | ○ | X | ○ | ⊙ | This invention |
| 16 | ITO/PET | Conducted | Exemplified Dye CC-4 | X | X | ○ | ○ | This invention |
| 17 | FTO/glass | Conducted | Sensitizing dye A | ○ | X | ○ | Δ | Comparative example |
| 18 | FTO/glass | Conducted | Sensitizing dye A | X | ○ | ○ | Δ | Comparative example |
| 19 | FTO/glass | Conducted | Sensitizing dye A | X | X | ○ | Δ | Comparative example |
| 20 | FTO/glass | Conducted | Sensitizing dye A | X | X | X | Δ | Comparative example |
| 21 | FTO/glass | Not conducted | Sensitizing dye A | X | X | ○ | X | Comparative example |
| 22 | FTO/glass | Conducted | Sensitizing dye A | ○ | X | ○ | X | Comparative example |
| 23 | ITO/PET | Conducted | Sensitizing dye A | ○ | X | ○ | Δ | Comparative example |
| 24 | ITO/PET | Conducted | Sensitizing dye A | X | X | ○ | X | Comparative example |

In Table 7-3, the columns for the items "UV ozone", "UV" and "Drying" represent the presence or absence of the UV ozone treatment, UV irradiation treatment and drying treatment, respectively, after the formation of the porous film and before the adsorption of the sensitizing dye. Treated samples are indicated with "○", and untreated samples are indicated with "x".

The column for the item "Pre-treatment of TiO$_2$" in Table 7-3 represents the presence or absence of a pretreatment (heat treatment for 30 minutes in an oven at 450° C.) of the titanium oxide fine particles. Samples 6, 14 and 22 represent samples obtained by using a paste with a high TTIP concentration (the molar ratio of titanium oxide:TTIP was 1:0.356). The other samples (samples 1 to 5, 7 to 13, 23 and 24) were all obtained by using a paste having a molar ratio of titanium oxide:TTIP of 1:0.0356.

From the results presented in the Table 7-3, it was found that when the dyes of the present invention were used, the conversion efficiencies of the photoelectrochemical cells were high, irrespective of the presence or absence of the UV ozone treatment, UV irradiation treatment, and drying treatment, after the formation of the porous film and before the adsorption of the sensitizing dye.

Example 8-1

An electrolyte solution in which 0.1 mol/L of lithium iodide, 0.05 mol/L of iodine, and 0.62 mol/L of dimethylpropylimidazolium iodide were dissolved was prepared using acetonitrile as a solvent. To this solution, the benzimidazole-based compounds of No. 1 to No. 8 shown below were separately added so as to be a concentration of 0.5 mol/L each, and the compounds were dissolved therein.

-continued

No. 2

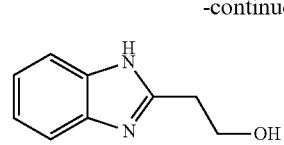

No. 3

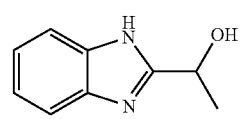

No. 4

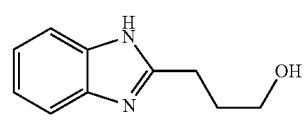

No. 5

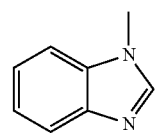

No. 6

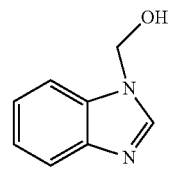

-continued

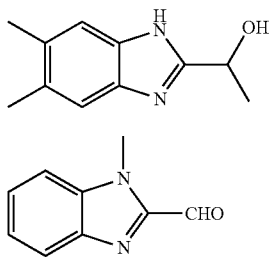

No. 7

No. 8

A conductive film was formed on a glass substrate by sputtering fluorine-doped tin oxide as a transparent conductive film. On this conductive film, a dispersion liquid containing anatase type titanium oxide particles (a dispersion liquid of semiconductor fine particles obtained by incorporating 32 g of anatase type titanium oxide (P-25 (trade name) manufactured by Nippon Aerosil Co., Ltd.) into 100 mL of a mixed solvent composed of water and acetonitrile at a volume ratio of 4:1, and uniformly dispersing and mixing the mixture using a rotation/revolution combination type mixing conditioner) was applied, and was sintered. Thereafter, the dye of the first embodiment of the present invention was adsorbed thereon, and thus a photosensitive layer having a thickness of 15 μm was formed. The electrolytic liquid of the benzimidazole-based compounds of No. 1 to No. 8 was added dropwise to the photosensitive layer.

A frame type spacer (thickness 25 μm) made of a polyethylene film was mounted thereon, and this spacer was covered with a platinum counter electrode. Thus, a photoelectric conversion element was produced.

Photoelectric conversion elements thus obtained were irradiated with light at an intensity of 100 mW/cm² using a Xe lamp as a light source. The open circuit voltages and photoelectric conversion efficiencies thus obtained are shown in Table 8-1. The results are presented such that one having an open circuit voltage of 7.0 V or more is indicated with "⊙"; one having an open circuit voltage of equal to or more than 6.5 V and less than 7.0 is indicated with "○"; one having an open circuit voltage of equal to or more than 6.0 V and less than 6.5 V is indicated with "Δ"; and one having an open circuit voltage of less than 6.0 V is indicated with "x". Further, the results are presented such that one having a conversion efficiency of 3% or more is indicated with "⊙"; one having a conversion efficiency of equal to or more than 2% and less than 5% is indicated with "○"; one having a conversion efficiency of equal to or more than 0.5% and less than 2% is indicated with "Δ"; and one having a conversion efficiency of less than 0.5% is indicated with "x".

In addition, Table 8-1 also shows the results obtained with a photoelectric conversion element which used an electrolytic liquid without any added benzimidazole-based compound.

TABLE 8-1

| Sample No. | Benzimidazole-series compound | Used dye | Open circuit voltage/V | Conversion efficiency | Remarks |
|---|---|---|---|---|---|
| 1 | No. 1 | Exemplified Dye D-7 | ⊙ | ⊙ | This invention |
| 2 | No. 2 | Exemplified Dye D-7 | ⊙ | ⊙ | This invention |
| 3 | No. 3 | Exemplified Dye D-7 | ⊙ | ⊙ | This invention |
| 4 | No. 4 | Exemplified Dye D-7 | ⊙ | ⊙ | This invention |
| 5 | No. 5 | Exemplified Dye D-7 | ⊙ | ⊙ | This invention |
| 6 | No. 6 | Exemplified Dye D-7 | ⊙ | ⊙ | This invention |
| 7 | No. 7 | Exemplified Dye D-7 | ○ | ⊙ | This invention |
| 8 | No. 8 | Exemplified Dye D-7 | ○ | ○ | This invention |
| 9 | None | Exemplified Dye D-7 | ○ | ○ | This invention |
| 10 | No. 1 | Sensitizing dye A | Δ | Δ | Comparative example |
| 11 | No. 2 | Sensitizing dye A | Δ | Δ | Comparative example |
| 12 | No. 3 | Sensitizing dye A | Δ | Δ | Comparative example |
| 13 | No. 4 | Sensitizing dye A | Δ | Δ | Comparative example |
| 14 | No. 5 | Sensitizing dye A | Δ | Δ | Comparative example |
| 15 | No. 6 | Sensitizing dye A | Δ | Δ | Comparative example |
| 16 | No. 7 | Sensitizing dye A | Δ | Δ | Comparative example |
| 17 | No. 8 | Sensitizing dye A | Δ | Δ | Comparative example |
| 18 | None | Sensitizing dye A | X | X | Comparative example |

It was understood from Table 8-1 that the dyes of the first embodiment of the present invention provide high conversion efficiencies.

Example 8-2

An evaluation was performed in the same manner as in Example 8-1, using the dye of the second embodiment of the present invention that was prepared as described above. The results are presented in Table 8-2.

TABLE 8-2

| Sample No. | Benzimidazole-series compound | Used dye | Open circuit voltage/V | Conversion efficiency | Remarks |
|---|---|---|---|---|---|
| 1 | No. 1 | Exemplified Dye A-10 | ⊙ | ⊙ | This invention |
| 2 | No. 2 | Exemplified Dye A-10 | ⊙ | ⊙ | This invention |
| 3 | No. 3 | Exemplified Dye A-10 | ⊙ | ⊙ | This invention |

TABLE 8-2-continued

| Sample No. | Benzimidazole-series compound | Used dye | Open circuit voltage/V | Conversion efficiency | Remarks |
|---|---|---|---|---|---|
| 4 | No. 4 | Exemplified Dye A-10 | ⊙ | ⊙ | This invention |
| 5 | No. 5 | Exemplified Dye A-10 | ⊙ | ⊙ | This invention |
| 6 | No. 6 | Exemplified Dye A-10 | ⊙ | ⊙ | This invention |
| 7 | No. 7 | Exemplified Dye A-10 | ○ | ⊙ | This invention |
| 8 | No. 8 | Exemplified Dye A-10 | ○ | ○ | This invention |
| 9 | None | Exemplified Dye A-10 | ○ | ○ | This invention |
| 10 | No. 1 | Sensitizing dye A | Δ | Δ | Comparative example |
| 11 | No. 2 | Sensitizing dye A | Δ | Δ | Comparative example |
| 12 | No. 3 | Sensitizing dye A | Δ | Δ | Comparative example |
| 13 | No. 4 | Sensitizing dye A | Δ | Δ | Comparative example |
| 14 | No. 5 | Sensitizing dye A | Δ | Δ | Comparative example |
| 15 | No. 6 | Sensitizing dye A | Δ | Δ | Comparative example |
| 16 | No. 7 | Sensitizing dye A | Δ | Δ | Comparative example |
| 17 | No. 8 | Sensitizing dye A | Δ | Δ | Comparative example |
| 18 | None | Sensitizing dye A | X | X | Comparative example |

It was understood from Table 8-2 that the dyes of the present invention provide high conversion efficiencies.

Example 8-3

An evaluation was performed in the same manner as in Example 8-1, using the dye of the third embodiment of the present invention that was prepared as described above. The results are presented in Table 8-3. It was understood from Table 8-3 that the dyes of the present invention provide high conversion efficiencies.

TABLE 8-3

| Sample No. | Benzimidazole-series compound | Used dye | Open circuit voltage/V | Conversion efficiency | Remarks |
|---|---|---|---|---|---|
| 1 | No. 1 | Exemplified Dye CD-1 | ⊙ | ⊙ | This invention |
| 2 | No. 2 | Exemplified Dye CD-2 | ⊙ | ⊙ | This invention |
| 3 | No. 3 | Exemplified Dye CD-3 | ○ | ○ | This invention |
| 4 | No. 4 | Exemplified Dye E-1 | ⊙ | ⊙ | This invention |
| 5 | No. 5 | Exemplified Dye M-1 | ○ | ○ | This invention |
| 6 | No. 6 | Exemplified Dye CA-2 | ⊙ | ⊙ | This invention |
| 7 | No. 7 | Exemplified Dye CA-3 | ○ | ⊙ | This invention |
| 8 | No. 8 | Exemplified Dye CA-4 | ⊙ | ○ | This invention |
| 9 | None | Exemplified Dye M-2 | ⊙ | ⊙ | This invention |
| 10 | No. 1 | Sensitizing dye A | Δ | Δ | Comparative example |
| 11 | No. 2 | Sensitizing dye A | Δ | Δ | Comparative example |
| 12 | No. 3 | Sensitizing dye A | Δ | Δ | Comparative example |
| 13 | No. 4 | Sensitizing dye A | Δ | Δ | Comparative example |
| 14 | No. 5 | Sensitizing dye A | Δ | Δ | Comparative example |
| 15 | No. 6 | Sensitizing dye A | Δ | Δ | Comparative example |
| 16 | No. 7 | Sensitizing dye A | Δ | Δ | Comparative example |
| 17 | No. 8 | Sensitizing dye A | Δ | Δ | Comparative example |
| 18 | None | Sensitizing dye A | X | X | Comparative example |

Example 9-1

Photoelectrochemical Cell 1

A photoelectrode having the same configuration as that of the photoelectrode 10 shown in FIG. 1 described in JP-A-2004-152613 (provided that the semiconductor electrode 2 was made to have a bilayer structure), was produced by the procedure shown below. Further, a photoelectrochemical cell (area of the light-receiving surface F2 of the semiconductor electrode 2: 1 cm$^2$) having the same configuration as that of the dye-sensitized solar cell 20 shown in FIG. 1 described in JP-A-2004-152613, except for the use of the above-described photoelectrode, was produced. In regard to the respective layers of the semiconductor electrode 2 having a bilayer structure, the layer disposed closer to the transparent electrode 1 is referred to as a "first layer", and the layer disposed closer to the porous substance layer PS is referred to as a "second layer".

First, P25 powder having an average particle diameter of 25 nm (manufactured by Degussa GmbH, trade name), and titanium oxide particles having a different particle size, P200 powder (average particle diameter: 200 nm, manufactured by Degussa GmbH, trade name), were used; and acetylacetone, ion-exchanged water, and a surfactant (manufactured by Tokyo Chemical Industry Co., Ltd.; trade name: Triton-X) were added to those powders and kneaded, such that the total content of P25 and P200 was 15% by mass, and the mass ratio of P25 and P200 was P25:P200=30:70. Thus, a slurry for second layer formation (hereinafter, referred to as "slurry 1") was prepared.

Next, a slurry for first layer formation (content of P1: 15% by mass; hereinafter, referred to as "slurry 2") was prepared by the same production procedure as that used for the slurry 1, except that only P25 was used, without using P200.

Meanwhile, a transparent electrode (thickness: 1.1 mm) in which a fluorine-doped $SnO_2$ conductive film (thickness: 700 nm) was formed on a glass substrate (transparent conductive glass), was prepared. The slurry 2 described above was applied on this $SnO_2$ conductive film with a bar coater, and subsequently, the slurry 2 was dried. Thereafter, the slurry 2 was calcined at 450° C. for 30 minutes in air. In this manner, a first layer of the semiconductor electrode 2 was formed on the transparent electrode.

Furthermore, a second layer was formed on the first layer by using the slurry 1 and repeating application and calcination as described above. In this manner, a semiconductor electrode 2 (area of light-receiving surface: 1.0 cm$^2$, total thickness of the first layer and the second layer: 10 µm (thickness of the first layer: 3 µm, thickness of the second layer: 7 µm)) was formed on the SnO$_2$ conductive film, and thus a photoelectrode 10 not containing any sensitizing dye, was produced.

Next, an ethanol solution of the dye of the first embodiment of the present invention (concentration of sensitizing dye: 3×10$^{-4}$ mol/L) was prepared as the sensitizing dye. The photoelectrode 10 was immersed in this solution, and the photoelectrode was left immersed for 20 hours under the conditions of a temperature of 80° C. Thereby, the sensitizing dye was adsorbed to the interior of the semiconductor electrode in an amount of about 1.0 mmol/m$^2$. Thereafter, in order to improve the open circuit voltage, Voc, the semiconductor electrode after dye adsorption was immersed in an acetonitrile solution of 4-tert-butylpyridine for 15 minutes, and then was dried in a nitrogen gas stream maintained at 25° C. Thus, the photoelectrode 10 was completed.

Next, a counter electrode CE having the same shape and size as the photoelectrode was produced. First, an isopropanol solution of chloroplatinic acid hexahydrate was added dropwise on a transparent conductive glass, dried in air, and then was calcination treated for 30 minutes at 450° C. Thus, a platinum sintered counter electrode CE was obtained. This counter electrode CE was provided in advance with a hole (diameter 1 mm) for the injection of an electrolyte E.

Next, zinc iodide, 1,2-dimethyl-3-propylimidazolium iodide, iodine, and 4-tert-butylpyridine were dissolved in methoxyacetonitrile, which served as a solvent, and thereby a liquid electrolyte (concentration of zinc iodide: 10 mmol/L, concentration of dimethylpropylimidazolium iodide: 0.6 mol/L, concentration of iodine: 0.05 mol/L, and concentration of 4-tert-butylpyridine: 1 mol/L) was prepared.

Subsequently, a spacer S (trade name: "Himilan", an ethylene/methacrylic acid random copolymer ionomer film) manufactured by Mitsui-DuPont Polychemical, Ltd., which had a shape matching the size of the semiconductor electrode, was prepared, and as shown in FIG. 1 described in JP-A-2004-152613, the photoelectrode and the counter electrode were arranged to face each other, with the spacer interposed therebetween. The electrodes were respectively pasted by heat fusion. Thus, a casing of a cell (not filled with an electrolyte) was obtained.

Subsequently, the liquid electrolyte was injected into the case through the hole on the counter electrode, and then the hole was closed with a member made of the same material as the spacer. This member was further thermally fused to the hole of the counter electrode to seal the hole. Thus, a photoelectrochemical cell 1 was completed.

(Photoelectrochemical Cell 2)

A photoelectrochemical cell 2 was produced by the same procedure and the same conditions as in the case of the photoelectrochemical cell 1, except that the concentration of zinc iodide in the liquid electrolyte was changed to 50 mmol/L.

(Photoelectrochemical Cell 3)

A comparative photoelectrochemical cell 1 was produced by the same procedure and the same conditions as in the case of the photoelectrochemical cell 1, except that lithium iodide was added instead of zinc iodide in the liquid electrolyte, and the concentration of lithium iodide in the liquid electrolyte was changed to 20 mmol/L.

(Photoelectrochemical Cell 4)

A comparative photoelectrochemical cell 2 was produced by the same procedure and the same conditions as in the case of the photoelectrochemical cell 1, except that lithium iodide was added instead of zinc iodide in the liquid electrolyte, and the concentration of lithium iodide in the liquid electrolyte was changed to 100 mmol/L.

(Cell Characteristics Evaluation Test)

The photoelectric conversion efficiencies ($\eta$ (%)) of the photoelectrochemical cells 1 and 2 and the comparative electrochemical cells 1 and 2 were measured by the following procedure.

The cell characteristics evaluation test was carried out using a solar simulator (manufactured by Wacom Electric Co., Ltd., trade name: "WXS-85-H type"), under the measurement conditions in which the condition for irradiation with pseudo-sunlight from a xenon lamp light source through an AM filter (AM1.5) was set at 100 mW/cm$^2$ (irradiation condition of so-called "1 Sun").

For each of the photoelectrochemical cells, the current-voltage characteristics were measured at room temperature using an I-V tester, and the photoelectric conversion efficiency $\eta$[%] was determined from these characteristics. The results thus obtained are indicated as "fresh" in Table 9-1 (irradiation conditions for 1 Sun). Furthermore, the results of a durability evaluation test obtained by examining, after a lapse of 300 hours, the photoelectric conversion efficiencies $\eta$[%] of the dye-sensitized solar cells 1 and 2 and the comparative dye-sensitized solar cells 1 and 2, which were kept under the operation conditions of 60° C., irradiation of 1 Sun, and under a load of 10Ω, are also shown in Table 9-1.

TABLE 9-1

| Sample No. | | Used dye | Conversion efficiency Fresh | After 300 h | Remarks |
|---|---|---|---|---|---|
| 1 | Photoelectrochemical cell 1 | Exemplified Dye D-9 | 5.9 | 5.0 | This invention |
| 2 | Photoelectrochemical cell 2 | Exemplified Dye D-9 | 5.8 | 4.9 | This invention |
| 3 | Photoelectrochemical cell 3 | Exemplified Dye D-9 | 5.9 | 4.5 | This invention |
| 4 | Photoelectrochemical cell 4 | Exemplified Dye D-9 | 5.9 | 4.2 | This invention |
| 5 | Photoelectrochemical cell 1 | Sensitizing dye A | 2.9 | 1.1 | Comparative example |
| 6 | Photoelectrochemical cell 2 | Sensitizing dye A | 2.8 | 0.9 | Comparative example |
| 7 | Photoelectrochemical cell 3 | Sensitizing dye A | 2.9 | 0.4 | Comparative example |
| 8 | Photoelectrochemical cell 4 | Sensitizing dye A | 2.9 | 0.3 | Comparative example |

As it is clear from the results presented in Table 9-1, it was understood that the dye of the first embodiment of the present invention was excellent even when zinc iodide was added to the electrolyte.

Example 9-2

An evaluation was performed in the same manner as in Example 9-1, using the dye of the second embodiment of the present invention that was prepared as described above. The results are presented in Table 9-2.

TABLE 9-2

| Sample No. | Photoelectrochemical cell | Dye | Conversion efficiency Fresh | Conversion efficiency After 300 h | Remarks |
|---|---|---|---|---|---|
| 1 | Photoelectrochemical cell 1 | Exemplified Dye A-2 | 5.9 | 5.0 | This invention |
| 2 | Photoelectrochemical cell 2 | Exemplified Dye A-2 | 5.8 | 4.9 | This invention |
| 3 | Photoelectrochemical cell 3 | Exemplified Dye A-2 | 5.9 | 4.5 | This invention |
| 4 | Photoelectrochemical cell 4 | Exemplified Dye A-2 | 5.9 | 4.2 | This invention |
| 5 | Photoelectrochemical cell 1 | Sensitizing dye A | 2.9 | 1.1 | Comparative example |
| 6 | Photoelectrochemical cell 2 | Sensitizing dye A | 2.8 | 0.9 | Comparative example |
| 7 | Photoelectrochemical cell 3 | Sensitizing dye A | 2.9 | 0.4 | Comparative example |
| 8 | Photoelectrochemical cell 4 | Sensitizing dye A | 2.9 | 0.3 | Comparative example |

As it is clear from the results presented in Table 9-2, it was understood that the dye of the present invention was excellent even when zinc iodide was added to the electrolyte.

Example 9-3

An evaluation was performed in the same manner as in Example 9-1, using the dye of the third embodiment of the present invention that was prepared as described above. The results are presented in Table 9-3.

TABLE 9-3

| Sample No. | Photoelectrochemical cell | Used dye | Conversion efficiency fresh | Conversion efficiency After 300 h | Remarks |
|---|---|---|---|---|---|
| 1 | Photoelectrochemical cell 1 | Exemplified Dye CA-3 | 5.3 | 5.1 | This invention |
| 2 | Photoelectrochemical cell 2 | Exemplified Dye CA-4 | 5.4 | 4.9 | This invention |
| 3 | Photoelectrochemical cell 3 | Exemplified Dye CB-2 | 5.1 | 4.9 | This invention |
| 4 | Photoelectrochemical cell 4 | Exemplified Dye R-2 | 5.2 | 4.4 | This invention |
| 5 | Photoelectrochemical cell 1 | Sensitizing dye A | 2.8 | 1.1 | Comparative example |
| 6 | Photoelectrochemical cell 2 | Sensitizing dye A | 2.6 | 0.2 | Comparative example |
| 7 | Photoelectrochemical cell 3 | Sensitizing dye A | 2.5 | 0.3 | Comparative example |
| 8 | Photoelectrochemical cell 4 | Sensitizing dye A | 2.4 | 0.4 | Comparative example |

As it is clear from the results presented in Table 9-3, it was understood that the dye of the present invention was excellent even when zinc iodide was added to the electrolyte.

Example 10-1

1. Preparation of Titanium Dioxide Dispersion Liquid

In a stainless steel vessel having an internal capacity of 200 mL and having the inside coated with a fluororesin, 15 g of titanium dioxide fine particles (manufactured by Nippon Aerosil Co., Ltd., Degussa P-25), 45 g of water, 1 g of a dispersant (manufactured by Sigma-Aldrich Company, Triton X-100), and 30 g of zirconia beads having a diameter of 0.5 mm (manufactured by Nikkato Corp.) were placed, and the mixture was subjected to a dispersing treatment at 1500 rpm for 2 hours using a sand grinder mill (manufactured by Aimex, Ltd.). The zirconia beads were separated by filtration from the dispersion liquid thus obtained. The average particle diameter of the titanium dioxide fine particles in the dispersion liquid thus obtained was 2.5 µm. The particle diameter was measured using a Mastersizer manufactured by Malvern Instruments, Ltd.

2. Production of Dye-Adsorbed Titanium Oxide Fine Particle Layer (Electrode A)

A conductive glass plate (manufactured by Asahi Glass Co., Ltd., TCO Glass-U, surface resistance: about 30 $\Omega/m^2$) having a size of 20 mm×20 mm and coated with fluorine-doped tin oxide, was prepared, and an adhesive tape for use as a spacer was affixed at the two ends (areas having a width of 3 mm from the edge) on the conductive layer side. Subsequently, the dispersion liquid described above was applied on the conductive layer using a glass rod. After the application of the dispersion liquid, the adhesive tape was detached, and the dispersion liquid was air dried for one day at room temperature. Subsequently, this semiconductor-coated glass plate was placed in an electrical furnace (muffle furnace FP-32 type, manufactured by Yamato Scientific Co., Ltd.), and was calcined at 450° C. for 30 minutes. The semiconductor-applied glass plate was taken out and cooled, and then the glass plate was immersed in an ethanol solution of the dye of the first embodiment of the present invention indicated in Table 10-1 (concentration: $3\times10^{-4}$ mol/L) for 3 hours. The semiconductor-applied glass plate adsorbed with the dye was immersed in 4-tert-butylpyridine for 15 minutes, subsequently washed with ethanol, and naturally dried. The thickness of the dye-sensitized titanium oxide fine particle layer thus obtained was 10 µm, and the application amount of the titanium oxide fine particles was 20 $g/m^2$. The amount of adsorption of the dye varied in the range of 0.1 to 10 $mmol/m^2$, in accordance with the type of the dye.

3. Production of Photoelectrochemical Cell

A mixture of acetonitrile and 3-methyl-2-oxazolidinone at a volume ratio of 90/10 was used as the solvent. Iodine and an iodine salt of 1-methyl-3-hexylimidazolium as an electrolyte salt were added to this solvent, and thus a solution containing 0.5 mol/L of the electrolyte salt and 0.05 mol/L of iodine was prepared. To this solution, 10 parts by mass of a nitrogen-containing polymer compound (1-1) was added relative to 100 parts by mass of a mixture of (solvent+nitrogen-containing polymer compound+salt). Furthermore, an electrophile (2-6) for the reactive nitrogen atoms of the nitrogen-containing polymer compound was mixed in an amount of 0.1 moles, and thus a uniform reaction solution was obtained.

On the other hand, a counter electrode formed from a glass plate deposited with platinum was disposed, with the platinum thin film side facing downward, on the dye-sensitized titanium oxide fine particle layer formed on the conductive glass plate, with a spacer interposed between the two plates, and thereby the conductive glass plate and the platinum-deposited glass plate were fixed. An open end of the assembly thus obtained was immersed in the electrolyte solution described above, and thus the reaction solution was caused to penetrate into the dye-sensitized titanium oxide fine particle layer by the capillary phenomenon.

Subsequently, the assembly was heated at 80° C. for 30 minutes, and thereby a crosslinking reaction was carried out. In this manner, a photoelectrochemical cell 1-1 of the present invention was obtained, in which a dye-sensitized titanium oxide fine particle layer 20, an electrolyte layer 30, and a counter electrode 40 formed from a platinum thin film 42 and a glass plate 41 were laminated in this order on a conductive layer 12 of a conductive glass plate 10 as shown in FIG. 2 described in JP-A-2000-323190.

Furthermore, photoelectrochemical cells 1-2 and 1-3 having a different photosensitive layer 20 and/or a different charge transport layer 30 were obtained by repeating the steps described above, except that the combination of the dye and the composition of the electrolyte composition was changed as shown in Table 10.

4. Production of Photoelectrochemical Cells A and B (1) Photoelectrochemical Cell A An electrode A (20 mm×20 mm) formed from a titanium oxide fine particle layer which was dye-sensitized by a dye of the present invention as described above, was superimposed on a platinum-deposited glass plate having the same size, with a spacer interposed therebetween. Subsequently, an electrolytic liquid (a solution of 0.05 mol/L of iodine and 0.5 mol/L of lithium iodide in a mixture of acetonitrile and 3-methyl-2-oxazolidinone at a volume ratio of 90/10 as a solvent) was caused to penetrate into the gap between the two glass plates by utilizing the capillary phenomenon, and thus a photoelectrochemical cell A-1 was produced. Furthermore, photoelectrochemical cells A-2 and A-3 were obtained by repeating the above steps except that the dye was changed as indicated in Table 10-1.

(2) Photoelectrochemical Cell B (Electrolyte Described in JP-A-9-27352)

An electrolytic liquid was applied on the electrode A (20 mm×20 mm) formed from a titanium oxide fine particle layer which was dye-sensitized by a dye of the present invention as described above, and thus the electrode A was impregnated with the electrolytic liquid. The electrolytic liquid was obtained by dissolving 500 mg of lithium iodide in a mixed liquid containing 1 g of hexaethylene glycol methacrylate (manufactured by Nippon Oil & Fats Co., Ltd., Blenmer PE-350), 1 g of ethylene glycol, and 20 mg of 2-hydroxy-2-methyl-1-phenyl-propan-1-one (manufactured by Ciba-Geigy Japan, Ltd., Darocur 1173) as a polymerization initiator, and degassing the solution in a vacuum for 10 minutes. Subsequently, the porous titanium oxide layer impregnated with the mixed solution was left under reduced pressure to remove air bubbles in the porous titanium oxide layer. Penetration of the monomer was accelerated and then the monomer was polymerized by irradiation with ultraviolet radiation, and thereby a uniform gel of a polymer compound was filled within the fine pores of the porous titanium oxide layer. The product thus obtained was exposed to an iodine atmosphere for 30 minutes to diffuse iodine into the polymer compound, and then a platinum-deposited glass plate was superimposed thereon. Thus, a photoelectrochemical cell B-1 (Sample No. 3) was obtained. Furthermore, photoelectrochemical cells B-2 (Sample No. 6) and B-3 (Sample No. 9) were obtained by repeating the steps described above, except that the dye was changed as indicated in Table 10.

5. Measurement of Photoelectric Conversion Efficiency

Pseudo-sunlight not containing ultraviolet rays was obtained by passing light from a 500-W xenon lamp (manufactured by Ushio, Inc.) through an AM1.5 filter (manufactured by Oriel Instruments Corp.) and a sharp cut filter (Kenko L-42). The light intensity was set at 89 mW/cm$^2$.

The conductive glass plate 10 and the platinum-deposited glass plate 40 of the photoelectrochemical cell were each connected to an alligator clip, and the respective alligator clips were connected to a current-voltage measurement device (Keithley SMU238 type). This photoelectrochemical cell was irradiated with pseudo-sunlight from the side of the conductive glass plate 10, and the electricity thus generated was measured using the current-voltage measurement device. The initial values (fresh) of the conversion efficiency (η) of the photoelectrochemical cells determined thereby, and the reduction ratios of the conversion efficiency after continuous irradiation for 300 hours are summarized in Table 10-1.

TABLE 10-1

| Sample No. | | Nitrogen-containing polymer | Electrophile | Dye | Conversion efficiency fresh | Reduction ratio after 300 h (%) | Remarks |
|---|---|---|---|---|---|---|---|
| 1 | Photoelectrochemical cell 1 | 1-1 | 2-6 | Exemplified Dye D-3 | 4.0 | 31 | This invention |
| 2 | Photoelectrochemical cell A | None | None | Exemplified Dye D-3 | 4.2 | 91 | This invention |
| 3 | Photoelectrochemical cell B | None | None | Exemplified Dye D-3 | 3.8 | 73 | This invention |
| 4 | Photoelectrochemical cell 1 | 1-1 | 2-6 | Exemplified Dye D-7 | 3.6 | 29 | This invention |
| 5 | Photoelectrochemical cell A | None | None | Exemplified Dye D-7 | 3.8 | 88 | This invention |
| 6 | Photoelectrochemical cell B | None | None | Exemplified Dye D-7 | 3.2 | 78 | This invention |
| 7 | Photoelectrochemical cell 1 | 1-1 | 2-6 | Sensitizing dye A | 2.5 | 39 | Comparative example |
| 8 | Photoelectrochemical cell A | None | None | Sensitizing dye A | 2.9 | 98 | Comparative example |
| 9 | Photoelectrochemical cell B | None | None | Sensitizing dye A | 2.1 | 74 | Comparative example |

(Remarks)
(1) The symbols of the dyes are as described in the detailed description of the invention.
(2) The nitrogen-containing polymer 1-1 represents the following compound.

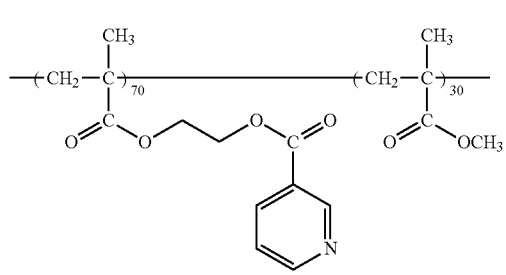

(3) Electrolyte salt
MHIm: Iodide salt of 1-methyl-3-hexylimidazolium
MBIm: Iodide salt of 1-butyl-3-methylimidazolium (4) Solvent
AN: Acetonitrile
PC: Propylene carbonate
NMO: 3-Methyl-2-oxazolidinone
(5) Electrophile

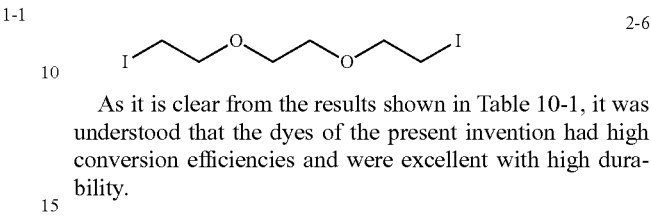

As it is clear from the results shown in Table 10-1, it was understood that the dyes of the present invention had high conversion efficiencies and were excellent with high durability.

Example 10-2

An evaluation was performed in the same manner as in Example 10-1, using the dye of the second embodiment of the present invention that was prepared as described above. The results are presented in Table 10-2.

TABLE 10-2

| Sample No. | Photoelectrochemical cell | Nitrogen-containing polymer | Electrophile | Dye | Conversion efficiency fresh | Reduction ratio after 300 h (%) | Remarks |
|---|---|---|---|---|---|---|---|
| 1 | Photoelectrochemical cell 1-1 | 1-1 | 2-6 | Exemplified Dye A-2 | 4.0 | 31 | This invention |
| 2 | Photoelectrochemical cell A-1 | None | None | Exemplified Dye A-2 | 4.2 | 91 | This invention |
| 3 | Photoelectrochemical cell B-1 | None | None | Exemplified Dye A-2 | 3.8 | 73 | This invention |
| 4 | Photoelectrochemical cell 1-2 | 1-1 | 2-6 | Exemplified Dye A-5 | 3.6 | 29 | This invention |
| 5 | Photoelectrochemical cell A-2 | None | None | Exemplified Dye A-5 | 3.8 | 88 | This invention |
| 6 | Photoelectrochemical cell B-2 | None | None | Exemplified Dye A-5 | 3.2 | 78 | This invention |
| 7 | Photoelectrochemical cell 1-3 | 1-1 | 2-6 | Sensitizing dye A | 2.5 | 39 | Comparative example |
| 8 | Photoelectrochemical cell A-3 | None | None | Sensitizing dye A | 2.9 | 98 | Comparative example |
| 9 | Photoelectrochemical cell B-3 | None | None | Sensitizing dye A | 2.1 | 74 | Comparative example |

As it is clear from the results shown in Table 10-2, it was understood that the dyes of the present invention provide high conversion efficiencies and were excellent with high durability.

Example 10-3

An evaluation was performed in the same manner as in Example 10-1, using the dye of the third embodiment of the present invention that was prepared as described above. The results are presented in Table 10-3.

TABLE 10-3

| Sample No. | Photoelectrochemical cell | Nitrogen-containing polymer | Electrophile | Used dye | Conversion efficiency fresh | Reduction ratio after 300 h (%) | Remarks |
|---|---|---|---|---|---|---|---|
| 1 | Photoelectrochemical cell 1-1 | 1-1 | 2-6 | Exemplified Dye CA-2 | 4.7 | 19% | This invention |

TABLE 10-3-continued

| Sample No. | | Nitrogen-containing polymer | Electrophile | Used dye | Conversion efficiency | | Remarks |
|---|---|---|---|---|---|---|---|
| | | | | | fresh | Reduction ratio after 300 h (%) | |
| 2 | Photoelectrochemical cell A-1 | None | None | Exemplified Dye CA-3 | 4.9 | 21% | This invention |
| 3 | Photoelectrochemical cell B-1 | None | None | Exemplified Dye CB-3 | 3.9 | 31% | This invention |
| 4 | Photoelectrochemical cell 1-2 | 1-1 | 2-6 | Exemplified Dye CB-5 | 3.9 | 19% | This invention |
| 5 | Photoelectrochemical cell A-2 | None | None | Exemplified Dye R-2 | 3.7 | 21% | This invention |
| 6 | Photoelectrochemical cell B-2 | None | None | Exemplified Dye O-2 | 3.9 | 32% | This invention |
| 7 | Photoelectrochemical cell 1-3 | 1-1 | 2-6 | Sensitizing dye A | 2.2 | 85% | Comparative example |
| 8 | Photoelectrochemical cell A-3 | None | None | Sensitizing dye A | 2.6 | 78% | Comparative example |
| 9 | Photoelectrochemical cell B-3 | None | None | Sensitizing dye A | 2.0 | 88% | Comparative example |

As it is clear from the results shown in Table 10-3, it was understood that the dyes of the present invention provide high conversion efficiencies and were excellent with high durability.

INDUSTRIAL APPLICABILITY

According to the present invention, a photoelectrochemical cell having high conversion efficiency can be provided by using an inexpensive metal complex dye or an organic dye. When this photoelectrochemical cell is used, utilization can be made in the fields of various photosensors, copying machines, photovoltaic devices and the like.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2008-278903 filed in Japan on Oct. 29, 2008, Patent Application No. 2008-308951 filed in Japan on Dec. 3, 2008, Patent Application No. 2009-55195 filed in Japan on Mar. 9, 2009, Patent Application No. 2009-153051 filed in Japan on Jun. 26, 2009, Patent Application No. 2009-153052 filed in Japan on Jun. 27, 2009, and Patent Application No. 2009-153053 filed in Japan on Jun. 27, 2009, each of which is entirely herein incorporated by reference.

REFERENCE SIGNS LIST

1 Electrically conductive support
2 Photosensitive layer
21 Dye compound
22 Semiconductor fine particle
23 Electrolyte
3 Hole transfer layer
4 Counter electrode
5 Light-receiving electrode
6 Circuit
10 Photoelectric conversion element

The invention claimed is:
1. A dye represented by formula (2C):

Formula (2C)

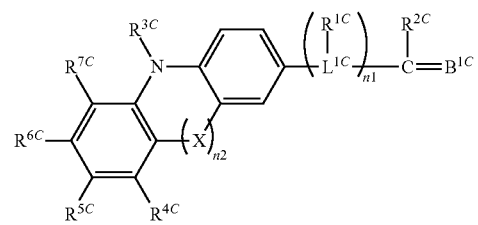

wherein X represents a carbon atom or a sulfur atom necessary for forming a 6- or 7-membered nitrogen-containing heterocycle by linking with the benzene rings and the nitrogen atom; $L^{1C}$ represents an electron transfer-linking group containing at least one hetero ring selected from the group consisting of a thiophene ring, a selenophene ring, a hetero ring in which at least two thiophene rings are condensed with each other and each thiophene ring is condensed with a benzene ring, and a hetero ring in which at least two selenophene rings are condensed with each other and each selenophene ring is condensed with a benzene ring; $R^{1C}$ represents at least one kind of substituent selected from the group consisting of a hydrogen atom, an alkyl group, an alkoxy group and an aryl group; $R^{2C}$ represents a hydrogen atom; $R^{3C}$ represents an alkyl group; n1 represents an integer of 1 to 12; $R^{4C}$, $R^{5C}$, $R^{6C}$, and $R^{7C}$ each represent a hydrogen atom; n2 represents an integer of 1 or 2 in a case where X represents a carbon atom; and n2 represents an integer of 1 in a case where X represents a sulfur atom; and $B^{1C}$ is represented by formula (6C), formula (7C) or formula (8C):

Formula (6C)

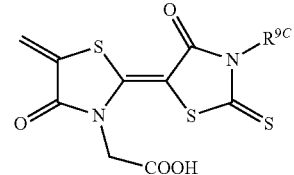

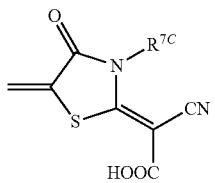

Formula (7C)

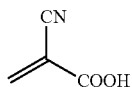

Formula (8C)

wherein $R^{7C}$ in formula (7C) and $R^{9C}$ in formula (6C) represent an aliphatic group or an aliphatic group with a carboxylic acid group.

2. The dye according to claim 1, wherein $L^{1C}$ in formula (2C) represents an electron transfer-linking group containing at least one thiophene ring.

3. The dye according to claim 1, wherein X in formula (2C) represents a carbon atom and n2 in formula (2C) represents an integer of 2.

4. A photoelectric conversion element, comprising a light-receiving electrode, wherein the light-receiving electrode comprises semiconductor fine particles sensitized by the dye according to claim 1.

5. A photoelectrochemical cell, comprising the photoelectric conversion element according to claim 4.

6. The photoelectric conversion element according to claim 4, further comprising a porous insulation material between the light-receiving electrode and a counter electrode.

7. The photoelectric conversion element according to claim 4, comprising an electrolytic solution containing γ-butyrolactone.

* * * * *